US006373753B1

(12) United States Patent
Proebsting

(10) Patent No.: US 6,373,753 B1
(45) Date of Patent: Apr. 16, 2002

(54) MEMORY ARRAY HAVING SELECTED WORD LINES DRIVEN TO AN INTERNALLY-GENERATED BOOSTED VOLTAGE THAT IS SUBSTANTIALLY INDEPENDENT OF VDD

(76) Inventor: Robert J. Proebsting, 13737 Wallace Pl., Morgan Hill, CA (US) 95037

( * ) Notice: Subject to any disclaimer, the term of this patent is extended or adjusted under 35 U.S.C. 154(b) by 0 days.

(21) Appl. No.: 09/503,050

(22) Filed: Feb. 12, 2000

Related U.S. Application Data

(60) Provisional application No. 60/120,032, filed on Feb. 13, 1999.

(51) Int. Cl.$^7$ .................................................. G11C 7/00
(52) U.S. Cl. .............. 365/189.09; 365/226; 365/230.06
(58) Field of Search ....................... 365/189.09, 189.11, 365/226, 230.06

(56) References Cited

U.S. PATENT DOCUMENTS

| | | | | |
|---|---|---|---|---|
| 5,510,749 A | * | 4/1996 | Arimoto ....................... | 327/546 |
| 5,592,421 A | * | 1/1997 | Kaneko et al. ......... | 365/189.09 |
| 5,633,832 A | | 5/1997 | Patel et al. ............. | 365/230.06 |
| 5,659,260 A | | 8/1997 | Kajimoto et al. .............. | 327/55 |
| 5,673,225 A | | 9/1997 | Jeong et al. ........... | 365/189.11 |
| 5,726,944 A | * | 3/1998 | Pelley, III et al. .......... | 365/226 |
| 5,781,481 A | * | 7/1998 | Iwakiri ................... | 365/189.11 |
| 6,075,746 A | * | 6/2000 | Ohsawa .................. | 365/230.06 |
| 6,141,262 A | * | 10/2000 | Sudo ....................... | 365/189.09 |

FOREIGN PATENT DOCUMENTS

| | | | | |
|---|---|---|---|---|
| JP | 11-306783 | * | 11/1999 | ........... G11C/16/06 |

OTHER PUBLICATIONS

Eto, S., et al., "A 1Gb SDRAM with Ground Level Pre-charged Bitline and Non–Boosted 2.1V Word Line," 1998 Digest of Technical Papers, vol. 41, 1998 IEEE International Solid–State Circuits Conference, Feb. 5, 1998, pp. 82–83 and 419.

(List continued on next page.)

*Primary Examiner*—Son Mai
(74) *Attorney, Agent, or Firm*—Zagorin O'Brien & Graham LLP

(57) ABSTRACT

A high performance dynamic memory array architecture is disclosed in several embodiments. The row decoders drive the selected word line to a boosted VPP voltage that is internally generated by a charge pump type circuit whose output is a substantially fixed voltage which is regulated with respect to VSS (i.e., ground). It is substantially independent of VDD over process and environmental variations. The VPP voltage is also used to boost selected array select signals from VDD to VPP. For typical operating voltages, the VPP voltage is somewhat higher than VDD, although at low operating voltage the VPP voltage may be substantially higher than VDD, while at very high operating voltage, the VPP voltage may be similar in magnitude to the VDD voltage. In a preferred embodiment, the VPP generator includes a plurality of pump circuits, each connected to the VPP output, and each controlled by a common control circuit. Each such pump circuit is enabled to pump according to the amount of charge which is needed at a particular time, based on the measured level of both VDD and VPP. If VDD is low, then more of the pump circuits are enabled for a given cycle. As VDD increases, fewer such pump circuits are enabled. Similarly, if VPP is particularly low (such as during power-up), then all the pump circuits are enabled, while if VPP is already high enough, then none of the pump circuits are enabled. In a preferred embodiment, none of the pump circuits are enabled if VPP exceeds 4.0 volts, while all of the pump circuits are enabled if VPP is less than 3.8 volts. Between 3.8 and 4.0 volts, the measured values of both VPP and VDD determine how many and what pumping capacity of pump circuits are enabled.

61 Claims, 46 Drawing Sheets

OTHER PUBLICATIONS

Eto, S., et al., "A 1-Gb SDRAM with Ground-Level Precharged Bit Line and Nonboosted 2.1-V Word Line," IEEE Journal of Solid-State Circuits, vol. 33, No. 11, Nov. 1998, pp. 1697–1702.

Gillingham, P., et al., "High-Speed, High-Reliabilty Circuit Design for Megabit DRAM," IEEE Journal of Solid-State Circuits, vol. 26, No. 8, Aug. 1991, pp. 1171–1175.

Itoh, K,. et al., "Limitations and Challenges of Multigigabit DRAM Chip Design," IEEE Journal of Solid-State Circuits, vol. 32, No. 5, May 1997, pp. 624–634.

Kirihata, T., et al., "Flexible Test Mode Approach for 256-Mb DRAM," IEEE Journal of Solid-State Circuits, vol. 32, No. 10, Oct. 1997, pp. 1525–1534.

Miyawaki, Y., et al., "A New Erasing and Row Decoding Scheme for Low Supply Voltage Operation 16-Mb/64-Mb Flash Memories," IEEE Journal of Solid-State Circuits, vol. 27, No. 4, Apr. 1992, pp. 583–588.

Morimura, H., and Shibata, N., "A Step-Down Boosted-Wordline Scheme for 1-V Battery-Operated Fast SRAM's," IEEE Journal of Solid-State Circuits, vol. 33, No. 8, Aug. 1998, pp. 1220–1227.

Tsukude, M., et al., "A 1.2-to 3.3-V Wide Voltage-Range/Low-Power DRAM with a Charge-Transfer Presensing Scheme," IEEE Journal of Solid-State Circuits, vol. 32, No. 11, Nov., 1997, pp. 1721–1727.

Ukita, M., et al., "A Single-Bit-Line Cross-Point Cell Activation (SCPA) Architecture for Ultra-Low-Power SRAM's," IEEE Journal of Solid-State Circuits, vol. 28, No. 11, Nov. 1993, pp. 1114–1118.

Yamagata, T., et al., "Low Voltage Circuit Design Techniques for Battery-Operated and/or Giga-Scale DRAM's," IEEE Journal of Solid-State Circuits, vol. 30, No. 11, Nov. 1995, pp. 1183–1188.

Yoo, S-M., et al., "Variable $V_{cc}$ Design Techniques for Battery-Operated DRAM's," IEEE Journal of Solid-State Circuits, vol. 28, No. 4, Apr. 1993, pp. 499–503.

* cited by examiner

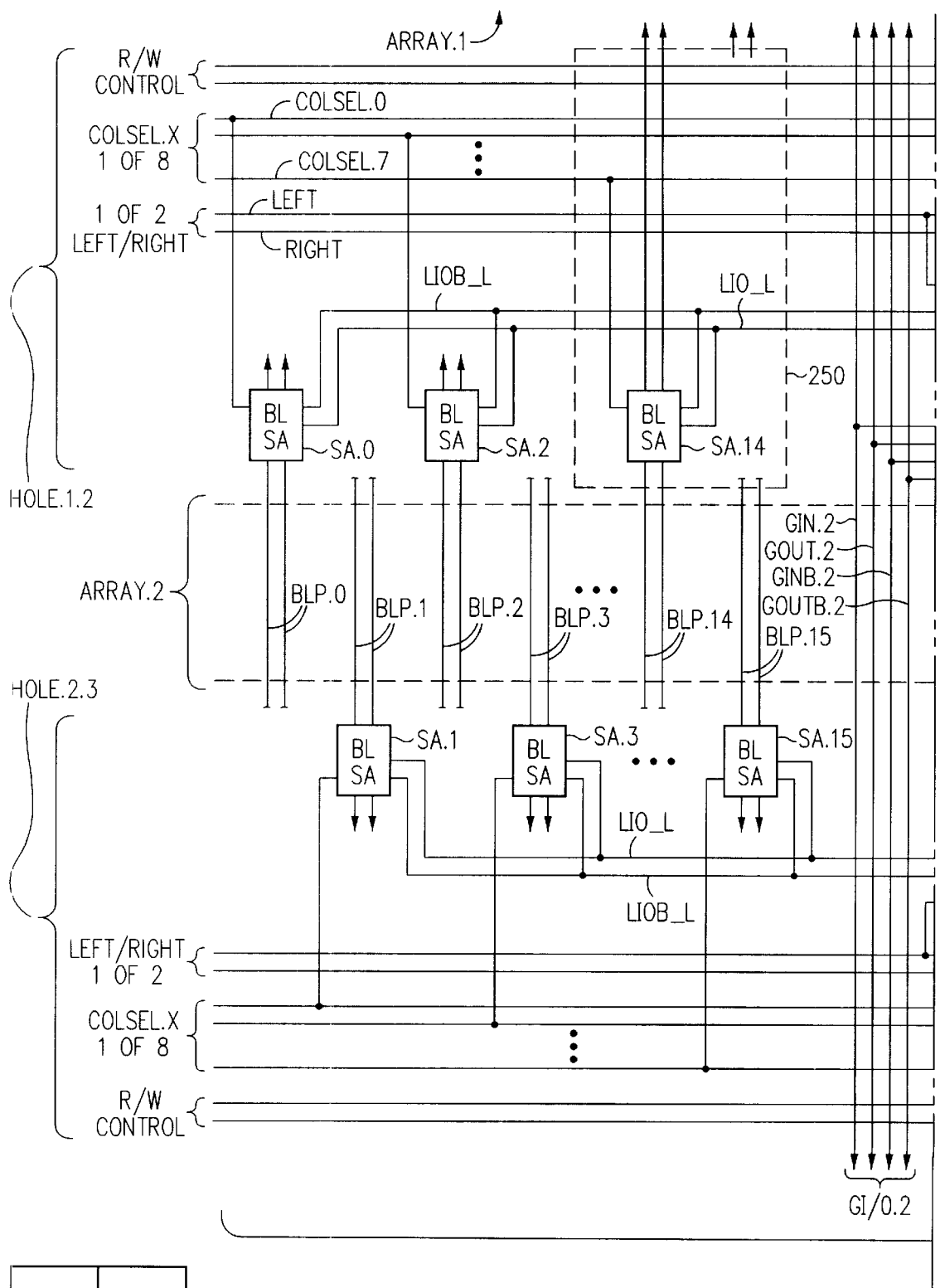
FIG. 4A
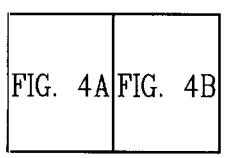
KEY TO FIG. 4

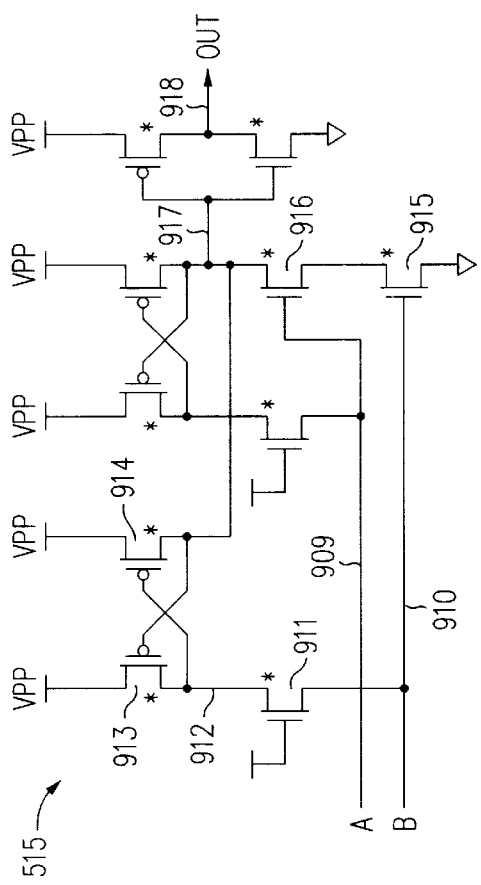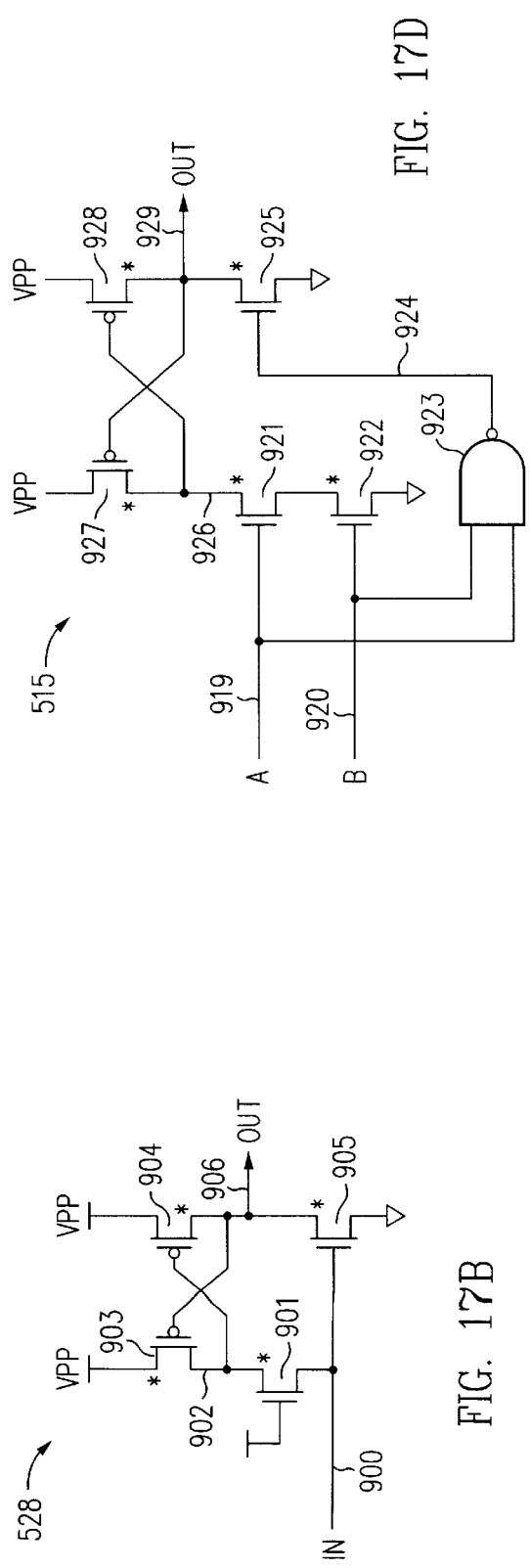
FIG. 17C
FIG. 17B
FIG. 17D

MEMORY ARRAY HAVING SELECTED WORD LINES DRIVEN TO AN INTERNALLY-GENERATED BOOSTED VOLTAGE THAT IS SUBSTANTIALLY INDEPENDENT OF VDD

CROSS-REFERENCE TO RELATED APPLICATION

This application claims the benefit of U. S. Provisional Application No. 60/120,032, filed Feb. 13, 1999, which application is incorporated herein by reference in its entirety.

BACKGROUND OF THE INVENTION

1. Field of the Invention

The present invention relates to semiconductor memories, and particularly to those driving a selected word line in a memory array to a boosted voltage level.

2. Description of Related Art

Semiconductor random-access memory devices or subsystems using arrays of dynamic memory cells (e.g., 1-transistor/1-capacitor (1T/1C) cells) have consistently provided greater density and lower cost per bit than those using static memory cells (e.g., 6-transistor (6T) cells, or 4-transistor/2-resistor (4T/2R) cells). However, such dynamic random-access memory arrays have historically also been lower in performance when compared to static random-access memory arrays. Consequently, system designers have typically chosen dynamic memory arrays (e.g., commercially available dynamic random access memories, or DRAMs) when high density and low cost are required, such as for CPU main memory applications. Conversely, designers have typically chosen static memory arrays when the highest possible performance is required, such as for cache memory and high speed buffer applications. Examples of static memory array devices or subsystems include commercially available static random access memories (SRAMs) and CPU-resident on-board cache memory sub-systems.

The reasons often cited for the lower performance of dynamic memory arrays include the destructive sensing of all memory cells common to the addressed word line (encountered in virtually all dynamic memory arrays) and the consequential need to restore data back into each sensed memory cell during the active cycle, the need to equilibrate bit lines and various other differential nodes and to precharge various circuit nodes between active cycles, and the requirement for periodic refreshing of all dynamic memory cells.

Traditionally, N-channel dynamic memory arrays have provided for boosting a selected word line to a voltage above the VDD power supply voltage. Moreover, a high-going bit line is usually restored to a fall VDD level by the bit line sense amplifier. If the selected word line is boosted to a voltage that is more than an NMOS threshold voltage above VDD, then a selected memory cell coupled to the high-going bit line can be restored to a fall VDD voltage level. Many techniques may be employed to generate such a boosted voltage, but inevitably most techniques rely on a capacitively-coupled method which results in a boosted voltage that is a ratio of VDD. If, at low VDD, a boosting capacitor is adequately sized to generate a boosted voltage sufficiently greater than a threshold voltage above VDD, then at high VDD the same size capacitor provides a boosted voltage that is higher than VDD by far more than a threshold voltage. The additional voltage stress placed upon devices within the integrated circuit can degrade the reliability of the integrated circuit, or alternatively would place more stringent requirements on the semiconductor process to be able to safely tolerate such higher voltages. As both the horizontal and vertical dimensions of devices continue to shrink, it is increasingly difficult and performance sacrificing to fabricate a semiconductor process that is capable of tolerating such variation of maximum voltage.

SUMMARY OF THE INVENTION

To provide for an internally-generated boosted voltage without such wide voltage extremes, a VPP voltage is internally generated by a charge pump type circuit whose output is a substantially fixed voltage which is regulated with respect to VSS (i.e., ground). It is substantially independent of VDD over process and environmental variations. The VPP voltage is used by the row decoders to drive a selected word line from VSS to VPP, and preferably to boost selected array select signals from VDD to VPP, rather than driving the selected word line to VDD or to a voltage which is a ratio of VDD.

For typical operating voltages, the VPP voltage is somewhat higher than VDD, although at low operating voltage the VPP voltage may be substantially higher than VDD, while at very high operating voltage, the VPP voltage may be similar in magnitude to the VDD voltage. Preferably the VPP voltage is chosen to be near the maximum voltage that the field effect transistors (FETs) can safely tolerate. Since the VPP is regulated to be substantially independent of variations in the VDD voltage, at low operating voltage the VPP level is advantageously at a higher voltage than would otherwise be safe, and tolerances in the VPP voltage level which would otherwise be necessary to account for variations in the VDD level are unnecessary.

In a preferred embodiment, the VPP generator includes a plurality of pump circuits, each connected to the VPP output, and each controlled by a common control circuit. Each such pump circuit is enabled to pump according to the amount of charge which is needed at a particular time, based on the measured level of both VDD and VPP. A first regulator compares various fractions of the VDD voltage to an internally generated bandgap voltage, while a second regulator compares various lower fractions of the VPP voltage to the bandgap voltage. If VDD is low, then more of the pump circuits are enabled for a given cycle (or alternatively, enabling one or more pump circuits having a higher aggregate pumping capacity). As VDD increases, fewer such pump circuits are enabled. Similarly, if VPP is particularly low (such as during power-up), then all the pump circuits are enabled, while if VPP is already high enough, then none of the pump circuits are enabled. In a preferred embodiment, none of the pump circuits are enabled if VPP exceeds 4.0 volts, while all of the pump circuits are enabled if VPP is less than 3.8 volts. Between 3.8 and 4.0 volts, the measured values of both VPP and VDD determine how many and what pumping capacity of pump circuits are enabled.

For a given VPP and VDD voltage there are a fixed number of pump circuits enabled. As VDD increases slightly, the charge per cycle increases, even though the same number of pump circuits are enabled, because the VDD is increasing. However, as VDD further increases slightly, one less pump is enabled, so the charge per cycle abruptly decreases. Then as VDD further increases, the charge per cycle again increases because VDD is increasing. When plotted as a function against VDD, the charge per pump cycle thus appears as a sawtooth waveform, which decreases abruptly as each such pump circuit is successively disabled. The pump circuits are preferably not uniformly sized, but instead each size determined individually so that the charge per pump cycle, when plotted as a sawtooth waveform against VDD, varies from min-to-max as little as possible over the range of VDD.

A significant amount of internal de-coupling (i.e., filtering) capacitance on the VPP node is provided by the various row decoder and array select circuits which are unselected during a given cycle. For example, the last two buffers within each row decoder provide in aggregate a large effective capacitance. Taken together, such capacitances provide a significant reservoir of charge on the VPP node without requiring separate devices or structures. A test control signal preferably causes the regulated value of VPP to decrease by a small amount (e.g., 200 mV) when in certain test modes to ensure reliable operation of the memory device when VPP is actually lower than the minimum expected VPP voltage. By using such test modes, adequate operating margins for normal operation may be more easily assured.

If the semiconductor technology allows, transistors which are exposed to the VPP level (e.g., transistors whose gate terminal is driven at any time to the VPP level while the source or drain terminal might be at ground, such as the memory array access transistors and various array select transistors, or those transistors whose drain or source terminal is driven at any time to the VPP level while the gate terminal might be at ground) are preferably implemented using a thicker gate dielectric than the majority of the other transistors which are never exposed to such a high differential voltage across gate-to-drain or gate-to-source terminals. Moreover, it is also preferable to limit the voltage across any transistor using the thin gate dielectric to no more than VDD. Transistors exposed to any voltage which is greater than the VDD level are preferably implemented with the thick gate dielectric and are limited in voltage to the VPP level, which is a fixed voltage substantially independent of the VDD voltage. Consequently, transistors exposed to such internally "boosted" voltages need only withstand a relatively fixed, predictable voltage level (e.g., by using a bandgap reference in the circuit which regulates the VPP voltage) and do not need to withstand even higher voltages which might otherwise be produced by a "boosted" voltage generator whose output voltage is a ratio of VDD (e.g., 1.5×VDD).

In one embodiment of the present invention, an integrated circuit includes: (1) a memory array including a plurality of memory cells, each memory cell coupled to an associated one of a plurality of word lines within the memory array; (2) a power supply terminal for receiving, relative to a ground potential, a power supply voltage operably coupled to the integrated circuit, by which voltage most circuits associated with the memory array are generally powered; (3) a voltage generator circuit for generating, on an output node thereof, a boosted voltage having a regulated magnitude, relative to the ground potential, that is substantially independent of the power supply voltage, over at least an expected range of possible operating values for the power supply voltage; and (4) a row decoder circuit coupled to receive the boosted voltage, for decoding a selected word line and driving the selected word line to the boosted voltage during a memory operation.

In another embodiment of the present invention, a method of operating an integrated circuit having a memory array includes: (1) receiving, relative to a ground potential, a power supply voltage operably coupled to the integrated circuit, by which voltage most circuits associated with the memory array are generally powered; (2) generating a boosted voltage having a regulated magnitude, relative to the ground potential, that is substantially independent of the power supply voltage, over at least an expected range of possible operating values for the power supply voltage; and (3) driving a selected word line to the boosted voltage during a memory operation.

In yet another embodiment of the present invention, an integrated circuit includes: (1) a memory array including a plurality of memory cells, each memory cell coupled to an associated one of a plurality of word lines within the memory array; (2) a power supply terminal for receiving, relative to a ground potential, a power supply voltage operably coupled to the integrated circuit, by which voltage most circuits associated with the memory array are generally powered; (3) means for generating a boosted voltage having a regulated magnitude, relative to the ground potential, that is substantially independent of the power supply voltage, over at least an expected range of possible operating values for the power supply voltage; and (4) means for driving a selected word line to the boosted voltage during a memory operation.

In still another embodiment of the present invention, an integrated circuit includes: (1) a memory array including a plurality of memory cells, each memory cell coupled to an associated one of a plurality of word lines within the memory array; (2) a power supply terminal for receiving, relative to a ground potential, a VDD power supply voltage operably coupled to the integrated circuit; (3) a voltage generator circuit for generating, on an output node thereof, a boosted VPP voltage that is nominally greater in magnitude than the VDD power supply voltage, over at least an expected range of possible operating values for the VDD power supply voltage; and (4) a row decoder circuit coupled to receive the VPP voltage, for decoding a selected word line and driving the selected word line to the VPP voltage. The voltage generator circuit includes a controller circuit, and a plurality of pump circuits responsive to the controller circuit for periodically coupling electronic charge onto the VPP output node of the voltage generator circuit, thereby tending to increase the magnitude of the VPP voltage. Each of the plurality of pump circuits may be independently enabled by the controller circuit to couple a corresponding amount of electronic charge per pump cycle onto the VPP output node of the voltage generator circuit. For a given value of the VPP voltage, the controller circuit is arranged to enable one or more pump circuits having, in aggregate, incrementally more total pump capacitance as the magnitude of the VDD voltage tends correspondingly further below its nominal value, and to enable one or more pump circuits having, in aggregate, incrementally less total pump capacitance as the magnitude of the VDD voltage tends correspondingly further above its nominal value, thereby tending to maintain a more uniform value of total pumped charge per cycle over an operating range of the VDD voltage. Also, each of the plurality of pump circuits are individually sized so that, as the VDD voltage varies over its anticipated operating range, and as the number and pumping capacity of pump circuits that are enabled varies accordingly, the peak magnitude of electronic charge pumped per cycle, just before each change in the selection of pump circuits so enabled, is substantially uniform over the anticipated operating range of the VDD voltage.

Another integrated circuit embodiment of the present invention includes a voltage generator circuit for generating, on an output node thereof, a boosted VPP voltage that is nominally greater in magnitude than a VDD power supply voltage operably coupled to the integrated circuit, over at least an expected range of possible operating values for the VDD power supply voltage. The voltage generator circuit includes a controller circuit, and a plurality of pump circuits responsive to the controller circuit for periodically coupling electronic charge onto the VPP output node of the voltage generator circuit, thereby tending to increase the magnitude of the VPP voltage. Each of the plurality of pump circuits may be independently enabled by the controller circuit to couple a corresponding amount of electronic charge per pump cycle onto the VPP output node of the voltage generator circuit. For a given value of the VPP voltage, the controller circuit is arranged to enable one or more pump circuits having, in aggregate, incrementally more total pump capacitance as the magnitude of the VDD voltage tends correspondingly further below its nominal value, and to enable one or more pump circuits having, in aggregate, incrementally less total pump capacitance as the magnitude of the VDD voltage tends correspondingly further above its nominal value, thereby tending to maintain a more uniform value of total pumped charge per cycle over an operating range of the VDD voltage. Also, each of the plurality of pump circuits are individually sized so that, as the VDD voltage varies over its anticipated operating range, and as the number and pumping capacity of pump circuits that are enabled varies accordingly, the peak magnitude of electronic charge pumped per cycle, just before each change in the selection of pump circuits so enabled, is substantially uniform over the anticipated operating range of the VDD voltage.

The scope of the present invention in its many embodiments is defined in the appended claims. Nonetheless, the invention and its many features and advantages may be more fully appreciated in the context of exemplary implementations disclosed and described herein which combine one or more embodiments of the invention with other concepts, architectures, circuits, and structures to achieve significantly higher performance than previously achievable. For example, a high performance dynamic memory array architecture is disclosed in several embodiments, along with various embodiments of associated supporting circuitry, which afford performance approaching that usually associated with static memory arrays.

In an exemplary embodiment an 18 MBit memory array includes four banks of arrays, each including thirty-two array blocks. Each array block includes 128 horizontally-arranged row lines (i.e., word lines) and 1152 (1024×9/8) vertically-arranged columns. Most internal circuitry operates using a single positive power supply voltage, VDD, and the reference voltage VSS (i.e., "ground"). Each column is implemented as a complementary folded bit line pair. Four independent row decoders are provided respectively for the four banks, and are physically arranged in two pairs, thus forming two splines, one spline located between the left pair of memory banks, and the other spline located between the right pair of memory banks. Latching input buffers for address and control inputs are located within each of the splines and are connected to respective input pads by horizontally arranged input wires running through the memory banks. Two input buffers are provided for each input pad, one located in each spline. Clock lines used to strobe the various inputs are arranged vertically, running through each spline. An R-C compensation circuit between each input wire and the corresponding latching input buffer located in the particular spline nearest its respective input pad provides a delay to the "upstream" buffer which compensates for the additional wiring delay in reaching the "downstream" buffer, and which allows all of the latching input buffers to be driven by phase-aligned clock signals, and still achieve a very narrow worst case setup and hold time over all such inputs. The use of a separate input buffer in each spline for each address and control input, requiring additional interconnect wire to connect each input pad to its input buffer in the "far" spline (above and beyond the interconnect wire to connect each input pad to its input buffer in the "near" spline), increases the input capacitance of each address and control input to the chip (which input capacitance, of course, must be driven by the source of the external signal). However, the complementary internal outputs for each such input buffer may be buffered immediately by self-resetting buffers, and need only drive decoder and/or control circuitry locally within the same spline. Thus, the total capacitive loading on the complementary outputs of each buffer are advantageously reduced and are more balanced between the various buffers.

The row decoder uses predecoding to reduce the total line capacitance driven during an active cycle. The final stages of the row decoder includes an N-channel tree configuration driven by VDD-level (i.e., VSS-to-VDD level) pre-decoded address signals to select and discharge to VSS a particular decode node which was precharged to VPP. Subsequent buffering stages provide a final 1-of-4 decode and drive the selected word line to the VPP voltage that is substantially independent of VDD, rather than driving the selected word line to VDD or to a voltage which is a ratio of VDD. There are no race conditions within the decoder, even though it accomplishes a level shifting from VDD-level signals to VPP-level word lines.

If the semiconductor technology allows, transistors which are exposed to the VPP level are preferably implemented using a thicker gate dielectric than the majority of the other transistors which are never exposed to such a high differential voltage across gate-to-drain or gate-to-source terminals. Moreover, it is also preferable to limit the voltage across any transistor using the thin gate dielectric to no more than VDD. The voltage across the memory cell capacitors is limited to less than one-half VDD (e.g., limited to about 1.0 volts for certain embodiments). A third dielectric material, thinner than the "thin" capacitor dielectric required for typical DRAM memory cells (which must normally support a voltage of one-half the maximum allowed VDD voltage) may be advantageously used to fabricate the memory cell capacitors to provide additional storage capacitance per unit area.

Within each memory bank, a row of sense amplifiers is implemented in the holes between each pair of array blocks. Each sense amplifier is shared between two pairs of bit lines—one pair located within the array block above the sense amplifier and the other pair located within the array block below the sense amplifier. The complementary internal nodes within each sense amplifier are respectively connected to the true and complement bit lines above the sense amplifier by a first pair of N-channel array select transistors whose gates are driven to VSS (to isolate the sense amplifier nodes from the bit line pair) or driven to VPP (to connect the sense amplifier nodes to the bit line pair), and are further connected to the pair of bit lines below the sense amplifier by a second pair of array select transistors whose gates are likewise switchable from VSS to VPP. A row of sense amplifiers is implemented above the top array block and another row of sense amplifiers is implemented below the bottom array block of the given memory bank, which serve half of the bit lines within the top and bottom array blocks, respectively. For any particular array block, half of the bit line pairs are served by a sense amplifier located above the array block, and the remaining half are served by a sense amplifier located below the array block. A pair of array select transistors having a gate voltage switchable between VSS and VPP connects any given pair of bit lines to the complementary internal sense amplifier nodes within the corresponding sense amplifier.

An amplifier in the read path is used to develop signal on a generic I/O line before bit line sensing has occurred. Such a generic I/O line may include a global output line, a column line, or an I/O line. This amplifier may be connected to the bit lines, the sense amplifier nodes, a local I/O line serving, for example, a few bit line pairs, or a local output line similarly serving, for example, a few bit line pairs. If the read amplifier inputs are connected directly to the bit line sense amplifier nodes (i.e., one read amplifier per bit line sense amplifier), the column select function may be advantageously used to enable the amplifier for the selected column, while if the read amplifier inputs are connected to local output or I/O lines (i.e., one read amplifier per group of bit line sense amplifiers), the column select function may be used to couple the selected bit line sense amplifier to the local output or I/O lines. If the common mode voltage of the read amplifier input nodes is so low that current flow through the tail of an N-channel differential pair cannot be assured for all voltage or process corners, the amplifier may incorporate a coupling circuit to capacitively couple the tail of the differential pair downward, preferably using a controlled current source, to approximate a constant current source to a negative supply voltage.

In a certain embodiment, each read amplifier's inputs are connected to the internal nodes of a corresponding bit line sense amplifier. The respective outputs of a group of read amplifiers are connected in common to a horizontally-arranged differential pair of local output lines. One such amplifier is enabled at a time by column select circuitry to develop signal on the pair of local output lines. A second stage amplifier then further buffers this signal and drives a pair of vertically-arranged global output lines. The global output lines extend the fall height of the memory bank, with half preferably extending beyond the memory bank to I/O circuits above the memory bank, with the remaining half extending beyond the memory bank to I/O circuits below the memory bank. In certain embodiments, the second stage amplifier may also include a multiplexer to choose between two different pairs of local output lines (e.g., a first pair of local output lines serving 8 sense amplifiers located to the left of the second stage amplifier, and a second pair of local output lines serving 8 sense amplifiers located to the right of the second stage amplifier).

The word lines within the array blocks may be implemented in a polysilicon layer and strapped using a later-processed metal layer to reduce word line delays. Such word line straps are preferably implemented using two different layers of metal (preferably the two "lowest" layers, metal-1 and metal-2) in order to match the word line pitch without requiring any distributed buffers or final decode buffers. The read amplifiers used to sense a local output line and subsequently drive a global output line may be advantageously located above word line straps where a break in the memory cell stepping already occurs. This allows the read amplifier block to more readily be laid out in the center of a group of bit line sense amplifier and column select circuits. As such, the bit line sense amplifier pitch may be slightly less than twice the column pitch (recalling that half of the bit line sense amplifiers are above the array block and the remaining half below the array block).

The bit line sense amplifiers each are implemented using a full CMOS cross-coupled latch. To sense the signal on a pair of bit lines, both the cross-coupled N-channel pair of transistors (i.e., the NMOS sense amplifier) and the cross-coupled P-channel pair of transistors (i.e., the PMOS sense amplifier) which form the CMOS sense amplifier are enabled at substantially the same time. The NMOS sense amplifier drives the bit line having a lower voltage toward VSS, while the PMOS sense amplifier drives the bit line having a higher voltage toward VDD. If enabled a sufficiently long time, the lower bit line substantially reaches VSS and the higher bit line would be driven substantially all the way to VDD. However, the PMOS sensing is terminated before the higher bit line substantially reaches the fall VDD voltage. This allows the bit line to quickly be driven to a high level without having to wait for the "exponential tail" if it were driven all the way to VDD. The internal sense amplifier nodes and the near end of the bit lines are actually driven above and overshoot the final high bit line "restore" level (e.g., 2.0 volts for a device operating at a VDD of 2.5 volts) before the PMOS sensing is terminated, whereas the far end of the high bit lines have not yet reached the final high bit line "restore" level when the PMOS sensing is terminated. Then, after the PMOS sensing is terminated, charge is shared between the near end and far end of the bit lines, thus speeding up the far end reaching the final high bit line "restore" level because the effective time constant of the resistive bit line is cut in half.

Since the word line and array select lines are left high for some time even after the PMOS sense amplifier is turned off, charge sharing between the sense amplifier nodes, the near and far ends of the bit lines, and the memory cell storage node itself contribute to determining the final high restore level which is "written" back into the selected memory cell. When compared to having a full VDD level on a high bit line, the relatively low final "high" bit line voltage (e.g., 2.0 volts) transfers into the selected memory cell more quickly due to the higher gate-to-source voltage of the memory cell access transistor.

The NMOS sensing is preferably continued, even after the PMOS sensing has stopped, to more adequately drive the bit line having the lower voltage (the "low-going" bit line) to a substantially full VSS level. This ensures that, if the selected memory cell happens to be coupled to the low-going bit line, a substantially full VSS level is restored into the selected memory cell. This also ensures that all the low-going bit lines (not just those having a selected memory cell connected thereto) are fully discharged before, at the end of the cycle, the high and low bit lines share their charge to set the bit line equilibrate voltage. The selected word line (which is driven when active to the VPP level) is then brought low as the NMOS sensing is terminated, after which the array block is automatically taken into precharge.

Timing circuitry is used to time the simultaneous start of both NMOS and PMOS sensing relative to the timing of the selected word line being driven high, to time the end of PMOS sensing, and to time the simultaneous end of NMOS sensing and the selected word line being brought low. The PMOS sense timing duration may be designed to decrease as the VDD voltage increases to ensure a written high level which is substantially independent of VDD, even over process and temperature corners. For example, the timing may be set to ensure a written high level on the high bit line (and into the selected memory cell) of about 2.0 volts for a device having a VDD voltage range from 2.3 to 2.9 volts. Such a PMOS sense timing generator may be accomplished by using a dummy bit line and sense amplifier structure (activated substantially before the main sense amplifiers are activated), detecting when the PMOS sensing needs to be turned off to achieve a final high voltage of about 2.0 volts on the dummy sense amplifier and bit line structure, then buffering this timing signal to control the turn off time of the PMOS sense enable signals for the regular sense amplifiers within the memory arrays. The PMOS timing may alternatively be accomplished using g a string of inverters powered at a voltage a fixed amount below VDD, or by other techniques to achieve a timing which is a combination of several variables, such as power supply voltage VDD, bandgap voltage, transistor threshold voltage and transconductance, temperature, or others.

In a preferred embodiment, the sense amplifier timing circuitry produces three main timing signals. The first timing signal is used to control, relative to the timing of the selected word line being driven high, the simultaneous start of both the NMOS and PMOS sensing. A second timing signal is used to control, relative to the simultaneous start of NMOS and PMOS sensing, the duration of the PMOS sensing, and a third timing signal is used to control, relative to the end of the PMOS sensing, when to simultaneously end the NMOS sensing and bring the selected word line back low. Each of these timing signals is independently generated, although the circuitry used for each may share portions with another. These three timing signals define three timing intervals. The timing interval "$T_1$" begins with the selected word line being driven high and ends with the simultaneously start of both the NMOS and PMOS sensing (i.e., the timing interval "$t_1$" is the amount of time the selected word line is high before sensing). The timing interval "$t_2$" extends from the simultaneous start of NMOS and PMOS sensing to the en d of PMOS sensing (i.e., the timing interval "$t_2$" is the duration of the PMOS sensing). The timing interval "$t_3$" extends from the en d of the PMOS sensing to the simultaneous end of the NMOS sensing and discharge of the selected word line (i.e., the timing interval "$t_3$" is the amount of time the word line remains high after the end of PMOS sensing).

The timing interval $t_1$ essentially controls how much signal f from the memory cell reaches the sense amplifier before starting the NMOS and PMOS sensing. A short $t_1$ may not provide enough time for all the charge in a selected memory cell to fully share with the charge on the bit line and sense amplifier nodes, and consequently the sense amplifier begins to sense with less signal than would be developed if, alternatively, a longer $t_1$ were configured. A longer $t_1$ increases operating margins at the expense of increased cycle time. Similarly, the timing interval $t_2$ essentially controls how much charge is driven onto the high-going sense amplifier node, bit line, and memory cell during sensing. Increasing $t_2$ increases the voltage stored into the memory cell, but also increases the bit line equilibrate voltage when charge is later shared between true and complement bit lines (and sense amplifier nodes). A short $t_2$ may not provide enough charge to develop the desired restored high level (e.g., 2.0 volts) on the bit line and into a selected memory cell. Conversely, an excessively long $t_2$ timing may not increase the stored high level in the memory cell as much as it increases the bit line equilibrate voltage, and thus may decrease the high level signal available for sensing, particularly at high VDD. The timing interval $t_3$ essentially controls how much charge is shared between the sense amplifier node, the near end and far end of a high-going bit line (which typically is moderately resistive), and the memory cell. The resistance of the NMOS memory cell access transistor is much higher when restoring a high level (due to its lower gate-to-source voltage) than when restoring a low level. The $t_3$ timing is constrained by the time needed to write a high voltage into the selected memory cell through the resistive bit line and further through the relatively high-resistance memory cell access transistor. A short $t_3$ may result in a worst case memory cell (one located at the "far" end of a bit line, furthest from its bit line sense amplifier) being written to a restored high level which is too low, for a given amount of "Q" transferred into the sense amplifiers (i.e., for the bit line equilibration voltage which results from the given amount of "Q").

These timing intervals $t_1$, $t_2$, and $t_3$ may be collectively optimized on a chip-by-chip basis. In a preferred embodiment, there may be sixteen different timing settings, each specifying a particular combination of the $t_1$, $t_2$, and $t_3$ timing intervals, ranging from very aggressive for highest performance, to very relaxed for highest yield. For example, the timing setting "1" may provide for the most aggressive (i.e., shortest) $t_1$ timing interval, the most aggressive (i.e., shortest) $t_2$ timing interval, and the most aggressive (i.e., shortest) $t_3$ timing interval. The timing setting "16" may provide for the most relaxed $t_1$ timing interval, the most relaxed $t_2$ timing interval, and the most relaxed $t_3$ timing interval. Each incremental timing setting between "1" and "16" is preferably optimized to incrementally increase, by a similar amount, the signal available at the bit line sense amplifier just before sensing. To accomplish this, the timing setting "2" may increase the $t_1$ interval by 200 ps compared to the "most aggressive" $t_1$ value of timing setting "1," while keeping $t_2$ and $t_3$ unchanged (a 200 ps increase may be easily achieved by adding two inverters to the logic path setting the time interval). The timing setting "3" may increase $t_3$ by 200 ps while keeping the same value of the $t_1$ and $t_2$ intervals as in timing setting "1." Each successive low-numbered timing setting preferably increases the value of one of the three timing intervals $t_1$, $t_2$, and $t_3$ relative to their values in the previous timing setting, while keeping the remaining two timing intervals unchanged. Higher numbered timing settings may increase a given timing interval by increasingly larger amounts to maintain a similar increase in the signal available at the bit line sense amplifier just before sensing, or may increase more than one of the three timing intervals. For example, the timing setting "15" may increase $t_1$ and $t_3$ each by 400 ps relative to the respective intervals in timing setting "14" (compared to a 200 ps increase in only $t_3$ between timing setting "2" and "3").

The timing setting "8" is preferably optimized to provide a "nominal" value for each of the three timing intervals $t_1$, $t_2$, and $t_3$ which is expected to be an appropriate setting for a typical device having typical transistor characteristics, typical sense amplifier offset voltage, typical bit line resistance, etc. Note that these "nominal" values of the timing intervals $t_1$, $t_2$, and $t_3$ are a function of the process corner. Higher bit line resistance, higher access transistor threshold voltage, or lower VPP, for example, raise the nominal value of each of the $t_1$, $t_2$, and $t_3$ timing intervals which are called for by timing setting "8." For the preferred embodiment, the various timing settings provide a variety of $t_1$ intervals, some shorter than nominal and others longer than nominal, and provide a variety of $t_3$ intervals, both shorter and longer than nominal. But since the duration of the PMOS sensing is so short for the nominal case, for some embodiments the shortest $t_2$ interval provided is the "nominal" value, and more relaxed $t_2$ intervals are provided for in the timing settings numbered above "8."

During manufacture, this timing setting "8" is configured as the default setting. During a special test mode (for example, at wafer sort) the timing setting may be temporarily made more or less aggressive to determine the window of operation for each chip. Some of the memory devices are found to function correctly with very aggressive timing, while others require more relaxed timing. Then, during the fuse blowing sequence for redundancy, timing fuses may be also blown to permanently modify the default strobe timing. The timing setting is preferably set as aggressively as possible to enhance device performance, while maintaining adequate sense amplifier signal margins for reliability. For example, if a timing setting of "4" is the most aggressive timing for which a given device functions without error, then the device may be advantageously fuse programmed to a timing setting of "6" to ensure some additional operating margin (the signal to the bit line sense amplifiers increasing as the timing setting increases). At a later test, such as at final test of a packaged device, the test mode may still be entered, and the timing setting advanced from its then fuse programmed setting to a more aggressive setting, in order to further verify adequate sense amplifier margins on a chip-by-chip basis, independent of which actual timing setting was fuse programmed into the device.

A two-dimensional grid of power buses is preferably implemented within each memory bank, with large VDD and VSS buses arranged parallel to the bit lines and implemented in a higher layer of metal (e.g., the top layer), vertically passing above the bit lines. Filter capacitors are located at the ends of each array block as well as at the top and bottom of each memory bank to help provide additional bypass capacitance to withstand the large current spikes which occur during sensing. These filter capacitors, as well as other filter capacitors implemented elsewhere within the device, are preferably implemented using multiple, independent capacitors which are individually de-coupled and automatically switched out of the circuit if, at any time, more than a predetermined leakage current is detected automatically by the memory device as flowing through a given capacitor (i.e., a "shorted" capacitor). The large metal buses allow this stored charge to reach the two selected rows of sense amplifiers (i.e., located in the holes above and below the selected array block) with very little voltage drop, and allow the sense amplifiers to latch quickly and provide a good VSS low level.

The bit lines are equilibrated together to achieve an equilibration voltage on the bit lines, for a preferred embodiment, of approximately 1.0 volts. The bit lines are preferably equilibrated at both ends to reduce the required equilibrate time. The bit line equilibration voltage is coupled from all bit line pairs to a common node which may be sampled just after equilibration and buffered (using a sample-and-hold amplifier) to drive the memory cell plate. Since the bit line equilibration voltage is approximately one-half the written high level, the bit line equilibration voltage may also be sampled, compared to a reference voltage (for example, a 1.0 volt reference), and any voltage difference used to adjust the PMOS timing (and thereby adjust the final written high level).

As stated above, the exemplary memory array is automatically taken back into precharge without waiting for a control signal. In other words, one edge of a clock causes the memory array to execute a useful cycle, then to automatically reset itself in preparation for a new cycle. This precharge timing is relative to the beginning of the active cycle. Of significance, this limits the amount of potential sub-threshold leakage through memory cell access transistors by limiting the time that any bit lines are at VSS. The precharging/equilibration is accomplished by using two sets of signals—one is an automatically timed pulse, while the other stays on until the start of the next cycle. For example, the bit line sense amplifiers are preferably equilibrated using two different equilibrate signals. Both turn on automatically at the same time after NMOS sensing is complete and the selected word line is brought low. One equilibrate signal is turned off by a timed pulse just when the bit line equilibration is substantially complete (i.e., at the end of the active cycle), while the other equilibrate signal is turned off by the start of the subsequent cycle. The pulsed equilibrate signal drives much larger internal capacitive loads, such as large equilibration devices, while the non-pulsed equilibrate signal drives fewer and/or much smaller devices which indeed assist the larger pulsed equilibrate devices in equilibrating the various nodes. However, the smaller devices are largely included as "keepers" to maintain the equilibration until the next active cycle. As such, the total capacitance of the various equilibration signal lines which must be discharged (i.e., brought low) at the start of new cycle is greatly reduced and can be accomplished with less delay after the initiating control signal, and the performance is enhanced. For relaxed clock cycle times, the pulsed equilibrate signal falls automatically at the end of a cycle, while the non-pulsed equilibrate signal stays high until the next cycle selecting this array block is initiated. However, for a clock cycle time which approaches the fastest possible cycle time for a given device, the non-pulsed equilibrate signal for the newly selected array block may be discharged by the initiation of the next cycle at substantially the same time as the pulsed equilibrate signal for the previously selected array block is discharged automatically at the end of the previous cycle. To save power, the non-pulsed equilibrate signal for only the selected array block and supporting circuitry is brought to VSS at the start of an active cycle, and all others remain inactive at VDD throughout the active cycle. Similarly, the pulsed equilibrate signal for only the selected array block and supporting circuitry is actually pulsed at the end of an active cycle, while all others remain inactive at VSS.

During an internal write operation, the exemplary device contains write circuitry that supplies a small differential voltage to the sense amplifier before bit line sensing, the polarity of the voltage depending on the data to be written. The circuitry furthermore "swallows" the voltage otherwise developed in the sense amplifier by the selected memory cell. Then, during their normal latching, the bit line sense amplifiers then "write" the level into the memory cell. Because of an internal write queue, the data to be written is already available when the actual internal write operation is started. In preparation for the current write operation, this data is preferably driven onto the global input lines late in the previous write operation, and then coupled to the selected sense amplifier by column select circuitry fairly early in the current write operation, before latching the bit line sense amplifiers. The magnitude of the write signal coupled onto the sense amplifier nodes is kept small to reduce power consumption and to reduce disturbance to the neighboring bit lines and sense amplifiers which are not being written. Preferably, the magnitude of the write signal imparted onto any given sense amplifier node is no higher than that normally developed during a read operation, so that coupling to the neighboring bit lines and sense amplifiers is no worse than during a read operation. The global input lines serving the next word to be written are equilibrated after each write operation, preferably to the bit line equilibration voltage, and driven to the new data state for the next write operation, even if the next write operation is not the next cycle. Moreover, the differential voltage on the global input lines serving the next word to be written is equilibrated away (in a write cycle) after bit line sensing has started and the column select lines are inactive (i.e., during the later stages of bit line sensing), and then driven to reflect the new write data for the following write cycle before the bit lines have finished equilibrating, rather than driving these data input signals during the early part of bit line sensing when such movement could disturb the bit line sensing. The global input lines then dynamically float until needed by the next write operation. To handle the possibility that the next write operation may be many cycles later, the global input lines may be refreshed periodically (e.g., every 256 external clock cycles, before any leakage current can substantially modify their voltage) by re-equilibrating and re-driving to ensure the proper magnitude of the write data signal for as long as necessary until the next write operation occurs.

By writing a dynamic memory array by "fooling" the sense amplifier and letting it actually restore the voltage levels onto the bit lines in accordance with the data to be written, rather than in accordance with the data previously in the selected memory cell, a write cycle takes the same very short time as a read cycle, rather than the longer time that would be required by first sensing old data, then modifying it. In addition, a significant amount of power is saved by not having to over-power many sense amplifiers after they have already been latched.

During power-up, all the memory cells are initialized to a low voltage under automatic internal control. Provision is made to allow every word line to simultaneously go high, to force the node to which the bit lines are equilibrated to VSS, and to ensure that the bit line equilibration and array select transistors are on. Since each sense amplifier is then coupled to a common node at VSS by precharge signals, each bit line (both true and complement) is driven to VSS and all memory cells are likewise forced to VSS, even if the word lines are no higher than a threshold voltage above VSS. At about the same time, the memory cell plate is established at a voltage near the eventual bit line equilibration voltage (preferably around 1.0 volts) by other power-up circuits, being careful to limit the current flow, which charges the cell plate, to an amount less than the output current of the substrate bias charge pump (to prevent the substrate from coupling positively and causing massive latchup from the diffused regions of each memory cell's internal node). Then, when normal cycles begin, the very first operation in the memory array occurs with memory array nodes (bit lines, cell plate) properly established, and all memory cells initialized at one of the two valid states (in this example, at VSS). The first cycles do not have to try to sense memory cells having an initialized voltage near the bit line equilibration voltage, as would likely occur without such a power-up sequence due to coupling from the memory cell plate to the memory cells themselves as the memory cell plate reaches its normal level at the bit line equilibration voltage of, for example, 1.0 volts. This prevents any bit line sense amplifiers which are not being written from spending time in a meta-stable state which, if allowed to occur, would affect the high level restored into the memory cells being written, as well as the equilibrate voltage resulting on the bit lines.

During a read operation, signal developed on the bit lines by the selected memory cell is immediately buffered by the local output line amplifier(s) before bit line sensing starts, and immediately starts to develop signal on the pair of global output lines. For certain embodiments, the differential signal propagates through lines and differential amplifiers to the output buffers, whose first stage is a latching amplifier which is then strobed to detect, amplify, and latch this signal. The timing of the strobe signal for this latching amplifier (which may be known as "$t_4$") may be optimized on a chip-by-chip basis. There may be, for example, eight possible strobe timings, from very aggressive to very relaxed. The device may be initially configured with an intermediate default strobe timing (e.g., having a value of "4," where "1" is the most aggressive and "8" is the most relaxed), and during a special test mode (for example, at wafer sort) the strobe timing may be made more or less aggressive to determine the window of operation for each chip. Then, during the fuse blowing sequence for redundancy, timing fuses may be also blown to modify the default strobe timing. The timing is modified to be as aggressive as possible while maintaining adequate margins for reliability. For example, if in the test mode a $t_4$ timing of "2" is the fastest timing for which a given device functions without error, then the device may be advantageously fuse programmed to a $t_4$ timing of "3" or not altered to remain at "4" to ensure sufficient operating margin. At a later test, such as at final test of a packaged device, the test mode may again be entered, and the $t_4$ timing advanced from its then fuse programmed setting to a more aggressive setting (e.g., 1 or 2 settings faster than its new programmed timing setting without needing to know the new programmed timing setting), in order to further verify adequate operating margins on a chip-by-chip basis, independent of which actual timing setting was fuse programmed into the device.

In an alternative embodiment of a memory array having a cycle time which is long compared to its read access time, a latching global output line amplifier may be strobed (at what was time $t_4$ in the earlier embodiment) to detect and amplify the signal on the pair of global output lines, and communicate the sensed data onward through output multiplexer circuitry and ultimately (if the particular global output line is selected) to output buffer circuitry. The timing of the global output line amplifier may be selected to support both a flow-through configuration as well as a pipelined configuration. To support a fast flow-through access time specification, the latching global output amplifier is aggressively strobed as soon as a predetermined amount of signal has developed on the global output lines. In this way, the data propagates to and is available at the outputs as quickly as possible. But with this aggressive timing, some devices may fail. Conversely, when in the pipelined mode of operation, the global output latch timing is relaxed to more closely coincide with the global output signal peak, and the sensed data is provided to the output buffers for driving to the output pins during the next cycle (using a PLL or delay-locked loop). By affording additional time for even more signal to develop on the global output lines, a particular device which may be marginal or may even fail at the fast t4 timing of the flow-through mode may prove to have adequate margin at the more relaxed timing of the pipelined mode, and may be sold for use and guaranteed to operate only in the pipelined mode of operation.

Bit line crossover structures are advantageously used to achieve lower worst case coupling, during both read or write operations, onto a particular bit line pair from neighboring bit lines on either side. Because photolithographic guard cells are used at the edges of each arrayed group of memory cells, there is a layout area penalty in providing crossover structures including the required guard cells on either side of each crossover structure. To reduce this area penalty, a novel crossover arrangement is employed, for certain embodiments, which provides a significant degree of noise (i.e., coupling) reduction while requiring only one crossover. Within each array block, each complementary pair of bit lines runs vertically from the top to the bottom of the array block. The true bit line and complement bit line of a first pair run adjacent to each other from the top to the bottom of the array block without any crossovers. The true bit line and complement bit line of a second pair do not run adjacent to each other, but instead straddle the first pair (i.e., both true and complement bit lines of the first pair lie between the true and complement bit lines of the second pair), with a single crossover half-way down the second bit line pair (vertically in the middle of the array block). This crossover arrangement repeats horizontally throughout each array block in groups of two pairs of bit lines (four physical bit line wires). By using this crossover arrangement, only four groups of guard cells are required in each array block—one each at the top and bottom of the array block, and one each at the top and bottom of the single crossover structure located in the vertical center of the array block.

The address and data for a write cycle are queued to eliminate dead cycles on the system data bus. In the exemplary embodiment operated in the pipelined mode, the address for a read cycle is strobed during one cycle, and the corresponding data read from the selected memory cells is driven onto the external data pins during a subsequent cycle. If an external write cycle follows immediately after an external read cycle, the write address may be presented to the address bus and strobed into the memory device just like for a read cycle, but the external bidirectional data bus is occupied with driving the data out corresponding to an earlier external read cycle (bey a number of cycles depending on the pipeline latency for a particular embodiment) and cannot be used to present the corresponding write data. Instead, the data for the external write cycle is driven onto the data bus and presented to the device during the cycle in which output data would have appeared had the cycle been an external read cycle instead of an external write cycle. In this way, the address bus and the data bus are used every cycle, with no wasted cycles for either bus. Both the write address and data are queued, the actual write operation to physically store the write data into the selected memory cells is postponed until a subsequent write cycle, which then, when executed, retires the previously received address and data from the write queue into the memory array. Read bypass circuitry is provided which allows data corresponding to the address of the read cycle to be correctly read from the write queue whenever an earlier queued write directed to that same address has not yet been retired.

In the exemplary embodiment, the internal data path is twice as wide (i.e., a "double word") as the external I/O word width (i.e., the least significant address bit selects one of the two possible 36-bit words), and a significant degree of internal power consumption is saved by merging external write cycles when sequential write addresses occur. The address of a given external write cycle is stored and compared to the address of the next external write cycle. If the selected memory cells to be written in both external write cycles correspond to the same physical word line and the same column within the same array block of the same memory bank (i.e., differ in only the least significant address bit), the internal write operation which would otherwise follow from the first external write cycle is delayed, and the data to be written is queued and merged with the data to be written in the second external write cycle. The write queue then "retires" both queued write requests by performing a single internal write operation, simultaneously writing both data words received in the first and second external write cycles. If the internal data path were wider than 72-bits, then more than two 36-bit write cycles could be merged into a single internal write operation. For example, if the internal data path were 144-bits wide, then four 36-bit write cycles could conceivably be merged into a single internal write operation.

The exemplary embodiment includes a burst mode of operation which provides, during subsequent cycles, read or write access to sequential addressed memory cells relative to a received (i.e., "load") address, without requiring such sequential addresses be presented to the device. Using the 72-bit wide (double word) organization of each memory bank, two 36-bit words are retrieved from the memory array in the first cycle. The second word is saved to present to the data outputs after the first word is output. Because the exemplary device is organized into separate memory banks, a burst of four sequential words may transcend the address boundaries between memory banks. Consequently, the exemplary device includes provision for automatically initiating a load cycle in another memory bank during a burst cycle.

In certain embodiments, a dynamic memory array using the architecture and supporting circuits described above achieves random access cycles (each requiring a new random row access) at a sustained rate in excess of 200 MHz operation, even when each new row access is within the same array block of the same memory bank.

The present invention may be better understood, and its numerous objects, features, and advantages made even more apparent to those skilled in the art by referencing the detailed description and accompanying drawings of the embodiments described below.

BRIEF DESCRIPTION OF THE DRAWINGS

FIG. 17B is a schematic diagram of a level-shifting inverter circuit useful for the circuitry shown in FIG. 17A.

FIG. 17C is a schematic diagram of a level-shifting AND-gate circuit useful for the circuitry shown in FIG. 17A.

FIG. 17D is a schematic diagram of another embodiment of a level-shifting AND-gate circuit useful for the circuitry shown in FIG. 17A.

In the drawings, depicted elements are not necessarily drawn to scale, and like or similar elements may be designated by the same reference numeral throughout the several views.

DETAILED DESCRIPTION

Figure 1:
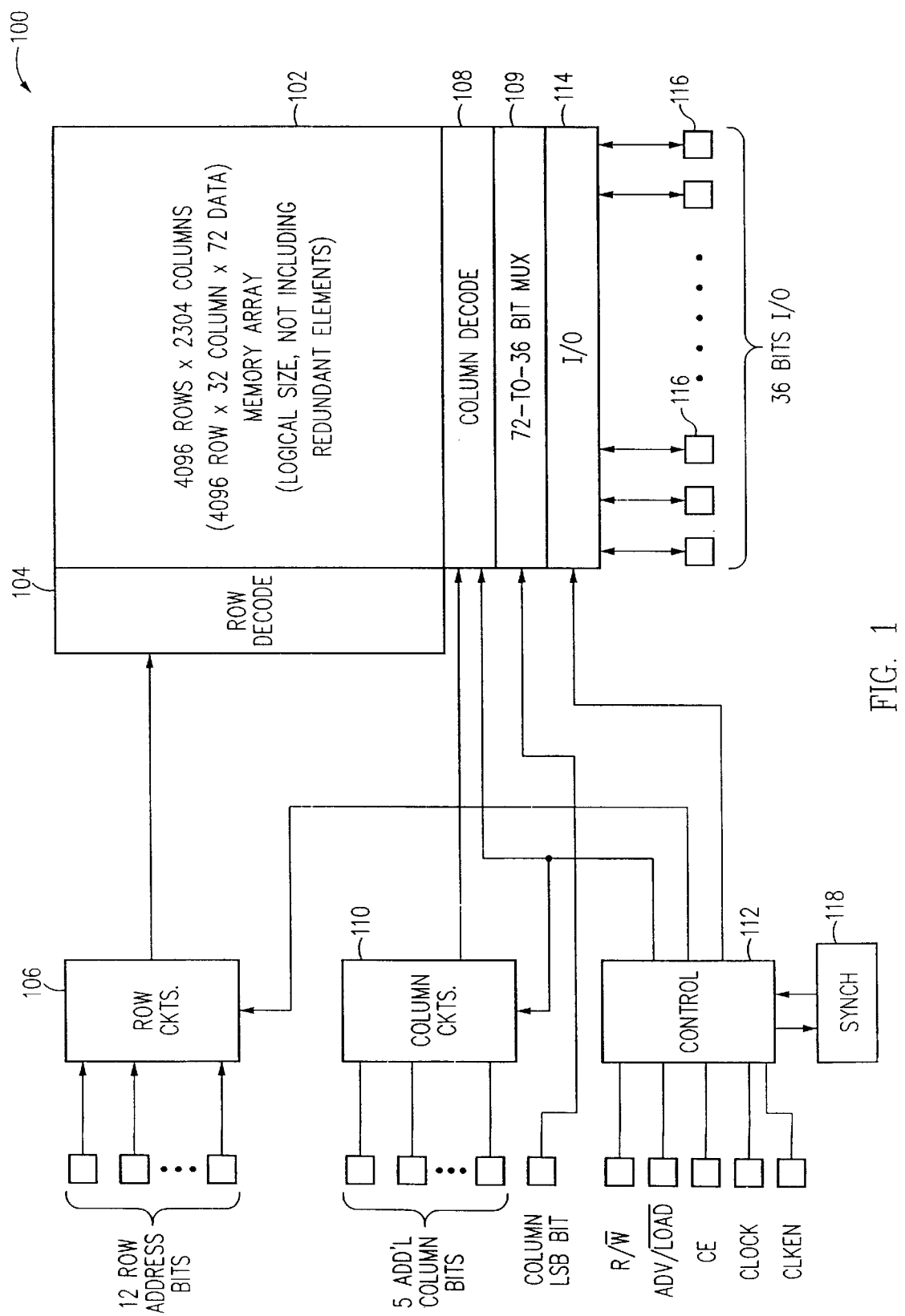
FIG. 1 is a block diagram of a memory device incorporating a dynamic memory array which provides an exemplary embodiment for describing the features and advantages of the present invention.

Referring now to FIG. 1, a memory circuit 100 is shown which incorporates various features of the present invention, and which provides an exemplary embodiment for describing the features and advantages of the present invention. A memory array 102 includes, for this embodiment, a logical size of 4096 rows by 2304 columns, and which is arranged logically as 4096 rows by 32 columns for each bit within a 72-bit double word. Row and column redundancy are also incorporated into array 102 which increases the actual number of physical rows and columns. A row decoder 104 receives row address information from row circuits 106 to decode a selected row (i.e., word line) within array 102. Likewise, a column decoder 108 receives column address information from column circuits 110 to decode 72 selected columns (i.e., bit lines) within the array 102. Either 36 or 72 bits are read from (or written into) the respective memory cells located at the intersections of the selected word line and the selected bit lines, and conveyed to (or from) 36 external terminals 116 through a 72-to-36 bit multiplexer 109 (selected by the least significant column address bit) and an I/O circuit 114.

A control block 112 receives an external clock signal CLOCK and a variety of other control signals, including a read/write control R/W#, an advance/load control ADV/LOAD #, a chip enable CE, and a clock enable CLKEN. A synchronization circuit 118, such as a phase-locked loop or delay-locked loop, affords synchronizing internal control signals with the external clock signal CLOCK. In the preferred embodiment the core of the memory device operates at a nominal VDD of 2.5 volts, the I/O section operates at a nominal VDD of 3.3 volts, and portions of the array (and related control signals) are driven to an internally-generated and regulated 4.0 volt level. Various embodiments of these circuits and their respective features and advantages are described in detail below.

Figure 2:
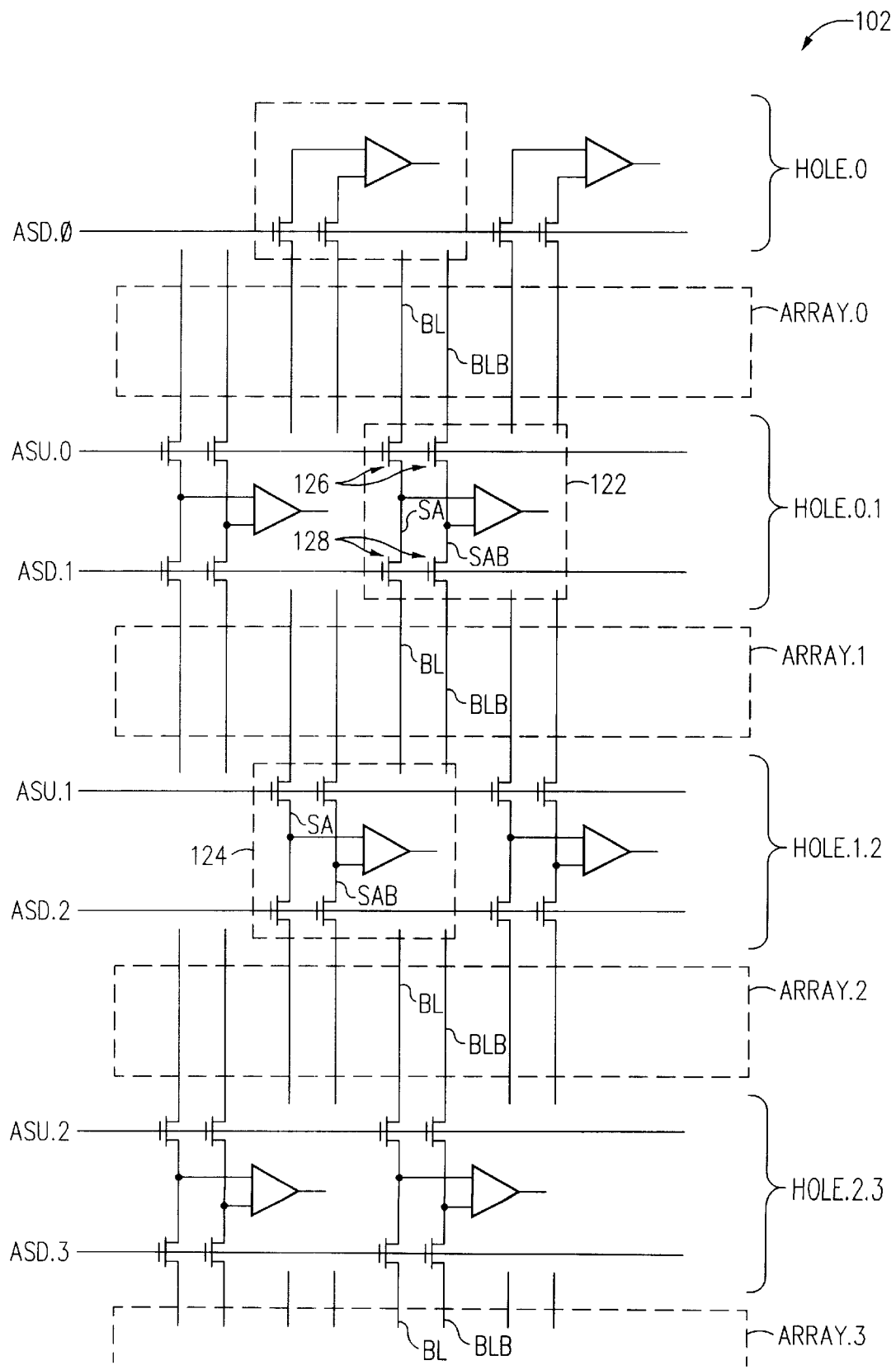
FIG. 2 is a block diagram of a portion of the memory array shown in FIG. 1 and showing a plurality of array blocks having bit line pairs alternately connected to shared sense amplifiers above and below the array block.

Referring now to FIG. 2, a portion of memory array 102 is illustrated and shows a plurality of sub-arrays or array blocks ARRAY.0, ARRAY.1, ARRAY.2, ARRAY.3, etc. each preferably having, for this embodiment, 256 word lines (running horizontally but not shown) and having a plurality of bit lines configured in a folded-bit-line arrangement. As used herein, an "array block" is a two-dimensional group of memory cells which may contain bit line cross-overs and word line straps (and related layout structures), but no other transistor circuitry. (Depending upon the capacitance and the resistance of each bit line, then each of the plurality of sub-arrays or array blocks may have other numbers of word lines, such as 128 word lines, as is discussed in greater detail below.) A plurality of sense amplifiers is located within each of the holes HOLE.0.1, HOLE.1.2, HOLE.2.3 between the array blocks, and within the hole HOLE.0 located above the top array block ARRAY.0. Each sense amplifier is selectable to sense and restore either a bit line pair from the array block above the sense amplifier, or a bit line pair from the array block below the sense amplifier. For example, sense amplifier 122 may be configured to sense and restore the bit line pair BL, BLB within array block ARRAY.0 if the selected word line is located within array block ARRAY.0, or alternatively may be configured to sense and restore the bit line pair BL, BLB within array block ARRAY.1 if the selected word line is located within array block ARRAY.1. Every other bit line pair (e.g., the odd-numbered pairs) within an array block is connectable to a sense amplifier located in the hole above the array block, with the remaining every other bit line pairs (e.g., the even-numbered pairs) within the same array block connectable to a sense amplifier located in the hole below the array block. Such an alternating sense amplifier arrangement allows the number of sense amplifiers within a hole to be equal to half the number of bit line pairs within each of the array blocks. Consequently, the layout of each sense amplifier need only match the pitch of two pairs of bit lines rather than one pair.

Sense amplifier 122 includes a first pair of array select transistors 126 which, if enabled by a suitable voltage level on an array select signal ASU.0 ("array select up, array block 0"), connect the true and complement bit lines BL, BLB within array block ARRAY.0 to respective true and complement sense amplifier nodes SA, SAB. The sense amplifier 122 further includes a second pair of array select transistors 128 which, if enabled by a suitable level on an array select signal ASD.1 ("array select down, array block 1"), connect the true and complement bit lines BL, BLB within array block ARRAY.1 to the same respective sense amplifier nodes SA, SAB within the sense amplifier 122.

Separate array select signals run (through each hole and parallel to the word lines) at the top and at the bottom of each array block. Between active cycles, each array select line is preferably held high (e.g., at the positive supply voltage VDD) to assist in equilibrating the bit lines. Then, when an active row cycle starts, high-order row addresses are decoded to determine which array block is to be selected. The array select signals at both the top and bottom of the selected array block remain logically high to provide a path between each bit line pair BL, BLB and corresponding sense amplifier internal nodes SA, SAB. The respective array select line on the deselected side of each of the two rows of selected sense amplifiers is preferably brought low before the selected word line is driven high, to isolate the respective internal sense amplifier nodes SA, SAB from the capacitance of respective bit lines BL, BLB located within the adjacent but deselected array block. All other array select lines within the memory array 102 preferably remain high since no other word line is driven active, nor are any other sense amplifiers strobed.

A particular example may provide additional clarity to such a memory organization and its operation. If, for example, a selected word line lies within array block ARRAY.1 the array select signals ASD.1 and ASU.1 at both the respective top and bottom of array block ARRAY.1 remain high, thus coupling each bit line pair within array block ARRAY.1 to a corresponding sense amplifier within either hole HOLE.0.1 or HOLE.1.2. The array select lines ASU.0 and ASD.2 on the deselected side of each of the two rows of selected sense amplifiers (i.e., those sense amplifiers located in holes HOLE.0.1 and HOLE.1.2) are brought low before the selected word line is driven high, to isolate the respective internal sense amplifier nodes SA, SAB from the capacitance of respective bit lines BL, BLB located within deselected array blocks ARRAY.0 and ARRAY.2. All other array select lines within the memory array 102 (e.g., ASD.0, ASU.2, ASD.3, etc.) except these four just described remain high to minimize power dissipation and to provide continuous bit line and sense amplifier equilibration to deselected array blocks (along with other equilibration transistors described below).

Similarly, if a selected word line falls within array block ARRAY.2, the array select signals ASD.2 and ASU.2 at both the respective top and bottom of array block ARRAY.2 remain high, thus coupling each bit line pair within array block ARRAY.2 to a corresponding sense amplifier within either hole HOLE.1.2 or HOLE.2.3. The array select lines ASU.1 and ASD.3 on the deselected side of each of the two rows of selected sense amplifiers are brought low before the selected word line is driven high, to isolate the respective internal sense amplifier nodes SA, SAB from the capacitance of respective bit lines located within deselected array blocks ARRAY.1 and ARRAY.3. All other array select lines within the memory array 102 (e.g., ASD.0, ASU.0, ASD.1) except these four just described remain high to minimize power dissipation and to provide continuous bit line and sense amplifier equilibration to deselected array blocks.

Further details of various embodiments of the sense amplifiers and array select signals, including detailed timing and voltage levels, are described in greater detail below.

Figure 3:
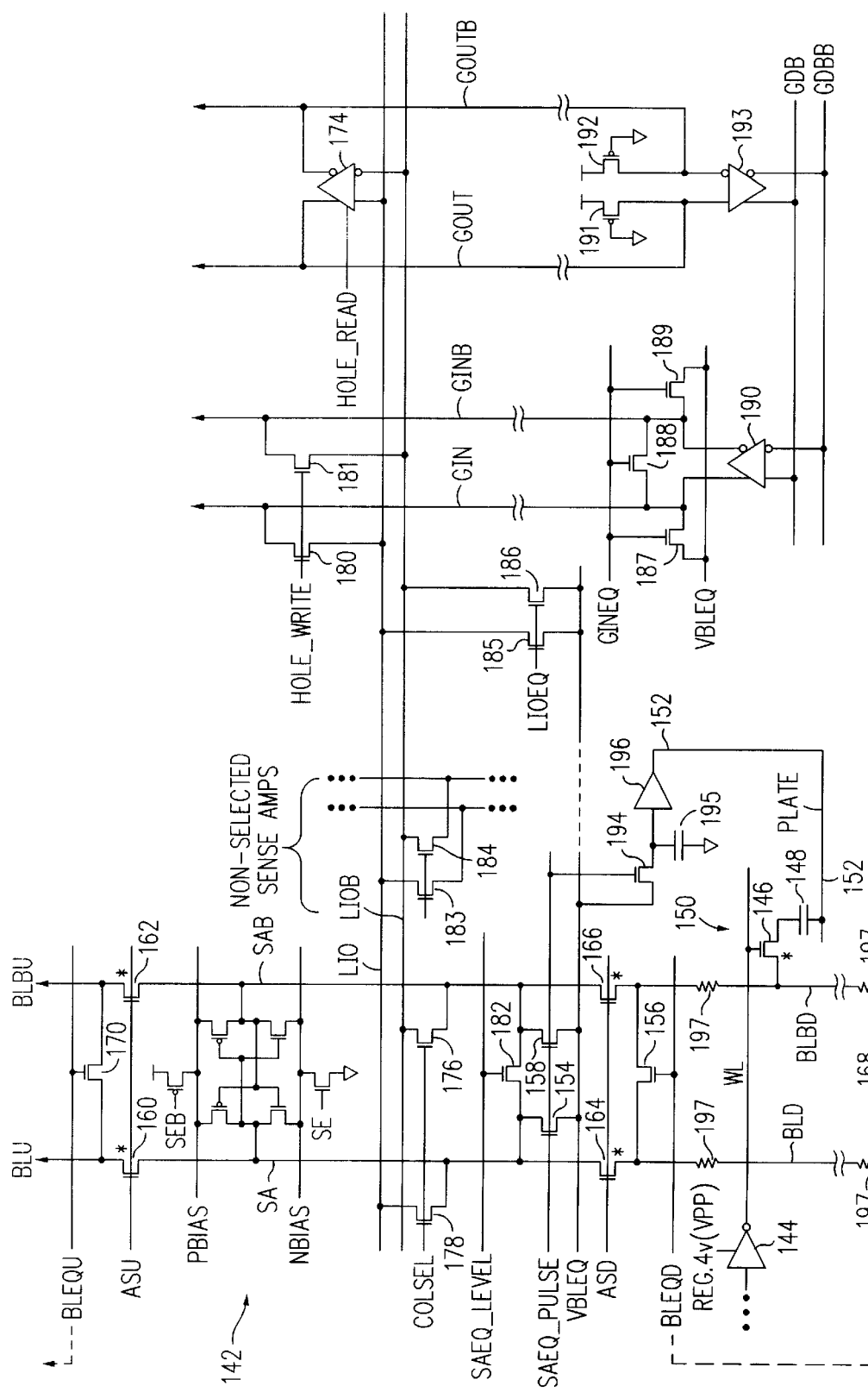
FIG. 3 is a simplified electrical schematic diagram conceptually illustrating the local and global I/O line aspects of the memory array shown in FIG. 1.

While the above description related to FIG. 2 illustrates a general organization of an exemplary memory array 102 into array blocks and the sharing (i.e., multiplexing) of sense amplifiers between bit line pairs from separate array blocks, it provides little indication of how columns are selected and how each sense amplifier output is steered to I/O circuits external to the memory array 102. FIG. 3 is a simplified electrical schematic diagram which illustrates for certain embodiments the basic functionality of the memory array 102, and particularly illustrates the use of a pair of bi-directional local I/O lines LIO, LIOB to couple differential data from the two internal nodes of a selected one of several neighboring bit line sense amplifiers to a local amplifier 174, which then drives a pair of global output lines GOUT, GOUTB. The pair of local I/O lines LIO, LIOB runs horizontally (i.e., parallel to the word lines) within an array hole and services several neighboring bit line sense amplifiers located within the same array hole, preferably from 4 to 16 sense amplifiers. The global output lines GOUT, GOUTB run vertically (i.e., parallel to the bit lines) and extend the fall length of the memory array. A separate local amplifier (e.g., amplifier 174) is used for each pair of local I/O lines LIO, LIOB located within each array hole, and is each selectable (by decoding array select addresses and other timing information described below) to drive a corresponding pair of complementary global output lines GOUT, GOUTB. Each pair of global output lines GOUT, GOUTB includes a pair of static P-channel load transistors 191, 192 (or other resistive means) and is sensed by a GOUT amplifier 193 (various embodiments of which are described below) to generate an output signal on a global data bus (here shown implemented as differential global data bus lines GDB, GDBB).

A corresponding pair of vertical global input lines GIN, GINB is used to steer write data into a selected memory cell. The pair of global input lines GIN, GINB is momentarily driven by a GIN amplifier 190 with a data signal received from the complementary global data bus (GDB, GDBB), which are then coupled by a pair of transistors 180, 181 to the pair of local I/O lines LIO, LIOB, and which is then coupled to a selected sense amplifier by column select transistors 178, 176. Simplified nomenclature is used in FIG. 3 for an arbitrary array block, to aid in clarity of description. Subsequent figures introduce circuit schematics which add full array block decoding and timing necessary to support a memory array 102 having a large number of array blocks, as is described more fully below.

Having briefly set forth thus far the basic I/O structure of the memory array 102, a more detailed description follows below in the context of a basic read cycle, followed by a description of a basic write cycle. A cross-coupled CMOS sense amplifier 142 is multiplexed, as described above, to sense either a bit line pair BLU, BLBU (i.e., "bit line up" and "bit line bar up") within the array block located above the sense amplifier 142, or to sense a bit line pair BLD, BLBD (i.e., "bit line down" and "bit line bar down") within the array block located below the sense amplifier 142. To select the upper bit line pair BLU, BLBU, an upper array select signal ASU is left high while a lower array select signal ASD is brought low, as described above in reference to FIG. 2.

Array select transistors 160, 162 remain on and couple the upper bit line pair BLU, BLBU to respective sense amplifier nodes SA, SAB while array select transistors 164, 166 are turned off to isolate the sense amplifier nodes SA, SAB from the lower bit line pair BLD, BLBD. Conversely, to select the lower bit line pair BLD, BLBD, the lower array select signal ASD is left high while the upper array select signal ASU is brought low to isolate the unselected bit line pair within the upper array block from the sense amplifier internal nodes SA, SAB. Preferably the array select signals which remain logically high (to gate the selected bit lines to the respective sense amplifier) are actually "boosted" or driven to a voltage above the VDD level to provide for a lower impedance path, particularly during restoration of the high level bit line voltage, as is discussed in greater detail below. If boosted array select levels are employed, then the array select transistors (e.g., array select transistors 160, 162) may be preferably fabricated using a high voltage transistor structure if one is available in the semiconductor process being used. However, as is described in greater detail below, the array select signals may be boosted to a VPP voltage which, for reliability reasons, is a regulated, fixed "safe" voltage level referenced to VSS, but which is typically well above VDD for typical operating conditions. If two different transistor structures (e.g., normal and high voltage) are not available, all the transistors, including the memory cell access transistors, are designed to work reliably at the boosted voltage.

The general column organization of this embodiment of the memory array 102 may be illustrated by considering a memory cycle in which the selected word line falls within, for example, the array block located below the sense amplifier 142 in FIG. 3. A word line WL is shown which, when driven active, couples a memory cell 150 to the complement bit line BLBD. The memory cell 150 includes NMOS access transistor 146 which couples one terminal of a memory cell capacitor 148 to the bit line BLBD, while the other terminal of memory cell capacitor 148 is connected to memory cell plate 152. As is common practice with all DRAMs, half of the memory cells associated with a given bit line pair connect to the true bit line, and the remaining half connect to the complement bit line. A portion of the row decoder for the word line WL includes row driver 144, which is powered from a VPP level which is higher than the normal VDD level used throughout the majority of the circuit. This VPP voltage is preferably internally generated and regulated (using a bandgap reference voltage) to a substantially constant value of 4.0 volts relative to VSS (for a memory device designed to work using a nominal VDD level of 2.5 volts) independent of semiconductor process corner, temperature, and the particular VDD level. NMOS access transistor 146 is preferably fabricated using a high voltage transistor structure, if available, as is indicated by the adjoining notation "*" in FIG. 3. If no special high voltage transistor structure is available, all transistors are designed (based upon reliability considerations) to tolerate a VPP voltage of, for example, 3.6 to 4.0 volts, even though the circuit is intended to operate at a VDD of nominally only 2.5 volts.

After a previous active cycle (and consequently while all the row lines are held inactive low) the complementary bit lines BLD, BLBD are equilibrated to each other by equilibration transistor 156 which is gated by a self-timed pulsed equilibrate signal BLEQD and which transistor is located at the "near end" of the bit line pair (next to the array select transistors 164, 166). Because the sense amplifier 142 restores one bit line to the low supply voltage level (i.e., VSS or ground) and the other bit line to a high voltage level, the bit lines subsequently establish, after sharing their charge, a bit line equilibration voltage that is approximately one-half of the high write (i.e., restore) level. The sense amplifier nodes SA, SAB are equilibrated to each other by transistor 182 which is gated by a sense amplifier equilibrate signal SAEQ_LEVEL which remains high until the next active cycle begins in which sense amplifier 142 is selected. The sense amplifier nodes SA, SAB are further equilibrated to a common (i.e., shared) bit line equilibrate node VBLEQ by transistors 154, 158 which are gated by a self-timed pulsed sense amplifier equilibrate signal SAEQ_PULSE, to establish the bit line equilibration voltage of the collective high capacitance of all the bit line pairs on the relatively low capacitance of the common bit line equilibrate node VBLEQ. The SAEQ_PULSE signal is self-timed and remains high for the same duration as the other pulsed equilibrate signals, which is for a sufficient time to adequately equilibrate the sense amplifier nodes SA, SAB, and to establish the bit line equilibration voltage faithfully onto the common bit line equilibrate node VBLEQ, but the SAEQ_PULSE signal is then automatically brought low without waiting for a new cycle to begin. (The equilibration transistor 182 may alternatively be implemented as two separate, parallel transistors: one gated by the sense amplifier equilibrate signal SAEQ_LEVEL, and the other gated by the sense amplifier equilibrate signal SAEQ_PULSE.) The lower bit line pair BLD, BLBD is also equilibrated at the "far end" of the bit lines (i.e., the end most distant from its sense amplifier) by equilibrate transistor 168, also gated by a decoded equilibrate signal having the same timing as pulsed equilibrate signal BLEQD (represented by a dashed line in FIG. 3). By equilibrating the bit lines from both ends, the equilibration time is reduced by almost a factor of four as compared to equilibrating from only one end of the bit lines (assuming the "on" resistance of each equilibrate transistor is small compared to the bit line resistance, represented schematically as parasitic bit line resistors 197).

The upper bit line pair BLU, BLBU is similarly equilibrated by equilibration transistor 170 which is gated by a self-timed pulsed equilibrate signal BLEQU and which transistor is preferably located at the near end of the upper bit line pair (next to the array select transistors 160, 162). The upper bit line pair is also equilibrated at its far end by an equilibrate transistor (not shown) analogous to transistor 168, also gated by a decoded equilibrate signal having the same timing as pulsed equilibrate signal BLEQU.

After the previous active cycle, both array select signals ASU, ASD are driven to VDD (if not already at such a voltage). The additional sense amplifier equilibration transistor 182, which is gated by equilibrate signal SAEQ_LEVEL, directly equilibrates the internal sense amplifier nodes SA, SAB together. Consequently, both the true and complement upper bit lines BLU, BLBU, the true and complement sense amplifier nodes SA, SAB, and the true and complement lower bit lines BLD, BLBD are all equilibrated together by transistor 182 until the next cycle using sense amplifier 142. These lines, when initially equilibrated, jointly establish the bit line equilibration voltage onto node VBLEQ and which voltage, for this embodiment, is equal to approximately 1.0 volt, as is further described below.

The local I/O lines LIO, LIOB are also equilibrated to the bit line equilibration voltage by transistors 185, 186. A local I/O equilibration signal LIOEQ provided to the gate terminals of both transistors 185, 186 is driven high between active cycles and remains high even during active cycles whenever the particular local I/O line pair is deselected (i.e., its hole is deselected). Between active cycles, strobed amplifier 174 is inactive, allowing the pair of global output lines GOUT, GOUTB to be both driven to VDD by respective static load transistors 191, 192.

When an active cycle starts in the lower array, the equilibrate signal SAEQ_LEVEL is brought low to de-couple the two internal sense amplifier nodes SA, SAB from each other. The other pulsed equilibrate signals (e.g., the SAEQ_PULSE and BLEQD signals in all the array blocks) are already low (for long cycle times) or are concurrently being brought low (for minimal cycle times) in order to reduce the capacitance of various "equilibrate" signals which must be brought low at the start of an active cycle before the selected word line may be driven high. Moreover, when an active cycle starts in the lower array, the ASU signal is also brought low to de-couple the internal sense amplifier nodes SA, SAB from the bit line pair BLU, BLBU in the de-selected array block located above the sense amplifier 142. Upper-order row addresses (i.e., array block select addresses) are decoded by the respective circuits which generate the various sense amplifier equilibrate signals and array select signals to determine, based upon which array block is selected, which of the signals to bring low. The LIOEQ signal is also brought low to de-couple the local I/O lines LIO, LIOB from each other, again based upon upper-order row address information (as well as internally-generated timing information).

As soon as the appropriate equilibrate and array select signals are sufficiently low, the selected word line WL is driven high. These waveforms may actually overlap slightly, as the voltage of the equilibrate and array select signals must preferably be below approximately one N-channel threshold voltage above the bit line equilibrate level before the voltage of the selected word line WL reaches the threshold voltage of the N-channel access transistor 146. Because the word line driver 144 is implemented using a very large output pull-up transistor, and is powered by an internally-generated and regulated 4.0 volt supply voltage (VPP) rather than by VDD, the selected word line WL rises smoothly and quickly to a 4.0 volt high level to facilitate restoration of a high level into a memory cell. As the selected word line WL rises, of course, a differential signal is generated between the differential bit lines BLD, BLBD, depending on whether the stored data within the selected memory cell 150 was earlier written to either a high voltage (e.g., about 2.0 volts) or a low voltage (about 0 volts). Because the array select transistors 164, 166 remain conductive (because array select signal ASD remains high) the differential signal on the bit lines BLD, BLBD is coupled onto the internal sense amplifier nodes SA, SAB.

At substantially the same time as the selected word line WL is driven high, and particularly of note before the sense amplifier 142 is strobed, the selected column decode signal COLSEL is also driven high, in this case to a VDD level. Consequently, the developing signal on the sense amplifier nodes SA, SAB is also coupled to the very short, very low capacitance local I/O lines LIO, LIOB before sensing of the sense amplifier 142. Moreover, at substantially the same time and still before sensing of the sense amplifier 142, the local I/O amplifier 174 is enabled (as determined by decoded address information combined with internal timing signals, not yet shown) and the developing signal on the local I/O lines LIO, LIOB is buffered onto the global output lines GOUT, GOUTB. As soon as a sufficient signal is developed on the internal sense amplifier nodes SA, SAB, the bit line sense amplifier 142 is strobed simultaneously by strobe enable signal SE and strobe enable bar signal SEB. When strobed, the sense amplifier 142 restores a low level on the bit line having a lower sense voltage and restores a high level on the bit line having a higher sense voltage, as is well known in the art. The relative timing of these strobe enable signals will be described in greater below, but for ease of description the strobing of the sense amplifier 142 may at this point be assumed to restore adequate high and low levels onto the respective bit lines connected thereto. With the selected word line WL still high, the selected memory cell voltage is restored as well.

In a traditional DRAM, the signal from the selected memory cell is developed in and strobed by the sense amplifier before any column decode signal is driven which couples either the selected bit lines and/or sense amplifiers to any type of I/O lines. One reason this is done is to ensure maximum signal in the sense amplifiers before sensing and to reduce any interference that the column select signals might impart upon proper sensing of the data from the selected memory cell. Connection of a very large capacitance global I/O line to a low capacitance bit line before sensing would severely attenuate the signal to be sensed. Another reason this is done include I/O lines which are advantageously equilibrated to a much different voltage than are bit lines.

In the embodiment shown in FIG. 3, the selected column decode signal is driven before sensing. This counter-intuitive technique slightly attenuates the signal available to the sense amplifiers due to the small increased capacitive loading of a very short, low capacitance local I/O line (e.g., LIOB) onto the combined capacitance of a bit line sense amplifier node (e.g., SAB) and a bit line (e.g., BLBD), but it advantageously affords an opportunity to start developing signal onto the global output lines GOUT, GOUTB even before sensing has occurred. This provides a tremendous read access time advantage compared to waiting for sensing before driving selected column decode signals. It should be appreciated that the sense amplifier nodes SA, SAB must not be disturbed or mis-equilibrated when the selected column decode signal COLSEL is driven high. Because the local I/O lines are precharged to the same voltage as are the bit lines and sense amplifier nodes (e.g., the bit line equilibrate voltage established on node VBLEQ), the common mode voltage of the bit line sense amplifier nodes nominally is unchanged when the selected column decode signal COLSEL is driven high because the equilibrate voltage is the same. Careful attention to balanced layout results in reducing any differential capacitive coupling through column select transistors 176, 178, which preserves the equilibration of the sense amplifier nodes SA, SAB.

The global output lines GOUT, GOUTB run the entire vertical length of the memory array 102, as described above. At substantially the same time as the selected word line WL and the selected column decode signal COLSEL are driven high, in a read cycle the decoded read signal HOLE_READ is driven high (as determined by decoded array select address information combined with internal timing signals, not yet shown), also before sensing. Thus, as the low voltage differential signal develops on the bit lines BL, BLB, the sense amplifier nodes SA, SAB, and the local I/O lines LIO, LIOB, it is buffered by the selected local I/O sense amplifier 174 and driven onto the differential global output lines GOUT, GOUTB. Load transistors 191, 192 need not be decoded, as the voltage of the both global output lines GOUT, GOUTB remain at VDD between active cycles, and during an active read cycle only one of the global output lines (e.g., GOUT or GOUTB) is briefly driven downward by the selected local I/O sense amplifier 174 to develop a relatively small differential signal level between the global output lines GOUT, GOUTB. Additional details of the local I/O sense amplifier 174 and the GOUT amplifier 193, as well as complete data path details from the memory array to the external connections of the exemplary embodiment, are described further below. An alternate embodiment may include several decoded GOUT load resistors along the length of a given global output line, which are decoded such that only the load resistor located adjacent to or at least physically nearest the selected local I/O sense amplifier is enabled during a read cycle, to minimize the voltage drop on the global output lines between the local I/O sense amplifier and the load resistor. However, this also adds significant complexity in control circuits to decode the load resistors appropriately. Other plausible embodiments include a decoded load resistor at both the ¼ and ¾ points along the global output lines, a non-decoded load resistor at both the top and bottom of the memory bank, or a non-decoded load resistor at just the end of the memory bank having the GOUT sense amplifier 193 (as shown in FIG. 3).

In a write operation, both the data to be written and the write address are known even before the start of the write operation. In the exemplary embodiment, this occurs because a write queue "buffers up" several write cycles before any data is actually written into the array. Additional details of the write queue are described in greater detail below. Nonetheless, to understand the basic write operation of the simplified circuitry as shown in FIG. 3, one may assume the data is known to the memory before the start of the write cycle which actually "writes" the data into the selected memory cells. More specifically, the data which is to be next written is already placed upon the global input lines GIN, GINB before an active cycle starts. Even more specifically, a differential voltage is driven onto the global input lines GIN, GINB during the latter portion of bit line sensing and the early portion of bit line equilibration so that the global input lines are not moving during the latter portion of bit line equilibration and through the early portion of bit line sensing when capacitive coupling to an underlying bit line or sense amplifier node could disturb bit line sensing.

At substantially the same time as the selected word line WL and the selected column decode signal COLSEL are driven high, in a write cycle the decoded write signal HOLE_WRITE is driven high (as determined by decoded array select address information combined with internal timing signals, not yet shown), also before sensing. This couples the low voltage differential write data signal already present on the global input lines GIN, GINB onto the local I/O lines LIO, LIOB by way of transistors 180, 181. Since the selected column decode signal COLSEL has also been driven (or is being driven) high, the write data signal is also coupled onto the internal sense amplifier nodes SA, SAB, where it is combined with the signal otherwise developed by the selected memory cell. The magnitude of the differential write data signal on the global input lines GIN, GINB is preferably chosen to nominally impart a voltage on each bit line which is no larger than might otherwise occur during a read cycle. Due to the much larger capacitance of the global input lines GIN, GINB compared to the sum of the respective capacitance of the bit lines BLD, BLBD, the bit line sense amplifier nodes SA, SAB, and the local I/O lines LIO, LIOB, the resulting voltage developed in the bit line sense amplifier 142 is almost as large as the differential write data signal itself. At the same time, the signal developed from the selected memory cell is negligible, as most of this charge ends up on the very large capacitance of the global input line. That is, the global input line substantially "swallows" the signal otherwise developed from reading the selected memory cell.

On the other hand, the magnitude of such a write data signal should be limited in order to reduce the magnitude of unwanted coupling onto neighboring sense amplifier nodes SA, SAB that are not being written (and whose restore operation must not be disturbed) when the sense amplifier nodes and bit lines to be written are driven with the write data signal. As a point of reference, during a read cycle one bit line (of a selected bit line pair) is either brought up by about 100 mV when reading a "high" or brought down by about 100 mV when reading a "low", while the other bit line of the selected bit line pair remains substantially at the bit line equilibrate voltage. In other words, the maximum voltage perturbation of a given bit line which might disturb a neighbor is either +100 mV or −100 mV. The magnitude of the write data signal on each global input line GIN, GINB is preferably chosen to nominally be equal to the expected read signal from the memory cell, that is, 100 mV above or below the bit line equilibration voltage. Thus the write data signal coupled to the selected bit line sense amplifier and bit line pair, will not disturb a neighboring bit line sense amplifier more than a read cycle would disturb that neighbor.

One global input line is driven to 100 mV above the bit line equilibrate voltage, while the other global input line is driven to 100 mV below the bit line equilibrate voltage. As stated above, due to the much larger capacitance of the global input lines, the resulting voltage on the selected bit line sense amplifier nodes and likewise on the selected bit line pair is only slightly attenuated from these voltage levels. Consequently, although a differential signal of 200 mV is developed in the bit line sense amplifier (twice that developed in a read cycle), each sense amplifier node and each bit line is driven by only 100 mV, which is no worse than the perturbation to a neighbor during a read cycle.

Because of this timing, a small differential voltage representing the write data is actually driven into the sense amplifier before sensing. As stated above, the magnitude of this small differential voltage may be preferably chosen to be comparable to, but somewhat larger than, the expected signal otherwise developed during reading. The sense amplifier 142 then latches the write data when strobed, rather than latching the read data from the memory cell. This technique has several significant advantages. First, as mentioned above, it does not disturb the neighboring bit line sense amplifiers. Second, it is fast! The bit line sense amplifiers do not first sense "old" data and then overwrite it with new data, which would require significant additional time. Rather, they initially sense the data to be written. Third, the global input lines only move +/−100 mV during each write cycle. Since there is a 36-bit wide data path and each global input line has over 1 pF of capacitance, considerable power is saved by only moving these wires by 100 mV. Fourth, since the bit line sense amplifier itself restores the levels onto the bit lines, the write levels into a memory cell are substantially identical to the restored level achieved after a read or refresh cycle. This is particularly advantageous in ensuring the high level during write matches the high level during read (which is extremely beneficial for reducing functional test times). Moreover, a uniform written high level is achieved, particularly when not writing all the way to VDD, irrespective of how many bits are written in a given cycle (because of the byte write capability). A fifth advantage is found in the lack of any requirement that the write circuits must over-power a latched A sense amplifier. If required, such circuits would be physically larger and consume even more power, and would require a write path other than the simple NMOS-only column select transistors, which alone could not drive the sense amplifier nodes all the way up the write restore level.

The sense amplifier latches either the data read from a selected memory cell, or data to be written to the selected memory cell. The sense amplifier is then responsible for restoring the proper high and low levels onto the complementary bit lines, and consequently into the selected memory cell. The selected word line WL is driven in an active cycle to an internally regulated VPP voltage which, for nominal power supply voltage, is above the VDD level. In other words, for nominal power supply values, the selected word line is boosted above VDD in order to reduce the effective resistance of the access transistor 146, thereby restoring a high level into the selected memory cell 150 in less time. For most process corners (especially aggravated by high threshold, low VDD, and cold temperature), the boosted word line level also overcomes the potential loss of the access transistor threshold voltage which would otherwise limit the high level which may be written into memory cell 150.

For much the same reasons as for the word line, the array select transistors 164, 166 could also limit either the ultimate voltage level or at least impact the delay of restoring a high level onto the appropriate true or complement bit line. Consequently, the array select signal ASD is also boosted to the VPP level during the restore portion of the active cycle. The array select signal ASD is biased at VDD between active cycles, as are all the other array select signals. Then, at the start of an active cycle, the array select signals on the deselected side of the selected sense amplifiers (e.g., array select signal ASU) are quickly brought to ground, and the array select signals on the selected side of the two rows of selected sense amplifiers (e.g., array select signal ASD) are boosted from VDD to VPP to more quickly allow passage of the read signal from the selected memory cell developing on the various bit lines onto the respective internal sense amplifier nodes SA, SAB, and then to much more quickly allow passage of the "latched signal" developing on the sense amplifier nodes during sensing (particularly a high-going restore level) back onto the respective bit lines.

In the exemplary embodiment shown, the bit line equilibrate voltage is approximately 1.0 volt, and the written/ restored high level is approximately 2.0 volts (which is described in additional detail below). Even at a low VDD of 2.1 volts, a VDD level on the "selected" array select signal is most likely sufficient to couple the true and complement bit line voltages, as the approximately 100 mV differential signal develops from reading a selected memory cell, onto the true and complement sense amplifier nodes SA, SAB. But such a 2.1 volt level on the gates of array select transistors 164, 166 would, for this example, limit the level developed of the high-going bit line, when the sense amplifier drives the high-going sense amplifier node to 2.0 volts. Consequently, during the time signal is developing on the bit lines and into the sense amplifier, the "selected" array select signal is boosted to the VPP level (nominally 4.0 volts) by circuitry which need not be particularly fast, as long as the voltage on the array select signal is driven to VPP fairly early in the sensing process.

The memory cell plate voltage PLATE (node 152) is generated by a sample-and-hold amplifier 196 to match the bit line equilibration voltage, which is sampled during the precharge pulse (of signal SAEQ_PULSE) by transistor 194 onto capacitor 195.

Figure 4B:
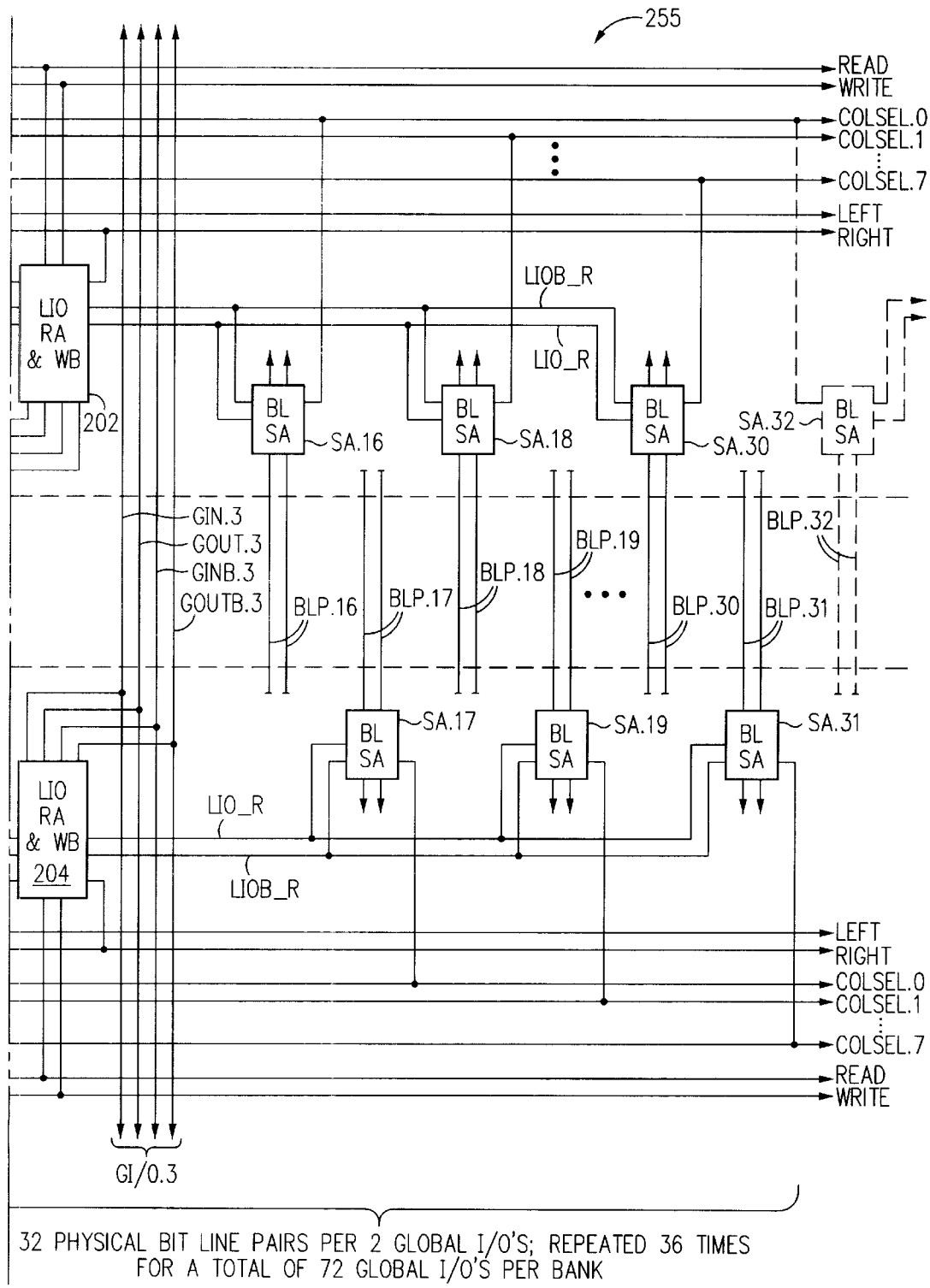
FIG. 4 consisting of FIGS. 4A and 4B, is a detailed block diagram of an array block and the supporting circuitry located above and below the array block, and particularly the connection to the global I/O lines.

Referring now to FIG. 4, an arrangement of local I/O lines is described which shows a pair of local I/O lines which are "broken" in the middle (to reduce capacitance), thus forming a left complementary local I/O pair and a right complementary local I/O pair. The left and right local I/O line pairs are then connected to share a single local I/O read amplifier/ write block 202. Thirty-two physical bit line pairs from a portion of, for example, array block ARRAY.2 are shown. As was previously described in relation to FIG. 2, half of the bit line pairs are connected to bit line sense amplifiers (indicated as BLSA) located in the hole HOLE.1.2 above the array block ARRAY.2, while the other half of the bit line pairs are connected to bit line sense amplifiers located in the hole HOLE.2.3 below the array block ARRAY.2. This circuitry may be horizontally repeated 36 times across each memory bank.

Of the sixteen physical bit line pairs on the left side of FIG. 4 (indicated as BLP.0, BLP.1, BLP.2, . . . BLP.15), the eight even-numbered bit line pairs BLP.0, BLP.2, . . . BLP.14 are connected to respective bit line sense amplifiers SA.0, SA.2, . . . SA.14 at the top of the array block ARRAY.2 (i.e., within the hole HOLE.1.2). Each of these eight even-numbered bit line sense amplifiers is then connected to a corresponding left-hand pair of local I/O lines LIO_L, LIOB_L. Of the sixteen physical bit line pairs on the right side of FIG. 4 (indicated as BLP.16, BLP.17, BLP.18 . . . BLP.31), the eight even-numbered bit line pairs BLP.16, BLP.18, . . . BLP.30 are connected to respective bit line sense amplifiers SA.16, SA.18, . . . SA.30 at the top of the array block ARRAY.2. Each of these eight even-numbered bit line sense amplifiers is then connected to a corresponding right-hand pair of local I/O lines LIO_R, LIOB_R.

Both the left local I/O pair LIO_L, LIOB_L and the right local I/O pair LIO_R, LIOB_R are brought to a local I/O read amplifier and write block 202, which is selectable during an active cycle to couple either the left or the right local I/O pair to an associated set of global I/O lines (e.g., "global I/O lines GI/O.2," which includes a differential global input pair GIN.2, GINB.2, and a differential global output pair GOUT.2, GOUTB.2). Note that the complementary global output lines GOUT.2 and GOUTB.2 are not routed adjacent to each other, but are instead separated by one of the global input lines (e.g., GINB.2). This significantly reduces the coupling capacitance between the true and complement global output lines GOUT.2 and GOUTB.2, and since the global input lines GIN.2, GINB.2 are not moving (i.e., they are "quiet") when the read signal is developing on the global output lines, the delay in the read path is reduced.

A group of eight pre-decoded column select lines COLSEL.X runs through each hole (e.g., hole HOLE.1.2, HOLE.2.3, etc.). For ease of introduction, assume a group of two pre-decoded left/right select lines LEFT, RIGHT also runs through each hole as shown in FIG. 4 for hole HOLE.1.2 and hole HOLE.2.3. During an active cycle, one of the eight bit line sense amplifiers connected to the left local I/O pair LIO_L. LIOB_L is selected by the active one of the eight pre-decoded column select lines COLSEL.X in accordance with a portion of the column address of the given active cycle. Likewise, one of the eight bit line sense amplifiers connected to the right local I/O pair LIO_R. LIOB_R is also selected by the same active one of the eight pre-decoded column select lines COLSEL.X. The active LEFT or RIGHT select line (which is also derived from a portion of the column address of the given active cycle) then steers the local I/O read amplifier and write block 202 appropriately to either the left local I/O pair LIO_L, LIOB_L or the right local I/O pair LIO_R, LIOB_R. The local I/O read amplifier and write block 202 buffers the signal from the selected local I/O pair onto the associated global output pair GOUT.2, GOUTB.2 (when enabled during a read cycle by a READ signal routed through the hole HOLE.1.2), or drives the data signal from the associated global input pair GIN.2, GINB.2 onto the selected local I/O pair (when enabled during a write cycle by a WRITE signal also routed through the hole HOLE.1.2).

In a similar fashion, the eight odd-numbered bit line pairs BLP.1, BLP.3, . . . BLP.15 on the left side of FIG. 4 are connected to respective bit line sense amplifiers SA.1, SA.3, . . . SA.15 in hole HOLE.2.3 below the array block ARRAY.2. Each of these eight odd-numbered bit line sense amplifiers is then connected to a corresponding left-hand pair of local I/O lines LIO_L, LIOB_L. Of the sixteen physical bit line pairs on the right side of FIG. 4 (indicated as BLP.16, BLP.17, BLP.18 . . . BLP.31), the eight odd-numbered bit line pairs BLP.17, BLP.19, . . . BLP.31 are connected to respective bit line sense amplifiers SA.17, SA.19, . . . SA.31 at the bottom of the array block ARRAY.2. Each of these eight odd-numbered bit line sense amplifiers is then connected to a corresponding right-hand pair of local I/O lines LIO_R LIOB_R.

Both the left local I/O pair LIO_L, LIOB_L and the right local I/O pair LIO_R, LIOB_R are brought to a local I/O read amplifier and write block 204, which is selectable during an active cycle to couple either the left or the right local I/O pair to an associated odd-numbered global I/O line, in this case, global I/O line GI/O.3 (which includes a differential global input pair GIN.3, GINB.3, interspersed with a differential global output pair GOUT.3, GOUTB.3).

As stated above, a group of eight pre-decoded column select lines COLSEL.X (individually identified as COLSEL.0, COLSEL.1, . . . COLSEL.7) also runs through hole HOLE.2.3. For ease of description, again assume a group of two pre-decoded left/right select lines LEFT, RIGHT also runs through hole HOLE.2.3, as shown in FIG. 4. During an active cycle, one of the eight odd-numbered bit line sense amplifiers connected to the left local I/O pair LIO_L. LIOB_L is selected by the active one of the eight pre-decoded column select lines COLSEL.X in accordance with a portion of the column address of the given active cycle. Likewise, one of the eight odd-numbered bit line sense amplifiers connected to the right local I/O pair LIO_R, LIOB_R is also selected by the same active one of the eight pre-decoded column select lines COLSEL.X. The active LEFT or RIGHT select line (which is also derived from a portion of the column address of the given active cycle) then steers the local I/O read amplifier and write block 204 appropriately to either the left local I/O pair LIO_L, LIOB_L or the right local I/O pair LIO_R, LIOB_R. The local I/O read amplifier and write block 204 buffers the signal from the selected local I/O pair onto the associated global output pair GOUT.3, GOUTB.3 (when enabled during a read cycle by a READ signal routed through the hole HOLE.2.3), or drives the data signal from the associated global input pair GIN.3, GINB.3 onto the selected local I/O pair (when enabled during a write cycle by a WRITE signal also routed through the hole HOLE.2.3). Note that in a single-word (36-bit) read or write cycle, the column select and read or write signals in either hole HOLE.1.2 or those in HOLE.2.3 are enabled, based upon the LSB of the entire address field. For a 72-bit double-word read or write cycle, these signals are enabled in both the holes HOLE.1.2 and HOLE.2.3.

A specific example of an active read cycle may be useful to reinforce the details of this organization. Assume the selected word line (not shown in FIG. 4) falls within array block ARRAY.2 (meaning that array decode addresses are decoded to select the array block ARRAY.2, and that row decode addresses are decoded to select a word line within array block ARRAY.2 as the active word line). Further assume that column decode addresses are decoded such that column select line COLSEL.1 and the left/right select line LEFT in hole HOLE.1.2 are both active. As a result, bit line sense amplifier SA.2 is selected by column select line COLSEL.1 and the signal developed by the selected memory cell on the bit line pair BLP.2 (and subsequently amplified by bit line sense amplifier SA.2) is coupled onto the left local I/O lines LIO_L, LIOB_L within hole HOLE.1.2. At the same time, bit line sense amplifier SA.18 is also selected by column select line COLSEL.1 and the signal developed by the selected memory cell on the bit line pair BLP.18 (and also subsequently amplified by bit line sense amplifier SA.18) is coupled onto the right local I/O lines LIO_R, LIOB_R within hole HOLE.1.2. Within the local I/O read amplifier and write block 202, the left local I/O lines LIO_L, LIOB L are selected (by the active select line LEFT) and coupled to the input of a read amplifier, and the corresponding read signal developed on the selected local I/O lines is buffered and driven onto the associated even-numbered global output lines GOUT.2, GOUTB.2. The non-selected right local I/O lines LIO_R, LIOB_R are de-coupled from the read amplifier (and thus de-coupled from the global output lines) and are also de-coupled from the global input lines when the left local I/O lines are selected.

At the same time during this exemplary (72-bit double-word) read cycle, odd-numbered bit line sense amplifier SA.3 is also selected by column select line COLSEL.1 and the signal developed by the selected memory cell on the bit line pair BLP.3 (and subsequently amplified by bit line sense amplifier SA.3) is coupled onto the left local I/O lines LIO_L, LIOB_L within hole HOLE.2.3. Bit line sense amplifier SA.19 is also selected by column select line COLSEL.1 and the signal developed by the selected memory cell on the bit line pair BLP.19 (and subsequently amplified by bit line sense amplifier SA.19) is coupled onto the right local I/O lines LIO_R, LIOB_R within hole HOLE.2.3. Within the local I/O read amplifier and write block 204, the left local I/O lines LIO_L, LIOB_L are selected by the active select line LEFT, and the corresponding read signal developed on the selected local I/O lines is buffered and driven onto the associated odd-numbered global output lines GOUT.3, GOUTB.3. As before, the non-selected right local I/O lines LIO_R, LIOB_R are de-coupled from the read amplifier (and thus de-coupled from the global output lines) and are also de-coupled from the global input lines when the left local I/O lines are selected.

As described above, during an active cycle when the selected row falls within array block ARRAY.2, bit line sense amplifiers are active in the holes immediately above and below the selected array block ARRAY.2, namely, within holes HOLE.1.2 and HOLE.2.3. For a single-word read or write operation, the local I/O lines, column select lines, etc. are active in either the hole HOLE.1.2 immediately above, or in hole HOLE.2.3 immediately below, the selected array block ARRAY.2. Alternatively, for a double-word read or write operation, the local I/O lines, column select lines, etc. are active in both these holes HOLE.1.2 and HOLE.2.3.

For ease of description, during such an active cycle both holes HOLE.1.2 and HOLE.2.3 may be considered to be "selected" and all other holes (e.g., holes HOLE.0, HOLE.0.1, HOLE.3.4, HOLE.4.5, . . . HOLE.15) are considered "deselected" or "non-selected." Consequently, the pre-decoded column select lines COLSEL.X and the pre-decoded left/right select lines LEFT and RIGHT in the two selected holes above and/or below the selected array block are active. All other column select lines and left/right select lines within non-selected holes of the array remain inactive to ensure only one local I/O sense amplifier block per global I/O is active, and to conserve power.

As can be appreciated from FIG. 4, a selected one of sixteen even-numbered bit line pairs is coupled to an even-numbered global I/O line, while a selected one of sixteen odd-numbered bit line pairs is coupled to an odd-numbered global I/O line. To illustrate the lateral repetition of this array block layout, an adjacent physical bit line pair BLP.32 is shown on the right side of FIG. 4 which is coupled to a neighboring left local I/O pair, and which ultimately is coupled to the adjacent global I/O line (e.g., GIN.4, GINB.4, GOUT.4, GOUTB.4, not shown).

Figure 5:
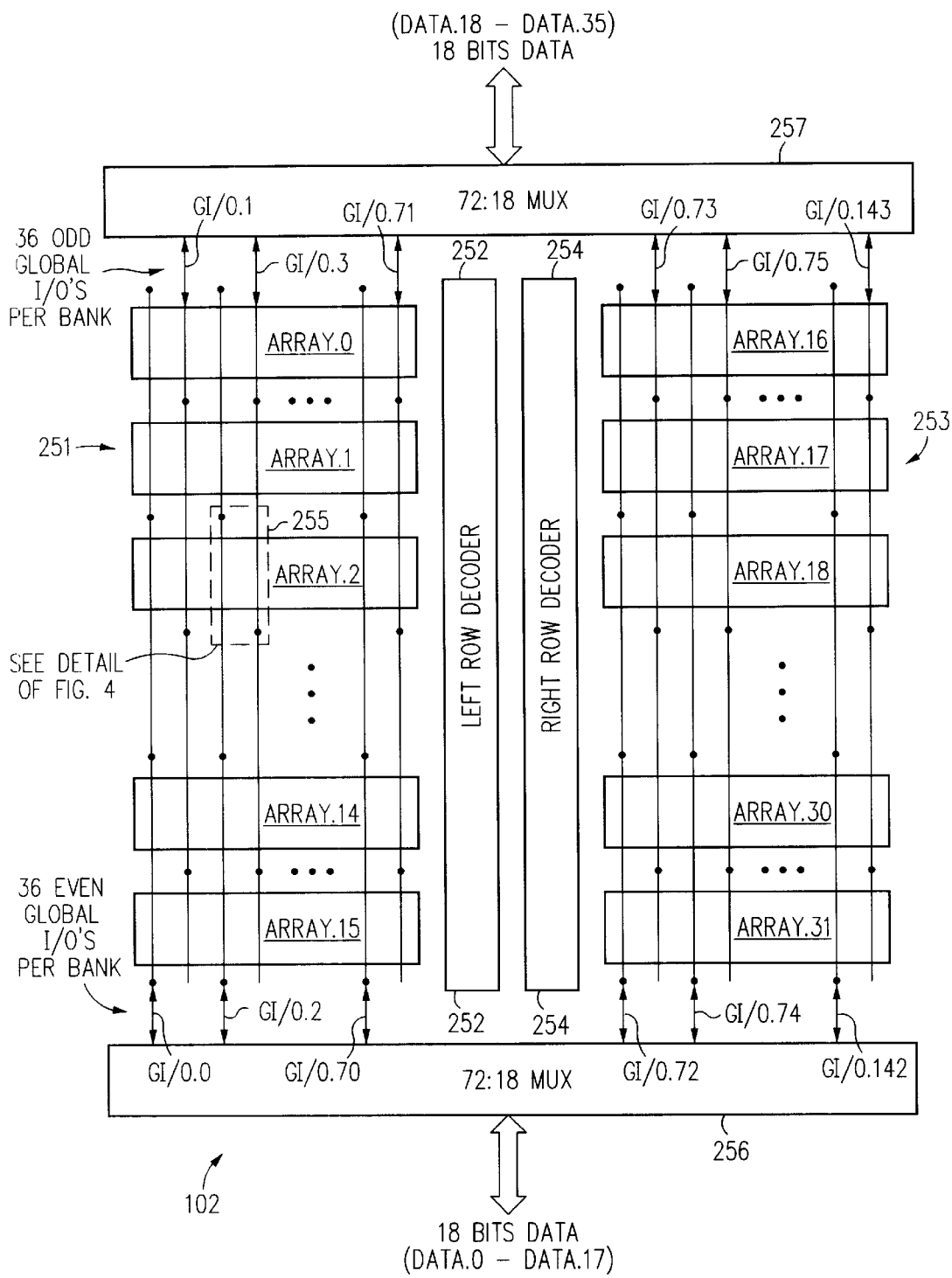
FIG. 5 is a block diagram of the memory array, and particularly illustrating the alternating connections of the global I/O lines to the data path multiplexer circuits located at the top and bottom of the memory array.

The general structure shown in FIG. 4 is repeated both horizontally and vertically to form the array 102 first introduced in FIG. 1 and described in additional detail in FIG. 2. Referring now to FIG. 5, an organization is shown which includes two array banks 251, 253, each respectively served by a corresponding independent row decoder 252, 254. Within the left bank 251, the structure shown in FIG. 4 is repeated horizontally 36 times (not including redundant elements), for a total of 72 global I/O lines within the left bank 251. The 36 even-numbered global I/O lines (e.g., GI/O.0, GI/O.2, . . . .GI/O.70) are brought out at the bottom of the array bank 251, while the 36 odd-numbered global I/O lines (e.g., GI/O.1, GI/O.3, . . . GI/O.71) essentially "stop" at the bottom of the array bank 251 (other than a "far end" equilibration circuit described in detail below). Conversely, the 36 odd-numbered global I/O lines GI/O.1, GI/O.3, . . . GI/O.71 are brought out at the top of the array bank 251, while the 36 even-numbered global I/O lines GI/O.2, . . . GI/O.70 essentially "stop" at the top of the array bank 251 (again, other than a "far end" equilibration circuit described in detail below). As previously stated above, a given "global I/O line GI/O.X" is a short-hand notation for a group of four physical wires which include a differential global input pair GIN.X, GINB.X and a differential global output pair GOUT.X, GOUTB.X). Within the left bank 251, there are 16 different array blocks ARRAY.0, ARRAY.1, . . . ARRAY.15, each array block having 256 word lines (for this exemplary embodiment). The alternating nature of the global I/O connections within each hole is indicated by a connecting "dot" in FIG. 5. In particular, one instance of the structure shown in FIG. 4 is indicated in FIG. 5 by the dashed outline of block 255. Of the two global I/O lines passing through block 255, the left-hand global I/O line (e.g., GI/O.2) is connected to left and right pairs of local I/O lines located above the array block ARRAY.2 within hole HOLE.1.2, while the right-hand global I/O line (e.g., GI/O.3) is connected to left and right pairs of local I/O lines located below the array block ARRAY.2 within hole HOLE.2.3.

Within the right bank 253, the structure shown in FIG. 4 is also repeated horizontally 36 times, for a total of 72 global I/O lines within the right bank 253. The 36 even-numbered global I/O lines (e.g., GI/O.72, GI/O.74, . . . GI/O.142) are brought out at the bottom of the array bank 253, while the 36 odd-numbered global I/O lines (e.g., GI/O.73, GI/O.75, . . . GI/O.143) essentially "stop" at the bottom of the array bank 253 (other than a "far end" equilibration circuit described in detail below). Conversely, the 36 odd-numbered global I/O lines GI/O.73, GI/O.75, . . . GI/O.143 are brought out at the top of the array bank 253, while the 36 even-numbered global I/O lines GI/O.72, GI/O.74, . . . GI/O.142 essentially "stop" at the top of the array bank 253 (again, other than a "far end" equilibration circuit described in detail below). Within the right bank 253, there are 16 different array blocks ARRAY.16, ARRAY.17, . . . ARRAY.31, each having 256 word lines (for this exemplary embodiment).

At the bottom of both array banks 251, 253, a multiplexer 256 provides a 72-to-18 data selection path for selecting 18 bits of data from the 72 even-numbered global I/O lines at the bottom of the array 102, which are then connected to appropriate data I/O circuitry (not shown in FIG. 4) which is described in detail below. Similarly, at the top of both array banks 251, 253, a second multiplexer 257 provides a 72-to-18 data selection path for selecting 18 bits of data from the 72 odd-numbered global I/O lines at the top of the array 102, which are also then connected to similar data I/O circuitry (not shown in FIG. 4). Consequently, the memory array 102 provides a 36-bit data path. Half of the data bits (e.g., data bits DATA.0, DATA.1, . . . DATA.17) are available at the bottom of the array 102, while the other half of the data bits (e.g., data bits DATA.18, DATA.19, . . . DATA.35) are available at the top of the memory array 102.

Each of the multiplexers 256, 257 is arranged to select all of its respective eighteen bits of data entirely from either the left bank 251 or the right bank 253. Consequently, all 36 bits of data are available from either the left bank 251 or the right bank 253. Because a separate row decoder is associated with each bank, an active cycle may be performed and yet only activate one bank of the memory array 102. In other words, a selected word line may be driven high in one of the banks as part of performing an active cycle, while the other bank remains inactive with no word line driven. Alternatively, because each of the row decoders 252, 254 has a row address bus independent of the other (not yet shown in FIG. 5), each row decoder may be supplied with a different row address. Thus, the two banks may both proceed with independent active cycles. For example, a read cycle may proceed in the left bank 251 in response to an externally requested cycle using externally-supplied address information, while an internal refresh cycle is performed in the right bank 253 using internally generated address information.

Figure 6:
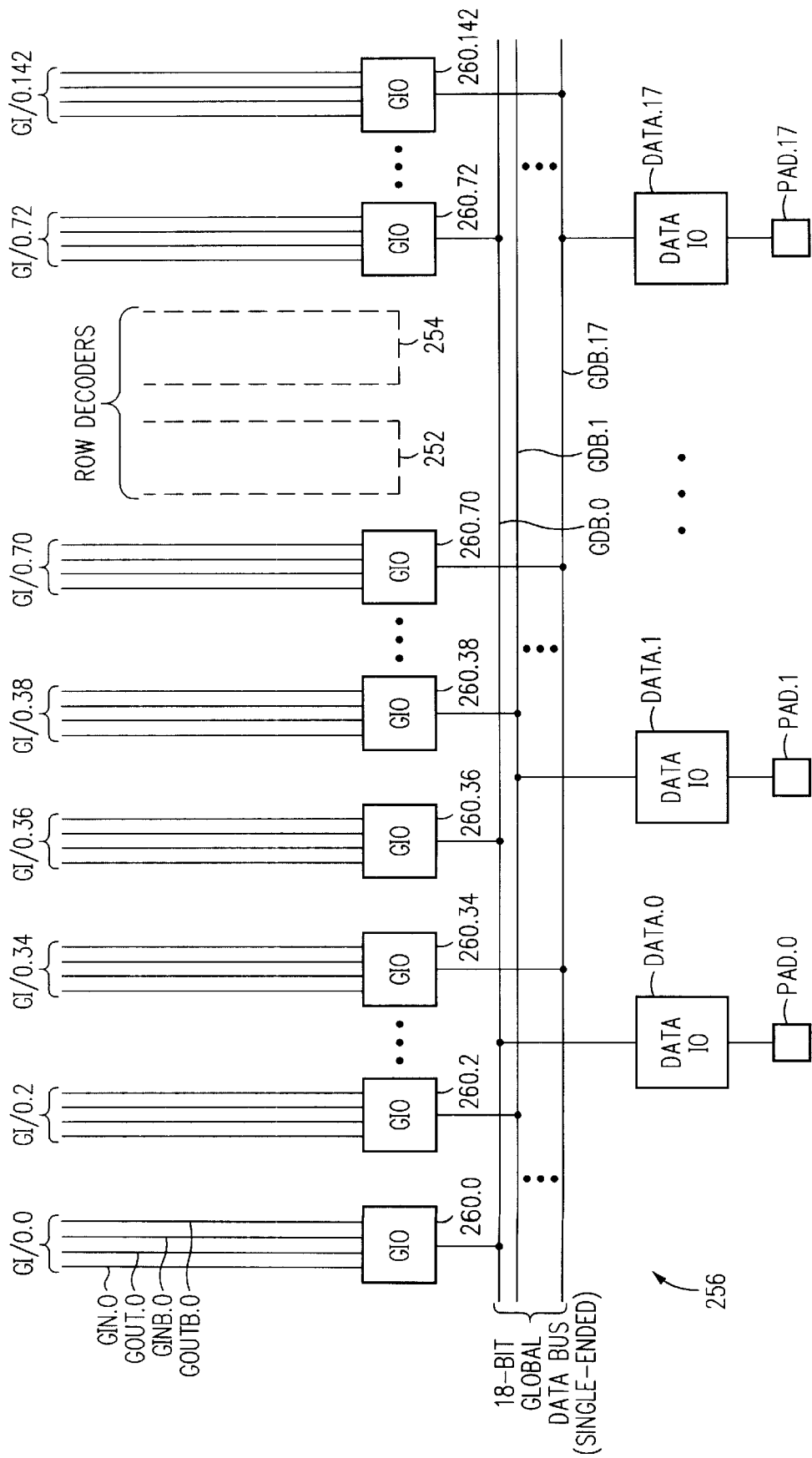
FIG. 6 is a block diagram illustrating the connection of every other global I/O line to the data path multiplexer circuit located at the bottom of the memory array, and particularly illustrating the connection mapping, for one embodiment, of each global I/O line to the respective bit within the global data bus.

FIG. 6 illustrates an embodiment of the multiplexer 256. An 18-bit bi-directional global data bus GDB.0, GDB.1, . . . GDB.17 is arranged to horizontally run substantially across the width of the memory array 102 (i.e., across the bottom of both the left array bank 251 and the right array bank 253). To save layout area, each bit of this global data bus may be implemented as a single-ended bus (each bit of data being conveyed on a single wire) with a "rail-to-rail" data signal driven thereupon. To save power consumption, there are no load devices on the global data bus: each bus line is briefly either driven high to VDD or low to VSS and then left dynamically floating and available to be sensed by a receiving circuit. To save further power, no reset or equilibrate is used on the global data bus lines. Rather, each bit of the global data bus is driven to the next data state or left at the previous data state as required. A small, easily over-powered latch may be added to each bit of the global data bus to maintain the state indefinitely until driven to the other state.

Each of the 36 even-numbered global I/O lines (GI/O.0, GI/O.2, . . . GI/O.70) from the left array bank 251 is coupled to a respective global I/O block (260.0, 260.2, . . . 260.70). The left-most 18 of these global I/O blocks (260.0, 260.2, . . . 260.34) are connected respectively to a corresponding bit of the global data bus GDB.0, GDB.1, . . . GDB.17. The right-most 18 of these global I/O blocks (260.36, 260.38, . . . 260.70) are also connected respectively to the corresponding bit of the global data bus (GDB.0, GDB.1, . . . GDB.17).

Similarly, each of the 36 even-numbered global I/O lines (GI/O.72, GI/O.74 (not shown), ... GI/O.142) from the right array bank 253 is coupled to a respective global I/O block (260.72, 260.74 (not shown), ... 260.142). The left-most 18 of these global I/O blocks (260.72, 260.74, ... 260.106 (not shown)) are connected respectively to a corresponding bit of the global data bus GDB.0, GDB.1, ... GDB.17. The right-most 18 of these global I/O blocks (260.108 (not shown), 260.110 (not shown), ... 260.142) are also connected respectively to the corresponding bit of the global data bus (GDB.0, GDB.1, ... GDB.17). Each of the global data bus lines (GDB.0, GDB, ... GDB.17) is connected to a corresponding data I/O circuit (DATA.0, DATA.1, ... DATA.17), which are each in turn connected to a corresponding data I/O pad (PAD.0, PAD.1, ... PAD.17).

The organization of the multiplexer 256 described above "spreads out" or spatially interdigitates 18 different 4:1 multiplexers across the bottom of the array 102. For example, the four different global I/O lines that potentially are connectable to bit 1 of the global data bus (i.e., GDB.1) are GI/O.2, GI/O.38, GI/O.74 (not shown), and GI/O.110 (not shown). Such a spatial distribution requires, of course, each of the global data bus lines to traverse a greater length across the chip than if the set of four global I/O lines connectable to a given global data bus line were more localized. Nonetheless, at least two key advantages result from this arrangement shown in FIG. 6. First, each bit of the 18 bits of data may be read from or stored into either the left array bank 251 or the right array bank 253. This is one of the necessary architectural requirements for a full 36-bit read or write cycle which activates only the left array bank or the right array bank, but not necessarily both array banks. Secondly, this multiplexer arrangement ensures that the global I/O lines corresponding to each 9-bit byte within the 36-bit data word are physically adjacent to each other. For example, the 9-bit byte conveyed on data I/O pads PAD.0, PAD.1, ... PAD.8 is respectively coupled (for a given address) to the nine even-numbered global I/O lines GI/O.0, GI/O.2, ... GI/O.16, which communicate with nine laterally adjacent read amplifier and write blocks 202 within the selected hole of the memory array. As is described in greater detail below, this adjacency may facilitate implementation of a byte write capability where one or more 9-bit bytes within a 36-bit data word are individually selectable to be written, while leaving the remaining bits within the 36-bit data word undisturbed.

Having introduced at the block diagram level the organizational details of the local and global I/O lines, several individual circuits are now described. Referring again to FIG. 3, a bit line sense amplifier was described which is selectable to service two pairs of bit lines: one above and the other below the bit line sense amplifier. FIG. 4 illustrates several of these bit line sense amplifiers, each of which is connectable to a respective bit line pair within array block ARRAY.2, and connectable to a second respective bit line pair within either array block ARRAY.1 or ARRAY.3. The portion of circuitry indicated in FIG. 4 by a dashed block labeled 250 is illustrated by the schematic shown in FIG. 7. This detailed bit line sense amplifier schematic is substantially identical to that described in FIG. 3 and indeed, where identical, uses the same element numbering. But FIG. 7 shows a few additional details and shows control signals which were omitted from FIG. 4 in order to more easily illustrate the organization of local I/O lines and global I/O lines.

Figure 7:
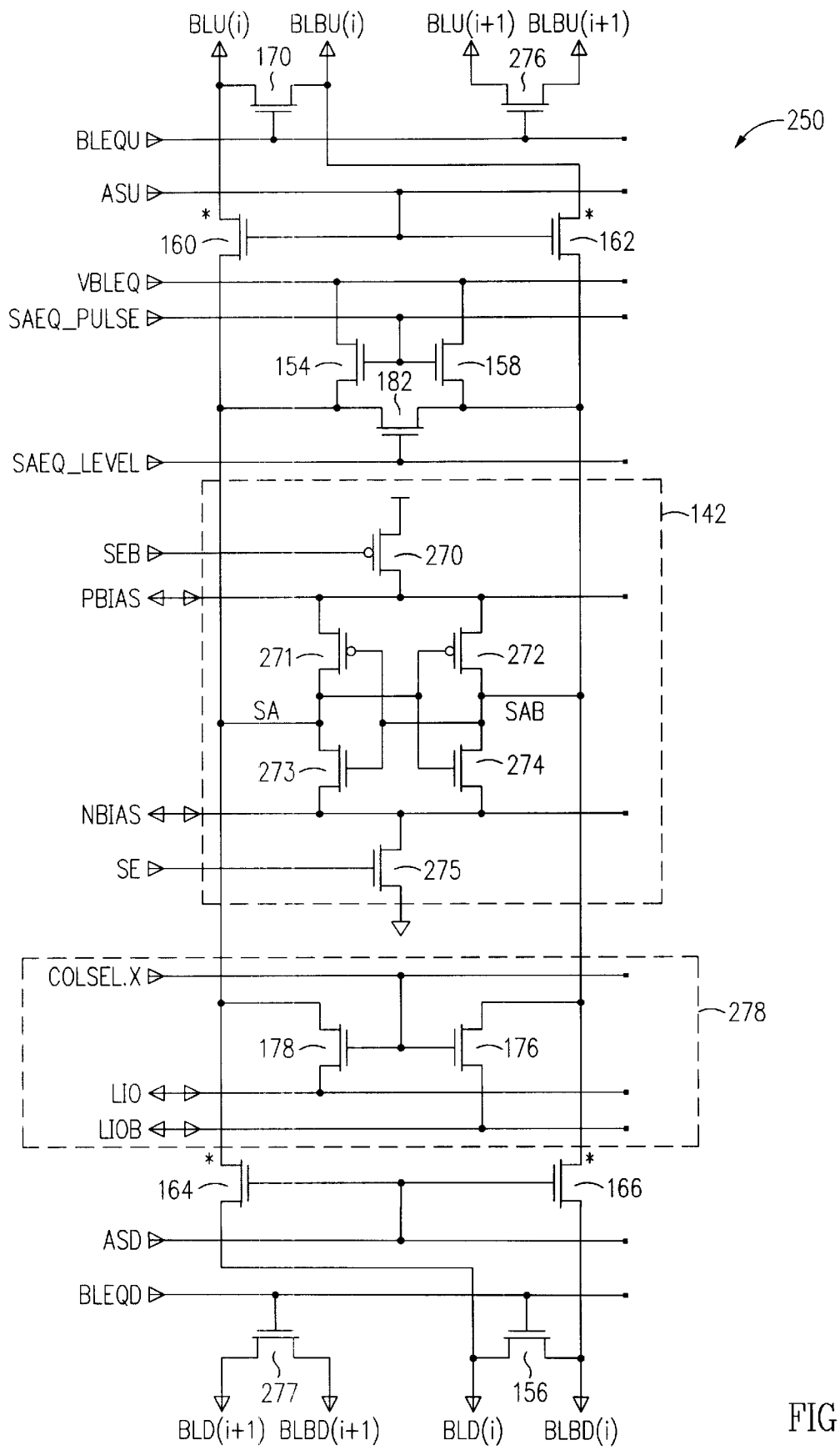
FIG. 7 is a schematic diagram of an embodiment of the sense amplifier circuitry and arrangement shown previously in FIG. 4.

Referring now to FIG. 7, the earlier-described sense amplifier 142 includes a pair of cross-coupled N-channel transistors 273, 274 whose common source terminals are driven toward ground by N-channel transistor 275 when enabled by a high voltage on the strobe enable signal SE coupled to its gate terminal. This common source node, NBIAS, is common to many adjacent bit line sense amplifiers. Consequently, NMOS transistor 275 is actually a large distributed transistor pulling node NBIAS low for many bit line sense amplifiers.

The sense amplifier 142 further includes a pair of cross-coupled P-channel transistors 271, 272 whose common source terminals are driven toward VDD by P-channel transistor 270 when enabled by a low voltage on the complementary strobe enable signal SEB (i.e., "strobe enable bar") coupled to its gate terminal. This common source node, PBIAS, is common to many adjacent bit line sense amplifiers. Consequently, PMOS transistor 270 is actually a large distributed transistor pulling node PBIAS high for many bit line sense amplifiers.

The internal sense amplifier nodes SA, SAB are equilibrated to each other by N-channel transistor 182 which is gated by the sense amplifier equilibrate signal SAEQ_LEVEL which remains high until the next active cycle begins in which sense amplifier 142 is selected. A common bit line equilibrate node VBLEQ is equilibrated to the internal sense amplifier nodes SA, SAB by transistors 154, 158 which are gated by a self-timed pulsed sense amplifier equilibrate signal SAEQ_PULSE, to establish the bit line equilibration voltage of the collective high capacitance of all the bit line pairs onto the relatively low capacitance of the common bit line equilibrate node VBLEQ, as described earlier.

The cross-coupled CMOS sense amplifier 142 is multiplexed to sense either a bit line pair within the array block located above the sense amplifier 142, or to sense a bit line pair within the array block located below the sense amplifier 142. To select the upper bit line pair BLU(i), BLBU(i), the upper array select signal ASU is left logically high and driven to VPP while the lower array select signal ASD is quickly brought low. Array select transistors 160, 162 remain on and couple the upper bit line pair BLU(i), BLBU(i) to respective sense amplifier nodes SA, SAB while array select transistors 164, 166 are turned off to isolate the sense amplifier nodes SA, SAB from the lower bit line pair BLD(i), BLBD(i). Conversely, to select the lower bit line pair BLD(i), BLBD(i), the lower array select signal ASD is left logically high and driven to VPP while the upper array select signal ASU is quickly brought low to isolate the unselected bit line pair within the upper array block from the sense amplifier internal nodes SA, SAB. Since these array select signals which remain logically high (to gate the selected bit lines to the respective sense amplifier) are preferably "boosted" to a voltage above the VDD level, the array select transistors 160, 162, 164, 166 are preferably fabricated using a high voltage transistor structure if one is available in the semiconductor process being used (and are so indicated by a "*" in the figure alongside each transistor).

The complementary bit lines BLD(i), BLBD(i) are equilibrated to each other by equilibration transistor 156 which is gated by a self-timed pulsed equilibrate signal BLEQD and which transistor is located at the "near end" of the bit line pair (next to the array select transistors 164, 166). Because the sense amplifier 142 restores one bit line to a low voltage level (i.e., ground) and the other bit line to a high voltage level (e.g., 2.0 volts), the bit lines when subsequently equilibrated establish a bit line equilibration voltage that is approximately one-half of the high write (i.e., restore) level. Each bit line pair BLD(i), BLBD(i) is also equilibrated at its "far end" (i.e., the end most distant from its sense amplifier) by an equilibrate transistor gated by a decoded self-timed pulsed equilibrate signal BLEQU running through the next row of sense amplifiers (not shown in FIG. 7). The pulsed equilibrate signals at each end of a given pair of bit lines are active (i.e., "pulsed") at the end of an active cycle only for the selected array block just completing its active cycle. The analogous pulsed equilibrate signals in the non-selected array blocks remain inactive (at VSS) without pulsing.

The other pair of complementary bit lines BLD(i+1), BLBD(i+1) which are laid out in the pitch of this sense amplifier block 250, and which are served by the sense amplifier in the next row of sense amplifiers below, are equilibrated to each other at their "far end" by equilibration transistor 277 which is also gated by the self-timed pulsed equilibrate signal BLEQD. The upper bit line pair BLU(i), BLBU(i) is similarly equilibrated by equilibration transistor 170 which is gated by a self-timed pulsed equilibrate signal BLEQU and which transistor is preferably located at the near end of the upper bit line pair BLU(i), BLBU(i) (next to the array select transistors 160, 162). The upper bit line pair BLU(i), BLBU(i) is also equilibrated at its far end by an equilibrate transistor (not shown) analogous to transistor 168 (see FIG. 3) which is also gated by a decoded equilibrate signal having the same timing as pulsed equilibrate signal BLEQU. Likewise, the other pair of complementary bit lines BLU(i+1), BLBD(i+1) which are laid out in the pitch of this sense amplifier block 250, and which are served by the sense amplifier in the next row of sense amplifiers above, are equilibrated to each other at their "far end" by equilibration transistor 276 which is also gated by the equilibrate signal BLEQU.

The column select transistors 176, 178 are as previously described relative to FIG. 3. A single pair of column select transistors is laid out within each sense amplifier block 250, as shown, whose gates may be connected to any one of the eight column select lines running horizontally through the sense amplifier layout cell. For example, each of eight adjacent sense amplifier blocks 250 would be respectively connected to a corresponding one of the eight column select lines (shown descriptively in FIG. 7 as COLSEL.X).

Figure 8:
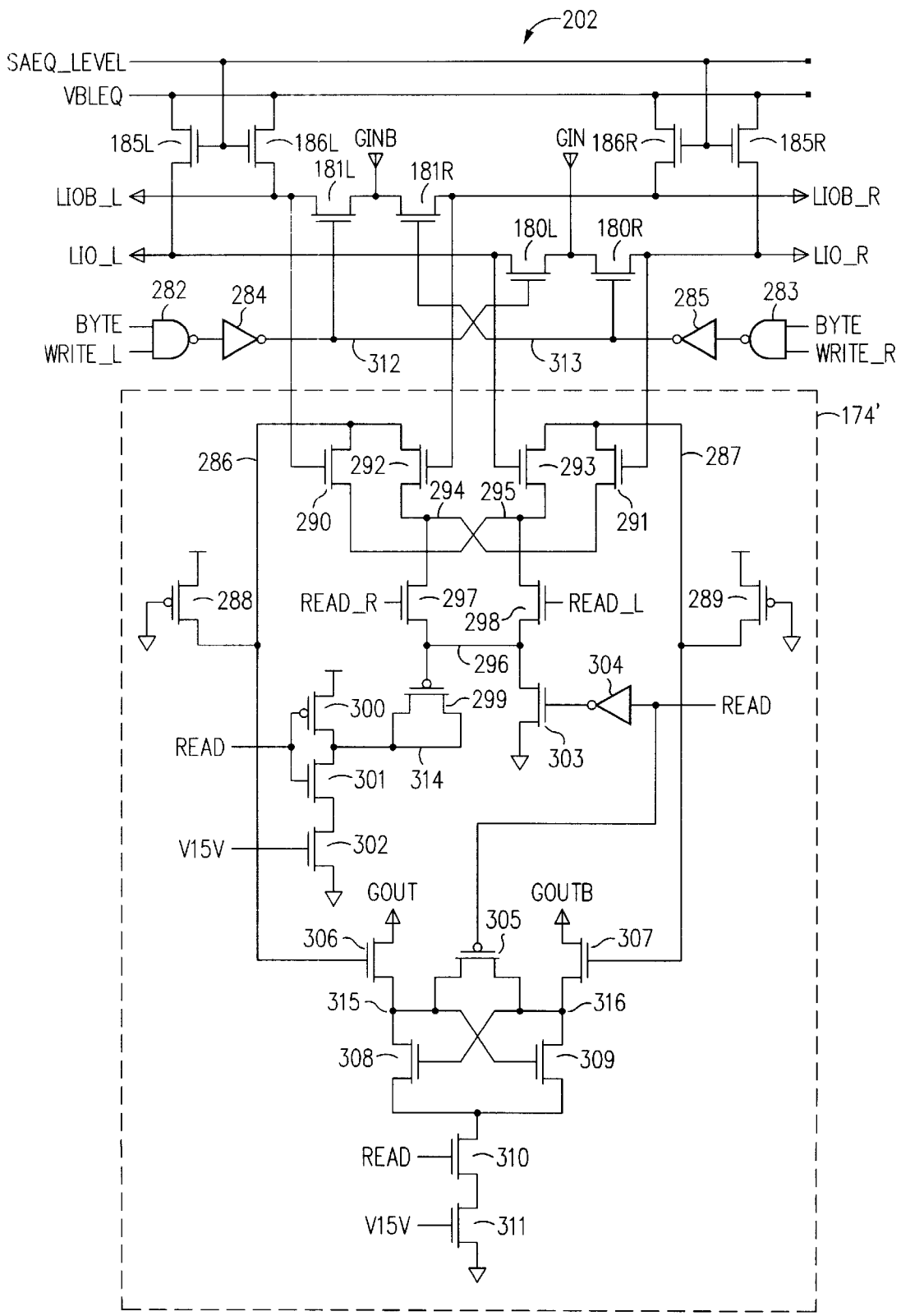
FIG. 8 is a schematic diagram of an embodiment of the local I/O to global I/O interface block shown previously in FIG. 4.

Referring briefly back to FIG. 4, sixteen sense amplifiers (such as the sense amplifier 250 described above) are coupled to and serviced by a single local I/O-to-global I/O interface block 202, which provides the interface to the associated global input lines GIN, GINB and global output lines GOUT, GOUTB. One embodiment of a suitable local I/O-to-global I/O interface block 202 is illustrated in FIG. 8. For read operations, the basic functions of this interface block 202 are to select one of the two pairs of local I/O lines (e.g., either the left local I/O pair LIO_L, LIOB_L or the right local I/O pair LIO_R, LIOB_R), amplify the signal on the selected local I/O pair (which are nominally biased at a common mode voltage of approximately 1.0 volts), and drive the amplified signal onto the associated global output lines GOUT, GOUTB (which are nominally biased at a common mode voltage near VDD). For write operation, the basic function of this interface block 202 is to steer the driven signal on the associated global input lines GIN, GINB (which is nominally a 200 mV differential signal at a common mode voltage of approximately 1.0 volts) onto the selected (left or right) local I/O pair (which are also nominally biased at the same common mode voltage).

A more complete description of the write operation of block 202 now follows. Two pairs of equilibrate transistors 185L, 186L and 185R, 186R are used to equilibrate the two respective pairs of local I/O lines LIO_L, LIOB_L and LIO_R, LIOB_R to the bit line equilibrate potential VBLEQ. These transistors are analogous to the single pair of equilibrate transistors 185, 186 first described in FIG. 3 for its single pair of local I/O lines. The sense amplifier equilibrate signal SAEQ_LEVEL is used for equilibrating the local I/Os and maintaining their equilibration between active cycles.

During a write operation, the signal previously driven onto the global input lines GIN, GINB is steered by either transistors 180L, 181L onto the left local I/O pair LIO_L, LIOB_L, or by transistors 180R, 181R onto the right local I/O pair LIO_R, LIOB_R. Both steering pairs remain inactive if the particular global input line corresponds to a bit within a byte of the external data word which is disabled for writing. Otherwise, only one such steering pair is active at any one time. For example, to write to the left local I/O pair, a decoded write signal WRITE_L is driven high slightly before the column select lines are decoded and driven so that node 312 is asserted high approximately at the same time as the column select line is asserted (i.e., well before bit line sensing). If the particular global input line corresponds to a bit within a byte of the external data word which is enabled for writing, then the byte write enable signal BYTE will have already been driven high (by the write queue, as is described in greater detail herebelow). As a result, control node 312 is driven high by the action of NAND gate 282 and inverter 284, and transistors 180L, 181L are turned on to drive the signal present on the global input lines GIN, GINB onto the left pair of local I/O lines LIO_L, LIOB_L. The asserted column select signal further steers this 200 mV differential write data signal onto the selected bit line sense amplifier internal nodes before sensing, and the asserted column select signal then turns off as bit line sensing begins. To write to the right local I/O pair, a decoded write signal WRITE_R is driven high instead, along with the byte write enable signal BYTE. As a result, control node 313 is driven high by the action of NAND gate 283 and inverter 285, and transistors 180R, 181R are turned on to drive the signal present on the global input lines GIN, GINB onto the right pair of local I/O lines LIO_R, LIOB_R.

For read operations, one of the two pairs of local I/O lines is selected and its signal is amplified by a two-stage amplifier 174' and driven onto the associated global output lines GOUT, GOUTB. Rather than using pass transistors as in the write case, the left/right selection for read is accomplished using a first stage amplifier having two differential input transistor pairs which are independently selectable by either a read left signal READ_L or a read right signal READ_R. Between active cycles, the output nodes 286, 287 of the first amplifier stage are precharged to VDD by P-channel transistors 288, 289. These precharge transistors do not need to be gated (i.e., they are always "on") because most such amplifiers 174' are inactive and no current flows therethrough. In the relatively few such amplifiers 174' which are selected (i.e., active) for a given active cycle, the current flows through only one of the transistors 288, 289 as a differential signal is developed on the first stage output nodes 286, 287, and the current flows for only a relatively short portion of the active cycle. Consequently, the extra complexity and power requirements of a decoded precharge signal is not necessary. Between active cycles, the decoded read signals READ_L, READ_R and the left/right non-decoded control signal READ are all low (inactive). Consequently, the output of inverter 304 is high, and transistor 303 holds node 296 at ground. Similarly, the output of inverter 300, 301 (i.e., node 314) is also high, and a VDD potential is developed across P-channel transistor 299, which is connected to function as a capacitor. In the second amplifier stage, equilibration transistor 305 is on to equilibrate the two cross-coupled nodes (the respective drains of transistors 308, 309) to a threshold below VDD, and to pull the common-source node (drain of transistor 310) to a voltage of VDD less two thresholds.

During an active read cycle, the READ signal (for the selected sense amplifiers) is driven high and the left/right decoded read signal READ_L or READ_R is also driven high, both at about the same time as the decoded one of the column select lines is driven high (e.g., well before bit line sensing). As an example, assume one of the eight sense amplifiers connected to the left local I/O line pair is to be read. When the READ signal is driven high, the precharge transistor 303 in the first stage turns off, as does the equilibrate transistor 305 in the second stage. Additionally, the inverter 300, 301 switches and begins to drive its output node 314 low. Transistor 302 receives on its gate terminal a DC bias voltage V15V having, for example, a nominal value of 1.5 volts. Consequently, an essentially constant current flows through this transistor 302 as long as it remains saturated (as long as its drain voltage exceeds its gate-to-source voltage less its threshold voltage). The inverter 300, 301, the constant current transistor 302, and the capacitor (transistor) 299 are employed to provide at node 296 what appears to be a constant current source connected to a negative voltage. (which, as described below, provides a "tail" current for the selected differential transistor pair).

Because the decoded signal READ_L is also driven high, transistor 298 is conductive and the differential pair formed by transistors 293 and 290 is enabled to amplify the signal present between their respective gates, namely LIO_L and LIOB_L, and to develop an output signal on the first stage output nodes 286, 287. The other differential pair formed by transistors 291, 292 remains off since READ_R remains low and transistor 297 remains off. To read the right pair of local I/O lines LIO_R, LIOB_R, the decoded signal READ_R is driven high while READ_L remains low. The "right" differential pair formed by transistors 291, 292 is enabled through transistor 297, and the "left" differential pair formed by transistors 290, 293 remains disabled.

As is well known in the art, a basic differential amplifier configuration is advantageously implemented using a constant current source in the "tail" of the differential pair. Frequently, such a constant current source is approximated by a single N-channel transistor with a DC bias voltage on its gate having a value which is less than the nominal common mode voltage of the two input signals connected to the gates of the differential pair. Such a configuration assumes that the current tail transistor remains saturated, which requires its drain voltage to exceed its gate voltage less a threshold. But in a traditional differential pair configuration, the drain voltage of the current tail transistor (assuming it's the same node as the common-source node of the differential pair) must be lower in voltage than the higher of the two input signals less a threshold voltage for any current to flow through either of the differential pair transistors. As a result, it is exceedingly difficult to use a traditional NMOS differential pair, having manufacturable threshold voltages, to sense a signal having a very low common-mode voltage which approaches the threshold voltage. In, the embodiment shown, the nominal equilibration voltage of the local I/O lines may be as low as 0.75 volts (although preferably it is around 1.0 volts, as described below). With N-channel transistor threshold voltages also in the range of 0.75, such as amplifier might not have any conductive paths, and therefore obviously could not be guaranteed to properly function.

To afford the capability of sensing signals having such a low common mode voltage, the inverter 300, 301, the constant current transistor 302, and the capacitor (transistor) 299 are employed to provide at node 296 what appears to be a constant current source connected to a negative voltage. When the READ signal is driven high, node 314 falls in voltage from VDD toward ground, and node 296 falls from ground to a negative voltage (since it was precharged to ground, but since transistor 303 is now off). As soon as the voltage on node 296 and on either node 294 or 295 (whichever is selected) are low enough for one side of the selected differential pair to start conducting, the voltage at node 296 is substantially clamped at that voltage. Since transistor 302 (and 301) provide a constant current to discharge node 314, the voltage of node 314 falls with a linear ramp. Since node 296 is essentially clamped to a constant voltage, the change in voltage across capacitor 299 is therefore linear with time. Consequently, the displacement current through capacitor 299 (i.e., the saturated current of transistor 302) drives 296 negatively by whatever voltage is required (with certain limitations, of course) for the sum of the currents of the differential pair to equal the current through transistor 302. The actual voltage resulting on node 296 depends on the transistor threshold voltage and the particular voltages present on the gates of the differential pair. For some operating conditions, this voltage may be above ground rather than below ground, but the "tail" current of the differential pair nonetheless remains equal to the saturated current of transistor 302.

The first stage amplifier, therefore, accomplishes the difficult task of sensing and amplifying a signal having a low common mode voltage, and developing an amplified signal on output nodes 286, 287 which are biased near VDD. Furthermore, it accomplishes this using relatively fast NMOS transistors rather than using slower PMOS transistors whose biasing would have been more straightforward. The second stage amplifier (transistors 305, 306, 307, 308, 309, 310, and 311) further amplifies the signal on its inputs (nodes 286, 287) and drives the amplified signal onto the global output lines GOUT, GOUTB. The amplifier is equilibrated when READ is low by transistor 305, which equilibrates the two internal circuit nodes 315, 316 (and which nodes are precharged to a threshold below VDD by transistors 306, 307 since the global output lines GOUT, GOUTB and nodes 286, 287 are all precharged to VDD). When READ is driven high, the equilibrate transistor 305 turns off and the current source transistor 311 is coupled through transistor 310 to provide a constant current to the non-latching cross-coupled transistors 308, 309. As configured here, the two input nodes 286, 287 are precharged to VDD, and one of them falls slightly in voltage when signal is developed by the first stage amplifier. The other input node remains at VDD. As the amplifier starts to sense, the source of the NMOS transistor having the lesser input gate voltage is brought low, while source of the NMOS transistor having the higher input gate voltage (i.e., the side whose input gate remains at VDD) stays high. Because of the voltage amplification of this second stage amplifier, the internal node 315 or 316 which falls in response to the falling input voltage (node 286 or 287) actually falls quite a bit further than does the input node. Due to large gate-to-source capacitance of the input transistors (especially because they are biased in saturation) there is a large negative coupling from the transistor source back into the input gate node. For example, if node 287 is falling from VDD to 200 mV below VDD, node 316 may fall, for example, by 800 mV, or 4 times as much as the input falls. The charge removed from the input node provides a negative input capacitance of the second stage amplifier onto the output nodes of the first stage amplifier, thus speeding up the response of the first stage amplifier. The differential voltage between nodes 286 and 287 provides a much larger differential voltage between nodes 315 and 316, which causes differential currents through transistors 309 and 308 which, in turn, provide a differential current pulling either GOUTB or GOUT low. These and other features and advantages of this second stage amplifier are described more fully in co-pending application Ser. No. 09/223,265, filed on Dec. 30, 1998, naming Robert J. Proebsting as inventor and entitled "Differential Sense Amplifier Circuit," the disclosure of which is incorporated herein by reference in its entirety.

Figure 9:
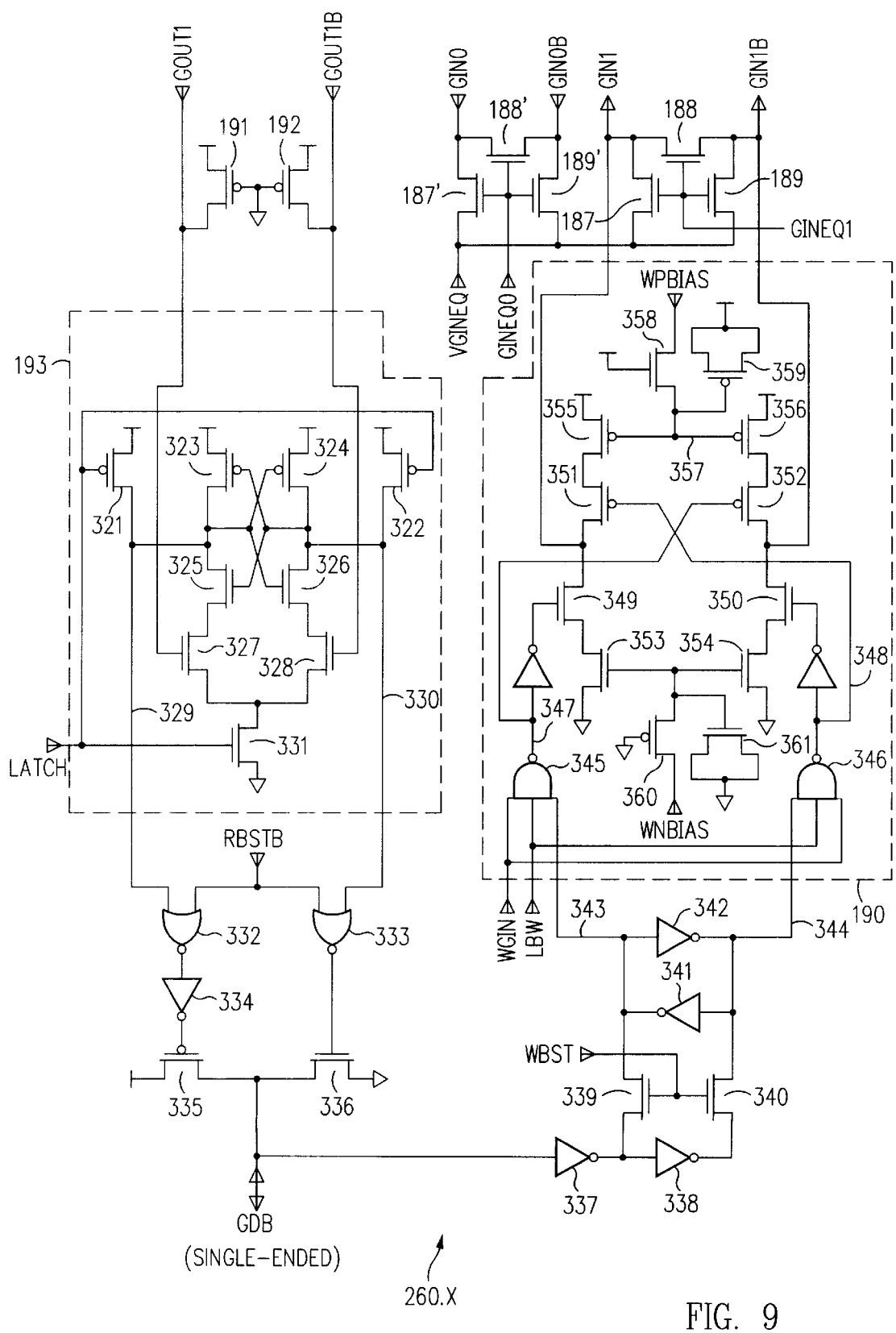
FIG. 9 is a schematic diagram of an embodiment of the global I/O to global data bus interface block shown previously in FIG. 6.

Referring now to FIG. 9, a global I/O interface block 260.X is shown which was introduced in FIG. 6 and which, when reading, senses a small signal on a pair of global output lines GOUT, GOUTB and drives a single-ended global data bus accordingly with a rail-to-rail signal swing, and which, when writing, receives a data bit from the global data bus and drives a small differential signal onto a pair of global input lines GIN, GINB which were previously equilibrated to the global input line equilibrate voltage VGINEQ.

Taking the more straightforward read path first, the pair of global output lines GOUT, GOUTB are precharged to VDD by P-channel load transistors 191, 192, first introduced in FIG. 3, which also serve as active load devices. A latching sense amplifier 193 includes a full CMOS cross-coupled latch (transistors 323, 324, 325, and 326) whose cross-coupled nodes 329, 330 (which are also the output nodes) are precharged to VDD by transistors 321, 322 when a LATCH signal is low (inactive), and which cross-coupled latch is caused to latch a "0" or a "1" (i.e., "steered") by transistors 327 and 328 according to the differential signal on the global output lines GOUT, GOUTB when LATCH goes high (active). Since even the low-going global output line (either GOUT or GOUTB) never drops much below VDD (and the other global line, as described above, stays substantially at VDD) the cross-coupled latch pulls one of its outputs (node 329 or 330) all the way to ground, while the other output (node 330 or 329) is held at VDD. As long as a complementary read strobe signal RBSTB remains inactive (high), the outputs of both NOR gates 332 and 333 are driven low, and push-pull driver transistors 335 and 336 are both held off. When the read strobe signal RBSTB is driven active (low) after the LATCH signal is driven high, the global data bus GDB is driven according to which cross-coupled output node 329, 330 is low. If node 330 is latched low, the gate of NMOS transistor 336 is driven high through NOR gate 333. Thus, transistor 333 drives the global data bus GDB to ground, while the gate of P-channel transistor 335 is held high by inverter 334. On the other hand, if node 329 is latched low, the gate of transistor 336 is held low by NOR gate 333 while the gate of P-channel transistor 335 is driven low by NOR gate 332 and inverter 334, thus driving the global data bus to VDD. In either case, the complementary read strobe signal RBSTB is active for a long enough time to drive a full rail-to-rail signal on the single-ended global data bus GDB (e.g., drive the voltage fully to either a VDD or ground level). There is no precharge circuit for the global data bus: it is driven with the next data on the next cycle. If two sequential cycles drive the same data onto the global data bus, then the voltage of the global data bus doesn't change. By not equilibrating or precharging this bus, which likely traverses across a significant portion of the width of the memory array, significant power is saved during an active cycle.

In a write operation, a data bit is placed onto the global data bus at the appropriate time by the write queue, which is described further below. For the description of the global input line driver shown here in FIG. 9, assume the global data bus is already driven either to VDD or to ground in accordance with the data to be written onto the global input line GIN, GINB (and ultimately into the selected memory cell). Inverters 337 and 338 buffer and invert the data received on the global data bus GDB to create complementary local nodes corresponding to the data on the global data bus GDB. When the write bus strobe signal WBST momentarily goes high (active), the complementary data is loaded via transistors 339, 340 into the latch formed by inverters 341 and 342 by over-powering the latch. Thus, complementary data is available, after the pulse of strobe signal WSTB, on nodes 343 and 344 which are respectively connected to NAND gates 345, 346.

The global input line driver circuit 190 receives the complementary data signals conveyed on nodes 343, 344, as well various control and timing signals and drives the global input lines GIN, GINB with a constant current pulse of a controlled magnitude for a timed duration to provide a reasonably predictable change in charge on each of the global input lines. A positive charge added to one of the global input lines GIN or GINB and a negative charge on the other creates a predictable small differential signal between GIN and GINB. In FIG. 9, two pairs of global input lines are illustrated, namely GIN0, GIN0B and GIN1, GIN1B. As described earlier, the pairs of global input lines are inter-digitated in each bank of the memory array, with half of the pairs exiting the memory bank toward the I/O section above the bank, and the other half exiting the memory bank toward the I/O section below the bank. As shown in FIG. 9, the left-most global input pair GIN0, GIN0B represent a pair which exits at the opposite end of the memory bank. The transistors 187', 188', and 189' form a "far end" equilibration circuit for this pair of global input lines, which are driven by a driver circuit (e.g., like driver circuit 190) and also equilibrated at the other end of the lines (i.e., the "near end") on the opposite side of the memory bank using another circuit as shown in FIG. 9. The transistors 187, 188, and 189 form a "near end" equilibration circuit for the second pair of global input lines, namely GIN1, GIN1B.

The equilibration signals GINEQ0 and GINEQ1 are driven high, if driven at all for a particular active cycle, during the latter portion of bit line sensing to equilibrate the global input lines together. The equilibration voltage for the global input lines is set by the common global input line equilibration node VGINEQ, which is coupled to the memory cell plate voltage PLATE which itself is driven by a sample-and-hold amplifier (e.g., see amplifier 196 in FIG. 3) to the same voltage as the bit line equilibrate voltage VBLEQ. Consequently, the global input lines are equilibrated to very nearly to the same voltage as are the bit lines (nominally about 1.0 volts). The common global input line equilibration node VGINEQ is coupled (during equilibration) to all pairs of global input lines receiving new write data to also help ensure a uniform equilibration voltage to all such pairs of global input lines.

The equilibrate signal GINEQ does not pulse for every active cycle, but typically only after a write cycle, and only for those global input lines receiving new write data as is described in greater detail below. To understand the operation of the driver circuit 190, assume that the global input pair GIN1, GIN1B has been equilibrated to a 1.0 volt level, and that the equilibration signal GINEQ1 is now low and transistors 187, 188, and 189 consequently are each turned off. As described above, also assume that complementary data to be written is already available on nodes 343 and 344.

As mentioned above, the global input line driver circuit 190 drives the global input lines GIN1, GIN1B with a constant current pulse for a timed duration to create a predictable small voltage signal between GIN1 and GIN1B. In operation, this write data input signal is driven onto the pair of global input lines (frequently well before the actual write operation in which the data is actually written into the selected memory cell), and the global input lines are then allowed to float, in effect storing dynamically on the pair of global input lines the next data bit to be written by the next write operation, even if several read operations may occur before the next write operation. A more complete description of the operation of the write queue, which makes the data to be written available to the driver circuit 190 well before the actual write operation is typically performed internally in the memory array, follows below.

The control signal WGIN is a timing pulse that controls the length of the current pulse applied to the global input lines. When inactive, the control signal WGIN is low, which holds the respective outputs 347, 348 of NAND gates 345, 346 high. Consequently, the gates of P-channel transistors 351, 352 are high and the gates of N-channel transistors 349, 350 are low. Thus, all four transistors (349, 350, 351, and 352) connected to either of the global input lines GIN1, GIN1B are off, and the driver circuit 190 presents a high impedance to the global input lines GIN1, GIN1B and allows the global input lines to either float (which preserves the data signal previous developed thereon) or be equilibrated by both the "near-end" equilibration circuit (transistors 187, 188, and 189) and by a "far-end" equilibration circuit (not shown in FIG. 9, but analogous to transistors 187', 188', and 189').

Each of the global input lines (e.g., GIN1, GIN1B) is allowed to float until the corresponding internal write operation actually utilizes the data signal thereon, and moreover until a subsequent external write cycle presents data to be written to a data bit which corresponds to the particular global input line. To ensure that the dynamically stored signals do not decay significantly from the global input lines should the next external write cycle not be presented to the chip within a reasonable time, the write signals thereon are refreshed periodically by equilibrating the global input lines and re-developing the write signals. In the preferred embodiment, the internal row refresh counter which generates an output every 256 clock cycles is used to initiate such a global input line refresh, whether or not the particular memory bank is actually active with a refresh cycle, is active with a non-refresh cycle, or is even otherwise inactive. The global input line refresh need not be synchronized to any row refresh activity because the global input line decay (if any) is substantially independent of whether any memory cells need refreshing. Consequently, any other counter or other means of generating a suitable refresh interval may also be used to initiate a refresh of the global input lines.

To write new data onto the global input line pair (or to refresh the data already there), it is first equilibrated by application of the equilibration signal GINEQx (i.e., GINEQ0 or GINEQ1), and then (again assuming that the new data to be written has already been strobed off of the global data bus GDB and is already present on complementary nodes 343, 344) the timing pulse WGIN is applied to the driver circuit 190. For each particular write cycle, if the global input line pair corresponds to a bit within a byte which is byte-enabled for writing, then the local byte write enable signal LBW (received by the driver 190 for such a global input line pair) is high. For any other byte, including other bytes not even within the presently addressed data word, the local byte write enable signal LBW remains low, and the timing pulse WGIN is ignored by NAND gates 345, 346. However, for a global input line which is byte-enabled for writing (i.e., in which LBW is also high), either NAND gate 345 or NAND gate 346 will progpagate the timing pulse received on timing signal WGIN and effectuate the write to the global input line pair. The LBW signal is preferably decoded from external control signals and is set up with about the same timing as the data signals. Both are preferably strobed by the write bus strobe signal WBST.

To better describe the operation of driver 190 in generating a small differential signal on the global input line pair, assume that a "1" is to be driven onto the global input line pair GIN1, GIN1B. Accordingly, node 343 is low, and node 344 is high. Also assume, of course, that the local byte write enable signal LBW is active (high): otherwise, no write would occur, as described above. When the high-going timing pulse WGIN arrives, the output node 348 of NAND gate 346 switches low, since all three of its inputs are now high. The low voltage on node 348 is applied to the gate of P-channel transistor 351. The gates of transistors 355 and 356 are both biased at a DC bias voltage WPBIAS, which is locally RC filtered by N-channel transistor 358 (connected so as to largely act as a resistor) and transistor 359 (connected to function as a capacitor to VDD). In this configuration, transistors 355 and 356 each implement a rather effective constant current source able to source a predictable (and fairly VDD independent) amount of current from the VDD supply into respective nodes GIN1 and GIN1B when enabled by respective switching transistors 351 and 352. Assuming the data polarity of the present example, since node 348 is low, the series combination of current-source transistor 355 and switch transistor 351 allows a predictable amount of current to flow from VDD into node GIN1 for the duration of the high pulse on the timing signal WGIN. Since transistor 349 is still off and no current is conducted from node GIN1, the integral of the current for the duration of the pulse results in a predictable increase in charge of node GIN1. The voltage of the global input line GIN1 (i.e., node GIN1) increases by an amount equal to this change in charge divided by the total capacitance of the global input line GIN1. In the embodiment described, the length of the timing pulse WGIN, and the width and gate-to-source voltage of the current source transistor 355 are such that the value of this change in voltage on the global input line GIN1 is approximately +100 mV.

The value of the internally-generated bias voltage WPBIAS is preferably set to achieve the greatest amount of bias (i.e., $V_{GS}$) across each of transistors 355 and 356 and yet still bias each transistor in saturation. Since the desired high level of the global input line is preferably equal to the equilibration voltage (e.g., 1000 mV) plus a 100 mV write signal (e.g., for a total voltage of 1.1 volts on a "written high" global input line), the value of the bias voltage WPBIAS is preferably set to approximately the magnitude of one PMOS threshold voltage below this 1.1 volt desired high level. By maximizing the magnitude of the gate-to-source bias voltage presented to the current source transistors 355, 356, at least four advantages result: (1) for a desired amount of current, the width of each current source transistor is reduced; (2) for a given width of the current source transistor, the width of the timing pulse WGIN which is necessary to achieve the desired write signal on the global input lines is reduced; (3) the sensitivity of the current source value to internal chip noise is reduced; and (4) the effectiveness of the local RC decoupling circuit (transistors 358, 359) in reducing drain-to-gate coupling is enhanced.

Looking at the lower half of the driver 190, the gates of transistors 353 and 354 are both biased at the voltage WNBIAS, which is preferably an internally-generated bias voltage relative to VSS (ground) having a value of approximately (0.9+$V_{TN}$) volts above VSS, and which for this embodiment is locally RC filtered by P-channel transistor 360 (connected so as to largely act as a resistor) and N-channel transistor 361 (connected to function as a capacitor to VSS). In this configuration, transistors 353 and 354 each implement a rather effective constant current source able to sink a predictable (and internal chip noise insensitive and fairly non-power supply dependent) amount of current from the respective nodes GIN1 and GIN1B into the ground node when enabled by respective switching transistors 349 and 350. Again assuming the data polarity of the present example, since node 348 is low, the gate of transistor 350 is high and the series combination of current-source transistor 354 and switch transistor 350 allows a predictable amount of current to flow from node GIN1B to ground for the duration of the high pulse on the timing signal WGIN. Since transistor 352 is still off (node 347 is high for this data polarity) and no current is conducted from VDD into node GIN1B, there results a predictable decrease in voltage of GIN1B. In the preferred embodiment described, the length of the timing pulse WGIN, and the width and gate-to-source voltage of the current source transistor 354 are such that the value of this decrease in voltage on GIN1B is also approximately 100 mV.

The value of the internally-generated bias voltage WNBIAS is preferably set to achieve the greatest amount of bias (i.e., $V_{GS}$) across each of transistors 353 and 354 and yet still bias each transistor in saturation. In the preferred embodiment, since the desired written low level of the global input line is preferably equal to the equilibration voltage (e.g., 1000 mV) minus a 100 mV write signal (e.g., for a total voltage of 0.9 volts on a "written low" global input line), the value of the bias voltage WNBIAS is preferably set to approximately (0.9+$V_{TN}$) volts above VSS. By maximizing the bias voltage presented to the current source transistors 351, 352, the same advantages result as described above for the pull-up current sources. Note that the duration of the timing signal WGIN is equal to both the duration of the positive current source pulling GIN1 up, and the duration of the negative current source pulling GIN1B down. Since it is desired to increase the voltage of GIN1B by the same amount that the voltage of GIN1 is decreased, the magnitude of the positive and negative current sources are preferably equal.

At the conclusion of the timing pulse WGIN, a 200 mV differential voltage exists between the two lines of a global input line pair, having a polarity in accordance with the data bit to be written on the next write operation. (While the operation of driver circuit 190 was described above in the context of a particular exemplary data polarity, the driver 190 is a symmetrical circuit and its operation with the opposite data polarity need not be described in detail.) The two global input lines GIN1, GIN1B are left floating dynamically until the next write operation is actually carried out, which may be some time in the future (e.g., several active cycles later). Assuming a preferred global input line equilibration voltage of 1.0 volts, the preferred "high" voltage on a global input line is therefore 1.1 volts, and the preferred "low" voltage on a global input line is therefore 0.9 volts. These preferred voltages are chosen because they are sufficient to cause a bit line sense amplifier to latch in accordance with the write data, yet are small enough to not disturb the sensing of neighboring bit lines.

It should also be emphasized that, because of the write cycle "merging" capability of the preferred embodiment (which is described in greater detail below), a data strobe signal WBST may be provided to latch the respective data (from the global data bus GDB) corresponding to a first external write cycle into the respective driver circuits 190 for a first decoded group of global input lines, followed by a pulse of the timing signal WGIN applied to the respective driver circuits 190 for the first group of global input lines to drive the respective latched data onto the respective global input lines. Then, in a subsequent cycle, another WBST pulse is provided to latch the respective data corresponding to a second external write cycle into a second set of respective driver circuits 190 for a second decoded group of global input lines, which is then followed by a pulse of the timing signal WGIN applied to the respective driver circuits 190 for this second group of global input lines to drive the respective latched data onto the respective global input lines. A single internal write operation then simultaneously writes the data for both groups into their respective memory cells (decoding and driving a word line, steering the two groups of selected sense amplifiers with the two groups of write data already present on the global input lines, restoring the data as latched in the sense amplifiers into the selected memory cells, etc.).

Alternatively, a data strobe signal WBST may be provided to latch the respective data (from the global data bus GDB) corresponding to a first external write cycle into the respective driver circuits 190 for a first decoded group of global input lines, followed by another WBST pulse to latch the respective data corresponding to a second external write cycle into a second set of respective driver circuits 190 for a second decoded group of global input lines, then followed by a pulse of the timing signal WGIN applied to the respective driver circuits 190 for both groups of global input lines to drive the respective latched data onto the respective global input lines, and only then followed by a single internal write operation to write the two groups of write data already present on the global input lines.

Such write cycle merging may be performed when consecutive write cycles address portions of the same 72-bit double word (i.e., when the respective row and column address portions of consecutive write cycles decode to the same column of the same word line (i.e., row) within the same array block within the same memory bank). In other words, write cycle merging may occur when consecutive write addresses differ only in the least significant address bit (the LSB) used by the multiplexer 109 shown in FIG. 1. This is particularly attractive when accessing the memory using sequential addresses, as would frequently occur during a burst mode access or when accessing a contiguous block of data, such as a cache line fill operation for a processor. Moreover, there is no reason to limit cycle merging at just two consecutive cycles. As an additional example, four consecutive external write cycles, each addressing a different 9-bit byte of the same addressed 36-bit word, followed by another four consecutive external write cycles, each addressing a different 9-bit byte of its addressed 36-bit word, will result in only one internal write operation so long as the two write addresses differ only in the least significant column address bit. The power savings from such a "merging" of write cycles is extremely significant. Moreover, such merging keeps the ultimately selected memory bank inactive during the "merged" cycle, which allows a hidden refresh cycle to occur in the selected memory bank during the "merged" cycle. Additional details and advantages of write cycle merging and of the write queue are described further below.

The array architecture described above, including the configuration and arrangement of the array blocks, shared sense amplifiers, local I/O lines serving several sense amplifiers from a global input and output "quad" of lines (an input pair GIN, GINB and an output pair GOUT, GOUTB), and the individual supporting circuits implementing this architecture which are also described above provides an attractive compromise between performance and memory array efficiency (i.e., the percentage of the overall memory chip which is actually memory cells rather than the necessary support circuitry such as sense amplifiers, decoders, input/output circuits, control circuits, other peripheral circuits, etc.) In another embodiment illustrated beginning in FIG. 10, a higher performance is achieved, albeit at the inevitable expense in array efficiency (and therefore, die size), by replacing the pairs of local I/O lines LIO, LIOB with a dedicated pair of local output lines and a dedicated pair of local input lines, and by essentially implementing a portion of the shared first stage amplifier within amplifier 174' (FIG. 8) into each and every bit line sense amplifier.

Figure 10:
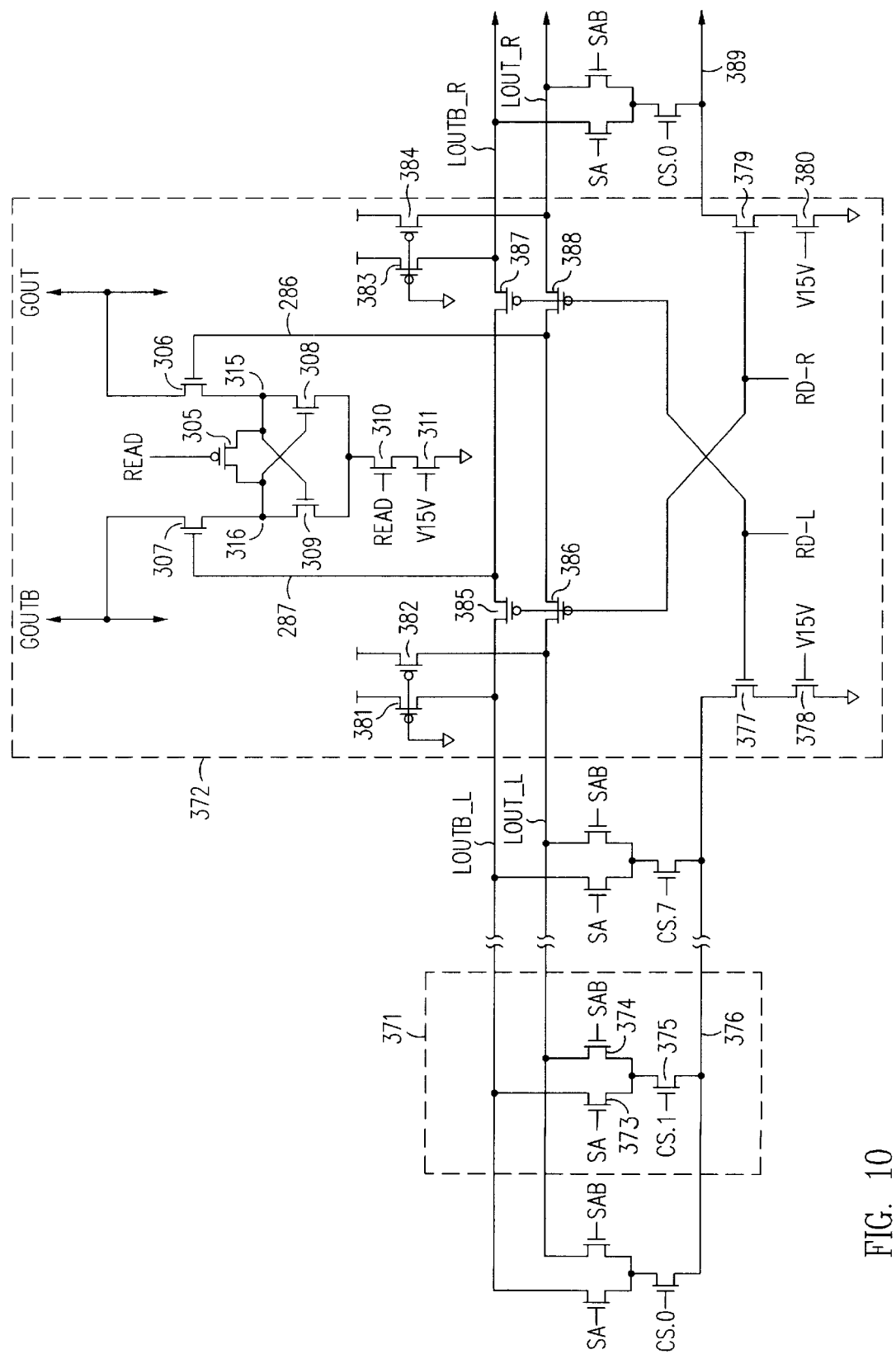
FIG. 10 is a schematic diagram of another embodiment of the supporting circuitry located above and below the array block, and particularly illustrating the use of a separate pair of local output lines between the sense amplifiers and the global output lines, and the placement of a portion of the first stage amplifier within each of the sense amplifiers.

Referring specifically to FIG. 10, a first stage amplifier portion 371 is implemented within each and every bit line sense amplifier (e.g., within bit line sense amplifier 250 shown in FIG. 4 and again in greater detail in FIG. 7) while the remaining portions of the first stage amplifier, the left/right multiplexer, and the second stage amplifier (all collectively indicated as circuit block 372) are implemented, as before, within the local I/O block 202 (see FIG. 4). In particular, the bi-directional local I/O section 278 of every bit line sense amplifier (shown in FIG. 7) is replaced by the first stage amplifier portion 371 for reading, and by additional write circuitry described below.

In the first stage amplifier portion 371, the internal sense amplifier nodes SA, SAB are directly connected to the gates of a differential pair (transistors 373 and 374, respectively) rather than, in the earlier embodiment, coupled first through column select transistors onto a local I/O line pair, and then to the differential pair. By being directly connected to the relatively low-capacitance of the transistor gate terminals, the capacitive loading on the internal sense amplifier nodes SA, SAB is greatly reduced since it no longer includes the capacitance of the local I/O lines (and the DC loading, of course, is virtually zero). The selection of a particular first stage amplifier is accomplished by a first switch transistor in the current tail within the first stage amplifier portion 371 (e.g., transistor 375) which is driven by one of the column decode signals, and further by a second switch transistor in the circuit block 372 (e.g., transistor 377) which is driven by a left/right read select signal (e.g., RD_L). The magnitude of the current tail current through the first stage differential amplifiers, as before, is largely determined by a current source transistor with a DC bias on its gate, in this embodiment shown as a nominally 1.5 volt signal V15V applied to both transistors 378 and 380 within circuit block 372. As before, if the voltages to be sensed are too low relative to the threshold voltages of the differential pair of transistors, node 376 (or node 389) can be driven below ground, for example, by circuitry included in amplifier 174' shown in FIG. 8.

The left-most eight first stage amplifiers are coupled to a shared local output pair LOUT_L, LOUTB_L which physically runs through each of the eight sense amplifiers. A single pair of load "resistors" (e.g., grounded-gate P-channel transistors 381, 382) is provided for the left local output pair LOUT_L, LOUTB_L within the circuit block 372. Similarly, the right-most eight first stage amplifiers are coupled to a shared local output pair LOUT_R, LOUTB_R which physically runs through each of the eight right-most sense amplifiers. A single pair of load "resistors" (e.g., transistors 383, 384) is provided for the right local output pair LOUT_R, LOUTB_R within the circuit block 372. A 2:1 multiplexer formed by P-channel select transistors 385, 386, 387, and 388 couples either the left or right pair of local output lines to a common pair of nodes 286, 287, which are the input nodes to the second stage amplifier (transistors 305, 306, 307, 308, 309, 310, and 311), as before.

Between active cycles, both read select signals RD_L and RD_R are inactive low, as are each of the column select signals (e.g., CS.1). Consequently, each of the first stage amplifiers 371 are off, intermediate nodes 376 and 389 are floating, and the local output lines LOUT_L, LOUTB_L, LOUT_R, and LOUTB_R are driven to VDD by load transistors 382, 381, 384, and 383, respectively. Because both left/right read select signals RD_L and RD_R are low, P-channel transistors 385, 386, 387, and 388 are on, which ensures that the output nodes of the multiplexer (i.e., the input nodes 286, 287 of the second stage amplifier) are also brought fully to VDD.

In an active cycle, one of the two left/right read select lines RD_L or RD_R, one of the eight column select lines CS.X, and the READ signal are all driven high at or about the same time. For example, assume that the first stage amplifier portion 371 is to be read during an active cycle. The column select signal CS.1 is driven high at about the same time as the left/right read select signal RD_L is driven high. The two multiplexer transistors 387, 388 are turned off, isolating the right local output pair LOUT_R, LOUTB_R from the common node pair 286, 287. Current flows through transistors 378, 377, and 375 to provide a tail current for differential pair 373, 374, which develops an output voltage on left local output pair LOUT_L, LOUTB_L. This signal is communicated through multiplexer transistors 386, 385 to the input nodes 286, 287 of the second stage amplifier, which functions as described above to amplify and drive the signal onto the global output pair GOUT, GOUTB. One of the eight right-most first stage amplifiers is also selected by the same column select line (for example, CS.1 for this description), but transistor 379 is off because the left/right read select signal RD_R is low. Therefore, no signal is developed on the right local output pair LOUT_R, LOUTB_R. The size of P-channel multiplexer transistors 385, 386, 387, and 388 are advantageously kept small to take advantage of the negative input capacitance of the second stage amplifier, described earlier with respect to FIG. 8.

Figure 11:
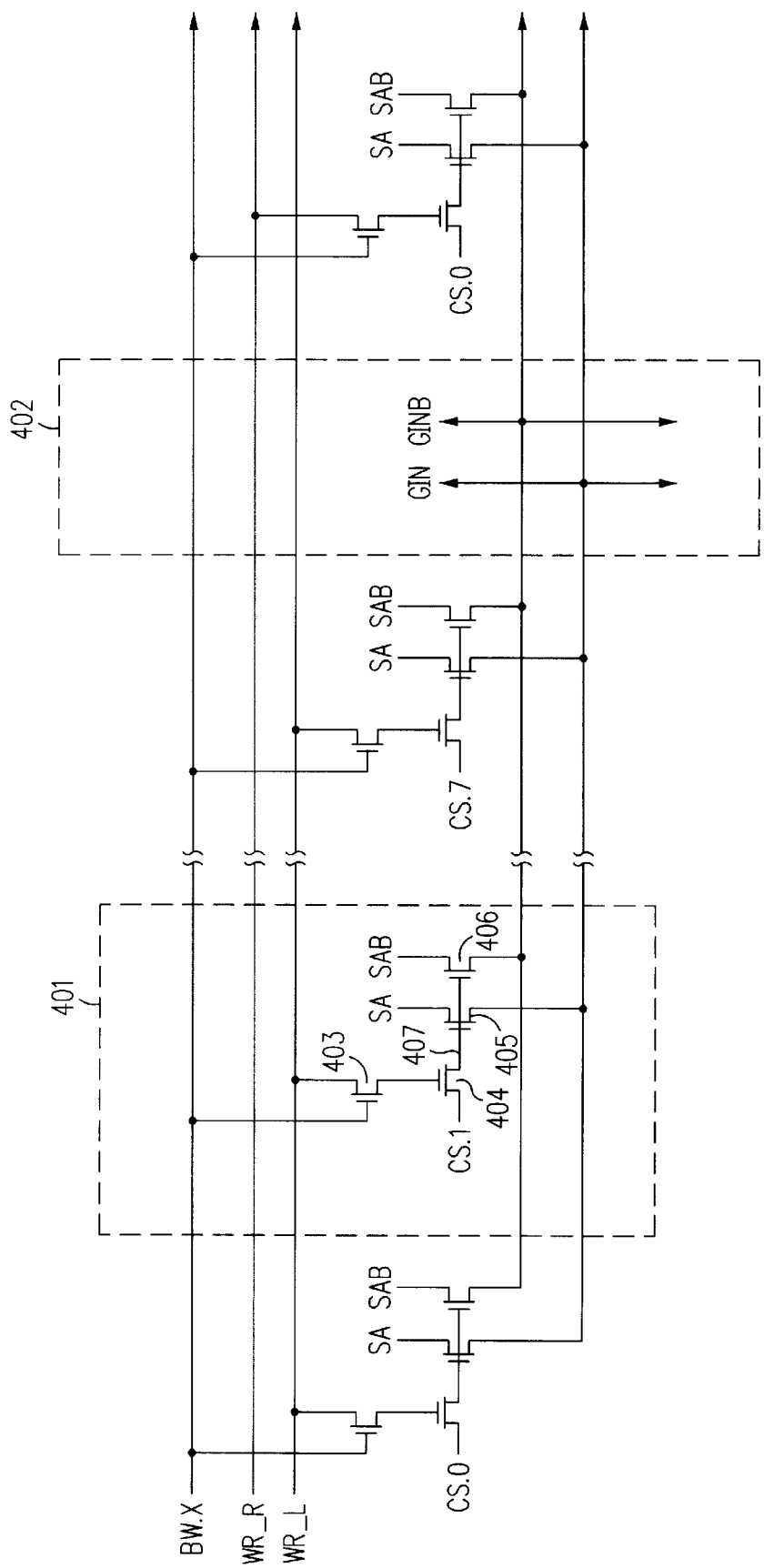
FIG. 11 is a schematic diagram of the embodiment shown in FIG. 10, illustrating the routing of the global input lines to each sense amplifier, and particularly illustrating the additional write circuitry within each of the sense amplifiers.

The corresponding circuitry, for this embodiment, for implementing a write operation is illustrated in FIG. 11. A write block 401 is provided for each bit line sense amplifier 250 of FIG. 7 (and implemented along with the first stage amplifier portion 371 of FIG. 10 described above within each sense amplifier 250, in place of the I/O section 278). While higher in performance (due to the much lower capacitance on the internal sense amplifier nodes), the area required to implement a sense amplifier including the first stage amplifier portion 371 and the write block 401 (totaling 7 transistors) is much larger than a sense amplifier including the bi-directional I/O section 278 (as in FIG. 7) which totals just 2 transistors. The global input pair GIN, GINB corresponding to the given group of bit lines, and which pair is preferably implemented in the top layer of metal and runs vertically through the array bank (e.g., array bank 251 shown in FIG. 5), is connected in each hole between array blocks to also run horizontally (in preferably a lower layer of metal) over a length equal to sixteen bit line sense amplifiers (eight typically to the left of the vertical GIN, GINB pair, and eight typically to the right). In the embodiment shown, the connection block 402 (simply a via or contact between layers of metal) is associated within the local I/O read amplifier and write block 202 (see FIG. 4), while the write block 401 is repeated for each of the sixteen bit line sense amplifiers 250 which share a given local I/O read amplifier and write block 202. When enabled, a given write block 401 couples the data input signal conveyed on the global input lines GIN, GINB to the corresponding internal sense amplifier nodes SA, SAB. As described above, this occurs before bit line sense amplifier sensing, which allows the sense amplifier itself to actually write the high or low level into the selected memory cell.

A write block 401 is enabled by the coincident application of three logical signals: the decoded one of the eight column select signals (e.g., CS.1) which are also used by the read circuitry, one of two left/right write select signals WR_L, WR_R, and a third signal, BW ("byte write"), which is enabled when the particular bit corresponding to the group of sixteen bit line sense amplifiers corresponds to an external byte which is enabled for writing. To more fully describe the operation, assume a bit line pair associated with the write block (labeled as 401) is to be written with a logical "1". In such a case, the global input lines GIN, GINB would already have been driven by operation of the write queue to reflect the data to be written into the selected memory cell during the "next" write cycle, as was described above. In this example, the true global input line GIN would have already been driven (for this embodiment) to a voltage equal to the equilibrate level (e.g., 1.0 volts) plus 100 mV, for a total of 1.1 volts, while the complementary global input line GINB would have already been driven (for this embodiment) to a voltage equal to the equilibrate level less 100 mV, for a total of 0.9 volts. The global input lines, after being driven to these voltages, remain dynamically floating after the write cycle occurs which actually uses the data until just before the next write cycle which uses the same global input lines, or until the global input lines are refreshed, whichever comes first. In either case, such global input lines are equilibrated and driven with the corresponding write data signal to create the appropriate differential levels. Moreover, the four byte write control signals for the next write data are driven high (to enable) or low (to disable) writing to the nine bits associated with the respective 9-bit byte. Consequently, the corresponding byte write signal BW would already have been driven by operation of the write queue in accordance with the address of the selected memory cell for the "next" write cycle (e.g., BW is driven high, or remains high if already so, in any hole which is enabled for write and the particular byte is selected for writing).

During the active write operation, the byte write signal BW is already valid. The equivalent of the 2:1 multiplexer found in the read path is accomplished in the write path by using the two left/right write control signals WR_L and WR_R. The left or right component of this information is valid in advance from the write queue. Since the selected array select and the selected hole(s) is also stored in the write queue and available in advance when a write cycle begins, this information is already combined, waiting for the next write cycle. As soon as the next write cycle is decoded and as early in the cycle as possible, either the WR_L or the WR_R signal for the active hole(s) is enabled. These WR_L and WR_R signals are normally low (to prevent writing during a read cycle), and pulse high during an active write cycle when selected. As is described below, there will normally be one selected hole for writing during any one write cycle, either the hole above or the hole below the selected array block. In the case of a merged write, both the hole above and the hole below the selected array block are enabled for writing, and the WR_L or WR_R signal and the selected column select signal for both holes will be driven high. If a byte write signal BW for a particular global input line is high, then the selected column to the left or right is going to be written by the next write operation, whenever it occurs, with write data corresponding to the global input line.

The eight left-most bit line sense amplifiers associated with this global input pair GIN, GINB are coupled to receive the left write control signal WR_L at the drain of transistor 403, while the eight right-most bit line sense amplifiers associated with this global input pair GIN, GINB are coupled to receive the right write control signal WR_R at the drain of the analogous transistor. Looking at the write block 401 on the left side of FIG. 11, the gate of transistor 404 is driven high when both the WR-L signal is driven high with the BW signal already high. Then, after the gate of transistor 404 is driven high, the column select signal CS.1 is driven high, and the voltage on the gate of transistor 404 bootstraps up well above VDD by the channel capacitance of transistor 404 so that the gate node of transistors 405 and 406 (i.e., node 407) is driven to follow the column select signal, without losing a threshold voltage in going through pass transistor 404. In particular, the VDD-level voltage communicated onto node 407 is high enough to drive an internal sense amplifier node (e.g., SA) from an equilibrate level of 1.0 volts up to a pre-sense write level of 1.1 volts as it drives the complement sense amplifier node (e.g., SAB) down to a pre-sense write level of 0.9 volts. The column select signal CS.1 is then brought low as the sense amplifier begins to latch, followed by the WR_L or WR_R signal returning low. It is imperative that the column select signal is brought low before the WR_L or WR_R signal is brought low. This ensures that transistor 404 remains conductive as the column select signal (e.g., CS.1) is brought low and is able to discharge node 407 fully to VSS, thereby turning off transistors 405 and 406. It is also imperative that the WR_L or WR_R signal returns to ground before the byte write enable signal BW.X is updated with new data, particularly if the byte write enable signal BW.X is disabled (brought low). If the BW.X signal were brought low before the WR_L or WR_R signal is brought low, a high voltage could be trapped on the gate of transistor 404, which could result in an unwanted write during a read cycle. If no write cycle occurs for a long time, the low (inactive) voltage on node 407 is maintained by both sub-threshold leakage current through transistor 404, and by diode leakage from the drain of transistor 404 (an N+region) to an underlying P-well region biased either at ground or at a voltage below ground. Operation of the bit line sense amplifier itself then completes the write by driving the high-going bit line up to the actual write level of, for this embodiment, about 2.0 volts. Since transistors 405 and 406 are off during latch, current into the sense amplifiers during latch is not communicated to the global input lines.

Although the capacitance of the global input lines is perhaps 20% higher than other embodiments utilizing a bidirectional local I/O line (as in FIG. 8), the signal on the global input lines is developed by the write queue before the internal write operation begins and may be accomplished without significant complication. The increase in power consumption required to drive the higher capacitance global input lines is negligible since the lines are only driven by +/−100 mV. Moreover, there is only one transistor in the write path from the global input lines to the sense amplifier nodes. Transistors 405, 406 may therefore be implemented as smaller devices and still achieve high performance. As is described in detail below, operation at 200 MHz is achievable using the hole circuit embodiments shown in FIG. 10 and FIG. 11.

Figure 12:
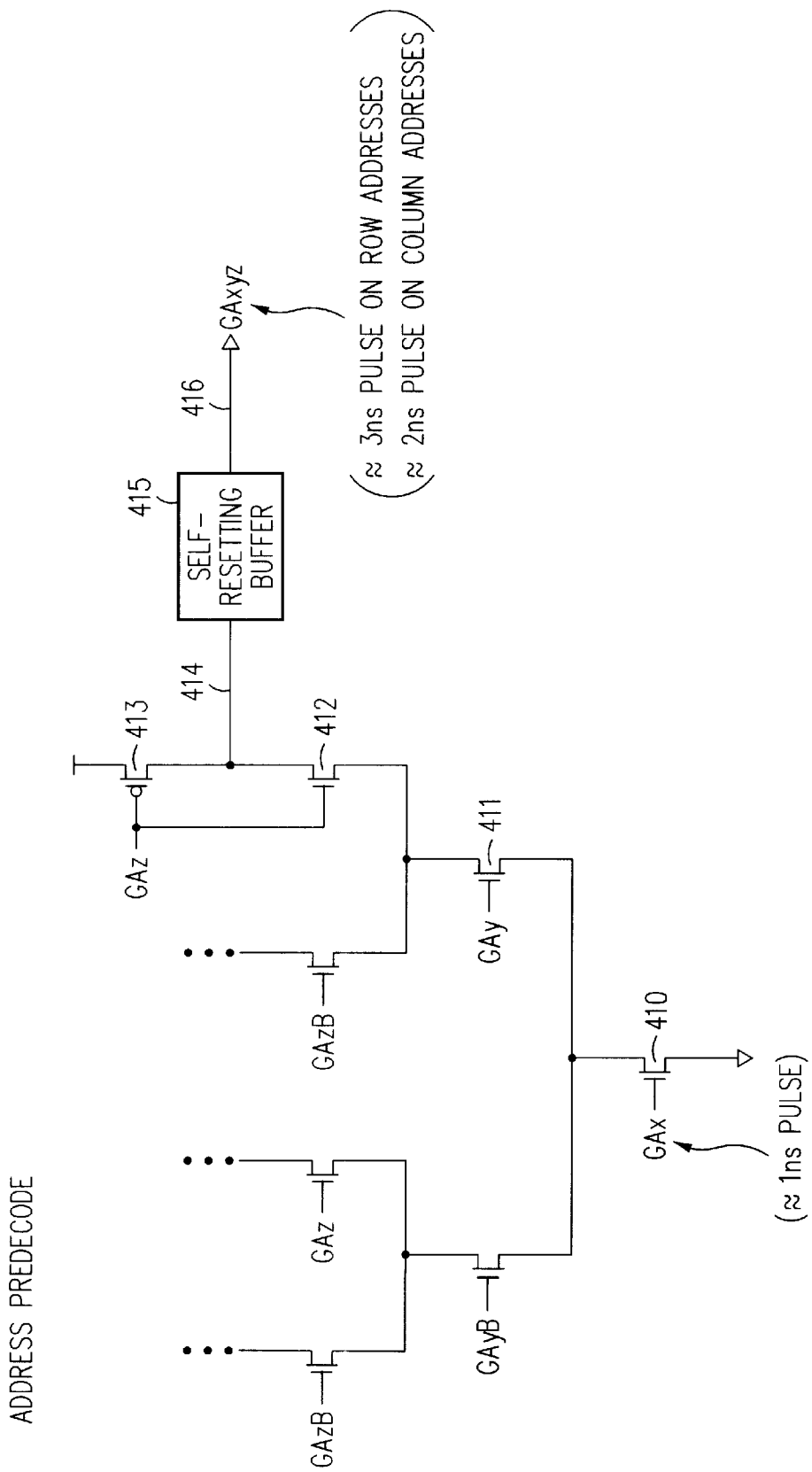
FIG. 12 is a schematic diagram of an address pre-decoding circuit useful for both row and column addresses.

FIG. 12 is a schematic diagram of an address pre-decoding circuit useful for both row and column addresses. Global address signals GAx, GAy, and GAz and their respective complement address signals GAxB (not shown), GAyB, and GAzB (each pulsing high, when active, for approximately 1 ns) are connected in a tree configuration to discharge a selected one-of-N decode nodes. For example, global address signals GAx, GAy, and GAz are connected to the gates of respective transistors 410, 411, and 412 to discharge decode node 414. One of the global address signals (in this embodiment, GAz) is connected to transistor 413 to precharge the decode node 414 high when the global address signals are inactive (low). A self-resetting buffer 415 then inverts and buffers the signal on the decode node 414 to generate an active high pulsed pre-decoded global address signal GAxyz. Eight such pre-decoded global address signals GAxyz are generated by pre-decoding three global address signals, with one of the eight pre-decoded signals pulsing high when active. The various row pre-decode signals are advantageously generated (by buffer 415) to have a pulse width of slightly more than 3 ns, and the various column pre-decode signals generated to have a pulse width of slightly more than 2 ns.

Figure 13:
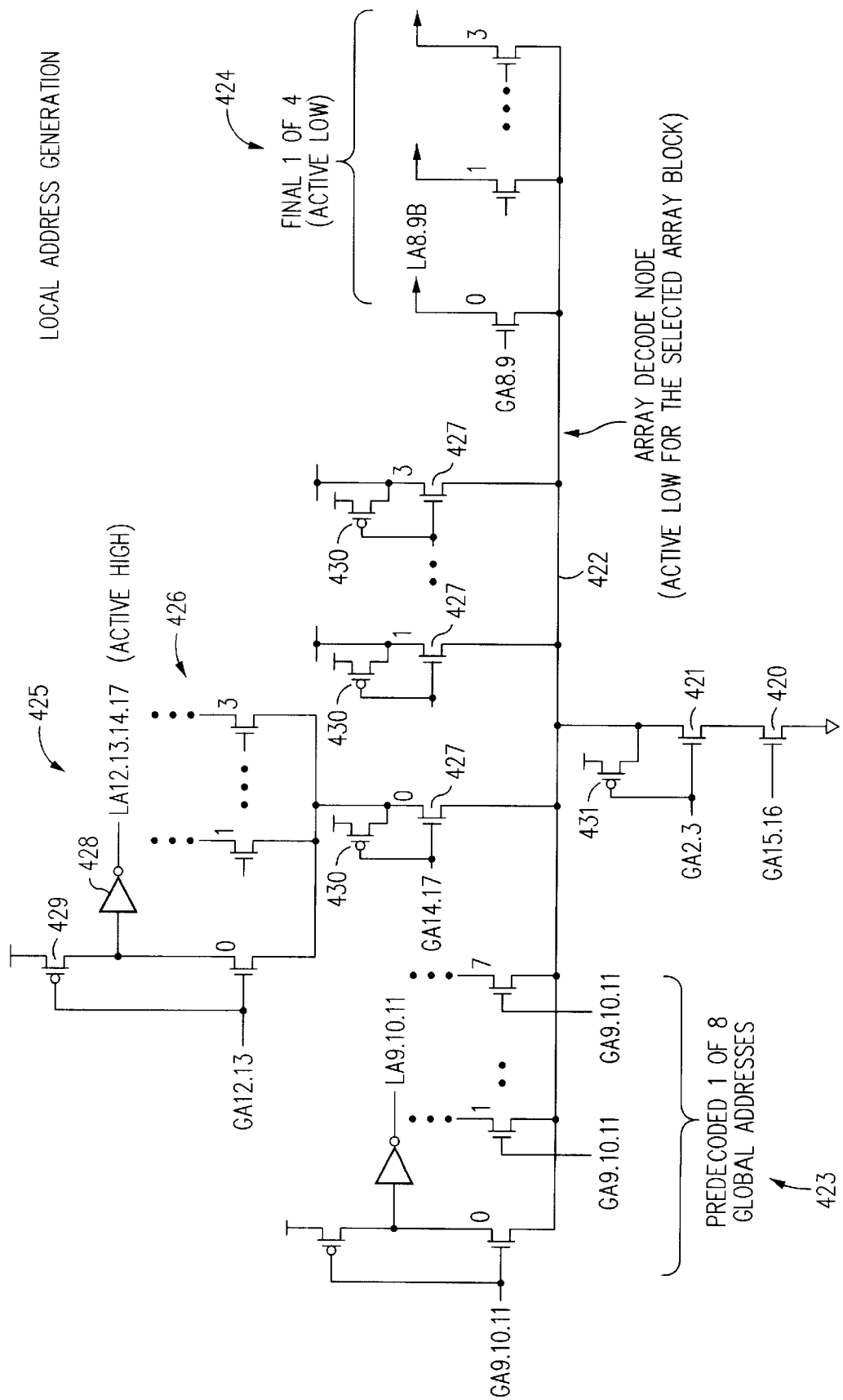
FIG. 13 is a schematic diagram of an address circuit which receives global pre-decoded row address lines and generates local pre-decoded row address lines which correspond to and are local to a single array block within a memory bank.

FIG. 13 is a schematic diagram of an address decoder circuit which receives global pre-decoded row address lines and generates local pre-decoded row address lines which correspond to and are local to a single array block within a memory bank. An array decode node 422 within the selected array block (which is precharged by PMOS transistor 431 when the global pre-decoded address signal GA2.3 is low) is brought to VSS by the series combination of transistors 420, 421 when both the global pre-decoded address signal GA15.16 (a pre-decoded signal of address bits 15 and 16) and GA2.3 are high. Since four address bits are encoded in these two pre-decoded signals, a one-of-sixteen decode is accomplished in selecting the array decode nodes (e.g., node 422). A group of eight pre-decoded local address signals LA9.10.11 is generated by decode circuit 423. One of the eight pre-decoded global address signals GA9.10.11 is driven high, and the corresponding pre-decoded local address signal LA9.10.11 within the selected array block is driven to follow accordingly. All eight local address signals LA9.10.11 within other non-selected array blocks remain inactive. A second decode circuit, labeled 424, generates a group of four pre-decoded local address signals LA8.9B which are active low, rather than active high as before. 1Lastly, an additional N-channel decoder tree circuit 425 includes four transistors 427 (and four associated PMOS precharge transistors 430) which each receive a particular one of four pre-decoded global address signals GA14.17, with each transistor 427 connected to a respective second tree level which each includes four transistors 426 for receiving a particular one of four pre-decoded global address signals GA12.13. A precharge transistor 429 and buffer 428 are included for each of sixteen pre-decoded local address signals LA12.13.14.17 to create active-high signals.

Figure 14:
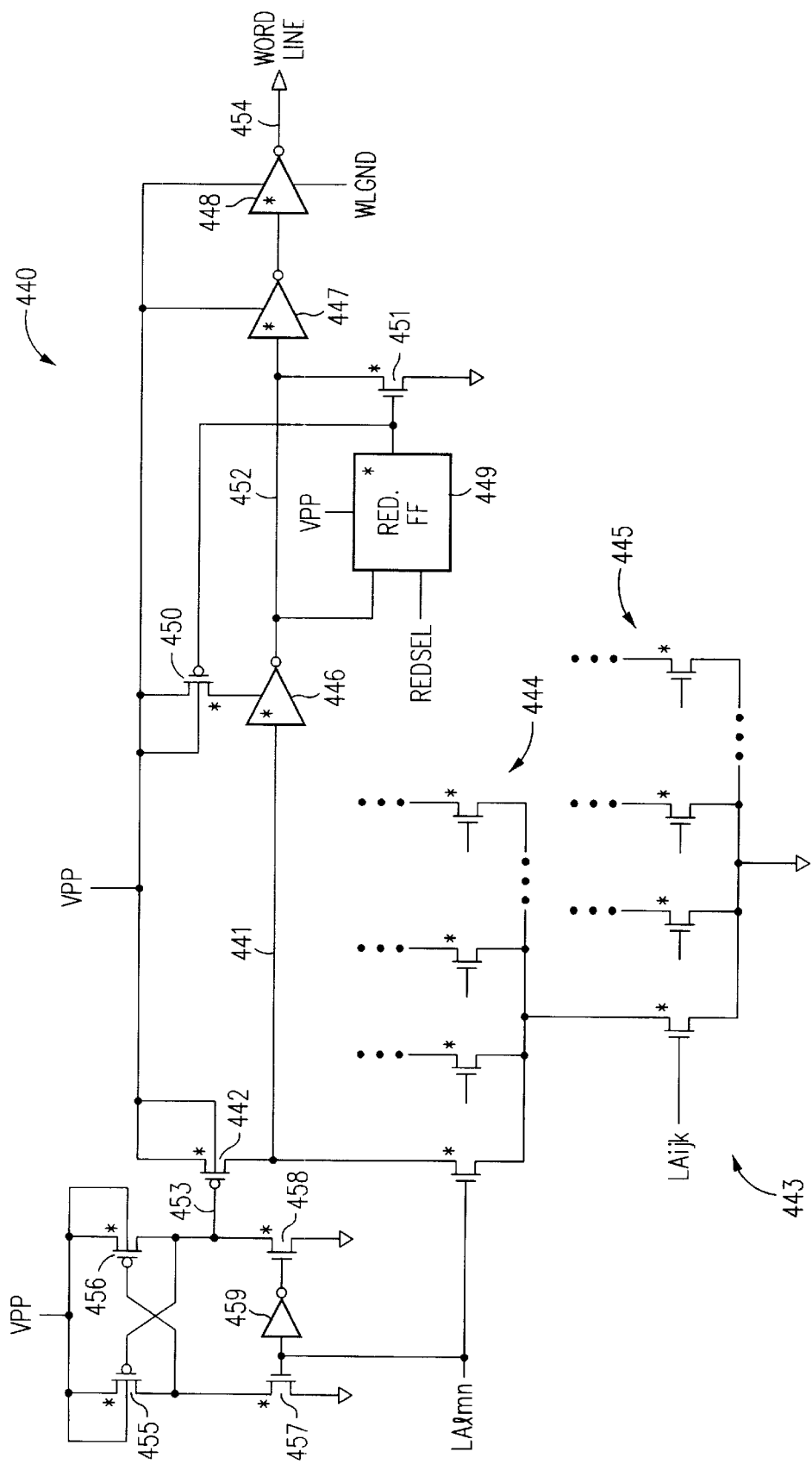
FIG. 14 is a schematic diagram of a row address decoder which receives VDD-level pre-decoded local address signals, level shifts up to a VPP level typically above VDD, and buffers a word line from VSS to VPP, all without any race conditions.

FIG. 14 is a schematic diagram of a row address decoder which receives VDD-level pre-decoded local address signals, level shifts up to a VPP level that is substantially independent of VDD and typically above VDD, and drives a selected word line from VSS to VPP. (It should be noted that the "body" terminal for all NMOS transistors is tied to VSS, unless otherwise indicated, and the "body" terminal for all PMOS transistors is normally tied to VDD, unless otherwise indicated. However, the body terminal for any PMOS transistor whose source or drain terminal is connected to VPP is also connected to VPP. Any inadvertent omission of the body terminal for a PMOS transistor whose source or drain is connected to VPP should not suggest that it is connected to VDD.) There are no race conditions within the decoder, even though it accomplishes a level shifting from VDD-level (i.e., VSS-to-VDD level) pre-decoded address signals to VPP-level word lines. A two-level tree includes a group of eight transistors 445 which each receive a particular one of eight pre-decoded local address signals LAijk, with each transistor 445 connected to a respective second tree level which each includes eight transistors 444 for receiving a particular one of eight pre-decoded local address signals LAlmn. The decode node 441 within the selected decoder 440 is precharged to VPP at the end of an active cycle by a level-shifted version of the local address signal LAlmn, conveyed on node 453 and connected to the gate of P-channel transistor 442. When the local address signal LAlmn goes low at the end of an active cycle, the inverter 459 drives the gate of transistor 458 high. This momentarily overpowers P-channel transistor 456 until its gate is pulled high by transistor 455. Then, node 453 is pulled all the way to VSS to precharge the decode node 441. When the local address signal LAlmn goes high at the beginning of an active cycle, the gate of transistor 456 is pulled low by transistor 457 (briefly overpowering transistor 455) and node 453 is pulled at the way to VPP, thereby turning off transistor 442.

It should be noted that transistors 445 are indicated as being high voltage transistors (as are nearly all others in FIG. 14). From a voltage point of view, transistors 445 do not need to be high voltage transistors. The maximum voltage of the local address signal LAlmn is VDD, and consequently the maximum voltage on the drains of transistors 445 is limited (by transistors 444) to a voltage of VDD less a threshold. Since the maximum voltage of the local address signal LAijk is also VDD, the maximum voltage on the gates of transistors 445 is VDD. Therefore, transistors 445 do not need to be high voltage transistors. However, there may be layout benefits to nonetheless make them high voltage transistors. High voltage transistors usually require considerable spacing to the nearest regular low-voltage transistor. Since transistors 444 must be high voltage transistors (i.e., its drain voltage goes to VPP), transistors 445 may be physically closer to the transistors 444 if both are high voltage transistors, than if transistors 445 are regular low-voltage transistors. Consequently, the layout area may be smaller, and the capacitance on the intermediate node therebetween may be smaller. Few things in life come for free, however. A high voltage transistor operated at low voltage is lower in performance than a normal low-voltage transistor operated at low voltage, so judicious choices must be made when considering making a particular transistor a high voltage transistor when the voltage considerations do not strictly so require.

All other nodes 441 of other non-selected decoders remain at VPP during an active cycle. Even though the local address signals LAijk and LAlmn are VSS-to-VDD signals, the N-channel tree configuration is useful to discharge the decode node 441 all the way from VPP down to VSS. The decode node 441 within the selected decoder 440 is brought to VSS, while the corresponding decode node 441 within all other decoders 440 remains at VPP. Buffers 446, 447, and 448 are all normally powered by VPP (rather than by VDD) and together invert the active low voltage on the selected decode node 441 and drive the word line 454 smoothly from VSS to VPP.

A redundancy flip-flop 449 is used to disable a particular decoder 440 from driving its word line 454. Normally, the flip-flop 449 is reset low, thus turning on transistor 450 to provide power to buffer 446 and turning off transistor 451 to allow node 452 to switch high (when the decoder is selected). However, if a redundant word line decoder also responds to the same row address, the signal REDSEL (which is routed through all the row decoders within an array block) is driven high, and the output of flip-flop 449 is driven high to disable buffer 446 and to ensure that node 452 remains low. Once redundancy flip-flop 449 is set, the particular word line 454 cannot be driven high and always remains inactive. The features and advantages of such a redundancy flip-flop are described more fully in co-pending application Ser. No. 09/199,884, filed on Nov. 24, 1998, naming Robert J. Proebsting as inventor and entitled "Disabling a Defective Element in an Integrated Circuit Device Having Redundant Elements," the disclosure of which is incorporated herein by reference in its entirety.

Figure 15:
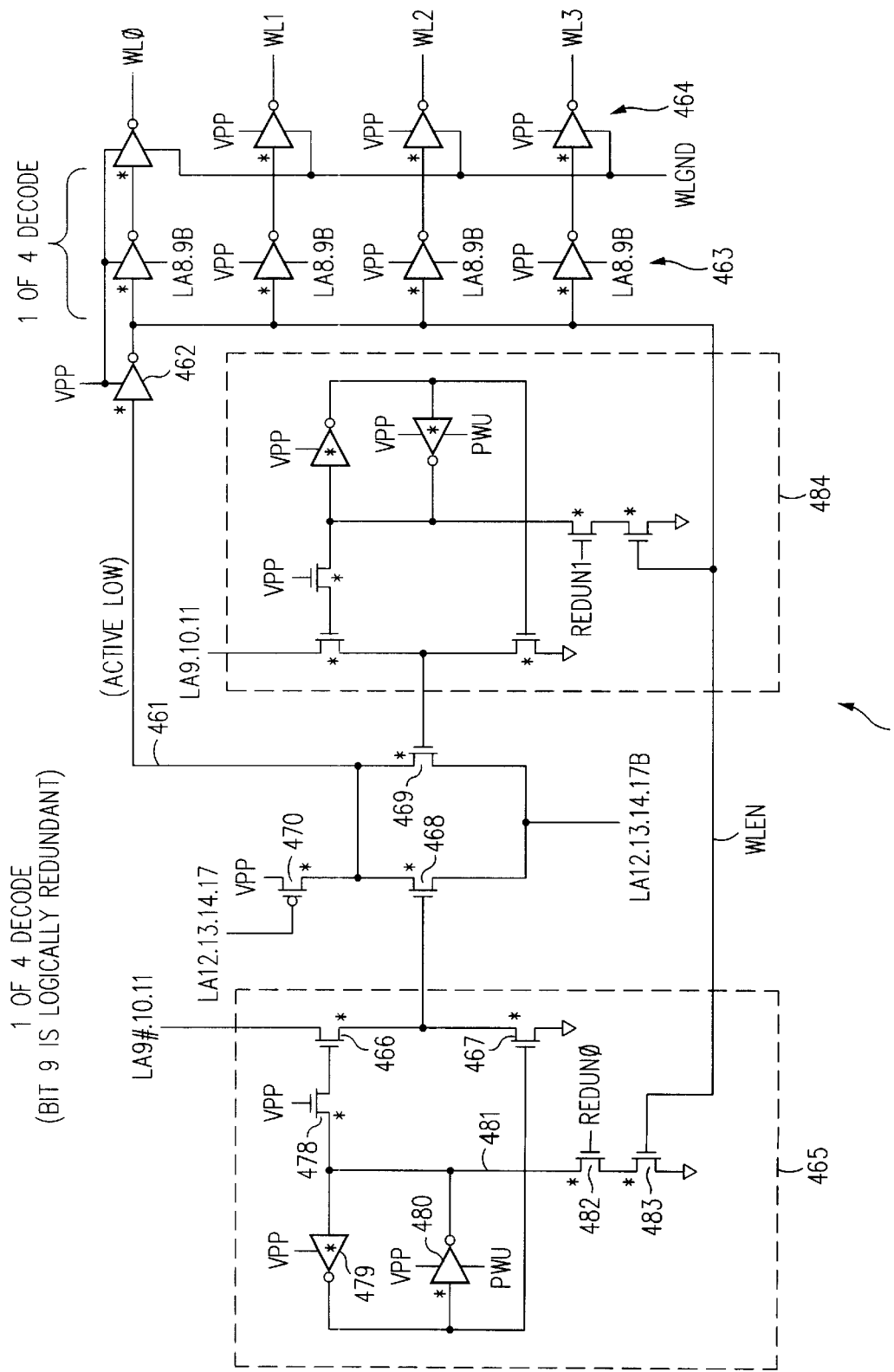
FIG. 15 is a schematic diagram of another embodiment of a row address decoder portion for driving four word lines which is conceptually similar to that shown in FIG. 14, but which includes a one-to-four decoder in the final word line buffers and two redundancy flip-flops useful for replacing pairs of word lines.

The lower power supply connection of buffer 448 is taken to a control signal WLGND which during normally operation is driven to VSS by a low impedance circuit. However, during power-up (i.e., during an internally controlled power-up sequence), the signal WLGND is driven high to VDD for a predetermined amount of time. Consequently, all word lines are driven high by the respective N-channel pull-down transistor within buffer 448 (not explicitly shown) which is normally used to "ground" the respective word lines. By holding major precharge and array select signals in a pre-charge state (in most cases forced to VDD), and by forcing the bit line equilibrate voltage (e.g., VBLEQ shown in FIG. 7) to VSS, all memory cells are initialized to VSS, as is described in greater detail below. Virtually all the transistors in this decoder 43 are indicated as being high voltage transistors Because the area required for a separate decode node and redundancy flip-flop may preclude such a row decoder 440 matching the word line pitch requirements of a memory array, FIG. 15 shows an embodiment of a final row decoder 460 for driving four word lines which is conceptually similar to that shown in FIG. 14, but which includes a one-to-four decoder in the final word line buffers and two redundancy flip-flops useful for replacing pairs of word lines (rather than single word lines). The particular address signals shown in the figure are, of course, arbitrary but are drawn to match the pre-decoded local address signals described in FIG. 13.

In normal operation, each decode node 461 is precharged high to VPP by transistor 470 whenever the pre-decoded local address signal LA12.13.14.17 is low (inactive). A level-shifting circuit (such as the one which generates node 453 in FIG. 14) may be employed to drive the gate of transistor 470 if the pre-decoded local address signal LA12.13.14.17 is a VDD level signal. Each single decode node 461 serves four separate word lines WL0, WL1, WL2, and WL3. When one of the four word lines is to be selected, the local address signal LA12.13.14.17B connected to the sources of transistors 468 and 469 is brought low (for the selected decoder), and the decode node 461 is discharged from VPP to VSS by either transistor 468 or 469 (which has a particular one of the eight local address signals LA9.10.11 coupled to its respective gate). The decode node 461 is then inverted by buffer 462 to generate an active high WLEN signal which is driven to VPP. A final one-of-four decode is implemented by a group of four switched buffers 463, each with a particular one of the four active-low pre-decoded local address signals LA8.9B serving as the respective "VSS" connection. A group of four respective buffers 464 then drives each respective word line WL0, WL1, WL2, and WL3.

Two redundancy flip-flop circuits 465 and 484 are provided to disable normal (i.e., non-redundant) word lines in adjacent pairs. In normal operation, inverters 479 and 480 implement a first flip-flop which is initialized at power-up so that node 481 is high. Consequently, transistor 478 drives the gate of transistor 466 high to a voltage of VPP–$V_T$ (e.g., drives the gate of transistor 466 to "a threshold below VPP"). When one of the normally low pre-decoded local address signals LA9.10.11 is driven high, the gate of transistor 466 bootstraps to pass the full VDD level voltage onto the gate of transistor 468 with little delay to discharge the decode node 461. However, whenever a first redundant row decoder responds to a particular row address, and address bit A9 within the particular row address is a logical "0", then a redundant row enable signal REDUN0 is driven high. During the first cycle after powerup which receives this particular row address (including A9=0), the WLEN signal within the selected decoder is driven high. Consequently, transistors 482 and 483 are both conductive since the regular decoder is selected (node WLEN is high) and a redundant row decoder also selected (signal REDUN0 is high), which discharges node 481 (overpowering inverter 480 briefly) and sets the flip-flop (479,480) with node 481 low. As a result, transistor 466 is held off, transistor 467 is held on, the gate of transistor 468 held at VSS, and the decoder 460 is prevented from ever again responding to this particular row address (with A9=0). The first redundant row decoder is now the only decoder ever again responding to that particular row address.

Redundancy flip flop circuit 484 is identical in structure, but receives a different one of the eight pre-decoded local address signals LA9.10.11 (responding to the same A10 and A11 address but the opposite A9 address) and receives a redundant row enable signal REDUN1 from a second redundant row decoder. The two pre-decoded local address signals received by flip-flops 465 and 484 are chosen to reflect the same pre-decode of bits address 10 and 11 (reflecting a one-of-four decode) but reflecting a complementary address bit 9. This address bit 9 (along with address bit 8) is also pre-decoded and forms the basis of the one-of-four decode within buffers 463. The presence of address bit 9 within the pre-decoded local address signals LA9.10.11 is a consequence of layout pitch realities, the use of a single decode node 461 shared by four word lines, and the desire to replace defective word lines by redundant word lines in groups of two, not in groups of four. (Replacing single word lines would be preferred but may be difficult to achieve due to layout constraints.) Conceptually, one may view pre-decoded local address signals LA9.10.11 as a group of four pre-decoded signals (using A10 and A11) which implement a one-of-four decode if each signal is connected to a single decoder 460, but wherein each of the four signals is actually implemented as two signals—one signal reflective of address bit A9 being a logic 1 (and indicated as LA9.10.11), and the other reflective of address bit A9 being a logic 0 (which is indicated as LA9#.10.11). Alternatively, if replacing defective word lines in groups of four is acceptable, the address bit 9 may be removed from the pre-decoded LA9.10.11 signals, and only a single flip-flop circuit 465 and a single redundant row enable signal REDUN0 need be used.

Figure 16:
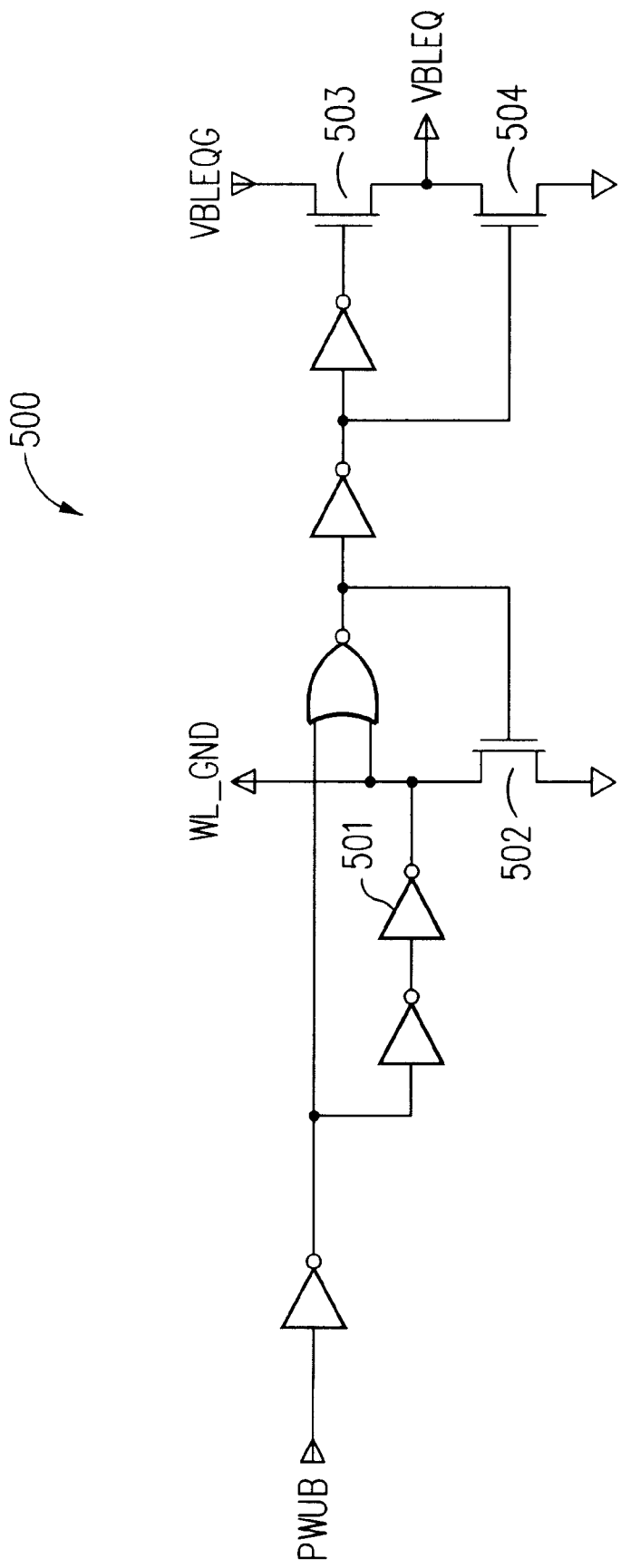
FIG. 16 is a schematic diagram of a support circuit for the row decoder shown in FIG. 15 which during power-up disables all row lines and drives the common bit line equilibrate node to VSS.

FIG. 16 is a schematic diagram of a power-up circuit 500 useful for the row decoder embodiments shown in FIG. 14 and FIG. 15 which during power-up turns on all row lines and drives the common bit line equilibrate node to VSS. During power-up, the control signal PWUB received by circuit 500 is low, and consequently the WLGND signal is driven high by inverter 501 (thus causing all word lines to go high, as described above), transistor 503 is held off, and transistor 504 grounds the bit line equilibrate line VBLEQ. Since the various equilibrate signals and array select signals are held high during power-up, the bit lines are thus driven to the ground voltage on the VBLEQ node and all memory cells are written with a "low" (which, of course, may appear as either a logic "0" or a logic "1" depending on whether the cell is connected to a true or complement bit line). At the conclusion of the "power-up sequence, the control signal PWUB goes high, large transistor 502 turns on to provide a low impedance ground to the final word line buffer within each row decoder, transistor 504 is held off, and transistor 503 is turned on and couples an internally generated voltage received on VBLEQG (having a typical value of around 1.0 volts) to the bit line equilibrate node VBLEQ.

Figure 17A:
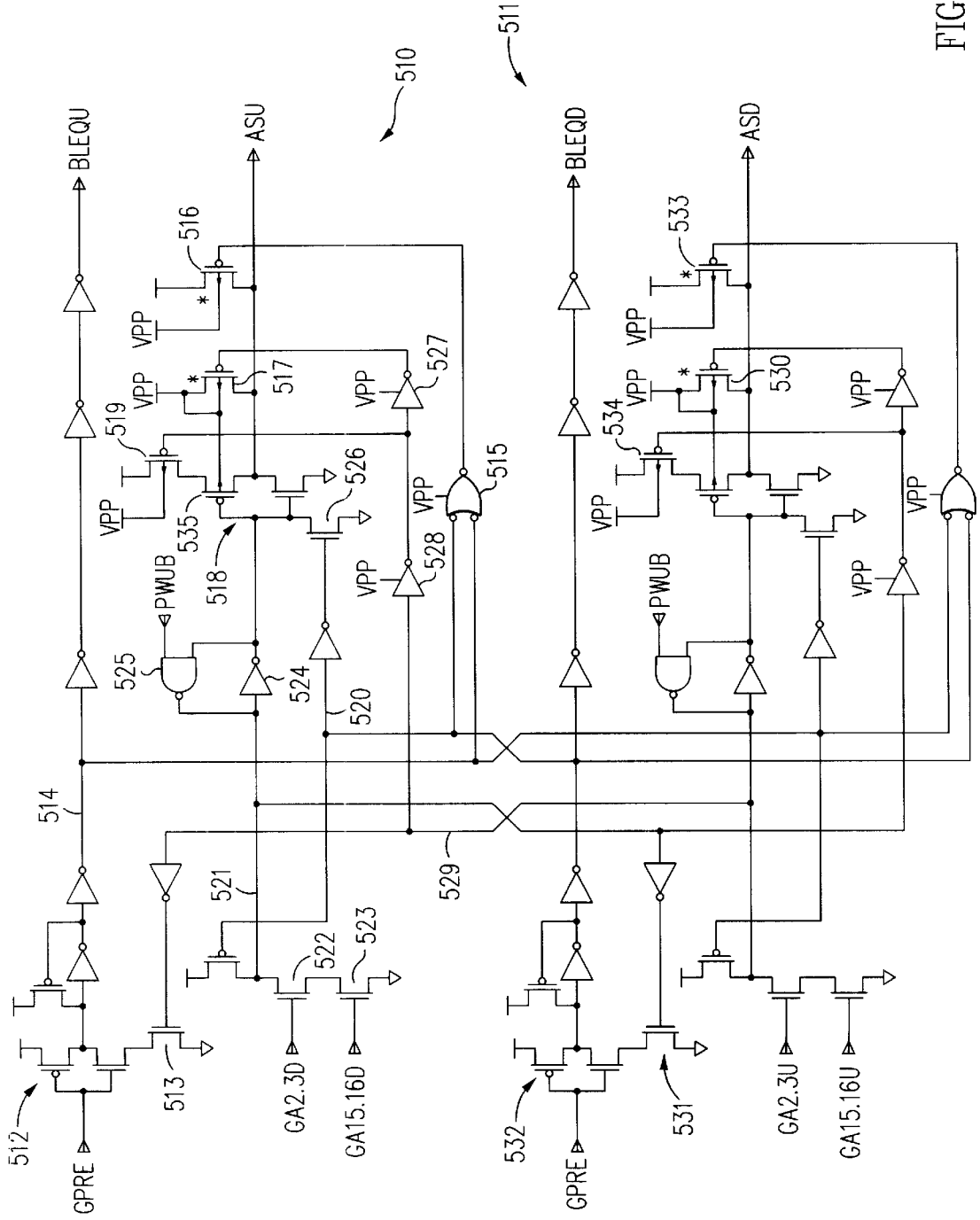
FIG. 17A is a schematic diagram of a circuit which generates the upper and lower pulsed equilibrate signals and the upper and lower array select signals for a row of sense amplifiers within a given hole between array blocks.

FIG. 17A is a schematic diagram of a circuit which generates the upper and lower pulsed equilibrate signals and the upper and lower array select signals for a row of sense amplifiers within a given hole between array blocks. Two symmetrical circuits 510 and 511 are shown to respectively generate the upper and lower signals. The operation of both may be understood by a description of the upper circuit 510. Between active cycles, the global precharge signal GPRE received by inverter 512 is low, and consequently node 514 is high, and the upper pulsed equilibrate signal BLEQU is low. Node 521 was precharged high by an earlier low-going pulse on node 520 (which is now high). Inverter 524 drives its output node 518 low, while transistor 519 (whose gate is held low by level-shifting inverter 528) is also conductive. Together these two fairly small transistors 519 and 535 weakly maintain the upper array select signal ASU at VDD. Inverter 527 holds transistor 517 off, and level-shifting "AND" gate 515 (described in greater detail below) holds transistor 516 off. As previously noted, the "body" or "well" connection for all PMOS transistors is tied to VDD, unless otherwise indicated. As specifically indicated, the body terminal of transistor 516 is connected to VPP, rather than its own source potential, VDD, so that the drain node ASU may be boosted above VDD without forward biasing the drain-to-body junction.

During an active cycle, global pre-decoded address signals GA2.3D and GA15.16D are received by transistors 522 and 523, respectively, which represent the particular ones of the pre-decoded global address signals GA2.3 and GA15.16 used to select the array block below the row of sense amplifiers within the given hole. If the array block below the row of sense amplifiers is to be selected, then transistors 522 and 523 turn on to discharge node 521, inverter 524 drives node 518 high, and inverter 518 quickly turns off the upper array select signal ASU. The falling node 521 also causes moderately-sized transistor 530 in the lower circuit 511 to turn on, thus driving the lower array select signal ASD toward VPP moderately quickly. Moreover, the gate of transistor 531 is driven high to "arm" inverter 532 to respond to a high-going pulse on the global precharge signal GPRE.

Near the end of an active cycle as the selected word line is returning to ground, the rising edge of the global precharge signal GPRE arrives, inverter 532 responds, node 520 is driven low, and the lower pulsed equilibrate signal BLEQD is driven high. Transistor 526 is also turned on, which then quickly turns off the N-channel pull-down transistor within inverter 518. At about the same time, level-shifting "AND" gate 515 turns on transistor 516 to charge the upper array select signal ASU back up to VDD in preparation for the next cycle. Node 520 going low also precharges node 521 high, which then enables the weak current source (transistor 519 and the P-channel transistor within inverter 518) which maintains the upper array select signal ASU at VDD. In the lower circuit 511, node 520 going low and node 521 going high also causes transistor 530 to turn off and transistor 533 to turn on, which drives the lower array select signal ASD down from VPP back to VDD. Since node 529 was never discharged during this exemplary cycle, transistor 513 is off and inverter 512 does not respond to the rising edge of the global precharge signal GPRE.

When the global precharge signal GPRE goes back low (i.e., at the end of the pulse on GPRE), the output of inverter 532 switches high (even more quickly because transistor 531 is already off), node 520 is driven high, and the lower pulsed equilibrate signal BLEQD is terminated (brought low). Because node 520 switches back high, the output of level-shifting "AND" gate 515 is driven to VPP and turns off transistor 516. The upper array select signal ASU had been brought quickly from VSS to VDD by the rather large transistor 516 which is now off, and then is weakly held at VDD by transistors 519 and 535 so that it may be discharged quickly at the start of the next cycle without having to first discharge the gate node of a large P-channel device, nor without wasting much charge through a large inverter during the transition of such a large inverter. NAND gate 525 is used to ensure that the upper array select signal ASU is held high, even if only weakly so, during power-up when the signal PWUB is low. Analogous transistors in all such circuits ensure that all such array select signals are also held high during power-up.

FIG. 17B is a schematic diagram of an embodiment of the level-shifting inverter circuit 528 useful for the circuitry shown in FIG. 17A. When the input signal IN goes low, node 902 is pulled low through transistor 901. This momentarily over-powers P-channel transistor 903 until its gate (output node 906) is pulled high by transistor 904. When the input signal IN goes high, the output node 906 is pulled low by transistor 905 (briefly over-powering transistor 904). Transistor 901 shuts off and allows cross-coupled P-channel transistor 903 to pull node 902 all the way up to VPP, thereby turning off transistor 904. After briefly over-powering the respective P-channel transistor upon a transition of its input signal IN, there is no significant standby current in either logic state.

FIG. 17C is a schematic diagram of an embodiment of the level-shifting AND-gate circuit 515 useful for the circuitry shown in FIG. 17A. Two circuit blocks similar to the level-shifting inverter 528 receiving respective input signals A and B are combined, with a NAND configuration of transistors 915 and 916 (in place of the single transistor 905) pulling the analogous output node 917 down, which is followed by an inverter to generate an overall AND function at the output node 918. The internal operation of the level-shifting AND gate 515 is analogous to that described for the level shifting inverter 528.

FIG. 17D is a schematic diagram of another embodiment of the level-shifting AND-gate circuit 515 useful for the circuitry shown in FIG. 17A. Its operation may be easily appreciated by one skilled in the art, given the teaching described above for the level-shifting inverter 528 shown in FIG. 17B and the level-shifting AND gate 515 shown in FIG. 17C.

Figure 18:
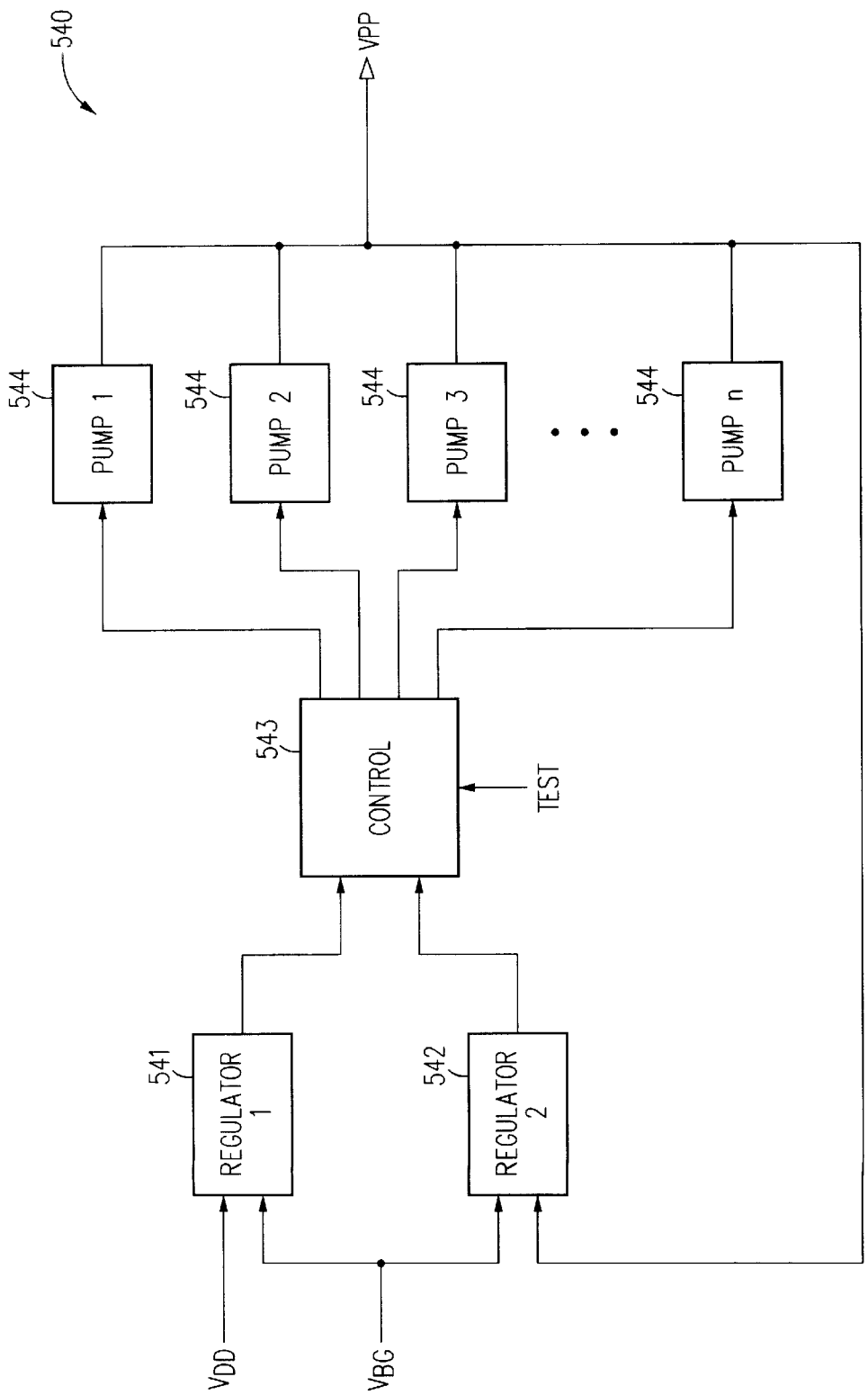
FIG. 18 is a block diagram of a preferred embodiment of the VPP generator which produces a substantially fixed voltage, usually above VDD for most process corners, which is referenced to VSS.

FIG. 18 is a block diagram of a preferred embodiment of a VPP generator useful for the various circuits described herein, which produces a substantially fixed voltage, usually above VDD for most process corners, which is referenced to VSS. Before describing the actual circuit, some background information about the design requirements of such a VPP circuit are warranted. In the embodiments described herein, the VPP voltage is used to drive the selected word line from VSS to VPP, and to raise the two selected array select signals (one just above and one just below the selected array block) from VDD to VPP. Since the array select signal lines are substantially higher in capacitance than a selected word line, the charge needed to boost the selected array signal lines is illustrative. At high VDD of, for example, 2.9 volts (assuming a nominal VDD value of 2.5 volts and a nominal VPP value of 4.0 volts) the array select signal line must be boosted from 2.9 volts to 4.0 volts (for a total of 1.1 volts), whereas at a low VDD of, for example, 2.1 volts, the array select signal line must be boosted all the way from 2.1 volts to 4.0 volts (for a total of 1.9 volts)—almost twice as much!

For most two-stage charge pump style circuits having no threshold loss (which circuits are well known in the art), the charge transferred per pump cycle is approximately equal to C·(2·VDD−VPP), where C is the capacitance of the pump capacitor. If VPP=4.0 volts and VDD=2.9 volts, the charge per cycle is equal to C·(5.8−4.0)=1.8·C. If, instead, VDD=2.1 volts, then the charge per cycle is equal to C·(4.2−4.0)=0.2·C. Thus, at high VDD, the charge provided by a single capacitor pump circuit is 9 times that at low VDD. Yet at high VDD, the array select lines need to be boosted less than at low VDD. Only about 58% as much charge would be needed at high VDD as at low VDD, but the pump circuit provides nine times as much charge at high VDD as at low VDD. A properly sized capacitor for low VDD would be 15× larger than a properly sized capacitor at high VDD. A capacitor sized to provide the correct charge at low VDD would generate far too much increase in VPP voltage per pump cycle at high VDD. Conversely, a capacitor sized to provide the correct charge at high VDD would only provide about 6% of the charge required at low VDD.

To prevent these and other problems, the VPP generator 540 shown in FIG. 18 includes a plurality of pump circuits 544, each connected to the output VPP, and each controlled by a common control circuit 543. Each such p ump circuit 544 is enabled to pump according to the amount of charge which is needed at a particular time, based on the measured level of both VDD and VPP. A first regulator 541 compares various fractions of the VDD voltage to an internally generated bandgap voltage VBG, while a second regulator 542 compares various lower fractions of the VPP voltage to the bandgap voltage VBG. Such regulator circuits may be implemented, for example, as a plurality of sensing circuits, each comparing VDD (or VPP) or a resistively-divided fraction thereof to a respective plurality of reference voltages (each derived from a bandgap voltage or a linear multiple or fraction thereof). Additional sensing circuits reduces the granularity of the measurement. Conversely, such regulator circuits may also be implemented, for example, as a plurality of sensing circuits, each comparing a bandgap reference voltage (or a linear multiple or fraction thereof) to a respective plurality of resistively-divided fractions of VDD and/or VPP.

Both regulators provide outputs to the controller 543. If VDD is low, then more of the pump circuits 544 are enabled for a given cycle. As VDD increases, fewer such pump circuits 544 are enabled. Similarly, if VPP is particularly low (such as during power-up), then all the pump circuits are enabled, while if VPP is already high enough, then none of the pump circuits 544 are enabled. In a preferred embodiment, none of the pump circuits 544 are enabled if VPP exceeds 4.0 volts, while all of the pump circuits 544 are enabled if VPP is less than 3.8 volts. Between 3.8 and 4.0 volts, the measured values of both VPP and VDD determine how many pump circuits are enabled.

For a given VPP and VDD voltage there are a fixed number of pumps enabled. As VDD increases slightly, the charge per cycle increases, even though the same number of pump circuits are enabled, because the VDD is increasing. However, as VDD further increases slightly, one less pump is enabled, so the charge per cycle abruptly decreases. Then as VDD further increases, the charge per cycle again increases because VDD is increasing. When plotted as a function against VDD, the charge per pump cycle thus appears as a sawtooth waveform, which decreases abruptly as each such pump circuit 544 is successively disabled. The pump circuits 544 are preferably not uniformly sized, but instead each size determined individually so that the charge per pump cycle, when plotted as a sawtooth waveform against VDD, varies from min-to-max as little as possible over the range of VDD.

A significant amount of internal de-coupling (i.e., filtering) capacitance on the VPP node is provided by the various row decoder and array select circuits which are unselected during a given cycle. For example, the last two buffers within each row decoder provide in aggregate a large effective capacitance. Referring briefly again to FIG. 14, an unselected row decoder 440 has node 452 held at ground by buffer 446. The P-channel transistor within buffer 447 is biased deeply in the linear region, and virtually all its channel capacitance, as well as its gate-to-drain and gate-to-source overlap capacitance, is effectively biased with VPP-to-VSS potential across the capacitors. Moreover, the N-channel transistor within buffer 448 has VPP on its gate and holds the unselected word line at VSS, and is therefore also biased deeply in the linear region. Virtually all of its channel capacitance, as well as its gate-to-drain and gate-to-source overlap capacitance, serve as filter capacitors for VPP. In addition, the gate-to-drain overlap capacitance of both the N-channel transistor within buffer 447 (whose gate is held to VSS and whose drain is held to VPP) and the P-channel transistor within buffer 448 (whose gate is held to VPP and whose drain is held to VSS) provide additional bypass capacitance. Taken together, such capacitances provide a significant reservoir of charge on the VPP node without requiring separate devices or structures. For one memory bank (which contains a total of 4096 word lines), the capacitance of the VPP node to VSS may be about 400 pF. The capacitance of one word line may be about 1.5 pF and the total capacitance of the two selected array select lines driven to VPP may be about 7.5 pF. The charge removed from VPP to boost the two selected array select lines from VDD to VPP (nominally 4.0 volts) and to boost the selected word line from VSS to VPP may be about 20 pC ("pico-coulombs") at VDD=2.1 volts. Thus, if no charge were added by the charge pump circuit, one active memory cycle will reduce the VPP voltage by about 50 mV. The pump circuit is responsible for supplying about the right amount of charge to first establish, and then to maintain, the VPP level at the desired voltage of 4.0 volts.

Nonetheless, VPP may still "wander" in voltage slightly depending on the frequency and interval between various cycles, in spite of the regulators 541 and 542 within VPP circuit 540. Consequently, a test control signal TEST is received by the control circuit 543 to decrease the regulated value of VPP by a small amount (e.g., 200 mV) when in certain test modes to ensure reliable operation of the memory device when VPP is actually lower than the minimum expected VPP voltage. By using such test modes, adequate operating margins for normal operation may be more easily assured.

Figure 19:
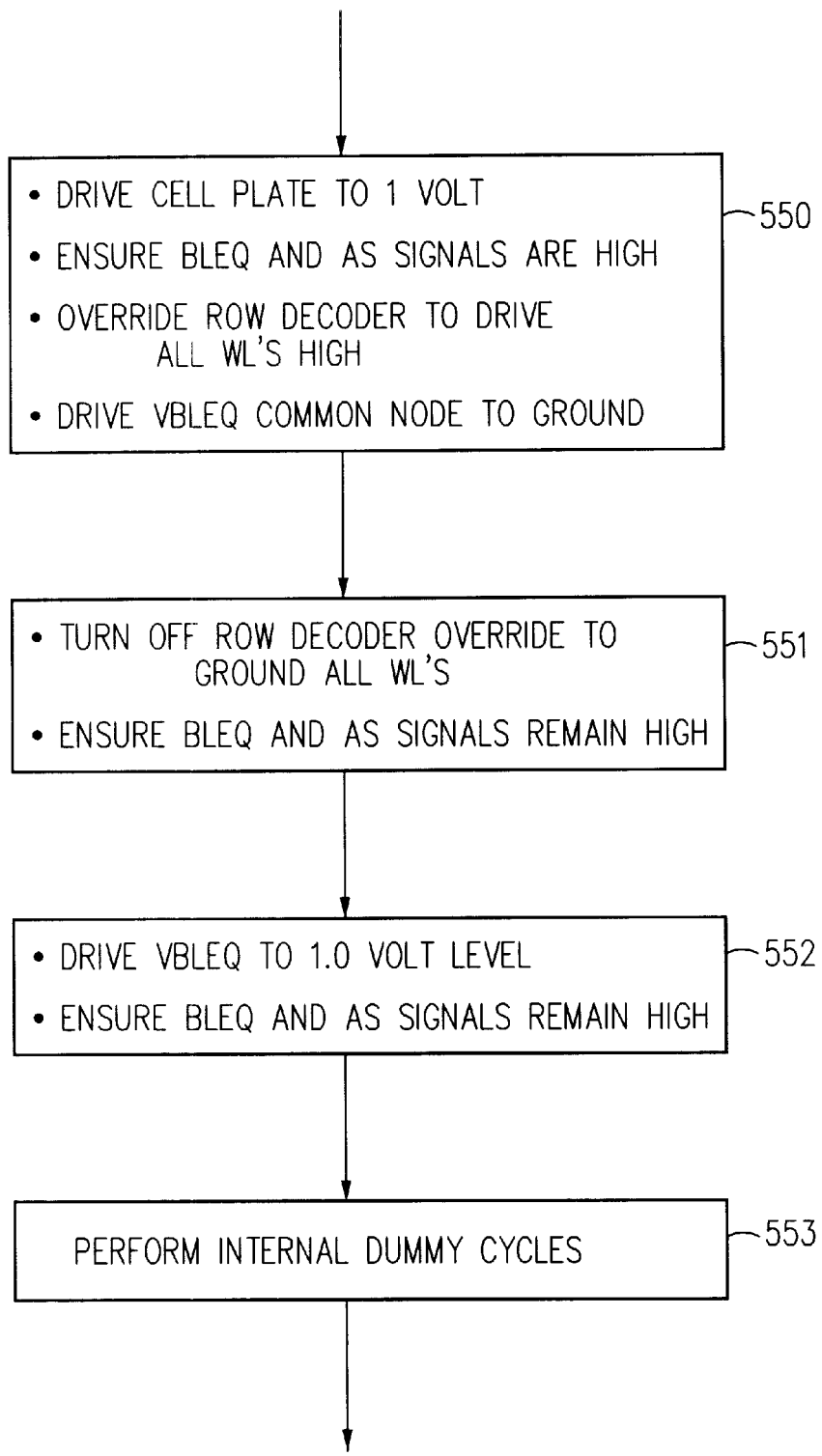
FIG. 19 is a flow chart diagram of a preferred embodiment of the power-up sequence for initializing all memory cells to a known data state.

FIG. 19 is a flow chart diagram of a preferred embodiment of the power-up sequence for initializing all memory cells to a known data state. At step 550, several actions occur in parallel. The memory cell plate within the memory array is driven toward the desired bit line equilibration voltage (preferably around 1.0 volts) to established its voltage at the eventual bit line equilibration voltage. In doing so the cell plate is driven weakly (being careful to limit the current flow which charges the cell plate to an amount less than the output current of the substrate bias charge pump) to prevent the increasing voltage of the memory cell plate and the resultant increasing voltage of the memory cell storage nodes from coupling the substrate positive and causing massive latchup. The row decoders are overridden to allow every word line to simultaneously go high. Moreover, the bit line equilibration voltage VBLEQ is forced to VSS, and the bit line equilibrate signals and array select signals are ensured to be high (typically at VDD). These actions need not be initiated in any particular order, but all four preferably occur simultaneously for a predetermined time. Consequently, since the bit line equilibrate signals are held high and the bit line equilibration voltage VBLEQ is held low, both true and complement internal sense amplifier nodes are then coupled to a common node at VSS by precharge (i.e., equilibrate) signals.

Since the array select signals are also held high, each bit line (both true and complement) is thus driven to VSS and all memory cells likewise are written with a "low" (which, of course, may appear as either a logic "0" or a logic "1" depending on whether the cell is connected to a true or complement bit line), even if the word lines are only slightly higher than a threshold voltage above VSS.

At step 551 the override to the row decoders is turned off, and the word lines are allowed to return to VSS (while ensuring that the array select signals and bit line equilibrate signals remain high). This "saves" the written low voltage in each memory cell. Then, at step 552, the bit line equilibrate voltage is driven to its normal level which, for a preferred embodiment, entails driving the VBLEQ signal to its desired level of about 1.0 volts (while again ensuring that the array select signals and bit line equilibrate signals remain high). Then, when more normal cycles begin, the very first operation in the memory array occurs with memory array nodes (bit lines, cell plate) properly established, and all memory cells initialized at one of the two valid states (in this case, a valid low level). The first cycles do not have to try to sense memory cells having an initialized voltage near the bit line equilibration voltage, as would likely occur without such a power-up sequence due to coupling from the memory cell plate to the memory cells themselves as the memory cell plate reaches its normal level at the bit line equilibration voltage. If the voltage of many memory cells were permitted to be halfway between a low and a high level, sense amplifiers attempting to sense and restore such memory cells could be in a meta-stable state during sensing for some considerable amount of time. This would decrease the high level written into the memory cell to a voltage lower than normal, possibly causing a malfunction.

The first "normal" cycles may actually be internally controlled and part of the power-up sequence. At optional step 553, a series of internal "dummy" cycles (or conditioning cycles) may be performed to more faithfully initialize any internal nodes not already so initialized, to establish a bit line equilibrate voltage identical to that resulting from normal operation, and to cycle through the row decoders to provide an opportunity for any programmed redundant word lines (which may have been programmed during manufacture to respond to a particular address) to disable the regular row decoder associated with the defective address before the defective element has a chance to interfere with normal operation after power-up.

Figure 20:
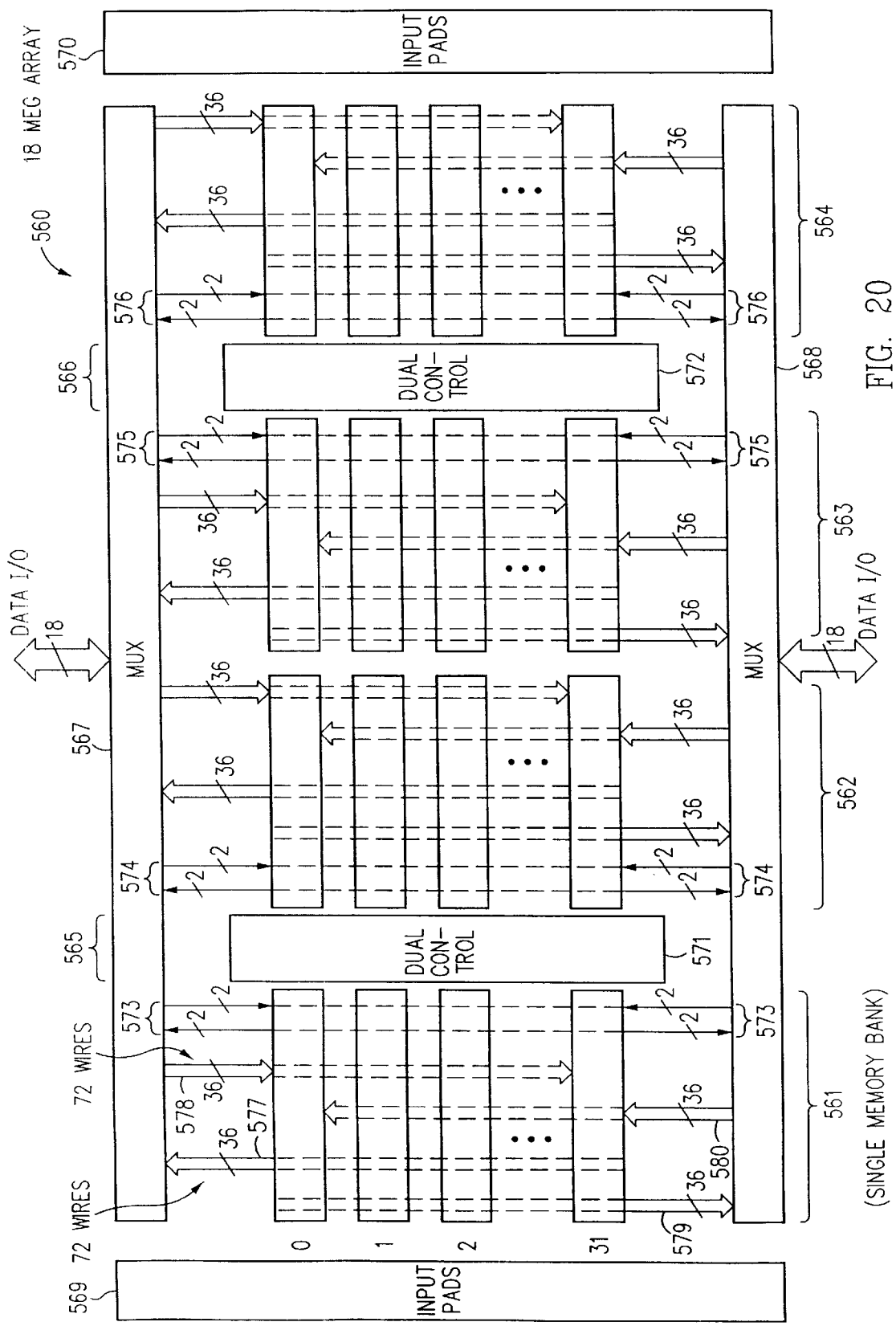
FIG. 20 is a block diagram of an embodiment having a memory array with four distinct memory banks, having a first row decoder block between the first and second memory banks, and having a second row decoder block between the third and fourth memory banks.

FIG. 20 is a block diagram of an exemplary embodiment of an 18 MBit memory array 560 with four separate memory banks 561, 562, 563, and 564, having a first dual control block 571 between the first memory bank 561 and the second memory bank 562, and having a second dual control block 572 between the third memory bank 563 and the fourth memory bank 564. Each memory bank 561, 562, 563, 564 includes thirty-two array blocks, each including 128 horizontally-arranged rows (i.e., word lines) and 1152 (1024×9/8) vertically-arranged columns (not including redundant rows and columns). Each column is implemented as a complementary folded bit line pair, and sense amplifiers and other supporting circuits within the holes between array blocks are as described above. Four independent row decoders, each with its own local address bus, are provided respectively for the four banks, and are physically arranged in two pairs. The first pair of row decoders are included in the dual control block 571 located within a first spline 565 between the left pair of memory banks (561, 562), and the second pair of row decoders are included in the dual control block 572 located within a second spline 566 between the right pair of memory banks (563, 564).

A first group of redundant columns 573 is located adjacent to spline 565 at the end of each array block within memory bank 561, and a second group of redundant columns 574 is located adjacent to spline 565 at the end of each array block within memory bank 562. Similarly, a third group of redundant columns 575 is located adjacent to spline 566 at the end of each array block within memory bank 563, and a fourth group of redundant columns 576 is located adjacent to spline 566 at the end of each array block within memory bank 564. Each group of redundant columns is preferably implemented by including an additional block 255 (i.e., the $33^{rd}$ block 255) of 32 complementary bit line pairs, which includes two sets of global I/O lines, such as is shown in FIG. 4 and FIG. 5. However, unlike the normal (non-redundant) global I/O lines, both of the two redundant global I/O lines within each memory bank exit both the top and bottom of the memory array, as shown. A first multiplexer 567 is located at the top of the memory array 560, which directs (e.g., during a read cycle) 18-bits of data received from one of the memory banks 561, 562, 563, or 564 (representing, for example, the upper half of a 36-bit data word corresponding to the address of the given cycle) to the data input/output buffers at the top of the memory array 560. A second multiplexer 568 is located at the bottom of the memory array 560, which similarly directs 18-bits of data received from one of the memory banks 561, 562, 563, or 564 (representing, for example, the lower half of a 36-bit data word corresponding to the address of the given cycle) to the data input/output buffers at the bottom of the memory array 560.

Within each memory bank (e.g., bank 561), write data may be conveyed from the top data multiplexer 567 to the memory bank 561 by thirty-six separate pairs of differential global input lines 578, and write data may be conveyed from the bottom data multiplexer 568 to the memory bank 561 by thirty-six separate pairs of differential global input lines 580.

Read data may be conveyed from memory bank 561 to the top data multiplexer 567 by thirty-six separate pairs of differential global output lines 577, and read data may be conveyed from memory bank 561 to the bottom data multiplexer 568 by thirty-six separate pairs of differential global output lines 579. During a read cycle of memory bank 561, either 36-bits of data (representing a "single word" of data) may be driven onto the respective global output lines (18-bits to the top multiplexer 567, 18-bits to the bottom multiplexer 568) for conveyance to the appropriate output buffers, or 72-bits of data (representing a "double word" of data) may be driven onto the respective global output lines (36-bits to the top multiplexer 567, 36-bits to the bottom multiplexer 568), 36-bits for conveyance to the appropriate output buffers during one cycle, and the remaining 36-bits for conveyance to the appropriate output buffers during the next cycle (as is described in greater detail below). If there were no column redundancy, the multiplexers 567, 568 would each be an 18×8:1 (i.e., 144:18). But each bank has two redundant global I/O lines (i.e., four physical wires per each global I/O line), each of which can be mapped to serve any of the eighteen data I/O buffers at the top or any of the eighteen data I/O buffers at the bottom of the memory array. Therefore, each memory bank can provide data to a single horizontal global data bus line from any of four sources: from a corresponding bit within the upper word (of a 72-bit double word), from a corresponding bit within the lower word (of the same 72-bit double word), from a first redundant column, or from a second redundant column.

Input pads for the addresses and various control signals (not shown) are generally located in either input pad block 569 to the left of memory array 560, or input pad block 570 to the right of memory array 560. Most data I/O pads (not shown in FIG. 20) are located at the top or bottom of the memory array 560, with some located within input pad blocks 569, 570 if sufficient area is unavailable at the top and bottom of the device.

Figure 21:
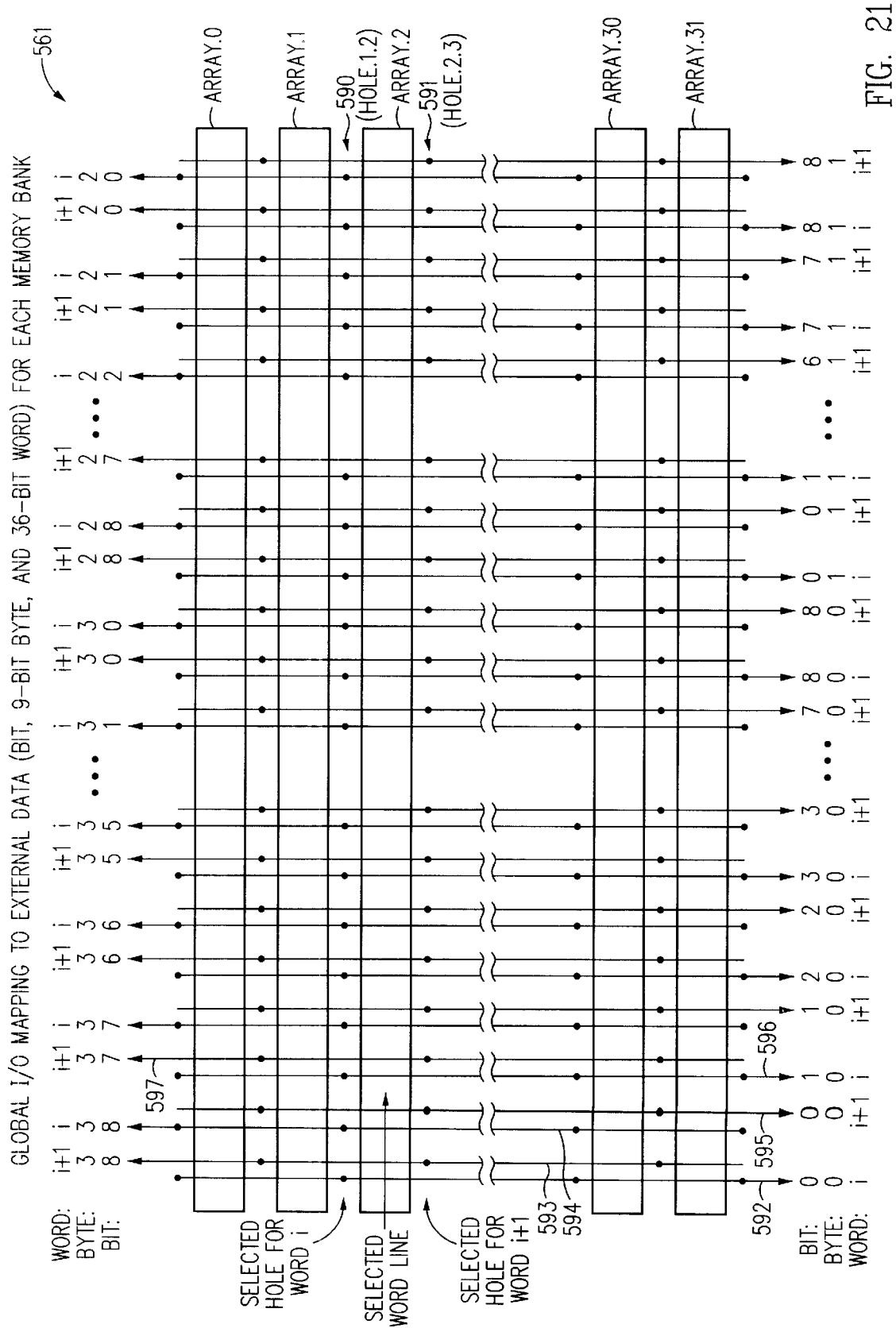
FIG. 21 is a block diagram of a memory bank within the embodiment shown in FIG. 20, illustrating an arrangement of global I/O lines providing a full 36-bit word while activating only one hole between array blocks, and two 36-bit words if two adjacent holes are activated, and which also allows reducing the length of the worst case global data bus.

FIG. 21 is a block diagram of memory bank 561, illustrating a preferred arrangement of global output lines (and analogous global input lines, not shown). In an exemplary cycle a selected word line falls within array block ARRAY.2. To read the memory cells corresponding to a word line within the array block ARRAY.2, the bit line sense amplifiers in hole HOLE.1.2 located above the selected array block (labeled as 590) and hole HOLE.2.3 located below the selected array block (labeled as 591) must both be activated, which should be readily apparent from the above descriptions regarding the earlier figures. A full 36-bit word may be driven onto thirty-six of the seventy-two global output lines by enabling only one of these two holes for driving its global output lines (which saves considerable power). In such a case, eighteen of the bits are conveyed onto global output lines which exit the memory bank 561 at the top, while the remaining eighteen bits are conveyed onto other global output lines which exit the memory bank 561 at the bottom. The "dots" in FIG. 21 indicate a connection between a local I/O read/write block (each serving, for example, a group of sixteen bit line sense amplifiers, as illustrated in FIG. 10) and the global output line passing overhead. For example, the row of local I/O read/write blocks within the hole HOLE.1.2 are connected to global output lines 592, 594, 596 it (and others as indicated). As can be discerned, global output line 594 is one of eighteen global output lines which are coupled to a local I/O read/write block within hole HOLE.1.2 and which exit the memory bank at the top, whereas global output line 592 is one of eighteen other global output lines which are coupled respectively to a local I/O read/write block within hole HOLE.1.2 and which exit the memory bank at the bottom. As the adjoining table at the top and bottom of FIG. 21 makes clear, each of the 36-bits of a single data word (i) is conveyed either to the top or bottom of the memory bank 561 by enabling only the global output circuits within a single hole HOLE.1.2. In particular, bits 0–8 of byte 0 and bits 0–8 of byte 1 are conveyed to the bottom of the memory bank, while bits 0–8 of byte 2 and bits 0–8 of byte 3 are conveyed to the top of the memory bank. Conversely, enabling only the global output circuits within the single hole HOLE.2.3 conveys a different 36-bit data word (i+1) from the memory array. Nonetheless, bits 0–8 of byte 0 and bits 0–8 of byte 1 of this data word (i+1) are conveyed to the bottom of the memory bank, while bits 0–8 of byte 2 and bits 0–8 of byte 3 of this data word (i+1) are conveyed to the top of the memory bank.

Conversely, two full 36-bit words may be driven onto seventy-two corresponding global output lines by enabling the read amplifiers in both of the two holes above and below the selected array block for driving its global output lines (e.g., by driving in both holes the selected one-of-eight column select signals CS.X, the selected one of the left/right read select signals READ_L or READ_R, and the non-decoded READ signal, all shown in FIG. 10, which traverse through each hole).

As in the case above, and in all cases, both holes are also enabled for bit line sense amplifier sense/restore. In this case, eighteen bits from the first word and eighteen bits from the second word are conveyed onto global output lines which exit the memory bank 561 at the top, while the remaining eighteen bits from the first word and the remaining eighteen bits from the second word are conveyed onto other global output lines which exit the memory bank 561 at the bottom. The row of local I/O read/write blocks within the hole HOLE.2.3 are connected to global output lines 593, 595, 597 (and others as indicated). Referring again to the adjoining table at the top and bottom of FIG. 21, each of the 36-bits of the second data word (i+1) is conveyed either to the top or bottom of the memory bank 561 by enabling the global output circuits within hole HOLE.2.3. In particular, as before, bits 0–8 of byte 0 and bits 0–8 of byte 1 are conveyed to the bottom of the memory bank, while bits 0–8 of byte 2 and bits 0–8 of byte 3 are conveyed to the top of the memory bank.

While the assignment of bit order within a 36-bit or 72-bit parallel access of the memory bank 561 is potentially arbitrary, the assignments shown ensure that a 36-bit single word may be accessed by enabling the local I/O read/write blocks within only one hole to drive its global output lines, and still route 18 of the bits to the top of the memory array (where half the data output buffers are located) and route the remaining 18 bits to the bottom of the memory array (where the other half the data output buffers are located). Of the 36 global output lines exiting the memory array at the bottom, the 18 bits of each word could have been assigned in two contiguous groups, but rather the assignment shown, where the corresponding bits of both word (i) and word (i+1) are adjacent, is preferred. As an example, global output lines 592 and 595 exit at the bottom as adjacent global output lines, and are assigned as bit 0, byte 0, of respective words (i) and (i+1). All 72 global output lines are assigned, as they exit the memory array, as adjacent pairs mapped to the same bit and byte of the two words (i) and (i+1). Each of the memory banks 561, 562, 563, and 564 are preferably arranged identically.

Figure 22:
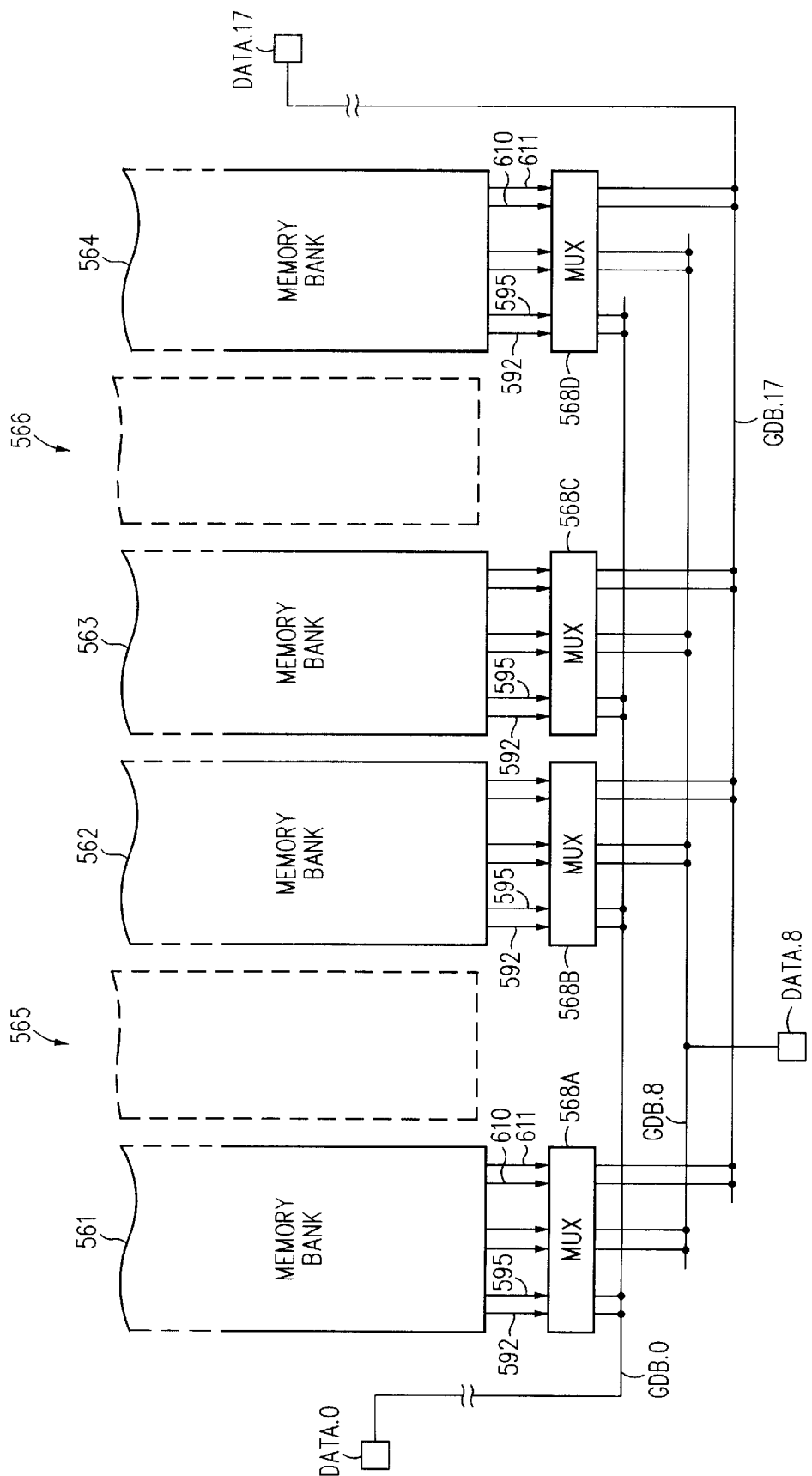
FIG. 22 is a block diagram of the memory array within the embodiment shown in FIG. 20 and using the arrangement of global I/O lines as shown in FIG. 21, particularly illustrating a worst case global data bus having a reduced length.

FIG. 22 is a block diagram of the memory array within the embodiment shown in FIG. 20 using the arrangement of global I/O lines as shown in FIG. 21 to reduce the worst case length of an internal horizontal data bus. Each memory bank 561, 562, 563, 564 is served by a respective multiplexer portion 568A, 568B, 568C, 568D, each of which incorporates an 18-bit×2:1 multiplexer (excluding the redundant columns). The first two global output lines 592, 595 exiting the bottom of memory bank 561 are shown, one of which is conveyed onto global data bus GDB.0 by multiplexer 568A when memory bank 561 is enabled. Likewise, the first two global output lines 592, 595 exiting the bottom of respective memory banks 562, 563, and 564 are also shown, one of which is conveyed onto global data bus GDB.0 by respective multiplexers 568B, 568C, or 568D when the respective memory bank 562, 563, or 564 is enabled.

Global data bus GDB.0 is associated with a data input/output buffer DATA.0 which may be located not at the bottom of the device, but rather "around the corner" and up the left side of the device. Consequently, the length of the global data bus GDB.0 extends for some distance up the left side of the device to reach its buffer DATA.0. If each of the eighteen global data buses extended fully across all four memory banks, global data bus GDB.0 would be longer than with this preferred organization. As shown, the global data bus GDB.0 need not extend across the bottom of memory bank 564 more than necessary to reach the first two global output lines 592,595, since these two global output lines correspond to bit 0, byte 0 for both data words (i) and (i+1).

Similarly, global data bus GDB. 17 is associated with a data input/output buffer DATA.17 which is located "around the corner" and up the right side of the device. Consequently, the length of the global data bus GDB.17 extends for some distance up the right side of the device to reach its buffer DATA.17. As shown, the global data bus GDB.17 need not extend across the bottom of memory bank 561 more than necessary to reach the right-most two global output lines 610,611, since these two global output lines correspond to bit 8, byte 1 for both data words (i) and (i+1).

Using this bit assignment of global I/Os, each global data bus only needs to extend for a length of slightly more than three of the memory banks (rather than all four), plus any additional distance necessary to reach its associated buffer. Moreover, the length of the global data buses is reduced even if all the buffers DATA.x are located below the memory banks (e.g., representative global data bus GDB.8 and associated buffer DATA.8) and none are located around the corner and up the side of the memory array.

Figure 22B:
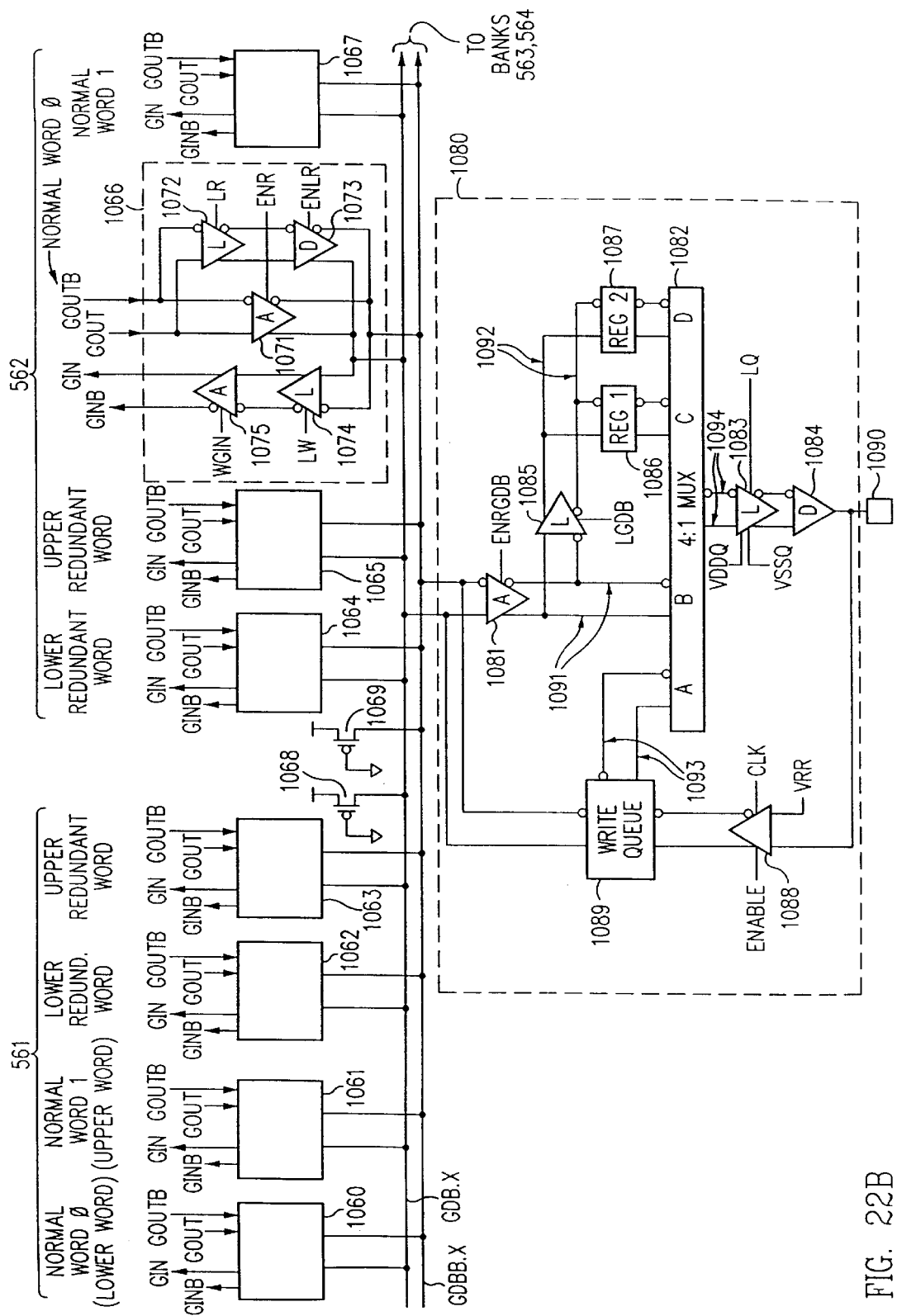
FIG. 22B is a schematic block diagram of an embodiment of the data path between the global I/O lines and the external data output pin which incorporates differential global data bus lines traversing horizontally across the top and bottom of the memory device.

FIG. 22B is a schematic block diagram of an embodiment of the data path between the global I/O lines and the external data output pin which incorporates differential global data bus lines traversing horizontally across the top and bottom of the memory device. In the figure, one such horizontal differential global data bus GDB.X, GDBB.X is shown, which is representative of each of the eighteen global data buses traversing horizontally across the bottom of the memory device. (An analogous structure is found at the top of the memory array, as well, to serve each of the eighteen global data buses traversing horizontally across the top of the memory device.)

Two non-redundant global I/O interfaces 1060, 1061, and two redundant global I/O interfaces 1062, 1063 couple respective global I/O lines within memory bank 561 to/from the global data bus GDB.X, GDBB.X. For the particular one of the eighteen data bits the global data bus GDB.X, GDBB.X corresponds to, the non-redundant global I/O interface 1060 couples the non-redundant global I/O line corresponding to a bit within the lower word (i.e., "word 0") of a 72-bit double word (e.g., global I/O line 592 shown in FIG. 21), and the non-redundant global I/O interface 1061 couples the non-redundant global I/O line corresponding to a bit within the upper word (i.e., "word 1") of the 72-bit double word (e.g., global I/O line 595 shown in FIG. 21). Similarly, the redundant global I/O interface 1062 couples the redundant global I/O line corresponding to a bit within the lower word, and the redundant global I/O interface block 1061 couples to the redundant global I/O line corresponding to a bit within the upper word. (both of which are collective labeled 573, shown in FIG. 20).

Four such global I/O interfaces are included in each of the other three memory banks. In the adjacent memory bank, two non-redundant global I/O interfaces 1066, 1067, and two redundant global I/O interfaces 1064, 1065 couple respective global I/O lines within memory bank 562 to/from the global data bus GDB.X, GDBB.X. For the particular one of the eighteen data bits the global data bus GDB.X, GDBB.X corresponds to, the non-redundant global I/O interface 1066 couples the non-redundant global I/O line corresponding to a bit within the lower word (e.g., analogous to global I/O line 592 shown in FIG. 21), and the non-redundant global I/O interface 1067 couples the non-redundant global I/O line corresponding to a bit within the upper word (e.g., analogous to global I/O line 595 shown in FIG. 21). Similarly, the redundant global I/O interface 1064 couples the redundant global I/O line corresponding to a bit within the lower word, and the redundant global I/O interface block 1065 couples the redundant global I/O line corresponding to a bit within the upper word (both of which are collective labeled 574, shown in FIG. 20).

The global data bus GDB.X, GDBB.X extends to the other two memory banks, 563, 564, as indicated. Although not shown in FIG. 22B, within each of the memory banks 563, 564, two non-redundant global I/O interfaces, and two redundant global I/O interfaces couple respective global I/O lines within each respective memory bank to/from the global data bus GDB.X, GDBB.X. A pair of P-channel "load resistor" transistors 1068, 1069 biases each global data bus near VDD when active, and pulls each of the global data bus lines to VDD when the global data bus is inactive. A data I/O interface 1080 (analogous to data input/output buffer DATA.X in FIG. 6) couples the global data bus GDB.X, GDBB.X to/from the particular external data pin 1090 (analogous to data pin PAD.X in FIG. 6) for the particular bit represented.

The operation of each of these global I/O interfaces may be appreciated by describing the operation of the non-redundant global I/O interface 1066, whose major internal components are shown, and its interaction with the data I/O interface 1080. When signal first develops on the global output lines GOUT, GOUTB in a read cycle, it is immediately buffered by amplifier 1071 (which is enabled by an "enable read" signal, ENR) to develop a signal on the global data bus lines. This allows the signal, as it develops, to propagate onto the global data bus lines without requiring a carefully timed latch signal. Then, after additional signal has developed on the global output lines GOUT, GOUTB, and near the peak of its signal (and importantly, before the signal starts to disappear after the read amplifiers (e.g., 372 in FIG. 10) are turned off) a latching buffer 1072, also connected to the global output lines GOUT, GOUTB is strobed by a "latch read" signal, LR, to latch the data. The latching buffer 1072 saves this data in the case of a burst mode read cycle. When the burst mode read cycle later occurs, rather than executing a memory array cycle to retrieve the other half of the double word (in this example, the lower word), the data is already present in the latching buffer 1072 from the previous 72-bit "load read" cycle, and driver 1073 is enabled by an "enable latched read" signal ENLR to drive the latched data onto the global data bus, and to the data I/O interface 1080. In a burst mode read cycle, the "enable latched read" signal ENLR is enabled at the same relative time in the cycle as the "enable read" signal ENR is enabled in a load read cycle.

The differential signal developed on the global data bus GDB.X, GDBB.X, whether driven by the amplifier 1071 or by driver 1073, is approximately 100 mV, biased near VDD, and lasts for only 1–2 ns. It is then amplified by an amplifier 1081 within the data I/O interface 1080, which develops a 300–400 mV signal on its complementary output nodes 1091 which is also biased near VDD. The description thus far is appropriate for both the flow-through mode of operation and the pipelined mode of operation.

In the flow-through mode of operation, this signal is steered through multiplexer 1082 (selecting the "B" input) to a latching amplifier 1083. When strobed by a 1–2 ns "latch output" signal LQ, the latching amplifier 1083 amplifies the read data signal received from the multiplexer 1082 and briefly drives one of its complementary output nodes active (in accordance with the polarity of the data signal, of course). This brief pulse on one of the two complementary outputs of latching amplifier 1083 drives a respective input of a latching output buffer 1084. This latching output buffer 1084 latches the data and immediately drives the external data pin 1090 accordingly. The latching output buffer 1084 remains latched, and continues to drive the external data pin 1090, until the data is updated when a subsequent LQ pulse strobes the latching amplifier 1083 with the next data signal (unless the latching buffer 1084 is disabled by a control signal which turns off both pull-up and pull-down drivers within the latching output buffer 1084, which occurs when a "stop" or a "load write" command follows a read in progress). In the flow-through mode of operation, the latching buffer 1085 and registers 1086, 1087 remain inactive.

In the pipelined mode of operation, the differential signal developed on the global data bus GDB.X, GDBB.X, whether driven by the amplifier 1071 or by driver 1073, is again approximately 100 mV, biased near VDD, and lasts for only 1–2 ns. It is amplified by an amplifier 1081 within the data I/O interface 1080, which eventually develops a 300–400 mV signal (also biased near VDD) on its complementary output nodes 1091 (see, for example, nodes DOUT, DOUTB in FIG. 28). Early in the active read cycle, the multiplexer 1082 is configured (selecting the "B" input) to couple the complementary nodes 1091 to the complementary output nodes 1094 of the multiplexer 1082, so that the data signal is available as soon as possible at the latching amplifier 1083, even before reaching its peak. However, near the peak of this data signal on complementary nodes 1091 (and importantly, before it, too, starts to disappear) a latching buffer 1085 is strobed by a "latch global data bus" signal, LGDB, to latch this data onto its complementary output nodes 1092. The latched signal on complementary nodes 1092 is a short pulse on either the true or complement node. This pulse is steered into one of two registers 1086, 1087, whose complementary outputs are rail-to-rail signals. (The high output is essentially at VDD, and the low output is essentially at ground.)

Assume for a moment that the data signal is loaded into register 1086. Consequently, the data signal from the amplifier 1081 is available first at the "B" input of the multiplexer 1082, and last for 1–2 ns. But before it goes away, the register 1086 latches the same data signal, which is then available at the "C" input of the multiplexer 1082 (as complementary rail-to-rail signals, as described above). The multiplexer 1082 is switched from its "B" input to its "C" input after the "C" input data signal becomes available but before the "B" input data signal goes away, so that the data signal is continuously available at inputs of the latching amplifier 1083. By using this arrangement, the data signal is made available to the latching amplifier 1083 as soon as possible without having to wait for the signal to develop sufficiently to strobe latching buffer 1085. Yet the same data signal remains available at the latching amplifier 1083 even after the signal on the global data bus GDB.X, GDBB.X and the signal on the complementary output nodes 1091 has gone away!

The latching amplifier 1083 is strobed by a 1–2 ns "latch output" signal LQ to amplify the read data signal received from the multiplexer 1082 and briefly drive one of its complementary output nodes active (in accordance with the polarity of the data signal, of course). As before, this brief pulse on one of the two complementary outputs of latching amplifier 1083 drives a respective input of a latching buffer 1084, latches the data and immediately drives the external data pin 1090 accordingly. Assuming the data outputs are driven at a time ⅓ of the way into the next external clock period, the LQ signal may occur very early in the next active cycle (for very fast external clock cycle times), or may occur well after the entire active cycle is complete and the memory device has automatically returned to an equilibrated state (for very slow external clock cycle times). The two registers 1086, 1087 are provided to account for this widely varying arrival time (relative to the internal active cycle timing) of the LQ signal which strobes the latching amplifier 1083.

Assume for moment the memory device is operating in the pipelined mode, with an external clock cycle time of 20 ns. The data output pins are consequently driven at approximately 7 ns into the next cycle. In other words, the data signal from the last read cycle, which may be stored in register 1086, is strobed into the latching amplifier 1083 and (by way of the latching buffer 1084) driven onto the external data pin 1090 at a time 7 ns after the current cycle is initiated. If the data signal from this current cycle arrives at the data I/O interface 1080 before this time, it is stored (before it goes away) in the second register 1087, because the data in register 1086 (from the last cycle) has not yet been conveyed to the latching amplifier 1083. At about 7 ns, the data signal from register 1086 is strobed by the latching amplifier 1083, after which the multiplexer 1082 is switched from its "C" input to its "D" input so that the data signal conveyed through the multiplexer 1082 and to the latching amplifier 1083 during the following cycle is the read data signal from the current cycle.

Conversely, assume for moment the memory device is operating in the pipelined mode at a very fast external cycle time of 5 ns. The data output pins are consequently driven at approximately 1.7 ns. Further assume that the internal "access time" of the memory device results in the data signal reaching the data I/O interface 1080 at about 6 ns after the start of its cycle. In other words, the data signal from the last read cycle reaches the amplifier 1081 only 0.7 ns before it needs to be strobed into the latching amplifier 1083 and driven (by way of the latching buffer 1084) onto the external data pin 1090. There is insufficient time to wait until the data signal is loaded into a register before presenting it to the latching amplifier 1083. Consequently, the "B" input of the multiplexer 1082 is selected to convey the data signal directly from the amplifier 1081 to the multiplexer 1082. Then, later in the active cycle, after the same data signal is also stored into one of the two registers 1086, 1087, the multiplexer 1082 is switched from its "B" input to either its "C" or "D" input so that the same data signal is still available to the latching amplifier 1083. In this way, the proper data signal is conveyed by the multiplexer 1082 to the latching amplifier 1083, independently of whether the LQ signal which strobes the latching amplifier 1083 arrives "early" or "late" in the cycle.

In the flow-through mode, the LQ signal timing is preferably made more or less aggressive in the fashion described elsewhere herein regarding the configurable $t_4$ timing signal. In the pipelined mode, the LQ signal is instead driven by the last of two events to occur. First, the data must already be available. That is, the timing signal $t_4$ from the previous clock cycle must have already occurred. And second, the appropriate time to output data (e.g., at ⅓ of the way into the present external clock cycle) has already occurred. If the timing signal $t_4$ from the previous cycle has not yet occurred at a time ⅓ of the way into the present cycle, the LQ signal must be delayed until the data signal from the previous cycle is present (as a result of the arrival of timing signal $t_4$).

For clarity, the data input path is also shown in the figure, although the operation details and relative timing is largely described elsewhere herein. Within the data I/O interface 1080, a data input buffer 1088, if enabled by an ENABLE signal, and upon the rising edge of the internal clock signal CLK, strobes the external data signal presented to the external data pin 1090 (comparing it with an internally generated VRR reference voltage), and conveys the data signal to the write queue 1089 (the data portion thereof). A read bypass path is provided for, and selected by the "A" input of the multiplexer 1082, to provide data, during a read cycle, which addresses the same word as an earlier write still pending in the write queue which has not yet been retired by writing the corresponding memory cells in the array.

Within the global I/O interface 1066, a differential latching buffer 1074 receives the small-signal differential data input signal when driven by the write queue 1089 onto the global data bus GDB.X, GDBB.X, which is then conveyed to global input line pulse driver 1075 to drive the +/−100 mV signal onto the selected GIN, GINB lines.

Generally, the linear amplifiers or drivers shown in FIG. 22B may be implemented similarly to the GOUT amplifier within circuit block 372 (shown in FIG. 10), the various latching amplifiers shown in FIG. 22B may be implemented similarly to the amplifier 193 (shown in FIG. 9), and the global input line pulse driver 1075 may be implemented similarly to driver 190 (shown in FIG. 3 and FIG. 9).

Figure 23:
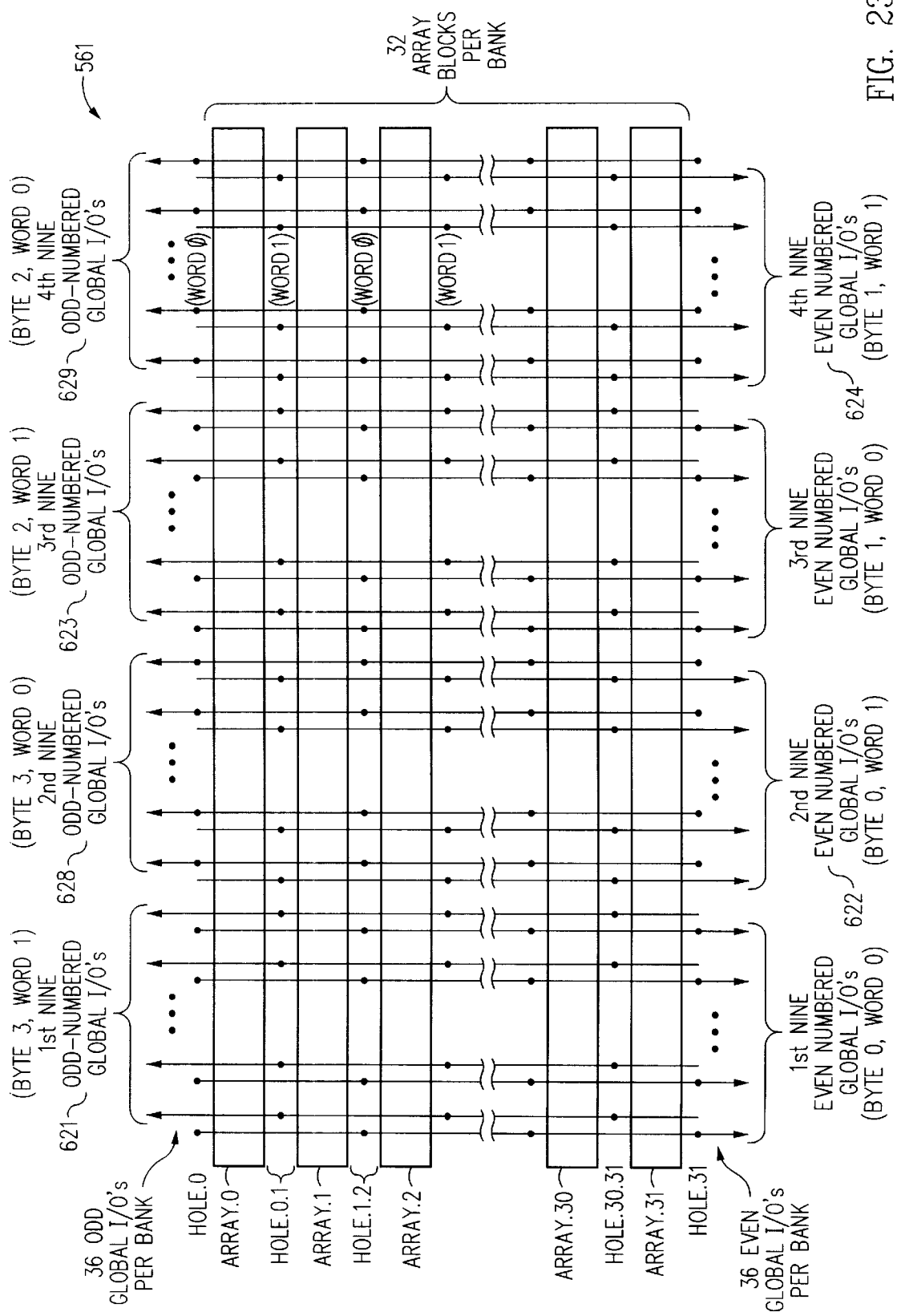
FIG. 23 is a block diagram of a portion of a memory bank in accordance with another embodiment of the invention which arranges the global I/O lines to provide contiguous data bytes.

FIG. 23 is a block diagram of a memory bank (e.g., memory bank 561) in accordance with another embodiment of the invention which arranges the global I/O lines (i.e., the global input lines and the global output lines) so that all nine bits within each byte are contiguous to each other. In the figure, only the global output lines are shown, one drawn line representing a differential pair (like in FIG. 21), and each global input line pair (not shown) runs substantially adjacent to the corresponding global output line pair. In an exemplary cycle a selected word line falls within array block ARRAY.1. To read the memory cells corresponding to a word line within the array block ARRAY.1, the bit line sense amplifiers in hole HOLE.0.1 located above the selected array block and hole HOLE.1.2 located below the selected array block must both be activated. A full 36-bit word may be driven onto thirty-six corresponding global output lines by enabling only one of these two holes for driving its global output lines. In such a case, eighteen of the bits are conveyed onto global output lines which exit the memory bank 561 at the top, while the remaining eighteen bits are conveyed onto other global output lines which exit the memory bank 561 at the bottom. The "dots" in FIG. 23 indicate a connection between a local I/O read/write block (each serving, for example, a group of sixteen bit line sense amplifiers) and the global output line passing overhead. For example, the row of local I/O read/write blocks within the hole HOLE.0.1 are connected to the first nine odd-numbered global output lines 621 (corresponding to Byte 3, Word 1) which exit the memory bank at the top, the second nine even-numbered global output lines 622 (corresponding to Byte 0, Word 1) which exit the memory bank at the bottom, the third nine odd-numbered global output lines 623 (corresponding to Byte 2, Word 1) which exit the memory bank at the top, and the fourth nine even-numbered global output lines 624 (corresponding to Byte 1, Word 1) which exit the memory bank at the bottom. Consequently, each of the 36-bits of a single 36-bit data word is conveyed either to the top or bottom of the memory bank 561 by enabling only the global output circuits within a single hole HOLE.0.1.

Conversely, two fall 36-bit words may be driven onto seventy-two corresponding global output lines by enabling both of the holes above and below the selected array block for driving its global output lines. (As in the case above, both holes are also enabled for bit line sense amplifier sense/restore.) In this case, eighteen bits from the first word and eighteen bits from the second word are conveyed onto global output lines which exit the memory bank 561 at the top, while the remaining eighteen bits from the first word and the remaining eighteen bits from the second word are conveyed onto other global output lines which exit the memory bank 561 at the bottom. For example, when both holes HOLE.0.1 and HOLE.1.2 are enabled for read/write (e.g., driving its global output lines when a read cycle), the first nine odd-numbered global output lines 621 (corresponding to Byte 3, Word 1) which exit the memory bank at the top are driven by read circuitry (e.g., a local I/O read/write block) in HOLE.0.1, the second nine odd-numbered global output lines 628 (corresponding to Byte 3, Word 0) which exit the memory bank at the top are driven by read circuitry in HOLE.1.2, the third nine odd-numbered global output lines 623 (corresponding to Byte 2, Word 1) which exit the memory bank at the top are driven by read circuitry in HOLE.0.1, and the fourth nine odd-numbered global output lines 629 (corresponding to Byte 2, Word 0) which exit the memory bank at the top are driven by read circuitry in HOLE.1.2.

While the assignment of bit order within a 36-bit or 72-bit parallel access of the memory bank 561 is potentially arbitrary, the arrangement shown ensures that a 36-bit word may be accessed by enabling the local I/O read/write blocks within only one hole to drive its global output lines, and still route 18 of the bits to the top of the memory array (where half the data output buffers are located) and route the remaining 18 bits to the bottom of the memory array (where the other half the data output buffers are located). By arranging the nine global output lines for a single byte as a contiguous group, the byte write enable circuitry may be conveniently located with each group, particularly if routed vertically from a circuit either at the top or bottom, as appropriate. Each of the memory banks 561, 562, 563, and 564 of FIGS. 20 and 22 may alternatively be arranged as shown in FIG. 23.

Figure 24:
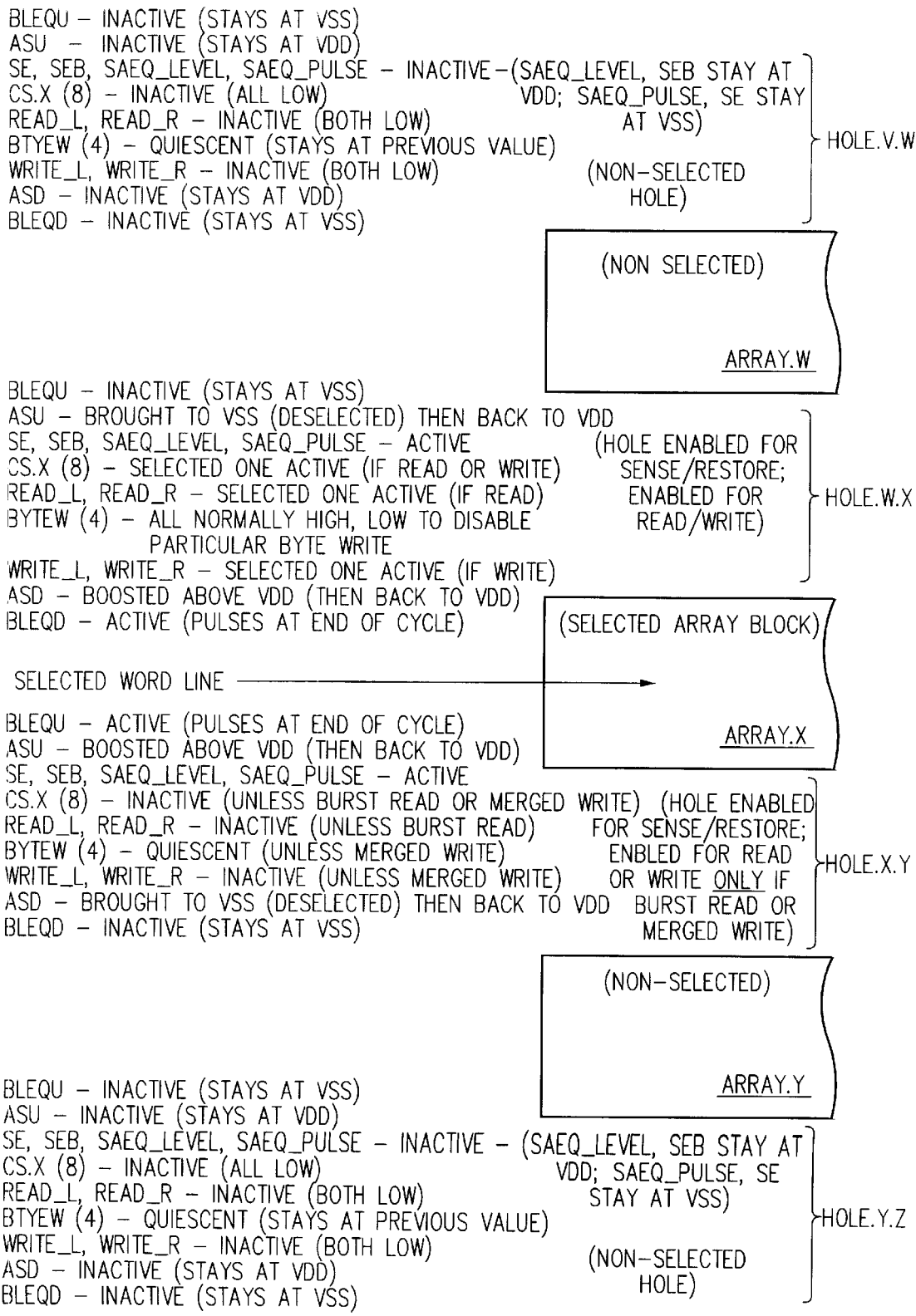
FIG. 24 is a block diagram of a portion of a memory bank as illustrated in FIG. 21, illustrating the operation of various array block signals for the selected array block and the adjacent, non-selected array blocks.

FIG. 24 is a block diagram of a portion of a memory bank as illustrated in FIG. 21 (and equally valid for the memory bank shown in FIG. 23) diagramming which array signals are active or inactive for both a normal cycle addressing a selected word line in an arbitrary array block (only 36-bits driven onto global output lines), as well as for a burst read cycle (72-bits driven onto global output lines) or a merged write cycle (up to 72-bits written within the same cycle). Three arbitrary array blocks ARRAY.W, ARRAY.X, and ARRAY.Y are shown, along with corresponding holes HOLE.V.W, HOLE.W.X, HOLE.X.Y, and HOLE.Y.Z. For the exemplary cycle described, assume the selected word line falls within array block ARRAY.X, as shown, and the addressed 36-bit word corresponds to global inputs and outputs connected to read/write circuits within hole HOLE.W.X.

Since the selected word line falls within array block ARRAY.X, both holes HOLE.W.X and HOLE.X.Y are enabled for bit line sense amplifier sense/restore of array block ARRAY.X. Looking first at the signals within hole HOLE.W.X, the upper array select signal ASU (i.e., the "unselected array select" for this exemplary cycle) is brought to VSS to isolate the selected sense amplifiers from the bit lines within array block ARRAY.W. The upper bit line equilibrate signal BLEQU (for the bit lines in array block ARRAY.W) remains at VSS to save power. The lower array select signal ASD (i.e., the "selected array select" for this exemplary cycle) is boosted above VDD to provide a lower impedance path between the selected sense amplifiers and the corresponding bit lines within the selected array block ARRAY.X. The lower bit line equilibrate signal BLEQD is already at VSS which allows signal to develop on the bit lines within the selected array block ARRAY.X. At the end of the active cycle, the ASD signal is brought back to VDD and the BLEQD signal is pulsed. To accomplish the sense/restore, the sense amplifier equilibrate signal SAEQ_LEVEL is brought to VSS to allow signal to develop on the internal sense amplifier nodes, the complementary sense amplifier enable signals SE, SEB are pulsed at the appropriate time and duration (described in detail elsewhere herewithin) to restore the high and low levels on the bit lines, then both the sense amplifier equilibrate signals SAEQ_LEVEL and SAEQ_PULSE, and the BLEQD signal, are brought to VDD. Lastly the SAEQ_PULSE and BLEQD signals are then brought back low to VSS. In the FIG. 24, each of these signals is indicated as being "ACTIVE."

Since the hole HOLE.W.X is also enabled for read/write, the various column circuits and read/write circuits are also enabled to drive its corresponding global output lines or to receive data signals from its corresponding global input lines (for those which are enabled for byte write). The column select signals CS.X are enabled, and the selected one-of-eight is driven high. For a read cycle, the selected one of either the READ_L or READ_R signal is driven high (and any non-decoded READ signal). Conversely, for a write cycle the selected one of either the WRITE_L or WRITE_R signal is driven high (and any non-decoded WRITE signal which may be employed). The four byte write signals BYTEW are each previously driven to VDD to enable write to its corresponding byte, or driven to VSS to disable write to its corresponding byte. Since most cycles typically write all four bytes, the four byte write signals usually remain at VDD. However, just after a write cycle, the four byte write signals for the next write cycle (even if many read cycles are performed before the next write cycle) are driven as appropriate within the particular hole which will be selected during the next write cycle, the next address and data to be written already presented to the memory device and stored within the write queue.

Looking next at the signals within hole HOLE.X.Y (which is also enabled for bit line sense amplifier sense/restore of array block ARRAY.X), the lower array select signal ASD (i.e., the "unselected array select" for this exemplary cycle) is brought to VSS to isolate the selected sense amplifiers from the bit lines within array block ARRAY.Y. The lower bit line equilibrate signal BLEQD remains at VSS to save power. The upper array select signal ASU (i.e., the "selected array select" for this exemplary cycle) is boosted above VDD to provide a lower impedance path between the selected sense amplifiers and the corresponding bit lines within the selected array block ARRAY.X. The upper bit line equilibrate signal BLEQU is already at VSS which allows signal to develop on the bit lines within the selected array block ARRAY.X. At the end of the active cycle, the ASD signal is brought back to VDD and the BLEQU signal is pulsed. To accomplish the sense/restore, the sense amplifier equilibrate signal SAEQ_LEVEL, the complementary sense amplifier enable signals SE, SEB, and the pulsed sense amplifier equilibrate signal SAEQ_PULSE are each active, and behave as described above.

In a normal 36-bit internal cycle, the hole HOLE.X.Y (unselected in this exemplary cycle) is not enabled for read/write. In such a cycle, the various column circuits and read/write circuits are not enabled to drive its corresponding global output lines or to receive data signals from its corresponding global input lines (for those which are enabled for byte write). In particular, the column select signals CS.X, the READ_L and READ_R signals (and any non-decoded READ signal which may be employed), the WRITE_L and WRITE_R signals (and any non-decoded WRITE signal which may be employed) are all inactive and remain at VSS. At the end of a write cycle the four byte write signals BYTEW.X within the hole(s) which will be write enabled (i.e., selected) during the next internal write operation are driven to reflect which of those bytes are to be written. If all four bytes were enabled on all write cycles, then all four byte write signals in all holes would remain at VDD throughout all cycles.

Alternatively, in a burst read cycle 72-bits are driven onto respective global output lines, and in a merged write cycle up to 72-bits are written with respective data signals on respective global input lines. In such a cycle requiring a simultaneous 72-bit internal access to the memory array, the various column circuits and read/write circuits within the hole HOLE.X.Y are also enabled for read/write. As is the case for hole HOLE.W.X, the column select signals CS.X are enabled (the selected one-of-eight driven high), the selected one of either the READ_L or READ_R signal (as well as any non-decoded read signal) is driven high (for a read cycle), and the selected one of either the WRITE_L or WRITE_R signal (as well as any non-decoded write signal) is driven high (for a write cycle). The four byte write signals BYTEW.X each were driven at the end of the most recent write cycle (for non-merged write cycles) by the write queue to VDD or VSS to accordingly enable or disable the corresponding byte for the next (i.e., this) write cycle, as described above. Since the byte write signals for a single 36-bit word are driven at the end of a given write cycle, and since writing a single 36-bit word requires enabling only one hole, the four byte write signals within a single hole are driven at the end of a given write cycle. Two successive write cycles are required to drive the eight total byte write signals within the two selected holes prior to a merged write. Then, at the end of the merged write cycle the four byte write signals BYTEW.X within the hole which will be write enabled (i.e., selected) during the next internal write operation are driven to reflect which of those bytes are to be written. If all four bytes are to be enabled during the next write operation, and were all enabled to be written during the last write operation when this hole was selected, then all four byte write signals BYTEW.X remain at VDD. All other byte write signals within other holes remain unchanged, as already described.

Up to this point, the two holes adjacent to the selected array block have been described. All other holes (represented here by holes HOLE.V.W and HOLE.Y.Z) are non-selected and thus inactive, meaning neither enabled for bit line sense/restore nor for read/write. Consequently, both the upper and lower array select signals ASU and ASD remain at VDD to continue coupling the sense amplifiers to the adjoining bit lines. The upper and lower bit line equilibrate signals BLEQU and BLEQD also remain at VSS to save power. The sense amplifier equilibrate signal SAEQ_LEVEL remains at VDD to continue equilibrating the internal sense amplifier nodes and the bit lines coupled thereto, the complementary sense amplifier enable signals SE, SEB remain at their respective inactive levels of VSS and VDD, and the pulsed sense amplifier equilibrate signals SAEQ_PULSE remains at VSS (without pulsing). In the FIG. 24, each of these signals so described is indicated as being "INACTIVE." The column select signals CS.X, the READ_L and READ_R signals (and any non-decoded READ signal which may be employed), the WRITE_L and WRITE_R signals (and any non-decoded WRITE signal which may be employed) are also all inactive and remain at VSS. The four byte write signals BYTEW within this hole behave as described above, which is indicated as "QUIESCENT." That is, the four byte write signals within the hole to be selected for the next write operation are driven to enable (VDD) or disable (VSS) these bytes as required. The four byte write signals in the presently selected hole remain unchanged at the end of the present write operation (unless the same hole is also selected for the next write operation with different bytes enabled). The four byte write signals in all other holes remain unchanged.

FIG. 25 through FIG. 31 are waveform diagrams illustrating the major array and sense amplifier signals described above, based upon circuit simulations. For ease of description, general terminology introduced thus far for a selected array block affords adequate reference to specific signals and description without requiring specific reference to a specific one of the array blocks. It should be readily understood that the descriptions which follow are appropriate for any of the array blocks when selected. Each of the figures depicts a read or write cycle initiated by a positive transition of the external clock (not shown) at t=19 ns. Earlier cycles establish realistic voltages on the various nodes at the start of this cycle shown.

Figure 25:
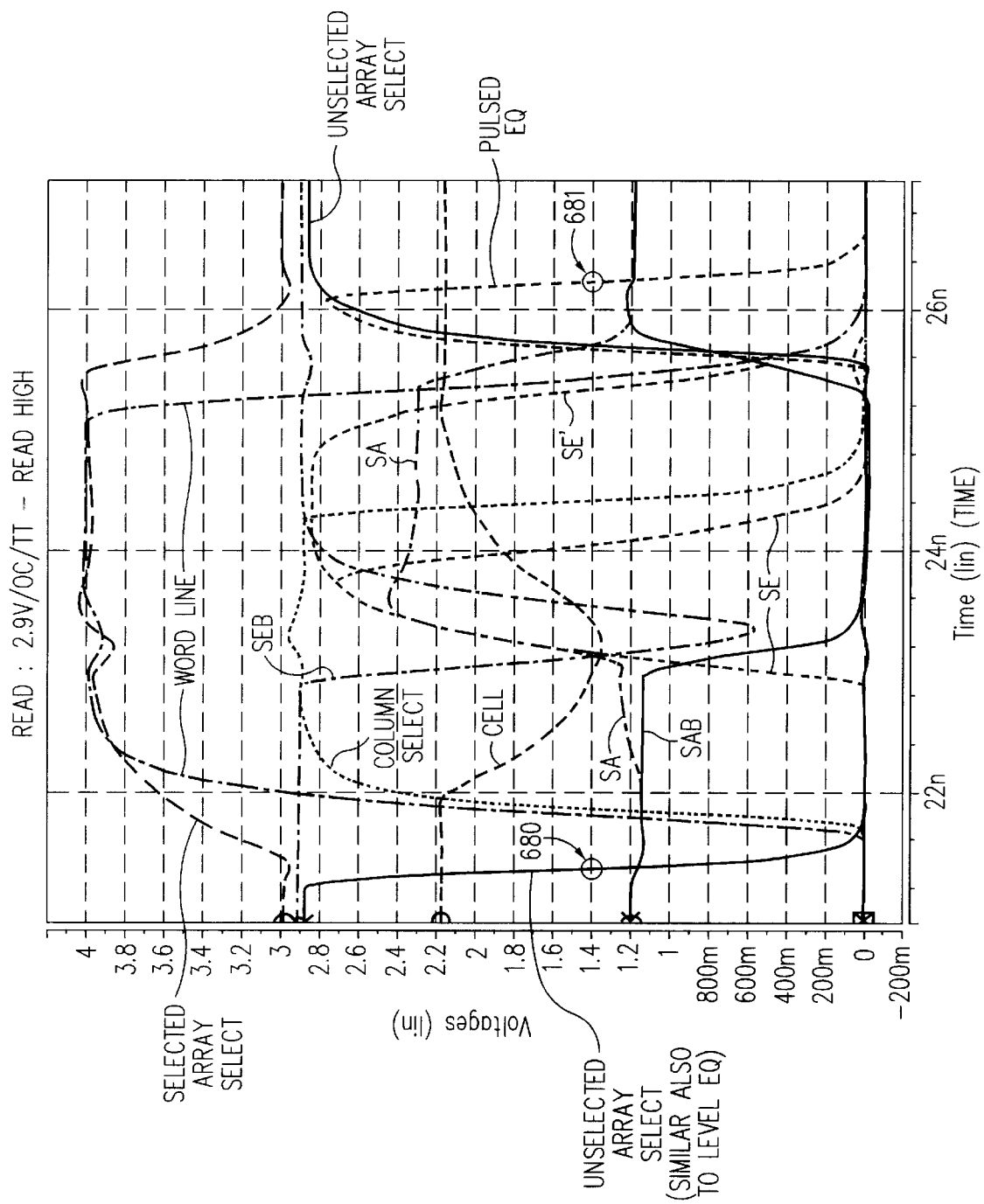
FIG. 25 is a waveform diagram illustrating the major array and sense amplifier signals when reading a high from the selected memory cell while operating at a VDD of 2.9 volts.

Referring now to FIG. 25, the waveforms are shown for a read cycle, sensing and restoring a high from the selected memory cell while operating at a VDD of 2.9 volts. Before the start of the cycle shown, the bit lines (not shown) and internal sense amplifier nodes SA, SAB are equilibrated together at a voltage of about 1.2 volts (i.e., the "bit line equilibration voltage"). The upper and lower array select signals for the bit line sense amplifiers within a given hole are both inactive at VDD (one of which will be decoded during the cycle shown as the "selected" array select signal and the other decoded as the "unselected" array select signal). The memory cell to be accessed is shown with a stored high level of approximately 2.2 volts.

At t=19 ns, a rising edge of the external clock (not shown) initiates the active cycle shown. At about t=21.5 ns, the unselected array select signal is quickly brought to VSS to decouple the selected sense amplifier from the bit lines in the adjoining non-selected array block, while the selected array select signal is boosted moderately quickly to the VPP voltage (which is internally generated and regulated to a value of about 4.0 volts above VSS) to better couple the selected sense amplifier to the bit lines in the adjoining selected array block (by lowering the impedance of the array select transistors coupling the bit lines to the internal nodes of the bit line sense amplifiers. The sense amplifier equilibrate signal SAEQ_LEVEL (not shown) is also quickly brought to VSS at substantially the same time (i.e., with the "falling" unselected array select signal) to turn off the lateral equilibration transistor in the sense amplifier. Shortly thereafter, the selected word line is very quickly driven from VSS to VPP and the decoded column select signal (e.g., CS.X in FIG. 10) is very quickly driven from VSS to VDD. It is important for the sense amplifier equilibrate signal SAEQ_LEVEL and the unselected array select signal to go low (actually, to go below the bit line equilibration voltage plus a threshold voltage) before the word line is high enough (a threshold voltage above VSS) to impart any signal from the selected memory cell onto the bit lines and the internal sense amplifier nodes.

Shortly after the high-going selected word line voltage exceeds the bit line equilibrate voltage plus a threshold (i.e., at about t=22 ns), the memory cell access transistor begins to turn on (the selected memory cell storing a high voltage for this cycle), and charge from the memory cell capacitor is shared with the corresponding bit line and subsequently with the internal sense amplifier node SA. From about t=22 ns to t=23 ns, the voltage on the memory cell is decreasing while the voltage on the bit line (not shown) and the internal sense amplifier node SA is increasing. At around t=23 ns, about 80% of the available signal from the memory cell has developed on the sense amplifier node SA, and the bit line sense amplifier is strobed by a simultaneous high-going pulse on the sense enable signal SE and low-going pulse on the complementary sense enable signal SEB. The simultaneous start time of these two pulses (which is determined by an internally generated timing signal) occurs at a time interval "$t_1$" after the selected word line is driven high, which is described in greater detail herein.

When the bit line sense amplifier is latched (at about t=23 ns), the high-going sense enable signal SE causes each of the selected bit line sense amplifiers to drive the lower of its two internal nodes (for this exemplary cycle, internal node SAB) downward toward VSS for as long the sense enable signal SE is applied (e.g., pulsed) to the selected sense amplifiers. The fairly low capacitance of the internal sense amplifier node SAB is then brought to VSS very quickly by one of the NMOS transistors in the bit line sense amplifier. The NMOS array select transistor (gated by the selected array select signal at VPP of about 4.0 volts) then drives the low-going bit line (not shown) toward the corresponding low-going internal bit line sense amplifier node SAB. Since the array select transistor is an NMOS transistor with a high gate bias above threshold, it has very low resistance and is able to discharge the low-going bit line relatively quickly compared to a high-going bit line (and memory cell node). The sense enable signal SE is pulsed for a controlled time which is independent of the complementary sense enable signal SEB pulse time. Both pulses start simultaneously, but each is terminated under independent control, as is additionally described elsewhere herein. As seen in the figure, at about t=24 ns the sense enable signal SE returns quickly to VSS at a time, for example, determined by several inverter delays after the end of the SEB pulse. Alternatively, the sense enable signal SE may remain high until the end of the active cycle, and then may be brought low at about the same time as the selected word line is brought low (see, for example, alternative signal SE' in FIG. 25).

The complementary sense enable signal SEB causes each of the selected bit line sense amplifiers to drive the higher of its two internal nodes upward toward VDD for as long the complementary sense enable signal SEB for the selected sense amplifiers is driven low. The array select transistor (gated by the selected array select signal now at VPP) then drives the high-going bit line toward the corresponding high-going internal bit line sense amplifier node, and the memory cell access transistor (gated by the selected word line at VPP) then drives the internal memory cell node toward the high-going bit line. If the complementary sense enable signal SEB were applied for a sufficiently long time, then all three of these nodes would eventually charge in series to substantially reach VDD, but this takes considerable time to asymptotically reach the final voltage. In contrast, as the waveforms show, the complementary sense enable signal SEB is pulsed only for a much shorter time (terminated by an internally generated timing signal ST2 at about 24 ns), which leaves the internal sense amplifier node SA charged to a voltage well below VDD, even though it was being charged toward VDD when the SEB pulse was active. Moreover, because of the delays through the array select transistor, the bit line (not shown) is charged to an even lower voltage than the internal sense amplifier node. Even more striking, because of the resistance of the bit line and the memory cell access transistor, the memory cell voltage has hardly been restored at all when the SEB pulse terminates. For example, at about t=23.6 ns the sense enable signal SEB returns quickly to VDD, and the voltage on internal node SA stops rising with the memory cell node still at only about 1.5 volts.

For the next approximately 2 ns (from about t=23.6 to t=25.4 ns), charge continues to be shared between the high voltage on the high-going internal sense amplifier node, the intermediate voltages along the resistive bit line, and the low voltage on the memory cell node because the selected array select signal and the selected word line both remain at VPP, and thus the array select transistor and the memory cell access transistor are relatively well turned on. Since the internal sense amplifier node and "near" end of the resistive bit line were charged higher than the desired final restored high level of approximately 2.2 volts, they are discharged to a lower voltage by the charge sharing, while the far end of the resistive bit lines and the memory cell node are charged to a higher voltage by the charge sharing. The final voltage is reached more quickly than if the sense amplifier were fixed at the final voltage. In other words, once the distributed capacitance of the sense amplifier node, the resistive bit line, and the internal memory cell is decoupled from the charging current toward VDD (i.e., when the complementary sense enable signal SEB terminates and the PMOS sense amplifier transistor to VDD turns off), the "self-equilibrating" time for these distributed nodes to reach approximately the same voltage is substantially faster than if the memory cell and far end of the resistive bit line must rise to a fixed voltage (such as VDD) of the sense amplifier node and near end of the resistive bit line. When sufficient charge has been shared between the high-going internal sense amplifier node, the high-going bit line, and the selected memory cell to generate a predetermined restored high level on the selected memory cell of about 2.2 volts, this restored high level is carefully isolated in the selected memory cell by bringing the selected word line back to VSS (followed, of course, by various equilibrating and precharging to prepare for the next active cycle), as is described in greater detail below.

The speed of this arrangement for restoring a predetermined high level onto the high-going bit line and into the selected memory cell derives from several separable factors. First, when enabled the PMOS transistors within the sense amplifier are driven toward VDD but stopped short before the internal sense amplifier nodes fully reach the VDD level. This avoids a long exponential "tail" otherwise required to fully reach VDD. Second, the over-shoot of the sense amplifier node voltage, along with the self-equilibration of the distributed capacitance of the sense amplifier node, the high-going bit line, and the memory cell achieves a faster settling time on the selected memory cell (assuming a worst case selected memory cell placement at the far end of the resistive bit line) to the desired high restore level. Third, the reduced voltage level of a stored high is transferred by the array select and memory cell access transistors (both NMOS transistors with a fixed VPP-level gate voltage) with a lower time constant than if a higher voltage were transferred.

As is apparent from FIG. 25, the column select signal is driven to VDD substantially at the same time as the selected word line which, of note, is well ahead of signal developing on the internal sense amplifier nodes SA, SAB, and is brought back to VSS at about t=24.4 ns. The significance of this timing will be described later in relation to FIG. 27.

Referring again to FIG. 25, an internal timing circuit generates a timing signal at the end of the timing interval "$t_3$" when sufficient charge has been shared between the high-going internal sense amplifier node, the high-going bit line, and the selected memory cell to generate a predetermined restored high level on the selected memory cell. The active cycle is then brought to a close by first bringing the selected word line back to VSS, which occurs here at about t=25.4 ns. Immediately thereafter (at about t=25.6 ns), the pulsed equilibrate signals (e.g., SAEQ_PULSE, BLEQU, BLEQD, labeled as "PULSED EQ") and the "level" equilibrate signals (e.g., SAEQ_LEVEL, not shown in FIG. 25) are driven almost simultaneously to VDD, which equilibrates the bit lines (at both ends) and the sense amplifiers to the bit line equilibrate voltage of, for this example, about 1.2 volts. The array select signals are simultaneously returned to their inactive (VDD) level. The pulsed equilibrate signals are timed to automatically terminate when the equilibration accomplished by the pulsed signals is substantially complete. The non-pulsed equilibrate signals (the "level" signals) stay active until the next cycle (using this hole) is initiated.

Figure 26:
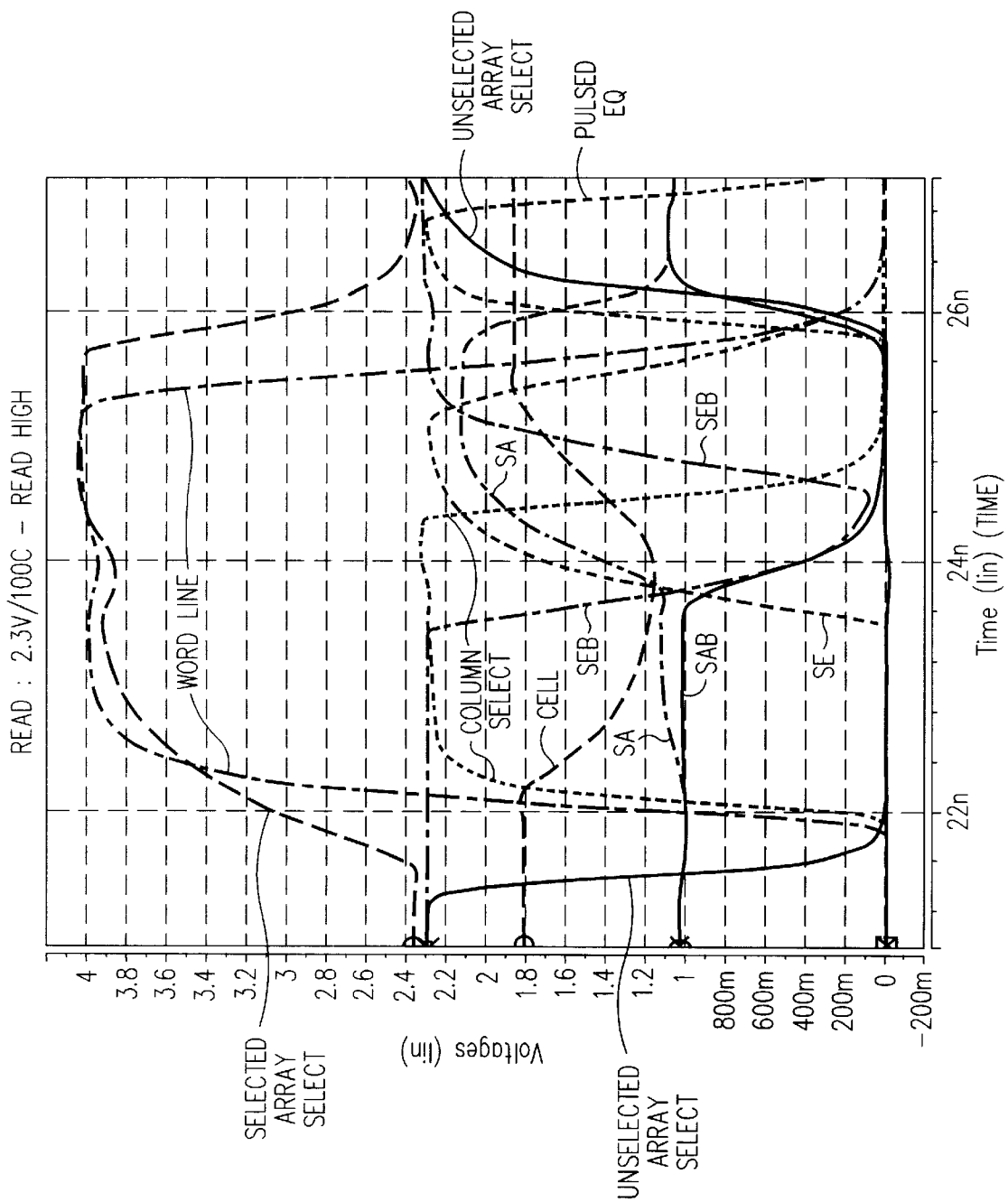
FIG. 26 is a waveform diagram illustrating the major array and sense amplifier signals when reading a high from the selected memory cell while operating at a VDD of 2.3 volts.

The waveforms of FIG. 25 correspond to a particularly "fast" environmental corner (i.e., high VDD, cold temperature) and a typical process having typical NMOS and PMOS transistors. Under these conditions, there is a very short complementary sense enable signal SEB, but more importantly, there is a very fast rise time of the internal sense amplifier node SA which results in significant over-shoot of the high voltage level briefly achieved on the internal sense amplifier node SA before self-equilibrating with the distributed capacitance of the resistive bit line. In FIG. 26, the same cycle is shown at a "slow" environmental corner (i.e., low VDD, hot) with the same typical transistors. While all the waveforms behave generally as before (and therefore merit little comment), some of the interesting (in some cases, subtle) differences will be pointed out.

A comment about performance is well taken at this point. As has been described earlier, the various pulsed equilibrate signals (represented in the figure as "PULSED EQ") are driven active at the end of a cycle for a predetermined time, and automatically are brought back inactive without waiting for the next cycle to start, whereas the "level" (or non-pulsed) versions of the equilibrate signals remain active until the start of the next cycle and are then brought inactive early in the cycle. For a particular device operating at near its minimum cycle time, the level equilibrate signals may be brought inactive about the same time as the pulsed equilibrate signals go inactive under automatic control from the last cycle. Said differently, the "back sides" of both the "level" equilibrate signals and the "pulsed" equilibrate signals substantially "line up" when a given device operates at its minimum cycle time. Looking again at FIG. 25, the unselected array select signal is brought to VSS at the start of the active cycle, which is substantially the same time as the level equilibrate signal is also brought to VSS. Using the point when a signal crosses 1.4 volts as a reasonable method to measure time (being approximately one-half of the VDD voltage), the level equilibrate signal therefore falls at a time labeled 680. At the end of the cycle shown, the pulsed equilibrate signal falls at a time labeled 681, at which time the bit line equilibration and bit line sense amplifier equilibration are complete. The falling edge of the level equilibrate signal in a subsequent cycle could therefore line up with the falling edge of the pulsed equilibrate signal shown at point 681 for the current cycle. Measuring the horizontal distance between points 680 and 681 on the horizontal axis suggests a minimum cycle time of 4.7 ns for the typical process embodiment shown operating at a fast environmental corner.

In FIG. 26, the VDD level is only 2.3 volts, but the VPP level remains at approximately 4.0 volts because of its internal regulation with respect to VSS, not VDD. This high, but regulated, VPP voltage helps ensure relatively low resistance of the "selected" array select transistors and memory cell access transistors, without needlessly sacrificing reliability. The signal available from the memory cell is unfortunately less than before (due to the lower VDD). Consequently, the "$t_1$" timing interval is lengthened to allow more of the signal to be developed on the sense amplifier nodes before sensing (i.e., the voltage of the memory cell is more completely discharged into the bit line/sense amplifier capacitance before strobing the bit line sense amplifiers). The "$t_2$" timing interval is also substantially lengthened to generate a longer pulse on the complementary sense enable signal SEB, which is necessary because the sense amplifier pull-up is much slower (asymptotically approaching a much lower VDD level relative to the desired stored high voltage level, and at high temperature) and a predetermined amount of electronic charge (a "bucket of Q") must be conducted into the sense amplifier/bit line nodes to generate the proper high restore level. A consequence of this slower timing and slower transistors is the lack of significant overshoot on the high-going internal sense amplifier node with respect to the bit line. That is, with the bit line sense amplifier node rising more slowly and being at a lower voltage where the array select transistor is more conductive, the sense amplifier internal node voltage never exceeds the bit line voltage very much. Therefore, less time is needed after the PMOS sensing terminates before the selected word line can be turned off. That is, the "$t_3$" timing interval is decreased.

Figure 27:
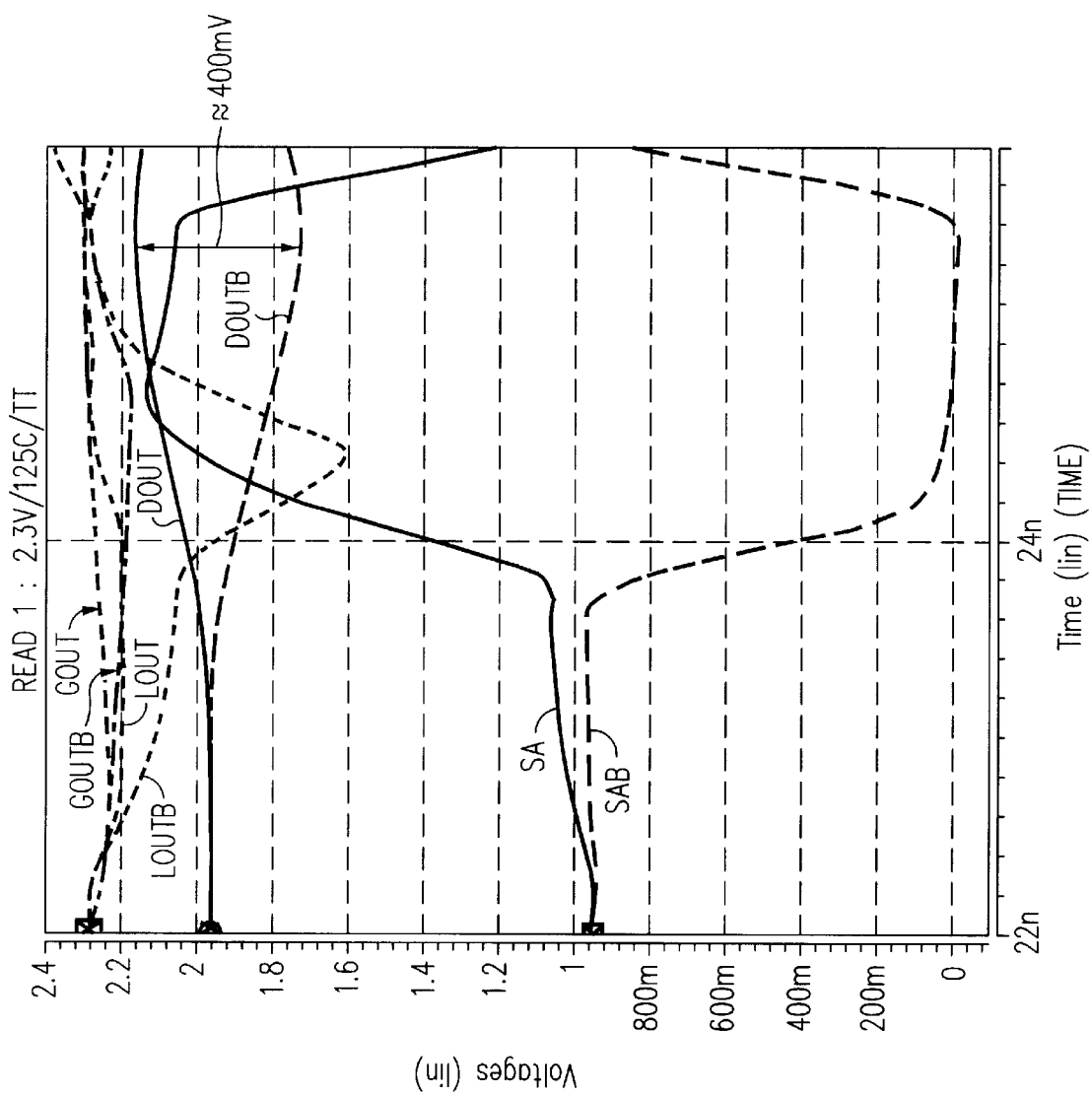
FIG. 27 is a waveform diagram illustrating major read path data signals, corresponding to the other waveforms shown in FIG. 26, when reading a high from the selected memory cell while operating at a VDD of 2.3 volts.

FIG. 27 is a waveform diagram illustrating the major read path data signals (for a non-burst cycle) for an exemplary low voltage, high temperature read cycle, such as the cycle shown in FIG. 26. The internal sense amplifier nodes SA, SAB are shown on both figures to provide a common reference. As has been described much earlier above, a selected read amplifier (e.g., read amplifier 371 shown in FIG. 10) is enabled by a column select signal (and/or other similar signals depending on the particular embodiment) to amplify the signal developing on the internal sense amplifier nodes and generate a level-shifted output signal on a pair of local output lines LOUT, LOUTB, which are shared between a group of eight sense amplifiers in a hole selected for read/write (e.g., HOLE.W.X in FIG. 24). The amplified differential signal between LOUT, LOUTB is shown developing shortly after the SA, SAB signal begins to develop. The large increase of the differential LOUT, LOUTB signal, which occurs at approximately t=24 ns, is a result of the bit line sense amplifier latching, and a substantially increased input signal being amplified by the first stage local output amplifier. A multiplexer (within the local output sense amplifier block of, for example, FIG. 10) selects between a left pair and right pair of local output lines, and a second stage amplifier then drives an associated pair of global output lines GOUT, GOUTB, which extend vertically the full height of the memory bank, and provide the associated bit of data out either the top or bottom of the memory bank. The global output signals GOUT, GOUTB in FIG. 27 are the delayed signals at the far end of the global output lines (which have distributed resistance and capacitance). At the top and bottom of the memory bank, for example, the data path continues with a differential linear amplifier which is enabled to amplify and drive the data signal from a selected pair of global output lines in a selected memory bank onto one end of a horizontally-arranged pair of bidirectional, differential global data bus lines GDB, GDBB (waveforms not shown), which route the read data signal to the physical output buffers (located, for this simulation, at the opposite end of the global data bus lines) whose first stage includes another differential linear amplifier which generates a pair of output nodes DOUT, DOUTB. The differential voltage between DOUT and DOUTB is strobed by a latching stage within the output buffer (e.g., latching amplifier 1083 in FIG. 22B) which is the first stage in the data path which is powered by the "noisy" output buffer power supply terminals, rather than the more "quiet" internal power supply terminals which power the memory array and most other internal supporting circuits. This latching buffer generates a fall rail-to-rail signal, which is then buffered by additional stages within the output buffer and ultimately driven off-chip. The latching buffer receives the input differential voltage on a pair of matched NMOS transistors. This differential voltage, near VDD, provides the differential current through these two NMOS transistors necessary to steer the latching stage, even in the presence of about +/−1.5 volts of noise on either or both of the "noisy" power supplies with respect to the voltages on the "quiet" supplies.

As can be seen from FIG. 27, there is about 60 mV of signal between DOUT and DOUTB, which is the signal at "the front porch" of the latching output buffer, when the bit line sense amplifiers begin to be latched (at around t=23.7), and the magnitude of the signal grows substantially over the next 2.0 ns to a peak signal of about 400 mV (at t=25.5 ns). This latching output buffer stage is latched at "$t_4$" time (starting, perhaps, at a time between t=23.6 ns and t=25 ns), which is adjustable electrically in a test mode and permanently with laser fuses based on the results of an electrical test at wafer probe. As more imbalance or offset exists in a particular data path, more signal is needed, before strobing a latch, to overcome the cumulative imbalances. One individual memory device may have a worst case imbalance much smaller than another individual memory device, and thus may function with smaller signal when latched. During final testing after assembly, the "$t_4$" time may be temporarily increased or decreased from its permanently programmed value. Individual devices may be configured with as fast an access time as possible, while still providing adequate signal margins in the output buffer latch. The $t_4$ timing for each device is preferably adjusted to be slightly later than the earliest $t_4$ timing for which the device still functions properly, to ensure adequate margins when operating normally. A memory device can be final tested with the $t_4$ timing advanced relative to its permanently programmed value set by the laser fuses, to ensure margin at its less aggressive $t_4$ timing in normal operation.

Figure 28:
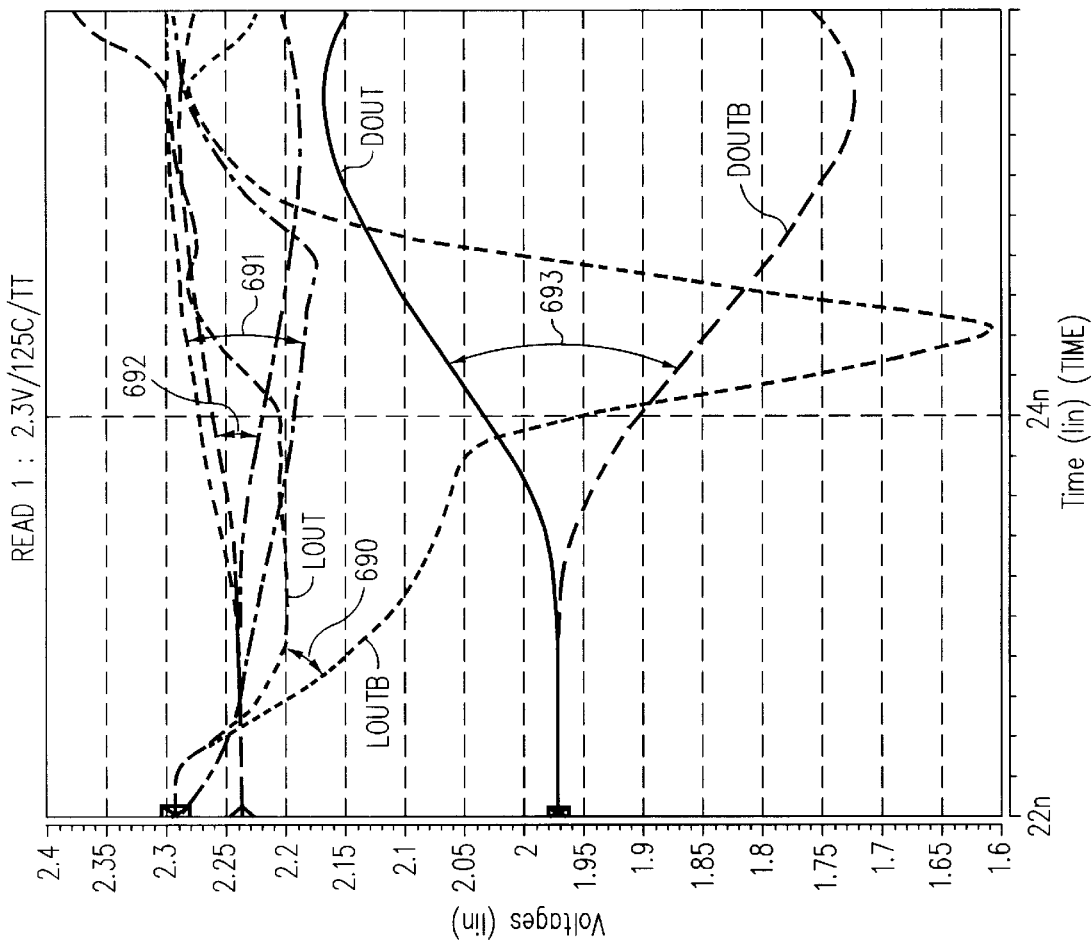
FIG. 28 is a waveform diagram illustrating additional major read path waveforms (some of which are shown in FIG. 27) but at a larger vertical scale to more readily perceive certain small amplitude signals.

FIG. 28 shows the same waveforms (except SA, SAB) but at a larger vertical scale to more readily perceive certain small amplitude signals, and also shows the differential signal between GDB and GDBB, labeled as 692, which was not shown in FIG. 27. For additional clarity, the differential signal between LOUT and LOUTB (labeled as 690), the differential signal between GOUT and GOUTB (labeled as 691), and the differential signal between DOUT and DOUTB (labeled as 693) are also indicated.

Figure 29:
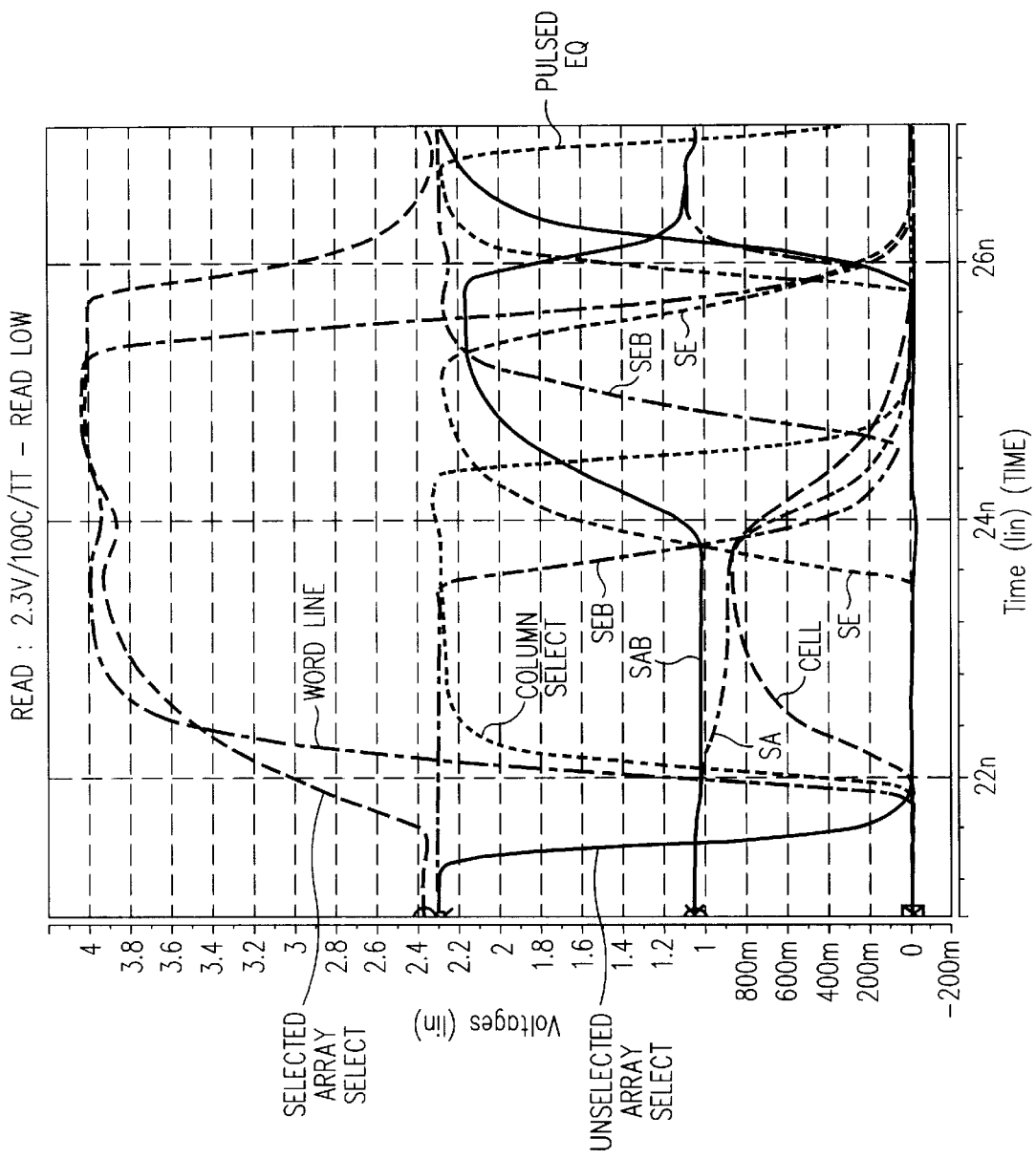
FIG. 29 is a waveform diagram illustrating the major array and sense amplifier signals when reading a low from the selected memory cell while operating at a VDD of 2.3 volts.

FIG. 29 is a waveform diagram illustrating the major array and sense amplifier signals when reading a low from the selected memory cell while operating at a VDD of 2.3 volts. It shows, of course, very similar waveforms to those shown in FIG. 26, except for the selected memory cell levels. In FIG. 29, as one would expect when reading a low, the selected memory cell pulls the associated sense amplifier node downward (before sensing) as charge is shared between the cell capacitor and the bit line/sense amplifier capacitance. Then, after sensing, the sense amplifier pulls the selected memory cell downward to relatively easily restore a low level of "substantially" VSS within the memory cell before the selected word line falls.

Figure 30:
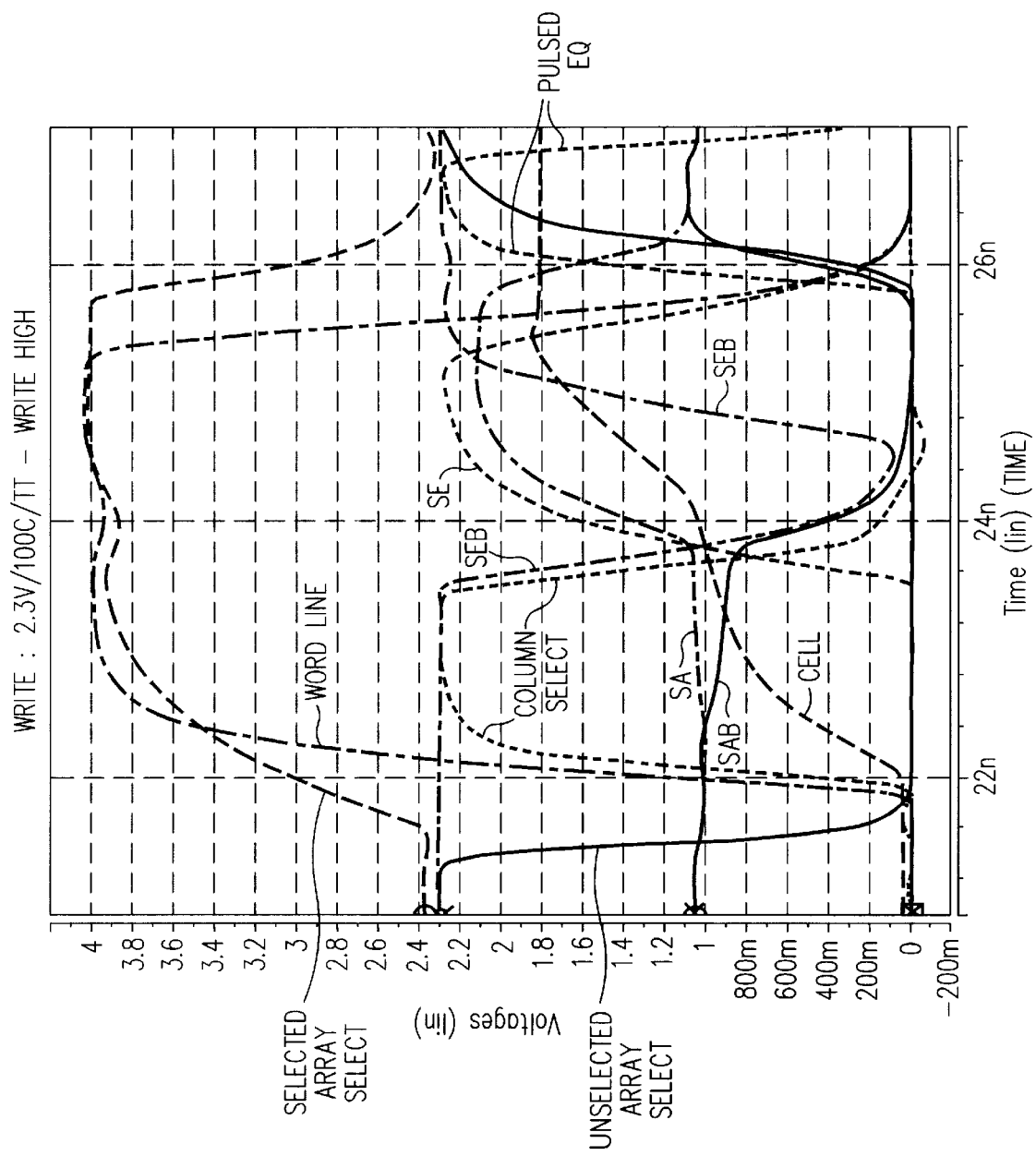
FIG. 30 is a waveform diagram illustrating the major array and sense amplifier signals when writing a high into the selected memory cell (having a previously stored low) while operating at a VDD of 2.3 volts.

The next two figures highlight timing details of a memory cell and related circuitry during an internal write operation. FIG. 30 is a waveform diagram illustrating the major array and sense amplifier signals when writing a high into the selected memory cell (having a previously stored low) while operating at a VDD of 2.3 volts (i.e., a slow corner). In the embodiment whose waveforms are shown, the data for a write operation has already been driven onto the global input lines GIN, GINB in the form of a +/−100 mV signal by the write queue, all before the internal write operation begins. Then, during the actual cycle which carries out (or retires) the write operation, each pair of global input lines (either all or a portion thereof corresponding to the particular data bits to be written) is coupled to a selected bit line sense amplifier (e.g., by the circuitry of FIG. 11) when the column select signal is driven high, which occurs well before sensing. The large capacitance of the (long) global input lines provides a ready source of electronic charge to drive the voltage of the sense amplifier nodes (as well as the bit lines connected thereto) to substantially the same voltage as the global input lines, irrespective of the initial voltage level of the selected memory cell which is also imparting charge onto one of the bit lines and one side of the bit line sense amplifier. Thus, the high capacitance of the global input lines "swallows" most of the signal otherwise imparted by the selected memory cell, while the initial differential voltage on the global input lines establishes the desired differential write data signal onto the selected sense amplifier nodes. The bit line sense amplifier then latches according to the write data signal coupled from the global input lines rather than latching according to the previously stored data within the selected memory cell.

This action is clearly seen in FIG. 30. From about t=22.1 ns through t=23.6 ns, the selected memory cell is rising in voltage as its charge is shared with, for this exemplary cycle, the true side of the bit line sense amplifier, internal node SA. But instead of decreasing in voltage as was seen in FIG. 29 when reading a low, here the voltage of internal node SA is increasing due to the coupling of the true global input line GIN (waveform not shown) to the internal sense amplifier node SA. Moreover, on the non-selected-cell side of the bit line sense amplifier (the side coupled to the bit line which is not connected to the selected memory cell), the voltage of the complementary internal node SAB is driven downward, rather than staying relatively unchanged as in the read cases above. The roughly 200 mV initial differential voltage which had been developed between GIN and GINB prior to the beginning of the active cycle results in approximately a 175 mV signal between internal node SA and SAB just prior to sensing, even though the selected memory cell is trying to develop a nominal 100 mV signal of opposite polarity on the internal nodes SA, SAB.

There is one major timing difference between read and write operations which is apparent from FIG. 30. In a write operation, the column select signal couples the low-capacitance sense amplifier nodes SA, SAB to the large-capacitance global input lines GIN, GINB, as described above, prior to sensing. However, the bit line sense amplifiers should be free to latch, and drive one low capacitance internal node toward VDD and the other low capacitance internal node to VSS, without dragging the very large capacitance of the global input lines with it. Since the complementary sense enable signal SEB is a pulse timed to deliver a relatively predetermined amount of "Q" into the high-going sense amplifier nodes and bit lines, any undesired charging of any global input lines would rob some of this "packet" of charge and lower the high level restored onto the high bit line and thus into the selected memory cell. Consequently, in a write operation, the column select signal is brought back to VSS (shown at about t=23.5 ns) just prior to the simultaneous arrival of the true and complement sense enable signals SE, SEB. Then, the "restoration" of this just-latched high level into the selected memory cell proceeds identically as in a read operation. Note that in a read cycle, the continued assertion of the column select signal after the simultaneous arrival of the true and complement sense enable signals SE, SEB provides continual development of the differential signal in the read path, but does not influence the bit line sensing operation, as is apparent from the read path 371 of FIG. 10.

Figure 31:
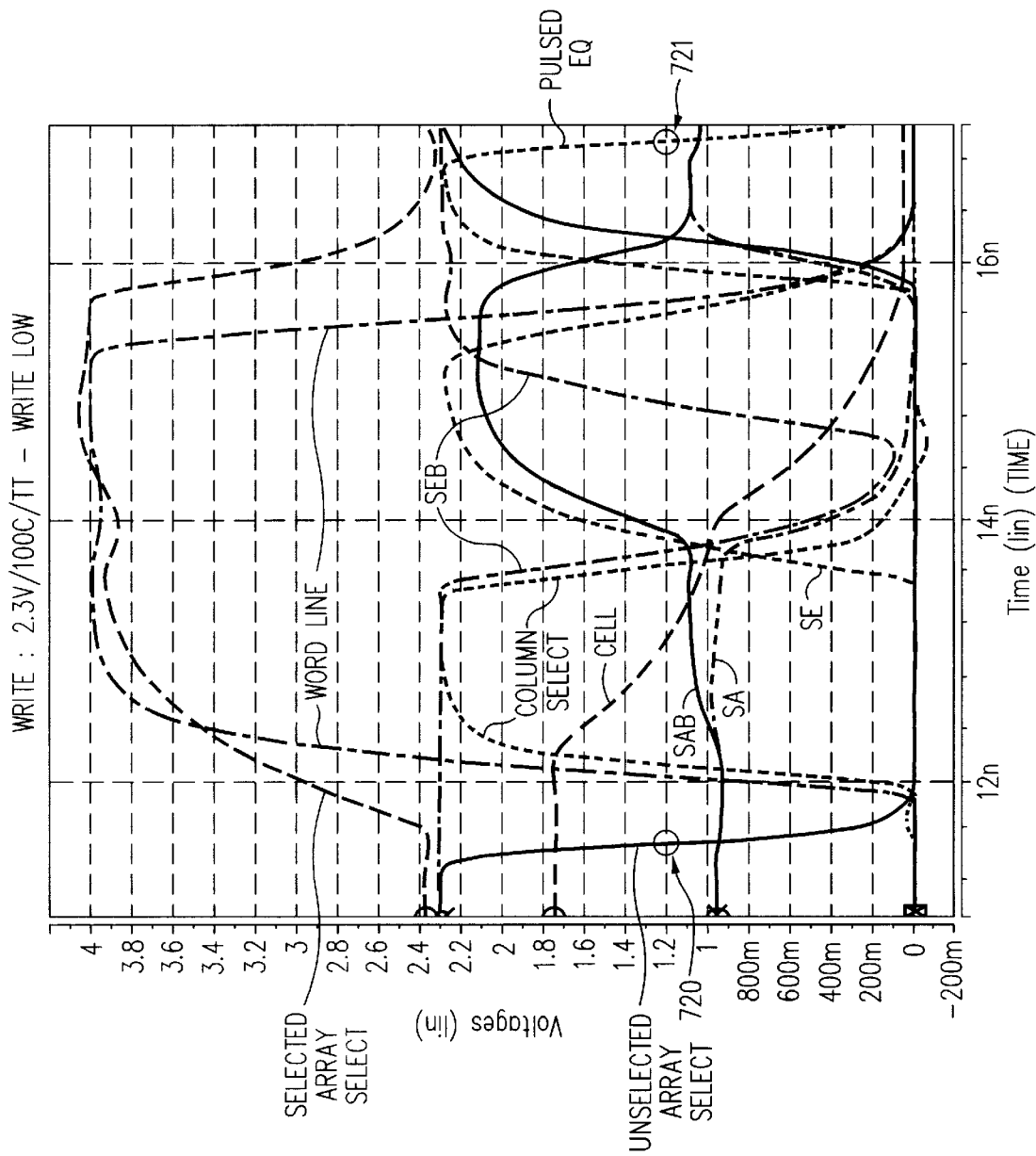
FIG. 31 is a waveform diagram illustrating the major array and sense amplifier signals when writing a low into the selected memory cell (having a previously stored high) while operating at a VDD of 2.3 volts.

FIG. 31 illustrates a write operation at the same process corner when writing a low into a selected memory cell having a previously stored high. Of note, the selected memory cell, which was previously written to a high level of about 1.75 volts, is discharged into the true bit line and true side of the sense amplifier, and yet the voltage of the internal node SA is driven downward (and the voltage of the complementary internal node SAB is driven upward) by the coupling of the global input line pair to the sense amplifier. After latching, the sense amplifier restores a low level of approximately 50 mV into the selected memory cell, even though this cycle must fully discharge the selected memory cell capacitor from a stored high to a stored low.

As stated above, for a particular device operating at near its minimum cycle time, the level equilibrate signals may be brought inactive about the same time as the pulsed equilibrate signals go inactive under automatic control from the last cycle. Said differently, the "back sides" of both the "level" equilibrate signals and the "pulsed" equilibrate signals substantially "line up" when a given device operates at its minimum cycle time. Looking again at FIG. 31, the unselected array select signal is brought to VSS at the start of the active cycle, which is substantially the same time as the level equilibrate signal is also brought to VSS. Using the point when a signal crosses 1.2 volts as a reasonable method to measure time (being approximately one-half of the VDD voltage), the level equilibrate signal therefore falls at a time labeled 720. At the end of the cycle shown, the pulsed equilibrate signal falls at a time labeled 721, at which time the bit line equilibration and bit line sense amplifier equilibration are complete. The falling edge of the level equilibrate signal in a subsequent cycle could therefore line up with the falling edge of the pulsed equilibrate signal shown at point 721 for the current cycle. Measuring the horizontal distance between points 720 and 721 on the horizontal axis suggests a minimum cycle time of 5.3 ns for the typical process embodiment shown operating at a slow environmental corner.

Because the preferred embodiment uses only 128 word lines per complementary bit line pair (64 memory cells connected to the true bit line BL, and 64 memory cells connected to the complement bit line BLB), and further because the preferred embodiment uses a first stage read amplifier connected directly to the internal nodes of each bit line sense amplifier, there is significantly less total capacitance on the combined bit line/internal node than in a traditional design which uses 256 word lines per complementary bit line pair. Even though the written high level is only approximately 2.0 volts, there nonetheless is more signal available at the sense amplifier when sense enable occurs than for a traditional DRAM design using 256 word lines per bit line pair and a fall VDD written/restored high level, even though not all of the available signal is used. For example, with aggressive timing, only 64% of the otherwise available signal (for extremely relaxed latch timing) may be actually achieved (e.g., 80% transferred to the bit line sense amplifier before sensing, and 80% transferred back into the selected memory cell before the end of restore), but this is still more signal than for a traditional DRAM design using 256 word lines per bit line pair and a fall VDD written/ restored high level. Moreover, with shorter bit lines, especially when equilibrated from both ends, a much faster equilibration time may be achieved.

Figure 32:
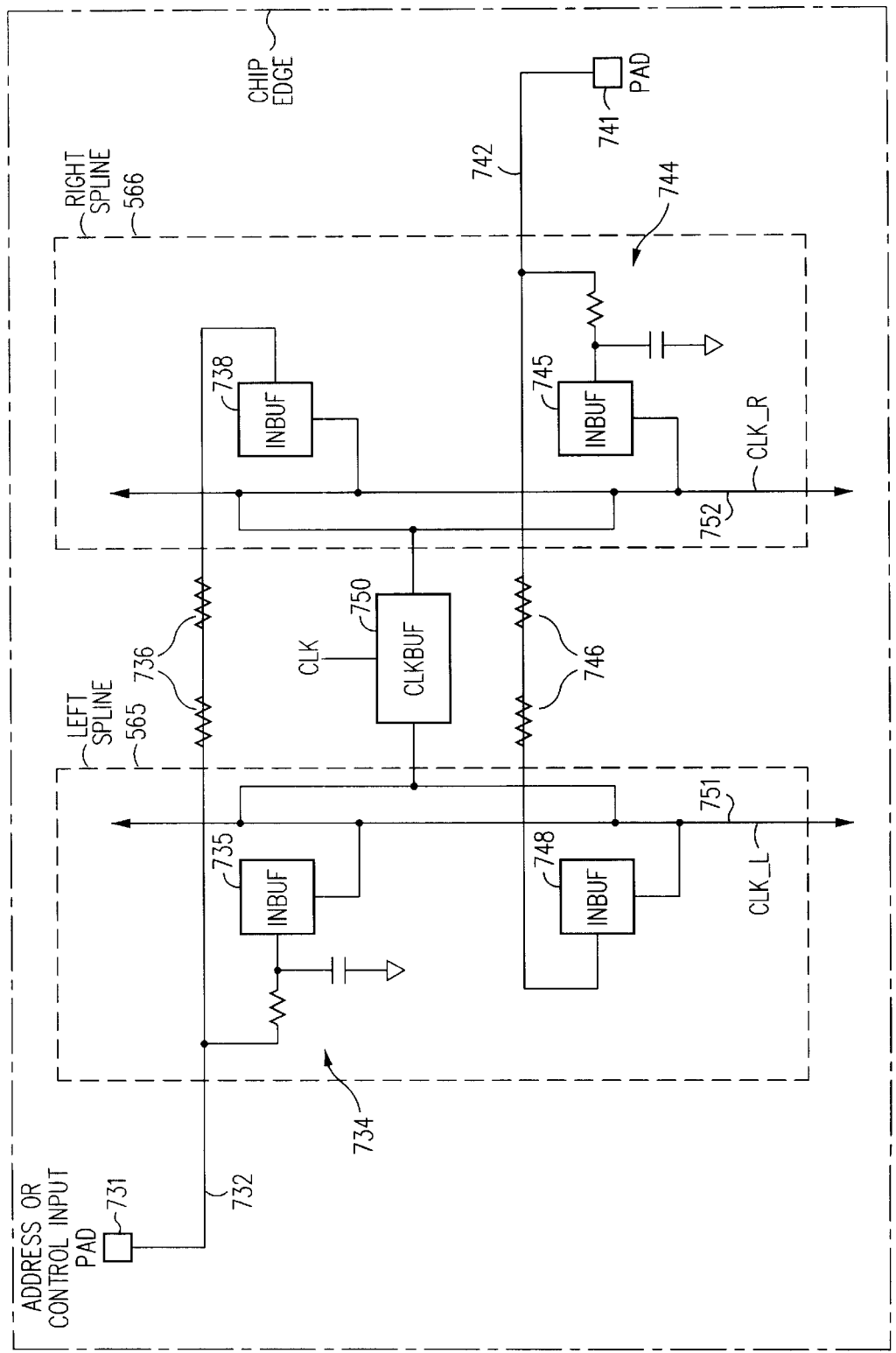
FIG. 32 is a schematic diagram illustrating use of dual input buffers for each address input for the memory array embodiment shown in FIG. 20, with one input buffer preferably located within the left spline, and the other input buffer located within the right spline, and further illustrates a timing compensation network for the internal clock signal which strobes each buffer, so that setup and hold times for both left and right buffers are closely matched.

FIG. 32 is a schematic diagram illustrating the preferred use of dual input buffers for each address and control input for the memory array embodiment shown in FIG. 20, with one input buffer preferably located within the left spline, and the other input buffer located within the right spline. FIG. 32 further illustrates a timing compensation network for the internal clock signal which strobes the buffers, so that setup and hold times for both left and right buffers are closely matched. An input pad 731 for an address or control input is shown located on the left side of the chip layout. An externally applied signal coupled to the pad 731 is conveyed via a horizontally-arranged interconnect wire 732 to a first input buffer 735 located in the left spline 565 and to a second input buffer 738 located in the right spline 566. The horizontal interconnect wire 732 is routed across the left-most memory bank 561 (not shown) and across both central memory banks 562, 563 (not shown) through an otherwise unused wiring channel in one of the holes between array blocks (see, for example, FIG. 20). A first R-C compensation circuit 734 is provided between the interconnect wire 732 and the corresponding "upstream" latching input buffer 735. This compensation circuit 734 delays the input signal from reaching the upstream buffer 735, and is sized to substantially match the additional delay of the input signal in reaching the "downstream" buffer 738 which arises because of the parasitic resistance 736 and capacitance of the interconnect wire 732 traversing the width of two additional entire memory banks. If the arrival of the signal reaching the upstream buffer 735 is delayed until the same signal reaches the downstream buffer 738, then both buffers 735, 738 may be clocked (i.e., strobed) at the same time, and the apparent setup and hold time window required by the combined use of two input buffers for the same input may be substantially identical to that otherwise required if only one such buffer were used.

A second input pad 741 is also shown for a different address or control input located on the right side of the chip layout. An externally applied signal coupled to the pad 741 is conveyed via a horizontally-arranged interconnect wire 742 to an upstream input buffer 745 located in the right spline 566 and to a downstream input buffer 748 located in the left spline 565. The horizontal interconnect wire 742 is routed across the right-most memory bank 564 (not shown) and across both central memory banks 563, 562 (not shown) through another otherwise unused wiring channel in one of the holes between array blocks. An R-C compensation circuit 744 is provided between the interconnect wire 742 and the corresponding upstream latching input buffer 745, which likewise delays the input signal from reaching the upstream buffer 735 to preferably match the additional delay of the input signal in reaching the "downstream" buffer 748 which arises because of the parasitic resistance 746 and capacitance of the interconnect wire 742 traversing the width of two additional entire memory banks.

This interconnect wire 732 is preferably implemented as a metal wire, although other conductive materials might also be employed if sufficiently low in resistance. The R-C compensation circuits 734, 744 may be implemented as a lumped resistance and lumped capacitance, or multiples thereof in series, but are preferably each implemented using a distributed resistance/capacitance structure to better match both the delay and waveshape of the signal as received by the downstream buffer (which is delayed by the distributed parasitic resistance and the distributed capacitance of its corresponding interconnect wire). For example, a long, narrow polysilicon feature, may provide adequately high total resistance, and may be loaded down with distributed capacitance to approximately match the delay of the interconnect wire 732 between the left and right splines.

A left internal clock signal CLK_L is conveyed on a vertically-arranged wire 751 running up through the left spline 565, and strobes both the upstream input buffer 735 and the downstream input buffer 748. A right internal clock signal CLK_R is conveyed on a vertically-arranged wire 752 running up through the right spline 566, and strobes both the downstream input buffer 738 and the upstream input buffer 745. Both left and right internal clock signals CLK_L, CLK_R are symmetrically driven by a centrally-located clock driver 750 through a symmetrical distribution network to substantially ensure phase-aligned clock signals along the fall length of both the left and right clock signals. Consequently, a very short worst case setup and hold time is achievable over all such inputs (using an input buffer requiring valid data for only a very short window of time). The use of a separate input buffer in each spline for each input increases the input capacitance of each input to the chip due to the long interconnect wire 732 or 742 (which input capacitance, of course, must be driven by the source of the external signal). However, each such input buffer now drives its complementary internal outputs only to decoder and control circuitry within the same spline. Thus, the total capacitive loading on the complementary outputs of each buffer are advantageously reduced. Furthermore, it easy to gate all the various signals to only the spline required for the particular operation. For a read or write operation to memory bank 561 or 562, the vertical global control, timing, and address signals for spline 565 are active, and the corresponding signals in spline 566 are inactive to save considerable power. Likewise, when memory bank 563 or 564 is to be read or written, most of the signals in spline 565 remain inactive.

In an alternative embodiment, an "early" clock signal and a "late" clock signal could be used in each spline. The upstream buffers within each spline are then strobed using the "early" (i.e., "upstream") clock signals, and the downstream buffers are then strobed using the "late" (i.e., "downstream") clock signals. In this case, the R-C compensation circuits 734, 744 are not used, and the delay between the upstream and downstream clocks is adjusted to substantially match the additional delay of the input signals, relative to their arrival at the upstream buffers, in reaching the downstream buffers. In this way, the setup and hold time window may still be achieved (albeit at the additional complexity of generating and distributing the second "downstream" clock).

Figure 33:
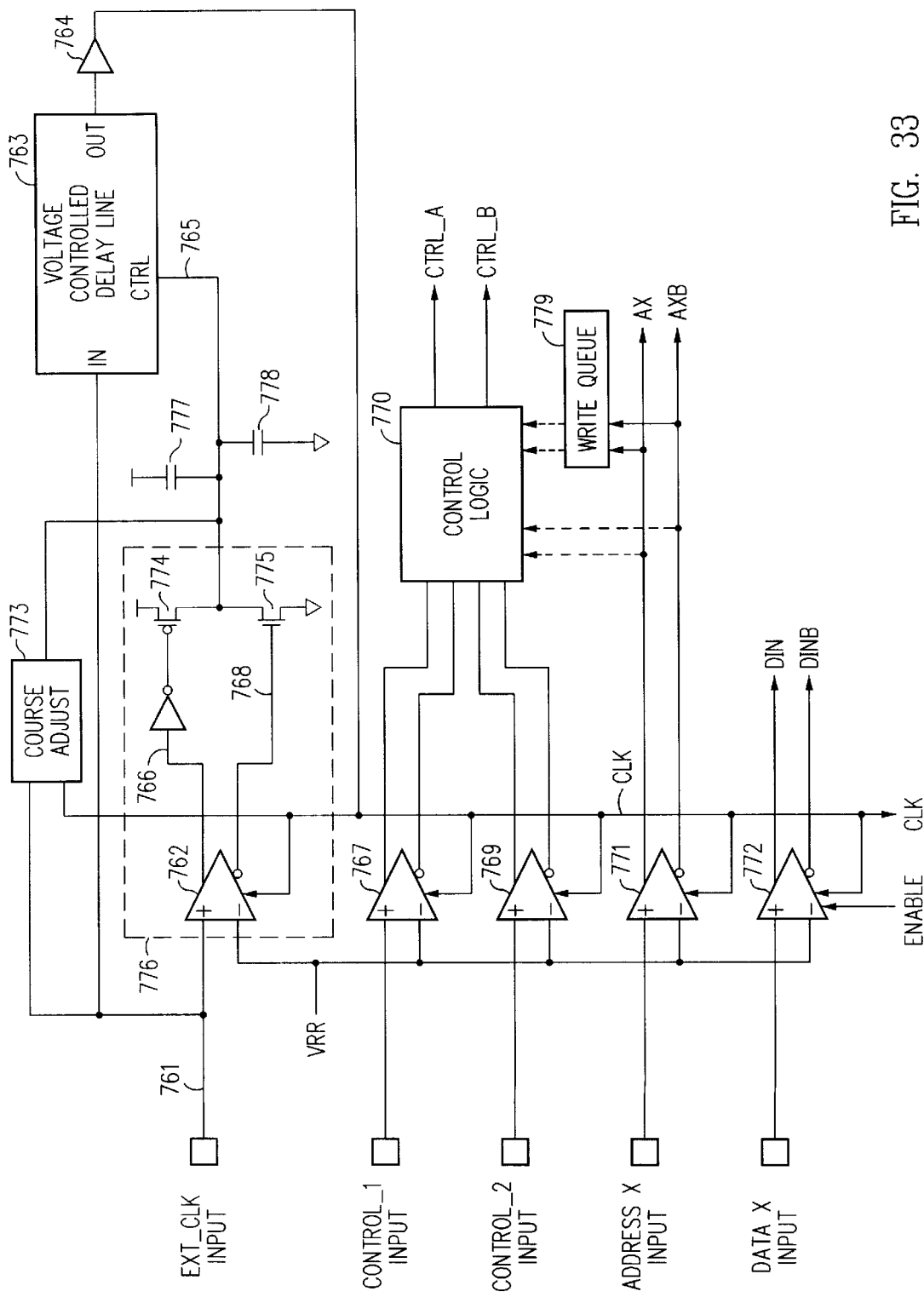
FIG. 33 is a block diagram of an embodiment of a feedback controlled circuit for generating an internal clock signal which is phase and frequency locked to an external clock signal, which is useful for strobing other address and control input signals into the memory device with a setup and hold time window very closely aligned to the rising edge of the external clock.

FIG. 33 is a block diagram of an embodiment of a feedback controlled circuit for generating an internal clock signal which is phase and frequency locked to an external clock signal, and which is useful for strobing address, data, and control input signals into the memory device with a setup and hold time window very closely aligned to and centered about the rising edge of the external clock.

An external clock signal EXT_CLK is conveyed on wire 761 to a voltage controlled delay line 763, which provides a delayed signal on its output in accordance with an analog voltage received on a CTRL input (node 765). The output of the voltage controlled delay line 763 is buffered by a buffer 764 to generate an internal clock signal CLK. The timing of the internal clock signal CLK is thus delayed from the external clock signal EXT_CLK, and is adjusted by the voltage controlled delay line 763 to nominally be aligned with the next rising edge of the external clock signal EXT_CLK, as is described in greater detail below.

The external clock signal EXT_CLK and the internal clock signal CLK are both conveyed to a course adjust block 773 which functions to bring the internal clock signal CLK in relatively close alignment to the external clock signal EXT_CLK (by adjusting the voltage of the timing node 765). However, when the alignment is fairly close, the course adjust block 773 then switches out, leaving just a fine adjustment block 776 to bring the internal clock signal CLK to the final "close" alignment with the external clock signal EXT_CLK. Since the course adjust block 773 need not provide for fine adjustment near the desired alignment, it may be advantageously designed to quickly bring the internal clock signal CLK into relatively close alignment with the external clock signal EXT_CLK. For example, during each clock cycle, it may cut the phase error by half, until the phase error is within +/−200 ps, at which point it switches out, and provides no additional charge to or from the timing node 765.

Within the fine adjustment block 776, the external clock signal EXT_CLK is also conveyed on wire 761 to a latching differential buffer 762, along with a reference voltage VRR which is preferably equal to one-half VDD (for rail-to-rail external input signals, including the external clock signal). The buffer 762 is strobed by the internal clock signal CLK. The internal clock signal CLK is delayed from the previous external clock signal EXT_CLK, and the precise delay from the previous rising edge of the external clock signal EXT_CLK is fine adjusted by the fine adjustment block 776 to strobe the buffer 762 nominally at the next rising edge of the external clock signal EXT_CLK. For example, assume a given phase alignment of the internal clock signal CLK with respect to the external clock signal EXT_CLK (which is already assumed to be brought within +/−200 ps of the desired time). If the buffer 762, when strobed, interprets its input, EXT_CLK, as a logic "0," (i.e., the complementary output is momentarily driven high, and the true output remains low), then the external clock signal EXT_CLK during its rising edge must not yet have reached the reference voltage (e.g., one-half VDD) when the buffer 762 was strobed. In other words, the buffer 762 was strobed too early.

If the complementary output of buffer 762 (node 768) is driven momentarily high, very narrow transistor 775 turns on very briefly to conduct a very small amount of charge from the timing node 765. The total capacitance of the timing node 765 is the sum of both capacitor 777 (the other terminal of which is coupled to VDD) and capacitor 778 (the other terminal of which is coupled to VSS). Together, the total capacitance of the timing node 765 is relatively high. The small charge removed from the large capacitance of the timing node 765 results in a very slight decrease in voltage of the timing node 765, which is coupled to the CTRL input of the voltage controlled delay line 763. The voltage controlled delay line 763 then reacts to the lower voltage on its CTRL input by very slightly adjusting its timing and delaying the phase of the internal clock signal CLK for the next (and following) cycles.

Conversely, if the buffer 762, when strobed, interprets its input, EXT_CLK, as a logic "1," then the external clock signal EXT_CLK during its rising edge must have already exceeded the reference voltage (e.g., one-half VDD) when the buffer 762 was strobed. In this case, the buffer 762 was strobed too late. In this case, the true output of buffer 762 (node 766) is driven momentarily high, and is inverted to drive the gate of P-channel transistor 774, which turns on briefly to conduct a small amount of charge into the timing node 765, thereby increasing the voltage on the timing node 765. The voltage controlled delay line 763 then reacts to the higher voltage on the timing node 765 (coupled to its CTRL input) by very slightly adjusting its timing and advancing the phase of the internal clock signal CLK for the following cycles.

In this fashion, the rising edge of the internal clock signal CLK is adjusted to nominally occur near the midpoint of the rising edge of the external clock signal EXT_CLK (i.e., be phase aligned with the external clock signal). However, the internal clock signal CLK is actually adjusted to occur slightly ahead of the external clock signal EXT_CLK, because the circuit arrangement shown actually adjusts the setup and hold time window of the buffer 762, as strobed by the internal clock signal CLK, to be centered around the mid-point of the rising edge of the external clock signal EXT_CLK. The fine adjustment block 776 typically provides, during each cycle, a net change in charge on the timing node 765, (and a resulting change of voltage on timing node 765) of a magnitude which causes about a +/−20 ps change in the delay through the voltage controlled delay line 763. The capacitance on the timing node 765 is split between a first timing capacitor 777 connected to VDD, and a second timing capacitor 778 connected to VSS. The ratio of these two timing capacitors is adjusted so that, for a change in voltage on, for example, VDD (as might occur during a noise spike), the voltage of the CTRL node is coupled by an amount which results in as little change as possible in the delay through the voltage controlled delay line 763.

Additional buffers 771, 772, 767, 769 are implemented with identical characteristics as buffer 762 (e.g., preferably using the same circuit and the same layout). For example, an external data input signal is received by buffer 772 which generates complementary internal data signals DIN, DINB. The phase alignment of the internal clock signal CLK affords a very narrow external setup and hold time window for the external data input signal which is substantially aligned to and centered about the rising edge of the external clock signal EXT_CLK. Similarly, an external address input signal is received by buffer 771 which generates complementary internal address signals Ax, AxB. The phase alignment of the internal clock signal CLK likewise affords a very narrow external setup and hold time window for the external address input signal which is substantially aligned to and centered about the rising edge of the external clock signal EXT_CLK. To save power, the data buffer 772 includes an enable input which is active only for external cycles which must strobe input data (e.g., those cycles following by one clock cycle (for the flow-through mode) or by two cycles (for the pipelines mode) the receipt of an earlier external write cycle, when the write data for such an external write cycle is received). Since the control inputs can initiate either a read or write on any cycle, the control inputs and address inputs are strobed for every external cycle. No such enable signal is provided, and the control buffers 767, 769 and the address buffers 771 are always enabled. While FIG. 33 illustrates the general relationship between the external clock signal EXT_CLK, the internal clock signal CLK, and the strobing of address signals by address buffers, the dual buffer arrangement of the preceding figure is preferably employed in addition to the concepts described here in FIG. 33.

A first control signal CONTROL_1 (which might be, for example, a read/write control input) is conveyed to buffer 767, which samples the control signal CONTROL_1 and conveys a corresponding output signal to a control circuit 770. A second control signal CONTROL_2 is conveyed to buffer 769, which samples the control signal CONTROL_2 and also conveys a corresponding output signal to control circuit 770, which then generates internal control signals CTRL_A, CTRL_B which may variously be combinations of the external control signals CONTROL_1, CONTROL_2, and any other control signals CONTROL_N (not shown) and optionally, certain address inputs (as shown). Examples of such internal control signals CTRL_A, CTRL_B include a signal to indicate a read operation from memory bank 1 (which requires the portion of the externally supplied read address that selects the memory bank to be read), a signal to indicate a write operation to memory bank 2 (which requires, from the "bottom" entry of the write queue 779 (i.e., the oldest non-retired entry), the portion of the previously supplied write address that selects the memory bank to be written), a signal to indicate a refresh operation for memory bank 3 (which requires that memory bank 3 is neither performing a read nor a write), and other similar signals. By first sampling the external control signals in buffers 767, 769, then performing the necessary logical operations on the output signals of the buffers 767, 769 to generate the required internal control signals, the setup and hold time window for the control signals is well matched to that of the address and data input signals (which is substantially aligned to and tightly centered about the rising edge of the external clock signal EXT_CLK).

The internal clock signal CLK may also be used to control the turn-off time of the data output buffers which drive the external data pins (e.g., and which are typically connected to an external data bus), so that enabling another output buffer (to drive the same external data bus) by a timing signal which occurs shortly thereafter (e.g., a timing signal which occurs at one-third of the external clock period), does not result in a bus conflict.

Figure 34:
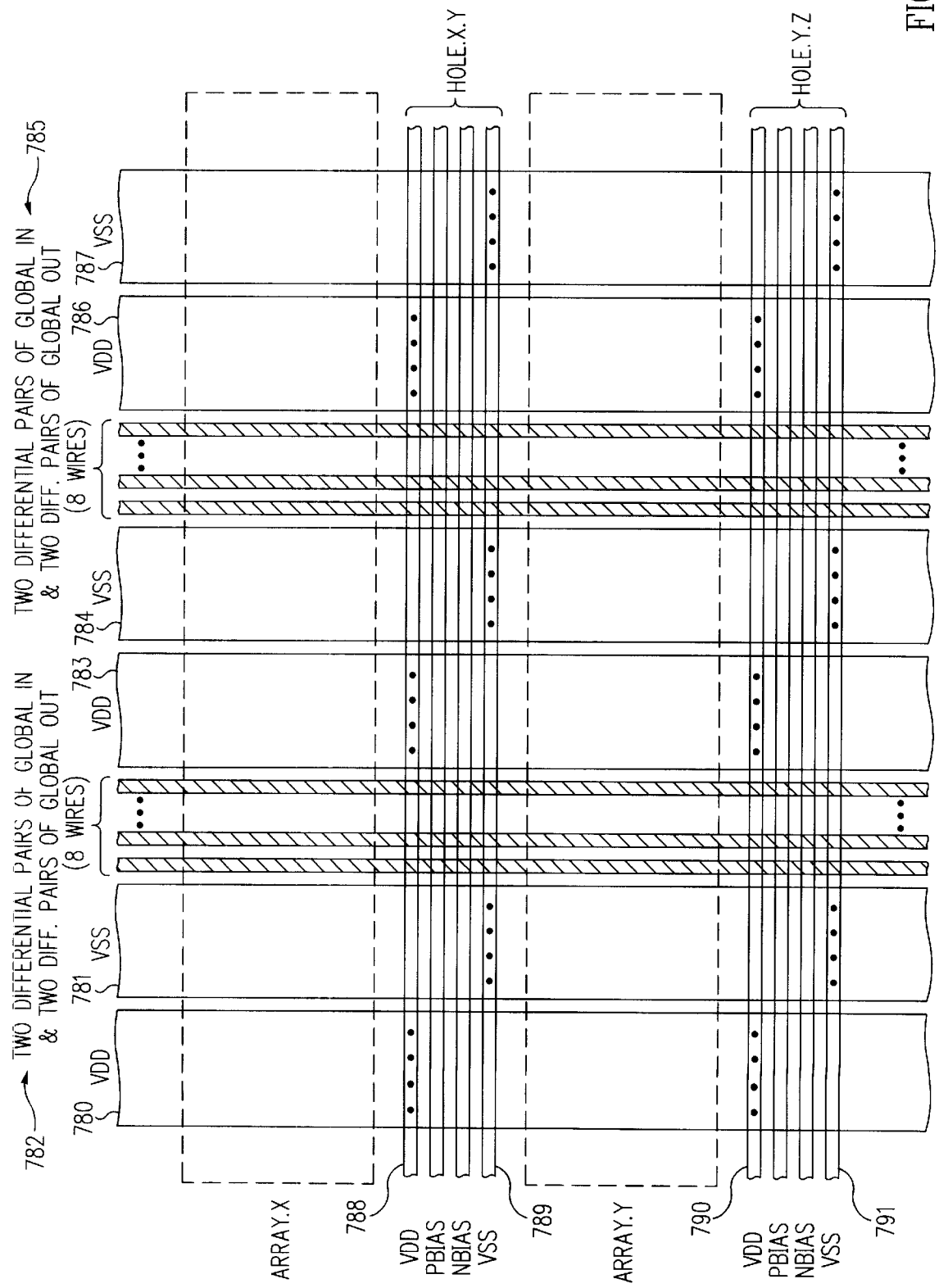
FIG. 34 is a layout diagram of a preferred embodiment of a two-dimensional power supply bus grid within a memory bank, and particularly shows large VDD and VSS buses arranged vertically to run parallel to, and in a metal layer located above, the bit lines, and covering substantially all the array block except for periodic groupings of global input and output lines which may be implemented in the same layer of metal as the VSS and VDD buses.

FIG. 34 is a layout diagram of a preferred embodiment of a two-dimensional power supply bus grid within a memory bank for handling the very high transient current during bit line sensing. Two representative array blocks ARRAY.X and ARRAY.Y within a memory bank are shown, along with adjacent holes HOLE.X.Y and HOLE.Y.Z. Looking first at hole HOLE.X.Y, a VDD bus (labeled as 788) and a VSS bus (labeled as 789) are routed horizontally through the hole for the entire width of the memory bank. The VDD and VSS terminals of each bit line sense amplifier within the hole are respectively connected to the VDD bus 788 and the VSS bus 789 which run overhead each and every bit line sense amplifier within the hole.

However, the width of the VDD bus 788 and the VSS bus 789 is typically limited by layout constraints within the bit line sense amplifier. If these are the only two buses providing a source of power and ground to the entire row of bit line sense amplifiers within the hole HOLE.X.Y, the limited width of these buses results in a total bus resistance which is high enough to significantly increase the time required to sense and restore the high and low levels on the bit lines. Moreover, the bit line sense amplifiers near the lateral center of the memory bank would have degraded voltages on their local portion of the power buses compared to the sense amplifiers near the left and right sides of the memory bank (i.e., at the two ends of the VDD and VSS buses routed through the hole). Since the preferred embodiments of the present invention includes a complementary sense enable signal SEB which is a relatively short pulse designed to deliver a predetermined amount of charge into the high-going sense amplifier and bit line nodes, such a wide variation of local power supply voltage would cause tremendous variations in the levels written into various bit lines across the width of the memory bank.

To provide a much lower impedance VDD and VSS supply for each row of sense amplifiers, a group of large VDD and VSS buses are provided which are routed vertically (parallel to the bit lines) across the entire height of the memory bank, and which respectively connect to each of the horizontal VDD and VSS buses already connected to each sense amplifier, thus forming a two-dimensional grid of VDD and VSS buses. For example, a vertical VDD bus 780 connects with the horizontal VDD bus 788 within the hole HOLE.X.Y (as indicated by the "dots" at their intersection), and further connects with the horizontal VDD bus 790 within the hole HOLE.Y.Z, and likewise connects with the horizontal VDD bus within all other holes (not shown). Similarly, a vertical VSS bus 781 connects with the horizontal VSS bus 789 within the hole HOLE.X.Y, and further connects with the horizontal VSS bus 791 within the hole HOLE.Y.Z, and likewise connects with the horizontal VSS bus within all other holes (not shown).

As is described much earlier above (particularly in regard to FIGS. 20–22), thirty-six differential pairs of global output lines (e.g., GOUT, GOUTB) traverse the entire height of the memory bank and exit the top of the memory bank to convey read data to an amplifier/multiplexer (which then conveys the selected half of these to associated data output buffers). Thirty-six additional differential pairs of global output lines traverse the entire height of the memory bank and exit the bottom of the memory bank. Two differential pairs of these global output lines are grouped together, along with two differential pairs of corresponding global input lines, making a group of eight physical wires. Two such eight-wire groups 782 and 785 are shown in FIG. 34. Thirty-six such 8-wire groups are evenly spaced across the width of the memory bank (excluding a thirty-seventh 8-wire group for column redundancy) at a spacing (center-to-center) equal to approximately the width of sixteen bit line sense amplifiers in one hole, or equal to approximately the width of 32 pairs of true and complement bit lines.

The vertical VDD bus 783 and the vertical VSS bus 784 together occupy almost the entire gap between the adjacent wire groups 782 and 785. These vertical buses are preferably implemented in a high layer of metal (e.g., the top layer) and vertically pass directly above the bit lines which lie below (a few of the bit lines actually lie below the global input and output lines in wire groups 782, 785). Other VDD buses 780, 786 and VSS buses 781, 787 are also shown, and which likewise occupy the respective gaps between their adjacent wire groups. These vertical VDD and VSS buses thus cover substantially all of each array block within the memory bank except for periodic groupings of global input and output lines, which may be implemented in the same layer of metal as the VDD and VSS buses.

VDD-to-VSS filter capacitors are located at the top and bottom of each memory bank to provide substantial bypass capacitance to withstand the large current spikes which occur during sensing. These very wide vertical VDD and VSS buses collectively provide a very low resistance and very low inductance path between sense amplifiers located in each hole and the VDD-to-VSS filter capacitors. The large metal buses allow the stored charge in the filter capacitors to reach the two selected rows of sense amplifiers with very little voltage drop, and allow the selected sense amplifiers to latch quickly and provide a good VSS low level and uniform restored high levels to the bit lines within the selected array block. The filter capacitors, as well as other filter capacitors implemented elsewhere within the device, are preferably implemented using many independent capacitors which are individually de-coupled and switched out of the circuit if more than a predetermined leakage current is detected flowing through a given capacitor (i.e., a "shorted" capacitor).

Figure 35:
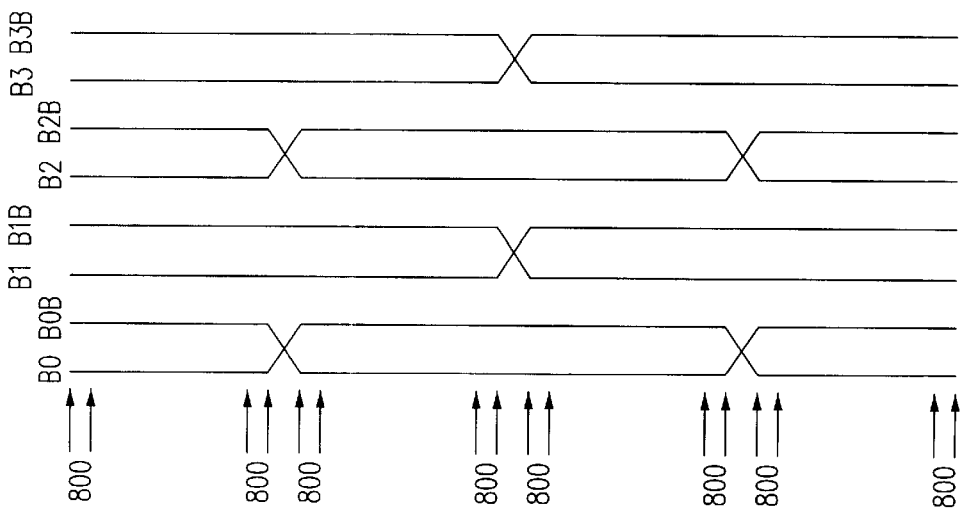
FIG. 35, labeled prior art, is a layout diagram of a well known bit line cross-over arrangement for reducing noise coupling from adjacent bit lines.

Bit line crossover structures are advantageously used to achieve lower worst case coupling, during both read or write operations, onto a particular bit line pair from neighboring bit lines on either side. FIG. 35, labeled prior art, is a layout diagram of a well-known bit line crossover arrangement for reducing noise coupling from adjacent bit lines. A first complementary bit line pair B0, B0B is shown incorporating a lateral crossover at both the ¼ and ¾ points along its length (which length, for the embodiments described herein, corresponds to the height of an array block). An adjacent complementary bit line pair B1, B1B incorporates a single crossover at the point half-way down its length. This pattern repeats every two pairs of bit lines, thus the third bit line pair B2, B2B and fourth bit line pair B3, B3B are configured respectively like B0, B0B and B1, B1B. Because photolithographic guard cells are frequently used at the edges of each arrayed group of memory cells, there is an increased layout area penalty in providing crossover structures due to the required guard cells on either side of each crossover structure. Eight such groups of guard cells, each labeled 800, are shown which are required with this arrangement at the top and bottom edges of each arrayed group of memory cells. As indicated in FIG. 35, each guard cell group 800 may be implemented as two additional non-functional (i.e., dummy) word lines. Consequently the area consumed by such guard cell groups is non-trivial, and thus the total area required to implement the crossover arrangement of FIG. 35 may be an appreciable percentage of the array block area. This prior art configuration reduces crosstalk (pattern sensitivity) and allows good signal development, but does so at the cost of significant extra area.

Figure 36:
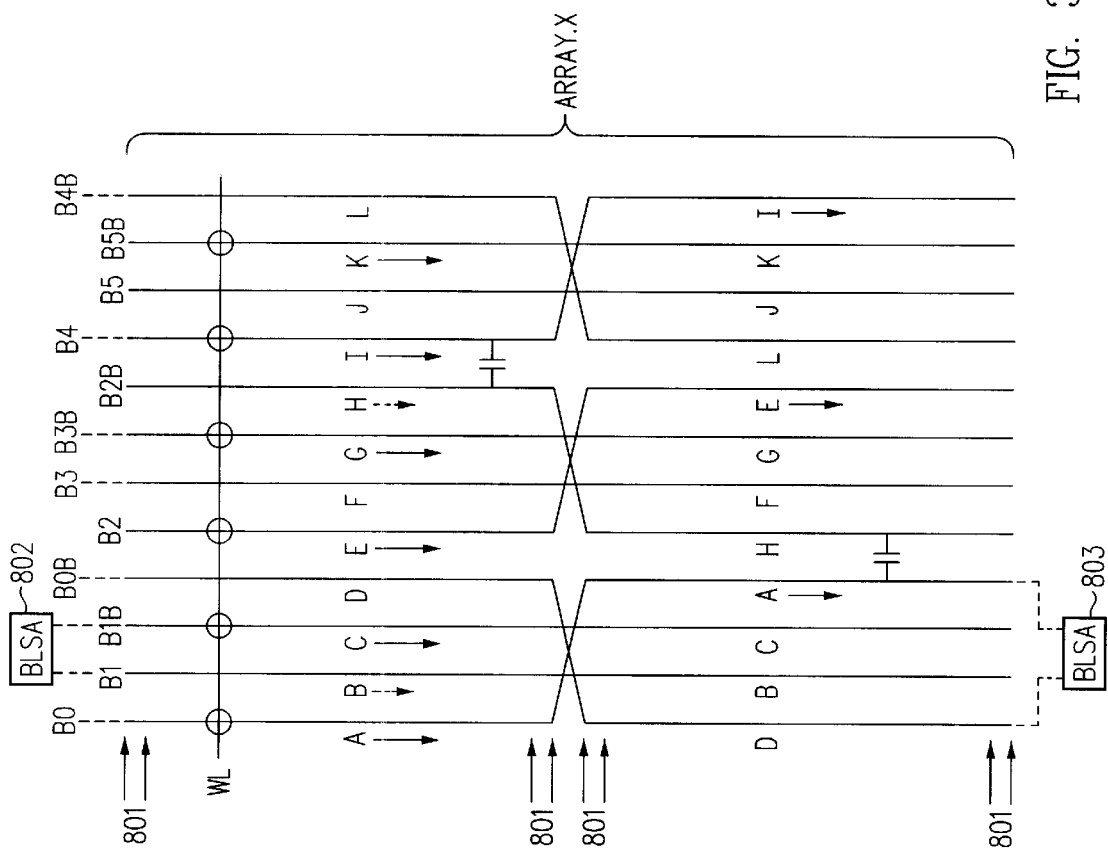
FIG. 36 is a layout diagram of a portion of a memory array block which illustrates a preferred embodiment of an improved cross-over arrangement for reducing noise coupling from adjacent bit lines within the array block, which affords similar benefits as that shown in FIG. 33 while reducing the area consumed by photolithographic guard cells.

To reduce this area penalty, a novel crossover arrangement is employed, for certain embodiments, which provides a significant degree of noise (i.e., coupling) reduction, allows the same worst case signal development as the prior art structure, but requires only one crossover structure within each array block. Referring now to FIG. 36, each complementary pair of bit lines runs vertically from the top to the bottom of an array block ARRAY.X, as before. The true bit line and complement bit line of a first pair (e.g., B1, B1B) run adjacent to each other from the top to the bottom of the array block without any crossovers. The true bit line and complement bit line of a second pair (e.g., B0, B0B) do not run adjacent to each other, but instead straddle the first pair, with a single crossover half-way down the second bit line pair (vertically in the middle of the array block). Both the true and complement bit lines B1, B1B of the first pair lie between the true and complement bit lines B0, B0B of the second pair. This crossover arrangement repeats horizontally throughout each array block in groups of two pairs of bit lines (four physical bit line wires). Thus, a third bit line pair B3, B3B and fifth bit line pair B5, B5B are configured like B1, B1B, and a fourth bit line pair B2, B2B and sixth bit line pair B4, B4B are configured like B0, B0B.

By using this crossover arrangement, only four groups of guard cells (each labeled as 801) are used in each array block- one each at the top and bottom of the array block, and one each at the top and bottom of the single crossover structure located in the vertical center of the array block. Consequently the area consumed by such guard cell groups for the crossovers as well as for the crossovers themselves is reduced to only one third that required by the prior art structure. And yet, the worst case signal degradation due to capacitive coupling between neighboring bit lines is no worse than for the arrangement of FIG. 35. To more easily describe the coupling within the arrangement of FIG. 36, each bit line wire has also been labeled "A," "B," "C" . . . "L."

Consider first the coupling between wire B and C. Any change in voltage which develops on wire C (e.g., when accessing a memory cell connected thereto) causes a change in voltage on wire B, albeit of a smaller magnitude, due to the lateral capacitive coupling between wires B and C. For example, if the voltage of wire C moves downward by 100 mV when reading a memory cell having a stored low, the voltage of wire B may move downward by, for example, 20 mV. The 100 mV of potential signal between the true and complement bit line (and likewise within the bit line sense amplifier 802) is reduced to a differential voltage of, for example, 80 mV because of this self-coupling between adjacent true and complement bit lines. The presence of any crossover between the adjacent true and the complement bit line does not change this result, because the coupling therebetween remains unchanged. In other words, the prior art circuit suffers from this signal attenuation, also.

In contrast, the coupling between the B, C wire pair and the A, D wire pair is perfectly balanced, so there is no similar degradation of differential signal levels on the B, C wire pair caused by voltage excursions on either wire A or D, and likewise no degradation of differential signal levels on the A, D wire pair caused by voltage excursions on either wire B or C. For example, if the voltage of wire C moves downward by 100 mV, the voltage of wire D is coupled downward by a certain amount (e.g., 10 mV) due to the adjacent "C-D" coupling in the upper half of the array block, but the voltage of wire A is coupled downward by the same amount due to the adjacent "C-A" coupling in the lower half of the array block. Thus, any differential voltage otherwise developed on the A, D wire pair is unaffected by any voltage perturbation of either wire B or C. (As the example just described shows, however, the common-mode voltage levels of the A, D wire pair may be affected by voltage perturbations of either wire B or C.) Similarly, if the voltage of wire A moves downward by 100 mV, the voltage of wires B and C are coupled downward by the same amount (e.g., 10 mV), and the differential voltage otherwise developed on the B, C wire pair is unaffected by any voltage perturbation of either wire A or D.

An arbitrary word line WL is shown in the upper half of the array block, and the memory cells driven by the word line WL are connected to particular bit lines as indicated by the open circles. Assume that each of these memory cells store the same data, which is a low, when the word line WL is driven high. The voltage of each bit line consequently moves in a direction as indicated by the solid vertical arrows. Wire H is coupled downward (i.e., "the voltage of wire H is coupled downward") by the "I-H" coupling in the upper half of the array block (represented by a small lateral capacitor) and by the "A-H" coupling in the lower half of the array block (also represented by a small lateral capacitor). Wire H is thus coupled downward (indicated by a dashed arrow) along its entire length by "an adjacent bit line wire" (actually half of wire I and half of wire A), which is no worse than the self-coupling between wires B and C described above or any pair of adjacent (crossing) wires of the prior art structure. Note that for this arbitrary word line WL, wire D is not driven by a memory cell and therefore does not couple a signal to the top half of wire E. Similarly, wire L does not couple a signal to the bottom half of wire E. Therefore, the E, H wire pair is no worse than the B, C wire pair. That is, for the signals and capacitances of the example, the prior art arrangement of FIG. 35 provides a signal of 80 mV independent of what the neighboring bit lines do. The new arrangement of FIG. 36 provides a worst case signal of 80 mV, no worse than the prior art. Interestingly, it provides a best case signal of 120 mV (wires A and I having opposite data as wire E) which is of little value since the memory device must function under worst case conditions or patterns. An analogous situation arises for a data pattern of all highs stored within each memory cell driven by a given word line. Consequently, the worst case pattern sensitivity of this arrangement is an array of all 1's or all 0's, which is particularly helpful in reducing required test times.

The crossover structure shown in the embodiment thus far described is located at the mid-point of the respective bit lines (i.e., half-way across the array block). As described, this cancels the non-common-mode contribution of the lateral capacitive coupling from neighboring lines within the array block. For some embodiments, a location other than the mid-point may be preferred. For example, the lateral coupling between adjacent bit lines which occurs within a portion of the bit line sense amplifier layout, or within a portion of an equilibration circuit, or for some other reason, may contribute to a coupling onto one of a pair of bit lines which is not entirely offset by an equal coupling onto the other of the pair of bit lines when the crossover structure is located at the mid-point of the array block. As a result, the placement of the crossover structure may be at a location within the array block other than half-way across the array block to provide a substantially equal coupling onto both bit lines of the pair (i.e., substantially negligible differential coupling).

It should be appreciated that a crossover structure as used herein provides an electrical path for one line to cross another line without contacting the other line. When viewed in layout terms, it does not necessarily imply that a higher level interconnect layer must be used to "cross over" a lower level interconnect layer. In other words, a "first wire which crosses over a second wire" may be used herein without separate meaning from a "first wire which crosses under a second wire" unless the context clearly requires a distinction. It should consequently be appreciated that a crossover structure which provides a path for a first wire to "cross over" a second wire may be implemented using either a lower or higher interconnect layer than the second wire. Moreover, while described in the context of a dynamic memory array, the cross-over arrangement shown in FIG. 36 is also well suited for other types of arrays whose memory cells connect to only one of either a true bit line or a complement bit line, such as a read only memory array or a programmable read-only memory array. The arrangement of FIG. 36 is not as well suited for use with static memory arrays because the spacing between a given true and complement bit line (at least for half of the bit line pairs) makes connection of a static memory cell to both the true and complement bit lines somewhat more difficult.

Figure 37:
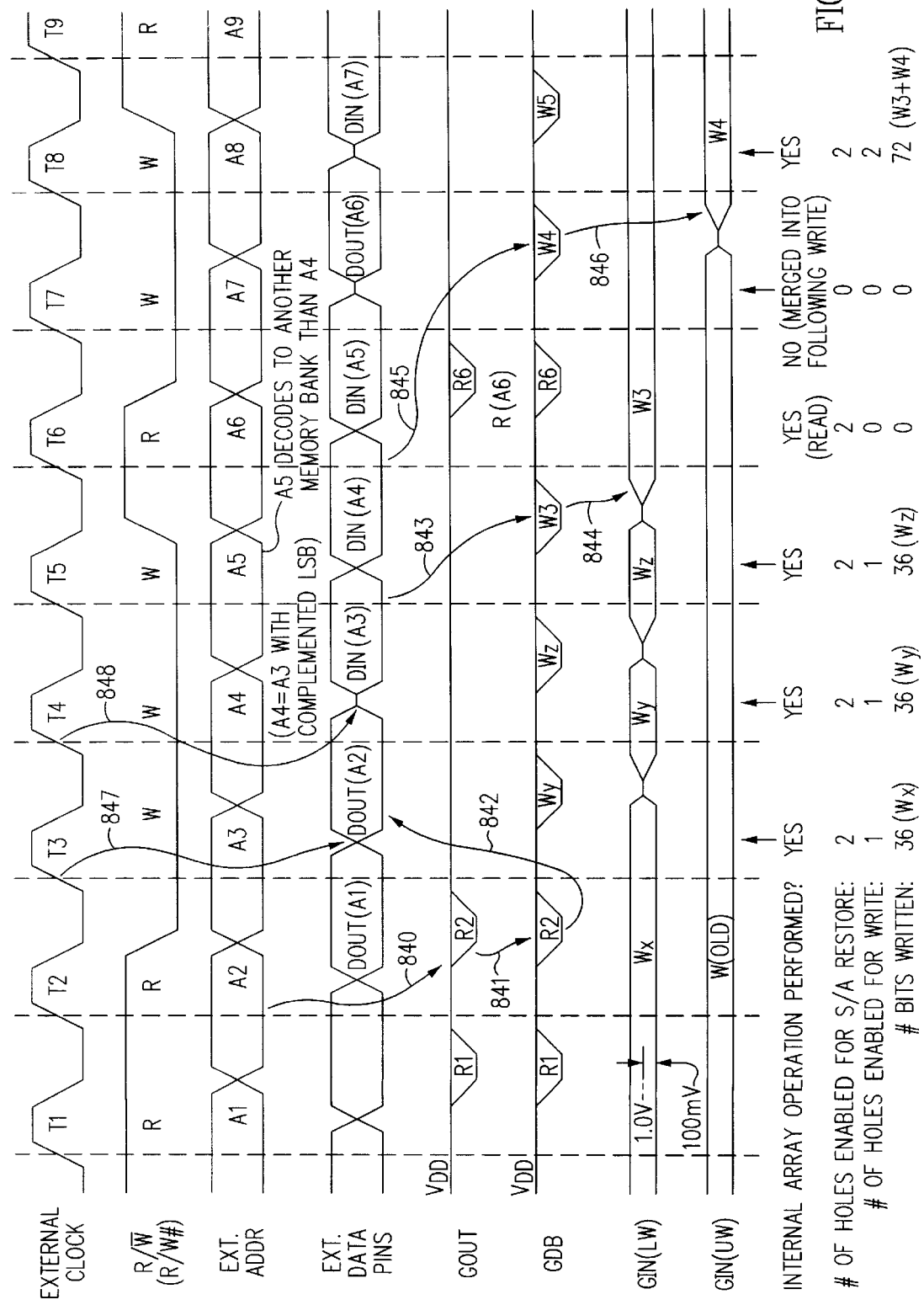
FIG. 37 is a timing diagram of several external memory cycles interspersing external reads and writes for a representative embodiment of a memory device in accordance with the present invention, which illustrates the latency of a read cycle, and the analogous delay between presenting a write address to the memory device and the corresponding data for the write, thus eliminating dead cycles on either the address bus or the data bus.

FIG. 37 is a timing diagram for several interspersed external read and write cycles for an exemplary embodiment of the invention. The diagram illustrates the timing of external address and data signals, and several important internal data signals, when operating in the pipelined mode of operation (rather than the flow-through mode of operation). The upper waveform depicts the external clock signal and is labeled to show nine successive cycles T1, T2, . . . T9, each initiated by the corresponding rising edge of the external clock signal. The second waveform represents a read/write control signal R/W# which is strobed, along with the external address and data signals, at a time generally corresponding to the rising edge of the external clock signal (as described above). If the read/write control signal R/W# is high when strobed, the cycle thus initiated is a read cycle, and if the read/write control signal R/W# is low when strobed, the cycle thus initiated is a write cycle. For ease of reference, each cycle T1, T2, . . . T9 is also labeled as either "R" or "W" accordingly to more easily identify each cycle as either a read or write cycle.

The third and fourth waveforms illustrate the external address and data signals corresponding to each cycle, which are conveyed respectively on the external address and data pins of the memory device. An external address signal (i.e., an N-bit address) is strobed into the memory device during each cycle irrespective of whether the cycle is a read or write (or idle) cycle. The external address signal presented to and strobed into the memory device for the T1 cycle is labeled A1, the external address signal strobed into the memory device for the T2 cycle is labeled A2, and so forth, for all nine cycles shown.

Since the embodiment described in FIG. 37 incorporates a common data I/O bus, the external data signals are indicated as "DOUT(address)" to indicate the memory device is driving the external data pins with a read data signal corresponding to the "address," or are indicated as "DIN(address)" to indicate the memory device is receiving a write data signal on the external data pins corresponding to the "address." For example, the external data signal indicated as DOUT(A2) is the read data signal corresponding to the address A2 which is driven by the memory device onto its external data pins, while the external data signal indicated as DIN(A3) is the write data signal corresponding to the address A3 which is presented to the external data pins and received by the memory device.

In the exemplary embodiment when operating in the pipelined mode of operation, the external address for a read cycle is strobed by a first rising edge of the external clock (e.g., the T2 rising edge), and the corresponding data which is read from the selected memory cells is driven onto the external data pins after a second rising edge of the external clock (e.g., the T3 rising edge), to be valid at the circuit receiving the data at a third rising edge of the external clock (e.g., the T4 rising edge). If an external write cycle follows immediately after two external read cycles, the write address is presented to the memory device on its external address pins and strobed into the device just like for a read cycle (on the rising edge of the external clock), but the external data pins are occupied with driving the read data signal corresponding to the first external read cycle and cannot be used at this time to present the corresponding write data signal. In the next cycle, the external data pins are occupied with driving the read data signal corresponding to the second external read cycle, and again cannot be used to present the corresponding write data signals. Instead, the write data for the external write cycle is driven onto the data bus and presented to the device during the cycle in which output data would have appeared had the cycle been an external read cycle instead of an external write cycle. In other words, in a write cycle the write command and the write address are concurrently presented to the memory device and strobed by a rising edge of the external clock, but the corresponding write data is presented to and strobed into the device by the rising edge of the external clock which occurs two cycles later. In this way, the address bus (i.e., the external address pins) and the data bus (i.e., the external data pins) are used every cycle, with no wasted cycles for either bus. The address and data for the write cycle are both stored into an internal write queue, and the actual internal write operation to physically store the write data into the selected memory cells is postponed until some subsequent write cycle.

Read bypass circuitry is provided which allows data corresponding to the address of the read cycle to be correctly read from the write queue whenever an earlier queued write directed to that same address has not yet been retired (i.e., written into the appropriate memory cells). When a read cycle is initiated, it immediately starts to access the addressed locations within the memory arrays, and simultaneously compares its read address to all the pending addresses in the write queue. If an address "hit" occurs to an entry in the write queue, then the data from all bytes that were enabled during the write (for that entry) are obtained from the write queue rather than from the memory array. If more than one "hit" occurs, the most recently written data (on a byte-by-byte basis) is substituted for the data from the memory array, and any bytes which were not enabled for writing by any entry in the write queue are retrieved from the memory array. Thus, data not yet retired from the write queue can still be properly read during a subsequent read cycle.

A representative read cycle's internal timing may be appreciated by examining the T2 cycle (which is assumed to be a non-burst cycle). As stated above, the rising edge of the external clock signal which starts the T2 cycle strobes the corresponding address signal A2 into the memory device. The control signals, including a READ/WRITE# control signal, are also received and the cycle determined to be a read cycle. An internal read operation is initiated which uses the strobed external addresses, decodes a selected word line in a selected array block of a selected memory bank, enables the bit line sense amplifiers for sense/restore in the holes both above and below the selected array block, and likewise decodes a selected column select signal and other related read signals (e.g., READ_L or READ_R, READ) within one of the holes adjacent to the selected array block (either the hole above or below the selected array block), all as has been extensively described above. The respective signals from the thirty-six selected sense amplifiers are amplified and driven onto thirty-six corresponding vertical pairs of global output lines GOUT, GOUTB (eighteen of which exit the memory bank at the top, and the remaining eighteen of which exit the memory bank at the bottom). The fifth waveform indicates the development of this signal on the selected group of global output lines, labeled representatively as GOUT. A read signal which results from the read data at the A2 address (indicated by an arrow labeled 840) develops on the global output lines during a later portion of the T2 cycle, and consequently is labeled R2. Recall that each true and complement global output line is preferably loaded by a static "resistive" load device (a grounded-gate PMOS transistor) to VDD. When enabled, each local output amplifier driving a complementary pair of global output lines pulls one line of the pair down (e.g., the true global output line) while leaving the other line at VDD to generate a differential read signal on the complementary pair of global output lines. The voltage of both true and complement global output lines GOUT, GOUTB is driven by the load device back to VDD (or, if already at VDD, is held at VDD) when no local output amplifier is enabled to drive the complementary pair of global output lines. This occurs automatically near the end of a cycle when the column select signal and associated read signals are de-activated, which is described in greater detail elsewhere herein, particularly in regard to FIGS. 8 and 10. The global output waveforms are drawn here in a manner to remind the reader of the general voltage levels and timing of these global output lines.

The respective signals from the thirty-six vertical differential pairs of global output lines GOUT, GOUTB are amplified and driven onto thirty-six corresponding horizontal differential pairs of bi-directional global data bus lines GDB, GDBB (eighteen pairs of which run substantially generally across the top of the memory array, and the remaining eighteen pairs run substantially generally across the bottom of the memory array). The sixth waveform indicates the differential signals present on these global data bus lines, and is representatively labeled GDB. The read signal on the selected global output lines during T2 is buffered to generate an associated read signal on the global data bus lines (indicated by an arrow labeled 841) which also corresponds to the read data at the A2 address. Consequently, the global data bus signal which develops during T2 is also labeled "R2". Since each true and complement global data bus line is also loaded by a static "resistive" load device to VDD, the behavior of the global data bus is very similar to that of the global output lines. As such, the global data bus waveforms are drawn here in a similar manner to remind the reader of the general voltage levels and timing of these global data bus lines.

The read signal on each of the global data bus pairs is further amplified by yet another linear amplifier (which is preferably located next to the output buffer) and subsequently strobed into a register within each respective output buffer, all within the T2 cycle (or perhaps, in the case of a memory device operating with a very short cycle time, near the beginning of the next cycle). However, the data out signal is not driven onto the external data pins during the current T2 cycle, but rather during the next (T3) cycle (for this embodiment, operating in the pipelined mode of operation). The arrival of the next rising edge of the external clock signal which initiates the T3 cycle also causes the output buffer to drive onto the external data pins (indicated by arrow 847) at a predetermined time within the T3 cycle (e.g., ⅓ of the way into the cycle), the data signal associated with the previous read operation performed during the T2 cycle, which data signal (R2) is latched from the global data bus, as indicated by arrow 842. Thus, the data signal driven onto the external data pins during the T3 cycle is labeled DOUT(A2).

This next (T3) cycle happens to a write cycle (for the exemplary cycles shown). The address A3 is strobed as in the read case, but no internal write operation of the memory array is initiated for the A3 address, because the data to be written is not yet available within the memory device! Instead, an internal operation of the memory array is initiated for the another write address (which, for example, could be the Wx address already stored within and now at the bottom of the first-in, first-out write queue), and the A3 write address is stored into the top of the write queue. The write data for the T3 cycle is presented later to the memory device on the external data pins during the time that the external data pins would otherwise have been driven, if the T3 cycle were instead a read cycle, with read data corresponding to the A3 address, namely during the T4 cycle (more specifically, from a time somewhat after the T4 cycle begins until a time somewhat after the T5 cycle begins). As is indicated by arrow 848, the T4 rising edge quickly causes the data output buffers to cease driving the DOUT(A2) data signal onto the external data pins. Soon thereafter, another device provides the data to be written at the A3 address, DIN(A3), to the external data pins, still during the T4 cycle, and held valid into the T5 cycle, so that the rising edge of the external clock signal (i.e., the T5 rising edge) can strobe the write data presented to the external data pins, which is then also stored into the write queue with the previously received and stored A3 write address.

The table at the bottom of FIG. 37 indicates, for cycles T3 through T8, whether an internal array operation is carried out (and if so, whether read or write), the number of holes which are enabled for bit line sense amplifier sense/restore (whether 0 or 2), the number of holes which are enabled for write (whether 0, 1, or 2), and the number of bits written by an internal operation during the cycle (whether a 36-bit single word or a 72-bit double word) and the particular address associated with the data written (i.e., the "identity" of the data written).

During all external write cycles, the write queue drives the bidirectional global data bus GDB with a write data signal corresponding to an earlier external write cycle. As a result of the specific order of the exemplary read and write cycles described in FIG. 37, the write queue, during the T5 cycle, drives the bi-directional global data bus with a write data signal corresponding to the data to be written at address A3, which is labeled as W3. This causal relationship is indicated by an arrow labeled 843. (Other cycles described below should make it clear that for some cycles, the internal write data signal is not necessarily driven onto the global data bus during the same cycle which strobes the write data.) In the exemplary embodiment, recall that the internal data path into each memory bank is twice as wide (i.e., a "72-bit double word") as the external I/O word width (i.e., the least significant address bit selects either a lower 36-bit word or an upper 36-bit word). Once a write data signal is placed onto the global data bus, a corresponding signal is driven onto the thirty-six complementary pairs of global input lines GIN, GINB which are selected by the write address A3 (specifically, the two bits of address that select one of the four memory banks, and the least significant address bit that selects between the upper and lower 36-bit data words) previously stored into the write queue. As indicated by the arrow labeled 844, the corresponding W3 write data signal is driven onto, for this exemplary cycle, the group of thirty-six pairs of global input lines associated with the lower 36-bit word in the selected memory bank, which is labeled GIN(LW).

The voltage levels and timing of the global input lines are briefly reiterated here to further clarify the cycle-to-cycle timing relationships shown in FIG. 37. An internal write operation is performed during each cycle which is initiated with the read/write control signal R/W# at a low level— namely during each external write cycle (except for a merged write, described below). However, the internal write operation performed during a given external write cycle corresponds to a write address and write data previously strobed into the device and stored within the write queue. At the end of each such internal write operation, the thirty-six complementary pairs of global input lines which are addressed by the next write operation are driven with the respective write data signal appropriate for the next internal write operation (which are also already stored within the write queue). None of the remaining complementary pairs of global input lines change state. Since, for the preferred embodiment, there is both a first group of 36 complementary pairs of global input lines associated with the upper 36-bit word (i.e., the "upper-word global input lines") and a second group of 36 complementary pairs of global input lines associated with the lower 36-bit word (i.e., the "lower-word global input lines")for each of the four memory banks, there are eight total groups of global input lines, each group having 36 complementary pairs of global input lines. In other words, at the end of a given internal write operation, one particular group of thirty-six complementary pairs of global input lines (which are addressed by the next write operation) are driven with the appropriate write data (for the next internal write operation), and the other seven groups remain unchanged.

During the T5 cycle (which is an external write cycle), a pending write is retired from the write queue by performing an internal write operation which writes a data signal Wz into the 36-bit word addressed by a corresponding address Az, both of which were presented to the memory device and strobed into the write queue earlier than any of the exemplary cycles shown here. The 36-bit word decoded by the address Az is the lower of the two words, and thus the write queue (at the end of the T4 cycle) drives the data signal Wz onto the lower-word global input lines GIN(LW) in preparation for the early part of the T5 cycle, when the data signal Wz is utilized (because, like any other write cycle, the T5 cycle expects to retire the bottom write queue entry, unless a merged write).

The internal write operation is accomplished, during the early portion of the T5 cycle, by coupling each of the global input line pairs to the corresponding bit line sense amplifier which is selected by the decoded write address from the write queue, prior to sensing the bit line sense amplifier. The signal otherwise developed by the selected memory cells is swallowed by the larger capacitance of the global input lines, and the bit line sense amplifiers latch according to the write data signal and then restore the bit lines voltages accordingly. This functionality is described in great detail elsewhere herein. At the time the bit line sense amplifiers begin to sense, the internal nodes of the bit line sense amplifier are decoupled from the global input lines. Consequently, near the end of the internal write operation, the data signals for the next internal write operation are driven onto the particular group of global input lines which are addressed by the next internal write operation. This is performed by first equilibrating the prior data signal from the next group global input lines, then by driving each true and complement global input line with a controlled current for a controlled amount of time, resulting in the high-going global input line moving up in voltage by about 100 mV, and the low-going global input line moving down in voltage by about 100 mV. As described earlier, this signal is developed on each corresponding pair of global input lines before the equilibration of the bit lines is complete. As shown in the FIG. 37, the new data signal W3 is developed on the lower-word global input lines well in time for the next cycle, T6, to use this data signal prior to bit line sensing, should that cycle have been a write cycle.

However, since the T6 cycle is a read cycle, an internal read operation is performed rather than an internal write operation. Consequently, the data signal W3 remains dynamically floating on the particular group of 36 global input lines until the next external write cycle, in this case the T7 cycle. At this point in time the write operation to address A3 is the oldest entry (i.e., not yet retired) in the write queue. But the write operation to address A4 has also been written into the queue, along with the corresponding data signal DIN(A4). During the T7 (write) cycle, this data signal is driven onto the bi-directional global data bus (indicated by the arrow labeled 845 writing the data signal labeled W4). In the exemplary cycles shown, the A4 address is assumed to be equal to the A3 address but with the LSB complemented (e.g., when A4=A3+1 or A4=A3−1).

The selected memory cells corresponding to two addresses which differ in only the least significant address bit (LSB) correspond to the same 72-bit double word, as described above. Before an internal write operation is performed, the address of the pending write operation is compared to the address of the next write operation (which has already been presented to the memory device during an earlier external write cycle and is already stored in the write queue). If the selected memory cells to be written in both the pending (first) write operation and in the next (second) write operation correspond to the same 72-bit double word (i.e., differ in only the least significant address bit), the pending internal write operation which would otherwise follow from the first external write cycle is not yet carried out. In the exemplary cycles shown, the data signal W3 remains on the lower-word global input lines (for the memory bank decoded by both address A3 and A4) while the data signal W4 is generated on the upper-word global input lines during the T7 cycle, and both data signals remain dynamically on the respective global input lines until the next external write cycle, which in this case is the T8 cycle.

During the T8 cycle, the address of the double-word pending write operation is again compared to the address of the next write operation, A5, which for this example is assumed to decode into another memory bank. In other words, the selected memory cells to be written in both the double-word pending write operation and in the next write operation do not correspond to the same address (ignoring, of course, the LSB). Consequently, a single internal write operation is carried out during the T8 (write) cycle which simultaneously writes both the 36-bit data word initiated by the T3 external write cycle and the 36-bit data word initiated by the T4 external write cycle. Recall that in any cycle, the hole above the selected array block and the hole below the selected array block are enabled for sense/restore. In a write cycle which writes either the upper or lower 36-bit word, one of these two holes is also enabled for write (see FIGS. 8, 11, 21, and 24, and related description). To write both the upper and lower 36-bit words, such as occurs in a merged write cycle, both holes above and below the selected array select are also enabled for write. At the end of the T8 cycle, both the lower-word global input lines GIN(LW) and upper-word global input lines GIN(UW) remain unchanged- neither is equilibrated and driven to a new data signal. This results because, for the exemplary cycles shown, the next address in the write queue (A5) decodes to select a different one of the four memory banks, and consequently the particular group of global input lines which is driven in preparation for the next write operation is associated with the memory bank to be written in the next write cycle.

By merging external write cycles having sequential addresses into one internal write operation, a significant amount of internal power consumption is saved compared to performing two separate write operations since the selected memory bank is cycled only once (instead of twice) to write the two words. An external write cycle is always carried out (i.e., retired) exactly three write cycles later unless it is delayed by the write merging with the following write cycle. Looking again at the relative timing of the particular cycles shown, the external T3 write cycle is retired four external write cycles later, due to the write merging. The normal latency of three write cycles results from several factors: the bi-directional external data bus (i.e., external data pins) which is operated with no wasted cycles in a "zero-bus-turnaround" manner (in accordance with the ZBT® protocol, a registered trademark owned by Integrated Device Technology, Inc.), the bidirectional global data bus GDB (also operated with no wasted cycles in a zero-bus-turnaround manner), the timing of driving the global input lines GIN late in a cycle (to avoid driving them during bit line sensing) and the method used to accomplish the write during the early portion of a cycle by swallowing the read signal otherwise developed in the bit line sense amplifier. Two external cycles are required before the external data signal for an external write cycle is strobed and available within the memory device and stored within the write queue. Only during an external write cycle is this data driven onto the bi-directional global data bus GDB, which may occur during the same cycle which strobes the data if the external cycle happens to be another external write cycle (such as occurs during the T5 cycle), or may occur during some subsequent external write cycle if the external cycle which strobes the data happens to be an external read cycle (such as occurs during the T6 cycle).

During the particular cycle that a particular write data signal is driven onto the global data bus, it is also buffered and driven onto the selected group of global input lines near the end of the particular cycle in preparation for the next internal write operation. The actual internal write operation is then performed (unless it is delayed and merged with the following internal write operation) during the next external write cycle.

Write cycle merging has been described thus far in light of two write cycles, each writing a fall 36-bit word, into two sequential memory addresses (differing only in LSB). Write cycle merging is also useful when sequential external write cycles write different portions of the same 36-bit word, or when sequential external write cycles over-write some or all of the same 36-bit word, using the byte write capability of the preferred embodiment. In each of these cases, like the others described above, the selected memory cells to be written in both the pending write operation and in the next write operation correspond to the same 72-bit double word (i.e., having addresses which differ only in LSB), and the pending internal write operation which would otherwise follow from the first external write cycle is not carried out but rather is merged with the next internal write operation. As an example, four sequential external write cycles, each writing a different (or over-writing the same) 9-bit byte within a 36-bit word corresponding to a given address, followed by four more sequential external write cycles, each writing a different (or over-writing the same) 9-bit byte within a 36-bit word at an address which differs from the given address only in the LSB, is actually carried out internally as a single internal write operation, simultaneously writing all 72-bits (assuming all 8 bytes were byte-write enabled in at least one of the eight cycles) into the selected memory cells. In the event the same 36-bit single word (or a portion thereof) were written in two consecutive external write cycles (both preceded and followed by write cycles to addresses which correspond to a different 72-bit double word than the two write cycles in question), the two write cycles would merge, but only one hole (above or below the selected array block, but not both) would be enabled for writing. That is, a hole is enabled for writing by the need to write data into that hole, not just by the fact that two write cycles have been merged.

It should be noted that READ cycles could be merged at the expense of an access time penalty, but there is NO such penalty for merging write cycles. To merge read cycles, all internal read operations would be 72-bits wide, and a comparison of the read address (just received for the current cycle) to the previous read address would be required before deciding whether to start an internal read operation, or whether the read data is already available as a result of the last read operation.

A, The ZBT® protocol (in which the write data for the external write cycle is driven onto the data bus and presented to the device during the cycle in which output data would have appeared had the cycle been an external read cycle instead of an external write cycle) requires a write queue. In conventional writing, data is written into the memory array on the cycle the data and its address are received. But even for more conventional write timing, including the case where write data is received at the same time as the write address and write command, delaying the write with a write queue offers several advantages over conventional writing. First, it allows the global input voltages to be changed at a time in the cycle that will not disturb the sensing of the bit lines or sense amplifier nodes below. Second, it allows merging of write cycles, since the next address to be written already exists on the chip. Third, it allows a write cycle to be aborted in the event there is a (parity) error in the address field during a write command. If not aborted, such an error would overwrite data at some address, the data at that address lost forever. The ability to abort a write cycle upon an error could be done without a write queue, but would delay the write until a parity check could be performed.

Figures 1, 38:
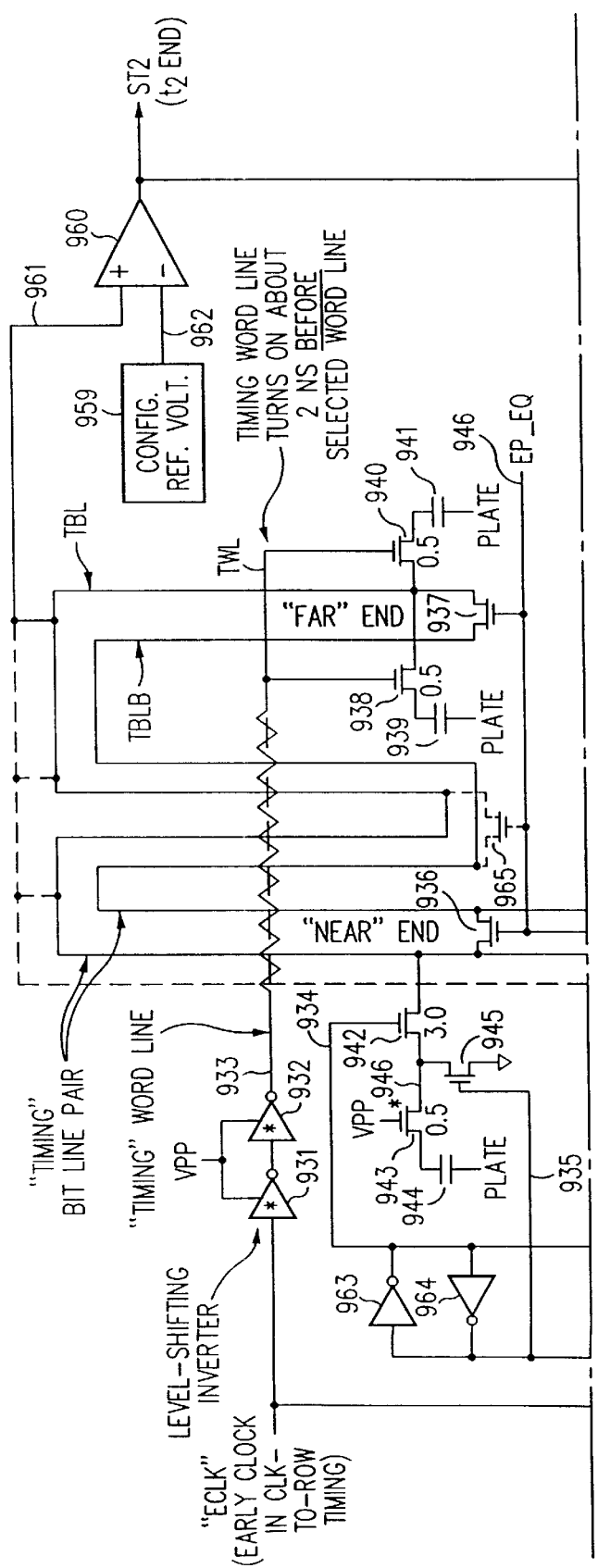
FIG. 38, consisting of FIGS. 38-1 and 38-2, is a schematic diagram of the latch timing circuit for generating the major timing signals which control the sense and restore timing of the bit line sense amplifiers.
Figures 2, 38:
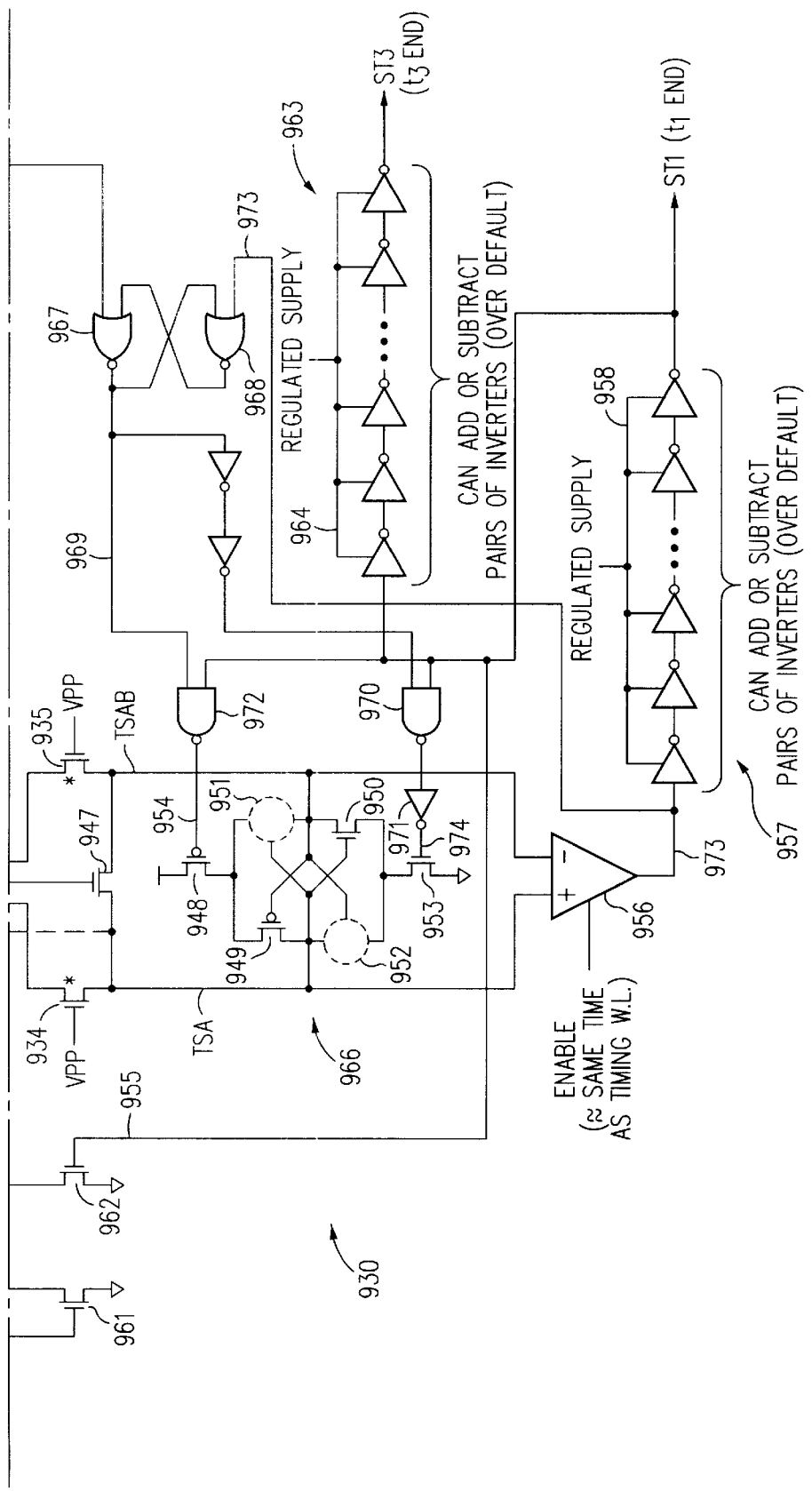

FIG. 38 is a schematic diagram of a latch timing circuit 930 for generating the major timing signals which control the sense and restore timing of the bit line sense amplifiers. This latch timing circuit 930 is used to time the simultaneous start of both NMOS and PMOS sensing relative to the timing of the selected word line being driven high, to time the end of PMOS sensing, and to time the simultaneous end of NMOS sensing and the selected word line being brought low (which is immediately followed by bit line and bit line sense amplifier equilibration).

In a preferred embodiment, the latch timing circuit 930 produces three main timing signals, ST1, ST2, and ST3. The first timing signal, ST1, is used to control, relative to the timing of the selected word line being driven high, the simultaneous start of both the NMOS and PMOS sensing. The second timing signal, ST2, is used to control, relative to the simultaneous start of NMOS and PMOS sensing, the duration of the PMOS sensing, and the third timing signal, ST3, is used to control, relative to the end of the PMOS sensing, when to simultaneously end the NMOS sensing and bring the selected word line back low. Each of these timing signals ST1, ST2, and ST3 is independently adjustable (described in detail below) and respectively defines a corresponding timing interval $t_1$, $t_2$, and $t_3$. The timing interval "$t_1$" begins with the selected word line being driven high and ends with the simultaneously start of both the NMOS and PMOS sensing (i.e., the timing interval "$t_1$" is the amount of time the selected word line is high before sensing). The timing interval "$t_2$" extends from the simultaneous start of NMOS and PMOS sensing to the end of PMOS sensing (i.e., the timing interval "$t_2$" is the duration of the PMOS sensing). The timing interval "$t_3$" extends from the end of the PMOS sensing to the simultaneous end of the NMOS sensing and discharge of the selected word line (i.e., the timing interval "$t_3$" is the amount of time the word line remains high after the end of PMOS sensing). The adjustment of each of these timing intervals $t_1$, $t_2$, and $t_3$ is made possible by the adjustment of the three respective timing signals ST1, ST2, and ST3, and is described in greater detail below.

The timing interval $t_1$ essentially controls how much signal from the memory cell reaches the sense amplifier before starting the NMOS and PMOS sensing. A short $t_1$ does not provide enough time for all the charge in a selected memory cell (especially one located at the "far end" of the resistive bit lines, furthest from its bit line sense amplifier) to fully share with the charge on the bit line and sense amplifier nodes, and consequently the sense amplifier begins to sense with less signal than would be developed if, alternatively, a longer $t_1$ were configured. A longer $t_1$ increases operating margins (i.e., bit line sense amplifier differential voltage) at the expense of increased cycle time.

Similarly, the timing interval $t_2$ essentially controls how much charge is driven onto the high-going sense amplifier node, bit line, and (high-going) memory cell during sensing. Increasing $t_2$ increases the voltage stored into the memory cell, but also increases the bit line equilibrate voltage when charge is later shared between true and complement bit lines (and sense amplifier nodes). A short $t_2$ may not provide enough charge to develop the desired restored high level (e.g., 2.0 volts) on the bit line and into a selected memory cell. Conversely, an excessively long $t_2$ timing may not increase the stored high level in the memory cell as much as it increases the bit line equilibrate voltage, and thus may decrease the high level signal available for sensing, particularly at high VDD.

The timing interval $t_3$ essentially controls how much charge is shared between the sense amplifier node, the near end and far end of a high-going bit line (which typically is moderately resistive), and the memory cell. The resistance of the memory cell access transistor is much higher when restoring a high level (due to its lower gate-to-source voltage) than when restoring a low level. The $t_3$ timing is constrained by the time needed to write a high voltage into the selected memory cell through the array select transistor, the resistive bit line, and further through the relatively high-resistance memory cell access transistor. A short $t_3$ may result in a worst case memory cell (one located at the "far" end of a bit line, furthest from its bit line sense amplifier) being written to a restored high level which is too low, for a given amount of "Q" transferred into the sense amplifiers (i.e., for the bit line equilibration voltage which results from the given amount of "Q"). The available signal to be sensed, of course, depends on the high voltage stored in the memory c ell relative to the equilibration voltage of the bit lines and internal bit line sense amplifier nodes.

To appropriately generate these timing intervals $t_1$, $t_2$, and $t_3$ to provide for highest performance with acceptable operating margins, the latch timing circuit 930 generates the respective timing signals ST1, ST2, and ST3 using circuitry which includes a word line, a bit line pair, and a sense amplifier, all design ed to track (i.e., "mimic") the delays of the actual circuitry used in the memory array. Referring specifically to FIG. 38, some of the major sub-circuits include a "timing" word line TWL, a "timing" bit line pair TBL, TBLB, and a "timing" sense amplifier 966. Other sub-circuits will be introduced and described in the context of describing the operation of the latch timing circuit 930 through an actual cycle.

Between active cycles, the timing bit line TBL, TBLB is equilibrated by transistor 936 located at the "near end" of the timing bit line, by transistor 937 located at the "far end" of the timing bit line, (and optionally by transistor 965 located at the "mid-point" of the timing bit line), which are each gated by an "early" pulsed-equilibrate signal (a pulsed equilibrate signal that is brought to ground much earlier than normal pulsed equilibrate signals, such as those for the bit lines and bit line sense amplifiers). The timing sense amplifier 966 is also equilibrated between cycles by transistor 947.

The latch formed by inverters 963, 964 is reset between cycles such that node 935 is high, which drives nodes 934 and 946 to ground, which "writes" a low level of VSS onto normally-sized memory cell capacitor 944 through transistor 943 which is sized like an actual memory cell access transistor (i.e., capacitor 944 and transistor 943 replicate the layers and layout of a normal memory cell), and whose gate terminal is driven with VPP to approximate the high voltage of a selected word line. Since node 934 is low, transistor 942 is off and the equilibrate level on the "true" timing bit line TBL is not discharged by transistor 945. Assume that the voltage previously written into normally-sized memory cell capacitor 939 and into normally-sized memory cell capacitor 941, and which is therefore present between cycles, is equal to the restored high level desired for the actual memory array (e.g., about 2.0 volts). All three timing signals ST1, ST2, and ST3 are low between active cycles.

At the end of the previous active cycle, the early pulsed equilibrate signal EP_EQ is brought low after having sufficiently equilibrated the timing bit line pair TBL, TBLB and timing sense amplifier 966 as described above. This equilibration is completed quickly by using oversized transistors 93 6, 93 7, 947 and, if needed, optional oversized transistor 965. A very early timing signal in the clock-to-row timing path, ECLK, is received by the latch timing circuit 930 to initiate the generation of the three timing signals ST1, ST2, and ST3. The particular early timing signal selected for this role needs to be so early that it is not practical to decode the various control signals to determine whether the particular active cycle need not perform the sense and restore of any sense amplifiers (e.g., such as an idle cycle or a burst cycle) in which case the latch timing circuit 930 need not generate the three timing signals at all. Rather, the early clock signal ECLK occurs every cycle, and the latch timing circuit 930 goes through its cycle for every external clock cycle. However, to save power, the three timing signal outputs ST1, ST2, and ST3 (the earliest of which, ST1, occurs some delay after the early clock signal ECLK), may be enabled or disabled after determining whether a bit line sense amplifier sense/restore operation is required by the given external cycle.

When an active cycle is initiated, the rising edge of the early clock ECLK is received by the gate of transistor 961, which grounds node 935 (turning off transistor 945), and which "sets" the latch 963, 964 with node 934 pulled high by inverter 963 (which ensures that nodes 934 and 935 are non-overlapping). Consequently, the stored low signal from memory cell capacitor 944 is then coupled through transistor 943 (sized to reflect an actual access transistor) and through transistor 942 (which is now turned on) and onto the "near end" of the true timing bit line TBL. This stored low, coupled onto the near end of the timing bit line as quickly as possible, is coupled through transistor 934 onto the true timing sense amplifier node TSA (also as quickly as possible) to bring the voltage of node TSA down from 1.0 volts to about 0.9 volts (for this exemplary embodiment).

The rising edge of the early clock ECLK is also buffered by level-shifting VPP-powered inverter 931 and VPP-powered inverter 932 to drive a "timing" word line TWL, which is driven very early in the active cycle (e.g., about 2 ns earlier than the "selected" word line for the cycle). This timing word line TWL is not necessarily as physically long or as capacitively loaded as an actual word line in the memory array, but is designed (e.g., with the size of inverter 932 scaled down relative to the actual word line driver) to track the delay of an actual word line. Since the actual memory array word lines are implemented in polysilicon which is strapped periodically in a metal layer (described in greater detail below), the timing word line includes a polysilicon portion to track the delays of the word line signal reaching a memory cell located at the "worst case" position (i.e., the memory cell access transistor located farthest from the nearest contact to the metal strap). At the end of the polysilicon tracking portion, the timing word line TWL is connected to two different memory cells, each identical in size and structure to a normal memory cell in the memory array, which are both connected to the "far end" of the true timing bit line TBL, and which cells, as previously stated, each store a high level.

When the far end of the timing word line TWL exceeds the timing bit line equilibration voltage by a threshold voltage, the two memory cell access transistors 938, 940 begin to conduct, which couples a high level from each memory cell capacitor 939, 941 onto the true timing bit line TBL. Since the timing bit line pair TBL, TBLB is also designed to track (i.e., "mimic") the delays of an actual complementary pair of bit lines, the signal from the "double" (or "2C") memory cell (i.e., memory cell capacitors 939, 941) is eventually imparted onto the internal sense amplifier nodes of the timing sense amplifier TSA, TSAB (i.e., "timing sense amplifier," and "timing sense amplifier bar"), which results in the true internal node TSA rising from 0.9 volts to 1.1 volts as the high level from the "2C" cell overcomes the low level from the "1C" cell (i.e., capacitor 944). This timing bit line arrangement is designed to track the delay of a signal coupled from a memory cell having a stored high level located at the far end of an actual complementary bit line pair, which is the worst case or slowest path.

About the same time as the timing word line is driven high, a differential amplifier 956 is enabled to amplify the differential voltage on the internal timing sense amplifier nodes TSA, TSAB. When enabled, this differential voltage is near the maximum negative signal occurring when the true internal node TSA is about 0.9 volts (from the signal coupled from memory cell capacitor 944 and before the timing word line is driven high) and the complement internal node TSAB remains at about 1.0 volts. When the signal from the "2C" memory cell starts arriving at the sense amplifier 966, the voltage of the true internal node begins to rise (in approximately an exponential fashion) from 0.9 to 1.1 volts, while the complement internal node TSAB remains at about 1.0 volts. As the differential signal exceeds zero, the differential amplifier 956 begins to drive its output high, which is then buffered by a configurable delay circuit 957 to generate the timing signal ST1, which provides an active-high strobe signal to the timing sense amplifier 966 (which signal is coupled through NAND gate 970 and inverter 971 to the gate of N-channel transistor 953, node 974), and which signal is inverted by NAND gate 972 to create a complement strobe signal for the timing sense amplifier 966 (which signal is coupled to the gate of P-channel transistor 948, node 954).

The timing sense amplifier 966 is preferably implemented identically as the actual bit line sense amplifier circuits (including layout parasitics), but omits one of the P-channel pull-up transistors (shown by a dotted line 951) and one of the N-channel pull-down transistors (shown by a dotted line 952). This ensures that the timing sense amplifier 966 always latches in the direction to restore a high level onto the true timing bit line TBL (which then restores the high level back into the "2C" cell (capacitors 939, 941).

At the same time that the timing sense amplifier 966 begins to latch, the rising edge of timing signal ST1 turns on transistor 962, which pulls node 934 low (briefly overpowering inverter 963), thereby turning off transistor 942, all before the timing sense amplifier 966 substantially begins to pull up on the true timing bit line TBL. The inverter 964 then drives node 935 high, which resets the latch 963, 964, and which turns on transistor 945 to restore the low level onto memory cell capacitor 944 (whose other terminal, like all actual memory cell capacitors, is connected to the "PLATE" voltage). Because nodes 934 and 935 are non-overlapping, there can be no current flow from the true timing bit line TBL through transistor 942 and through transistor 945 to ground. Consequently, all of the "Q" provided by the P-channel transistor 949 (in series with the P-channel latch transistor 948) and conducted onto the true timing bit line TBL results in a higher voltage on the true timing bit line TBL, with no "Q" wasted by conduction through transistor 945, nor with any "Q" wasted by conduction through transistors 942 and 943 which might otherwise needlessly charge the memory cell capacitor 944 prior to its being written to a low voltage.

The timing sense amplifier 966 is designed to match the delays of an actual bit line sense amplifier in sensing and then, after latching, in restoring the high and low levels onto the bit lines. When the complementary sense enable nodes 974, 954 are driven to cause the timing sense amplifier 966 to begin latching, the true timing bit line TBL is driven high through transistors 949 and 948, and the complementary timing bit line TBLB is driven low through transistors 950 and 953. Because the timing bit line is resistive (like the actual bit lines), some time is required to drive the voltage of the far end of the timing bit line to its eventual level. A second differential amplifier 960 is provided to determine when the voltage of a chosen "tap" along the true bit line TBL (or alternatively, when the true sense amplifier node TSA) exceeds a configurable reference voltage 959 having a nominal value, for example, equal to 2.0 volts. The timing signal ST2 is then buffered and routed to the memory array to control the turn off time of the PMOS sense enable signals for the selected two rows of regular sense amplifiers within the memory array. It is also inverted (by NOR gate 967) and routed to NAND gate 972 to terminate the PMOS sensing in the timing sense amplifier 966 of the latch timing circuit 930.

The tap position along the true timing bit line TBL is chosen to provide the desired high restore level in the actual bit line sense amplifiers. Such a tap may be easily connected to the timing bit line which is implemented in a serpentine pattern, as shown, or may be connected to the true sense amplifier node TSA, as appropriate. The best tap connection is the one for which the equilibrate voltage established following an active cycle varies as little as possible as the operating supply voltage VDD varies. The timing interval $t_2$ should decrease significantly as VDD increases. For example, contrast the narrow SEB pulse width at a VDD=2.9 volts, as shown in FIG. 25, with the much wider SEB pulse width at a VDD=2.3 volts, as shown in FIG. 26.

The latch timing circuit 930 ensures that the delay between timing signal ST1 and ST2 (i.e., the PMOS sense timing duration) decreases as the VDD voltage increases to ensure a written high level which is substantially independent of VDD, even over process and temperature corners. For the exemplary embodiment shown, this is accomplished by using a "timing" bit line and sense amplifier structure (activated substantially before the main sense amplifiers are activated), and detecting when the PMOS sensing needs to be turned off to achieve a final high voltage of about 2.0 volts on the timing sense amplifier and bit line structure. The tap location and configurable reference voltage are set to ensure a written high level on the high bit line (and into the selected memory cell) of as close to 2.0 volts as possible over a VDD voltage range from 2.3 to 2.9 volts.

The first timing signal, ST1, is also coupled to a second configurable delay circuit 963, whose output generates, at a configurable time delay later, the third timing signal, ST3, which is buffered and routed to the memory array to turn off the selected word line and to preferably terminate the NMOS sense enable. The delay through the configurable delay circuit 963 may be optimized to be independent of both VDD and temperature by powering the inverters forming the delay circuit with a regulated supply voltage (coupled to node 964) which is designed to increase in voltage as temperature increases. The increase in inverter delay, which otherwise would result from the higher temperature, may be made to offset the decrease in inverter delay which otherwise would result from the higher "supply voltage" and the resulting inverter delay may consequently be made constant and independent of both external VDD and temperature. The "configurability" of the delay circuit 963 may be accomplished, for example, by selectively switching in or out additional inverter pairs in the path from input to output. Alternatively, the regulated supply voltage coupled to node 964 may be a substantially fixed voltage, independent of temperature, to generate a configurable delay which is independent of VDD, but dependent on temperature. The configurable delay circuit 957, which partially determines the overall delay from the early clock ECLK to the timing signal ST1, may also be powered by a regulated supply voltage, as shown, to achieve a constant delay, independent of temperature and VDD.

The timing sense amplifier 966 is disabled by the timing signal ST2 first turning off the PMOS transistor 948, then turning off the NMOS transistor 953. The timing signal ST3 then turns off the timing word line (by circuitry not shown), thereby trapping the high level on the "2C" memory cells, and the early pulsed equilibrate signal EP_EQ is driven high. The timing sense amplifier 966 is then equilibrated by transistor 947, while the timing bit line pair is equilibrated by transistors 936, 937, and optionally transistor 965 (as described above). This EP_EQ signal is then automatically brought low near the end of an active cycle to prepare for a rising edge on the early clock signal ECLK and the initiation of a new active cycle.

In an alternative embodiment, a suitable PMOS sense enable timing may alternatively be accomplished using a string of inverters powered at a voltage a fixed amount below VDD, or by other techniques to achieve a timing which is a combination of several variables, such as power supply voltage VDD, bandgap voltage, transistor threshold voltage and transconductance, temperature, or others.

The timing intervals $t_1$, $t_2$, and $t_3$ (respectively created by the corresponding timing signals ST1, ST2, and ST3) may be collectively optimized on a chip-by-chip basis. In a preferred embodiment, there may be sixteen different timing settings, each specifying a particular combination of the $t_1$, $t_2$, and $t_3$ timing intervals, ranging from very aggressive for highest performance, to very relaxed for highest yield. Referring now to Table 1, the timing setting "1" may provide, for example, the most aggressive (i.e., shortest) $t_1$ timing interval, the most aggressive (i.e., shortest) $t_2$ timing interval, and the most aggressive (i.e., shortest) $t_3$ timing interval. The timing setting "16" may provide for the most relaxed $t_1$ timing interval, the most relaxed $t_2$ timing interval, and the most relaxed $t_3$ timing interval. Each incremental timing setting between "1" and "16" is preferably optimized to incrementally increase, by a similar amount (e.g., by 10 mV), the signal available at the bit line sense amplifier just before sensing. To accomplish this, the timing setting "2" may increase the $t_1$ interval by 200 ps compared to the "most aggressive" $t_1$ value of timing setting "1," while keeping $t_2$ and $t_3$ unchanged. A +200 ps increase may be easily achieved by adding two low-fanout "skewed" inverters to the logic path setting the time interval (a skewed inverter being one in which the PMOS pullup transistor and the NMOS pulldown transistor are sized to favor driving its output in a particular direction, rather than sized to provide similar propagation delay and output rise and fall times when driving either high or low). A slightly longer increase, such as 220 ps, may be easily achieved by adding two inverters, slightly higher in fanout or slightly less skewed (or both), to the logic path setting the time interval. The timing setting "3" may increase $t_3$ by 200 ps while keeping the same value of the $t_1$ and $t_2$ intervals as in timing setting "1." Each successive low-numbered timing setting increases the value of one of the three timing intervals $t_1$, $t_2$, and $t_3$ relative to their values in the previous timing setting, while keeping the remaining two timing intervals unchanged. Higher numbered timing settings may increase a given timing interval by increasingly larger amounts to maintain a similar incremental increase in the signal available at the bit line sense amplifier just before sensing, or may increase more than one of the three timing intervals. For example, the timing setting "15" may increase $t_1$ and $t_3$ each by 400 ps relative to the respective intervals in timing setting "14" (compared to a 200 ps increase in only the $t_3$ timing interval between timing setting "2" and "3").

The timing setting "8" is preferably optimized to provide a "nominal" value for each of the three timing intervals $t_1$, $t_2$, and $t_3$ which is expected to be an appropriate setting for a typical device having typical transistor characteristics, typical sense amplifier offset voltages, typical bit line resistance, etc., and which is desired to provide a 100 mV signal in the bit line sense amplifier just before sensing. Note that these "nominal" values of the timing intervals $t_1$, $t_2$, and $t_3$ are a function of the process corner. Higher bit line resistance, higher access transistor threshold voltage, or lower VPP, for example, raise the nominal value of the $t_1$ and $t_3$ timing intervals which are called for by timing setting "8." For the preferred embodiment, the various timing settings provide a variety of $t_1$ intervals, some shorter than nominal and others longer than nominal, and provide a variety of $t_3$ intervals, some shorter and others longer than nominal. But since the duration of the PMOS sensing is so short for the nominal case, for some embodiments the shortest $t_2$ interval provided is the "nominal" value, and more relaxed $t_2$ intervals are provided for in the timing settings numbered above "8," as is shown in the Table 1. For the embodiment shown in FIG. 38, however, a variety of $t_2$ intervals, some shorter than nominal and others longer than nominal, may be provided by altering, for example, the configurable reference voltage 959 which is conveyed on wire 962 to the inverting input of the differential amplifier 960.

TABLE 1

(for a VDD = 2.3 volts)

| Timing Setting | Interval $t_1$ | Interval $t_2$ | Interval $t_3$ | Desired Signal at Sense Time |
|---|---|---|---|---|
| 1 | Fastest | Fastest | Fastest | 30 mV |
| 2 | +200 ps | — | — | 40 mV |
| 3 | — | — | +200 ps | 50 mV |
| 4 | +220 ps | — | — | 60 mV |
| 5 | — | — | +220 ps | 70 mV |
| 6 | +240 ps | — | — | 80 mV |
| 7 | — | — | +240 ps | 90 mV |
| 8 | +270 ps | — | — | 100 mV |
| 9 | — | +200 ps | — | 110 mV |
| 10 | — | — | +270 ps | 120 mV |
| 11 | +300 ps | — | — | 130 mV |
| 12 | — | +240 ps | — | 140 mV |
| 13 | — | — | +300 ps | 150 mV |
| 14 | +350 ps | — | — | 160 mV |
| 15 | +400 ps | — | +400 ps | 170 mV |
| 16 | +500 ps | — | +500 ps | 180 mV |

During manufacture, this timing setting "8" is configured as the default setting a special test mode (for example, at wafer sort) the timing setting may be temporarily made more or less aggressive to determine the window of operation for each chip. Some of the memory devices are found to function correctly with very aggressive training, while others require more relaxed timing. Then, during the fuse blowing sequence for redundancy, timing fuses may be also blown to permanently modify the default strobe timing. The timing setting is preferably set as aggressively as possible to enhance device performance, while maintaining adequate sense amplifier signal margins for reliability. For example, if a timing setting of "4" is the most aggressive timing for which a given device functions without error, then the device may be advantageously fuse programmed to a timing setting of "6" to ensure some additional operating margin (the signal to the bit line sense amplifiers increasing as the timing setting increases). At a later test, such as at final test of a packaged device, the test mode may still be entered, and the timing setting advanced (e.g., by an offset of 2 timing settings) from its then fuse programmed setting (e.g., timing setting "6") to a more aggressive setting (e.g., resulting in a timing setting of "4", its previously determined most aggressive functional timing setting), in order to further verify adequate sense amplifier margins on a chip-by-chip basis, independent of which actual timing setting was fuse programed into the device.

Figure 38A:
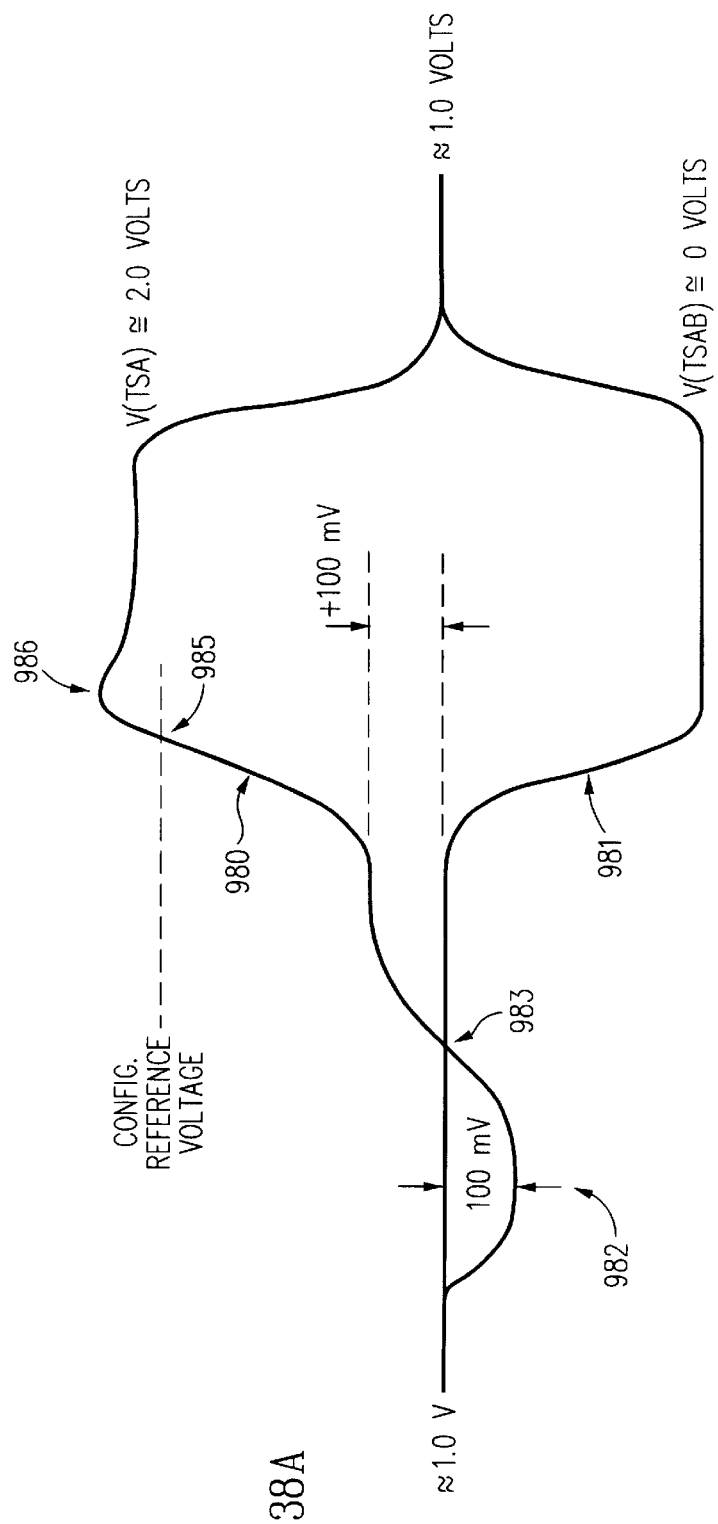
FIG. 38A is a waveform diagram which illustrates the waveforms for the internal nodes of the latch timing sense amplifier shown in FIG. 38.

FIG. 38A is a waveform diagram which illustrates the waveforms for the internal nodes of the latch timing sense amplifier shown in FIG. 38. When the "low" signal from the "1C" memory cell at the near end of the timing bit line arrives at the timing sense amplifier, the voltage of the true sense amplifier node TSA is brought down by 100 mV (labeled as time 982) relative to the equilibration level of approximately 1.0 volts, at which voltage the complement internal timing sense amplifier node TSAB also remains. Then, when the "high" signal from the "2C" memory cell at the far end of the timing bit line starts to arrive at the timing sense amplifier, the voltage of the true sense amplifier node TSA is brought back high, passing through the voltage of the complement timing sense amplifier node TSAB (at time 983), and eventually reaches (if its latch enable is delayed long enough) a value of +100 mV relative to the complement internal node TSAB. Note that when half of the signal from the "2C" high memory cell reaches the timing sense amplifier (at time 983), differential amplifier 956 (see FIG. 38) terminates the timing interval $t_1$ independent of the particular magnitude of the memory cell capacitance. Referring again to FIG. 38A, when the latch enable for the timing sense amplifier occurs, the true internal node TSA is driven high (labeled as 980). When it reaches the reference voltage level of the configurable reference voltage 959 (labeled at time 985), the timing interval $t_2$ is terminated. After the propagation delay through the differential amplifier 960 and one or more buffers, the PMOS sensing terminates at a time labeled 986. With the PMOS sensing terminated, the true timing sense amplifier node TSA reaches a value (after charge sharing with the bit line) of about 2.0 volts. At the same time, the complement internal node TSAB is driven to ground (labeled as 981). Finally, both are equilibrated to about 1.0 volts in preparation for the next active cycle.

Figure 39:
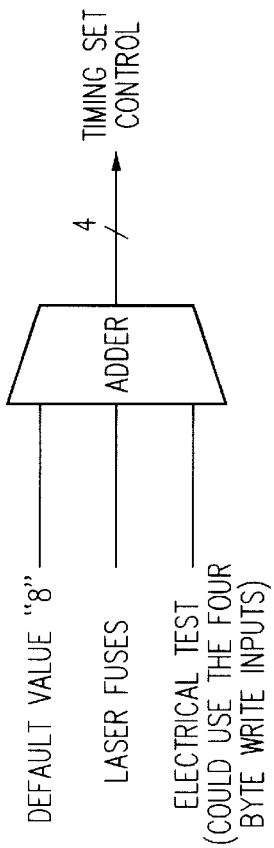
FIG. 39 is a conceptual diagram of the timing setting control circuit which generates a signal for selecting one of several possible latch timing settings, and which signal may be permanently modified by laser fusing to alter the default timing setting, and may also be temporarily modified, either before or after laser fusing, by electrical test signals to alter the timing setting.

FIG. 39 is a block diagram of such a timing setting control circuit which uses an "adder" to generate a signal for selecting one of several possible latch timing settings, and which signal may be permanently modified by laser fusing to alter the default timing setting, and may also be temporarily modified, either before or after laser fusing, by electrical test signals to alter the timing setting. When in a test mode, the electrical configuration inputs may be provided to the memory device by logically enabling all four bytes for any write cycles, independent of the status of the four byte write control inputs, and then using the four byte write control inputs to specify up to sixteen different timing setting offsets, such as −7 through +8.

Figure 40:
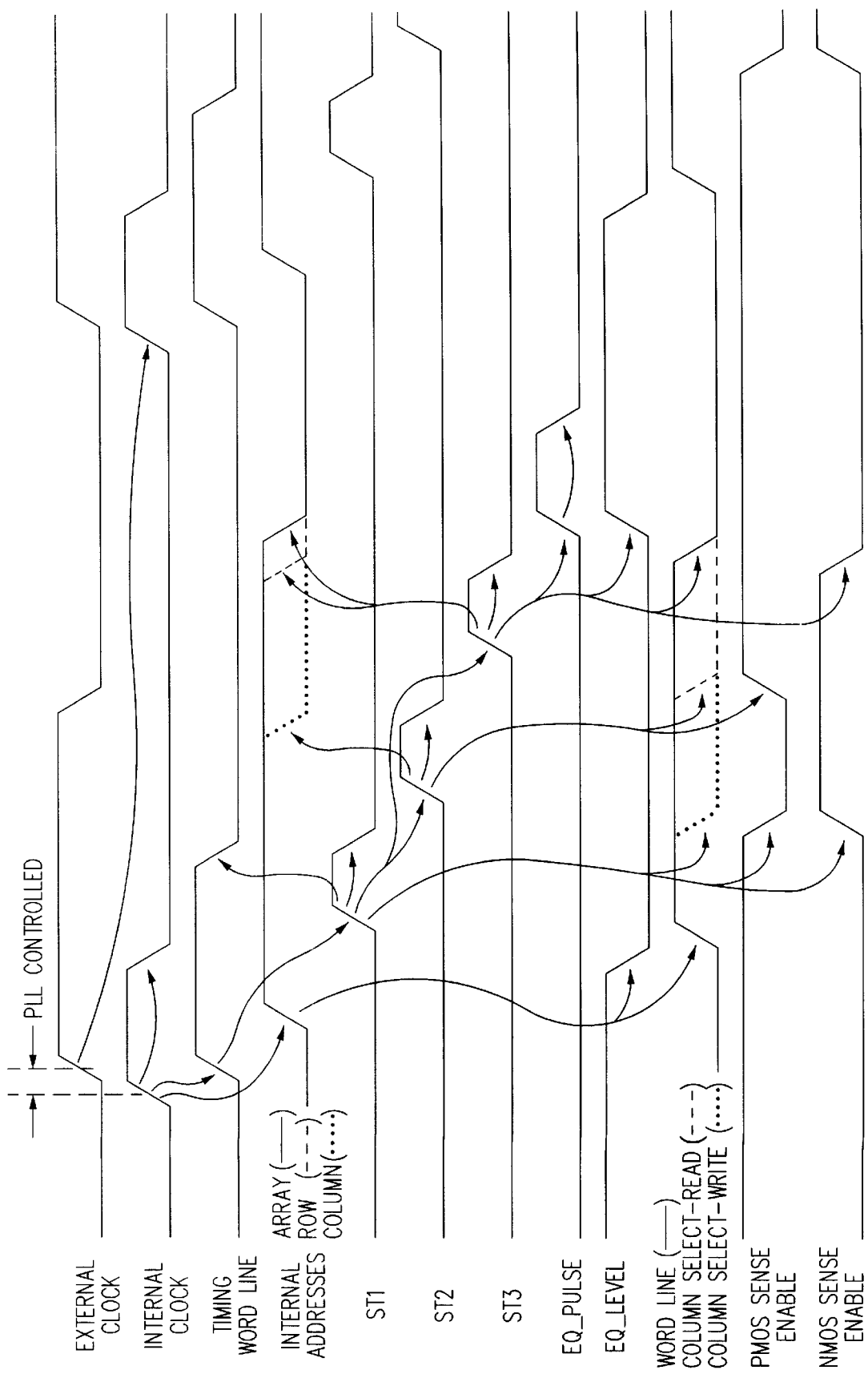
FIG. 40 is a timing diagram illustrating the general relationship between major timing signals for an array (read or write) operation for various embodiments of a memory array.

FIG. 40 is a timing diagram illustrating the general relationship between major timing signals for an array (read or write) operation for various embodiments of the memory array described. As is customary in such "waterfall" charts, the waveforms provide a general representation of the relative timing of the signals shown, and the arrows indicate which signal transitions cause corresponding transitions on other signals (either directly or after some intermediate delay). As all the signals shown are well described elsewhere herein, this diagram is included to provide additional clarity, but need not be discussed separately.

Figure 41:
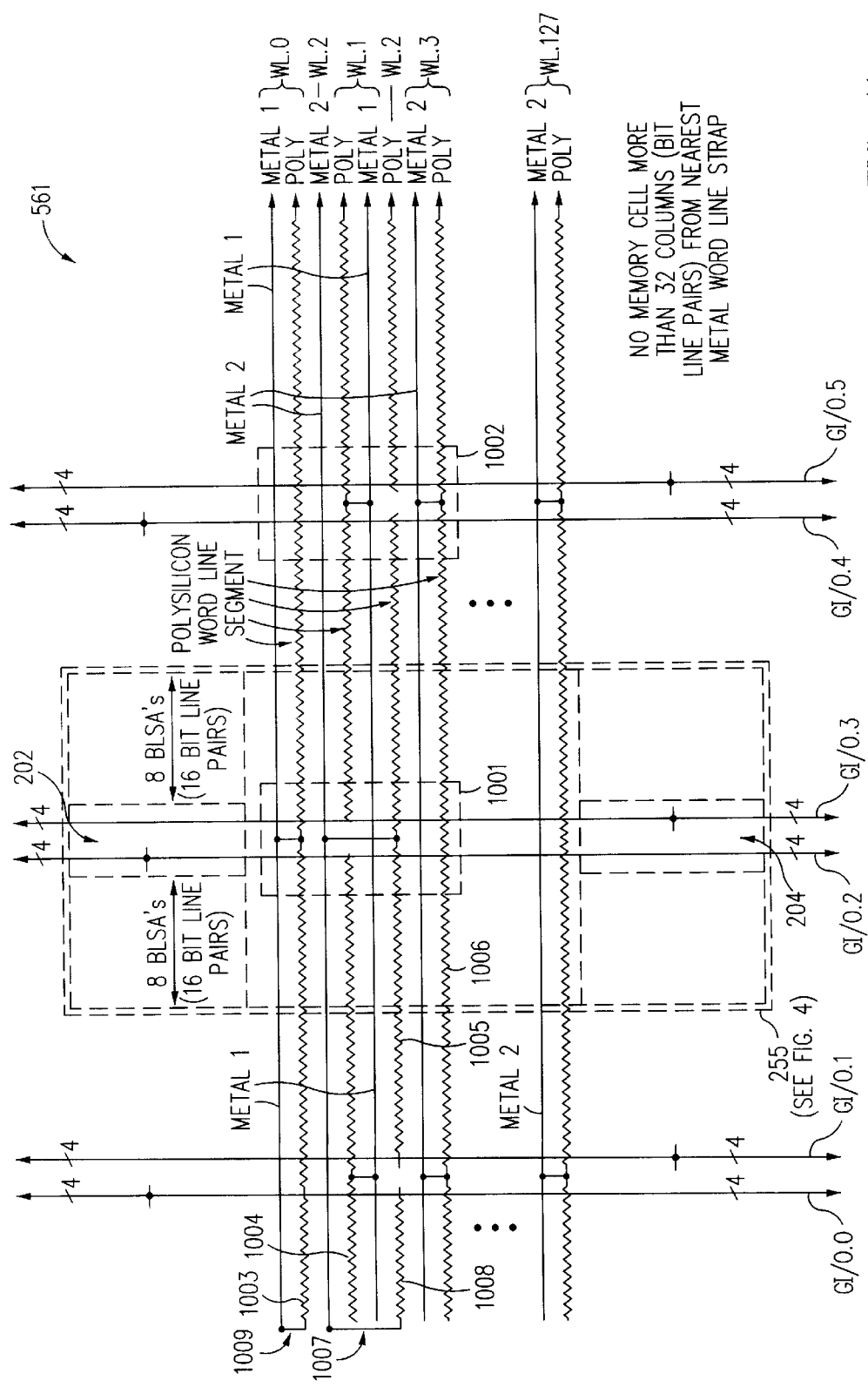
FIG. 41 is a block diagram of a portion of a memory bank, illustrating the row strapping gaps, in which alternating metal1 and metal2 word lines are each strapped to an associated polysilicon word line segment, which gaps are horizontally aligned with local I/O read amplifier and write blocks and located beneath the vertically arranged global input and output lines generally traversing overhead.

FIG. 41 is a block diagram of a portion of a memory bank, illustrating the row strapping, in which alternating metal1 and metal2 word lines are each strapped to an associated polysilicon word line to reduce word line delays which would otherwise be present if the word lines were implemented only in the polysilicon layer. Such word line straps are preferably implemented using two different layers of metal (preferably the two "lowest" layers, metal1 and metal2) in order to match the word line pitch without requiring any distributed buffers or final decode buffers. Polysilicon layers and interconnections are frequently silicided to reduce their resistance, and reference herein to "polysilicon" should not be inferred to exclude silicided polysilicon.

The figure is believed to be relatively self-evident, but some features which ay not immediately be apparent are worthy of description. Four word lines WL.0, WL.1, WL.2, and WL.3 are shown. Word lines WL.0 and WL.1 are implemented in the metal1 layer and traverse horizontally across the given memory bank (here showing, for example, a small portion of memory bank 561). Word lines WL.2 and WL.3 are implemented in the metal2 layer and also traverse horizontally across the given memory bank. The metal2 word lines are located between the metal1 word lines (on the lower layer of metal below) so that the coupling between adjacent word lines is reduced (e.g., word line WL.2 is implemented in a metal2 layer placed largely "between" the underlying metal1 word lines WL.0 and WL.1). As shown in the figure, each of the polysilicon word lines (which may exist as more than one segments) of a first adjacent pair connect to a respective metal1 word line, and each of the polysilicon word lines of a second (remaining) adjacent pair connect to a respective metal2 word line. In particular, note that the upper pair of polysilicon word lines (1003, 1004) connect to respective word lines WL.0 and WL.1, which are both implemented in metal1. The lower pair of polysilicon word lines (1005, 1006) connect to respective word lines WL.2 and WL.3, which are both implemented in metal2. This is done to coordinate with the row redundancy capability, which replaces word lines in adjacent pairs. Since intra-layer shorts (including poly-to-poly, metal1 -to-metal1, and metal2-to-metal2) are more common than inter-layer shorts, the efficiency of the limited number of redundant rows is enhanced. The redundant rows replace normal (i.e., non-redundant) rows in pairs 0,1 or 2,3. With this arrangement, a row-to-adjacent row short in either metal1, metal2, or poly has a 50% chance of causing a failure in two rows that would be replaced together anyway.

The area labeled 1001 provides a row "strap hole" wherein half of the metal word lines (of a repeating group of four word lines) connect to their respective polysilicon counterpart. In particular, word line WL.0 makes a metal1-to-poly (i.e., polysilicon) contact, and word line WL.2 makes a metal2-to-metal1-to-poly (vertical stacked) contact. The other two word lines WL.1 and WL.3 traverse through area 1001 without contacting their respective poly word lines. Three of the polysilicon word lines traverse through area 1001 without a break, but the polysilicon word line WL.1 is discontinuous (i.e., there is a "break" in the poly) due to the enlarged area of polysilicon required for the contacts to the poly word line WL.1 and to the poly word line WL.3 to also fit within this area 1001. However, the two poly segments of WL.1 are each contacted by its metal1 counterpart in each adjacent strap hole areas (e.g., area 1002).

Conversely, the area labeled 1002 provides a row "strap hole" wherein the remaining two metal word lines connect to their respective polysilicon counterpart. In particular, word line WL.1 makes a metal1-to-poly contact, and word line WL.3 makes a metal2-to-metal1-to-poly contact. The other two word lines WL.0 and WL.2 traverse through area 1002 without contacting their respective poly word lines.

Three of the polysilicon word lines traverse through area 1002 without a break, but there is a "break" in the polysilicon word line WL.2 due to the area required for the two contacts to also fit within this area 1002. However, the two poly segments of WL.2 are each contacted by its metal2 counterpart in each adjacent strap hole areas (e.g., area 1001).

These two areas 1001, 1002 alternately repeat across each memory bank using the same interval as the global I/O lines, six of which are indicated in the figure. The read amplifiers used to sense a local output line and subsequently drive a global output line may be advantageously located above the word line strap holes where a break in the memory cell stepping already occurs to accommodate the row (i.e., word line) straps. This allows the read amplifier block (e.g., 202, 204 of FIG. 4) to more readily be laid out in the center of a group of bit line sense amplifier and column select circuits. As such, the bit line sense amplifier pitch may be slightly less than twice the column pitch (recalling that half of the bit line sense amplifiers are above the array block and the remaining half below the array block). With this arrangement, the word line straps are thus located largely beneath the vertically arranged global input and output lines generally traversing overhead. With the arrangement shown, no memory cell is located more than the width of 32 columns (bit line pairs) away from its nearest metal row strap, independent of whether the word line contains a periodic polysilicon "gap" (such as word line WL.1), or whether the word line contains no such periodic polysilicon "gaps" (such as word line WL.0). Of course, with this layout other contacts are needed at the left and right ends of the memory bank. For example, without contact 1007, the segment 1008 of poly word line WL.2 would be floating. Without contact 1009, the end 1003 of poly word line WL.0 would be 48 columns from its nearest metal row strap, having more than twice the otherwise worst case distributed RC delay (both R and C increase by a factor of 1.5 over the otherwise worst case memory cell being 32 columns away from its nearest metal row strap).

Figure 42:
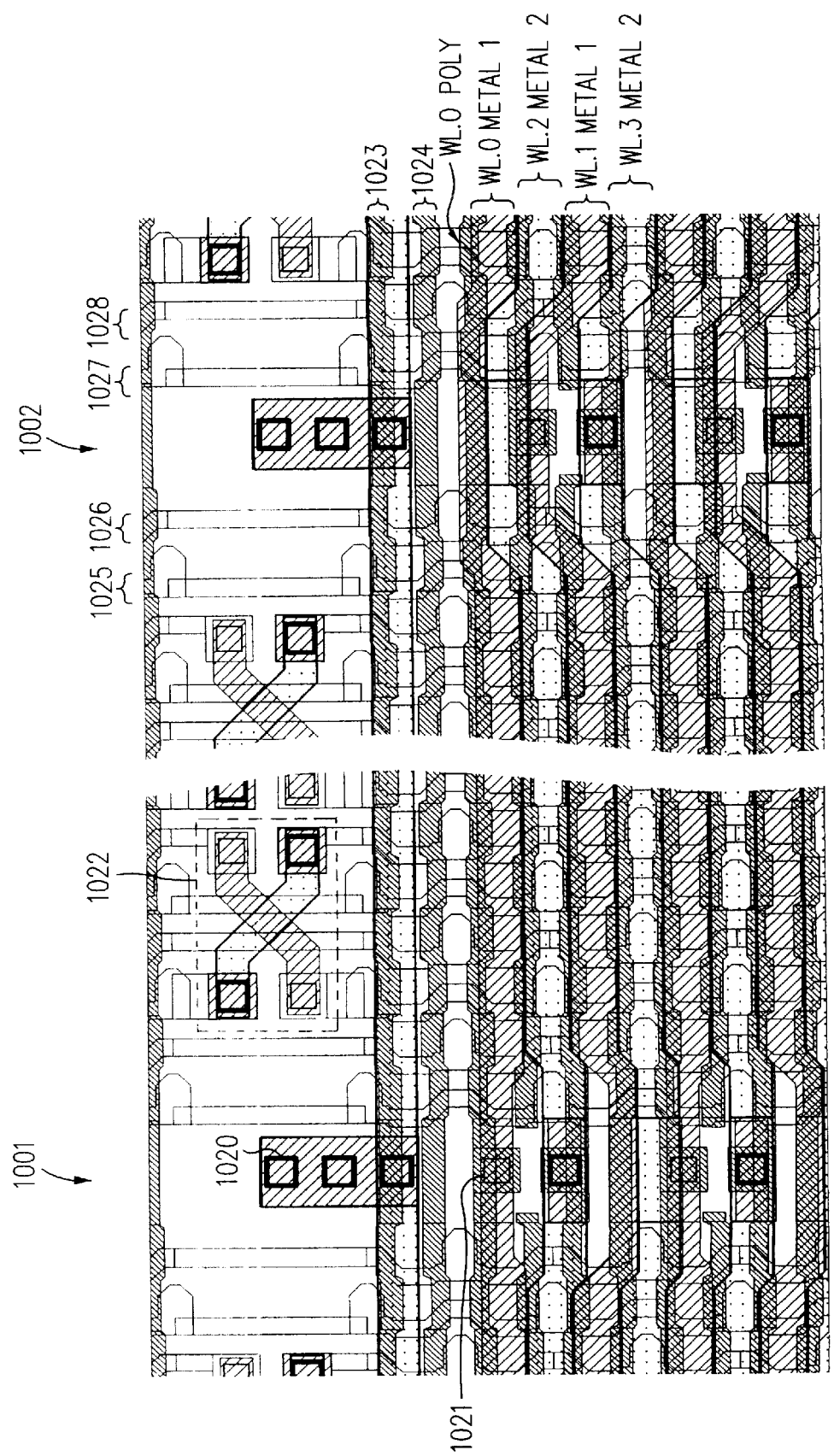
FIG. 42 is a layout diagram of a portion of a memory bank, illustrating the row strapping gaps depicted in FIG. 41, and which also shows the bit line cross-over structures.

FIG. 42 is a layout diagram of a portion of a memory bank, illustrating the row strapping gaps depicted in FIG. 41, in which alternating metal1 and metal2 word lines are each strapped to an associated polysilicon word line. The diagram shows areas 1001, 1002 from FIG. 41 (and a small portion of the surrounding layout), although a number of columns (bit line pairs) have been removed to fit the size of the page without loss of comprehension. In the FIG. 42, a heavy-lined ("dark") square contact, such as contact 1020, is a metal2-to-metal1-to-poly stacked vertical contact, whereas a lightly-lined square contact, such as contact 1021, is a metal1-to-poly contact. As the structure of this layout was relatively well represented in FIG. 41, reference should be made to the earlier description to assist in understanding. As a further point of clarity, a bit line cross-over structure, labeled 1022, is shown which uses metal1 and metal2 to cross a polysilicon bit line pair over each other and over another polysilicon bit line pair therebetween. Also shown are two dummy rows 1023, 1024 of the guard cells 801 previously shown in FIG. 36. A pair of polysilicon dummy bit lines is also implemented on either side of each row strap hole to provide photolithographic guard cells at the side of each arrayed group of memory cells (e.g., dummy bit line pair 1025, 1026 on the left of area 1002, and dummy bit line pair 1027, 1028 on the right of area 1002). For clarity, the many layers not associated with the word line straps or the bit line cross-over structures are not included in the figure.

Figure 43:
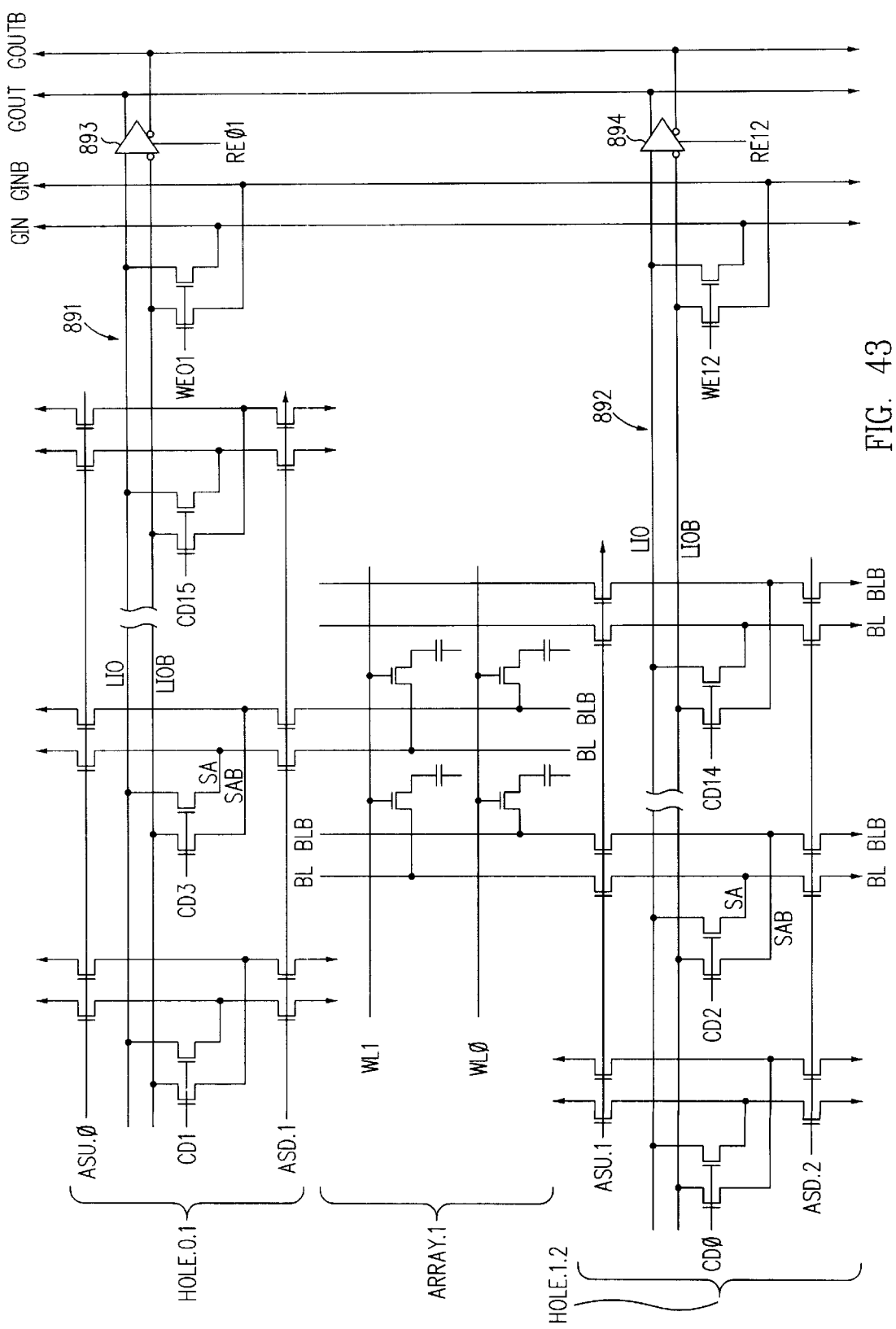
FIG. 43 is a schematic diagram of another embodiment of a column decode arrangement for coupling a selected sense amplifier through a pair of local I/O lines to a pair of global output lines when reading, and for coupling a pair of global input lines through the pair of local I/O lines to the selected sense amplifier when writing, with the even column addresses selecting a sense amplifier below the array block, and the odd column addresses selecting a sense amplifier above the array block, both of which are coupled to the same set of global input/global output lines.

FIG. 43 is a schematic diagram of another embodiment of a column decode arrangement for coupling a selected sense amplifier through a pair of local I/O lines to a pair of global output lines when reading, and for coupling a pair of global input lines through the pair of local I/O lines to the selected sense amplifier when writing, with the even column addresses selecting a sense amplifier below the array block, and the odd column addresses selecting a sense amplifier above the array block, both of which are coupled to the same set of global input/global output lines. Such an embodiment (using 1 set of GOUT lines to serve both the sense amplifiers above the array block and below the array block) may be advantageous if no burst mode need be provided, particularly if the layout is too squeezed to fit two pairs of global input line wires and two pairs of global output line wires between the massive vertical VDD and VSS power supply wires.

A preferred embodiment of the memory device receives an external clock signal EXT_CLK and a variety of other control signals, including a read/write control R/W#, an advance/load control ADVALOAD#, a chip enable CE, and a clock enable CLKEN. Table 2 describes the internal operation performed in response to various combinations of these external control signals.

TABLE 2

(assumes CLKEN is valid)

| CE# | ADV/LOAD# | R/W# | Action Taken |
|---|---|---|---|
| Valid (L) | LOAD (L) | R (H) | Start Read (load cycle) |
| Valid (L) | LOAD (L) | W (L) | Start Write (load cycle) |
| (Don't care) | ADV (H) | (Don't Care) | Continue (R, W, or Stop) |
| Invalid (H) | LOAD (L) | (Don't care) | Stop |

In the preferred embodiment, the memory device includes refresh control circuitry for automatically performing internal refresh of the memory array without user intervention. A separate refresh control circuit is provided for each memory bank, which are each configured to request a refresh request, for its respective memory bank, every 256 external clock cycles. When a refresh request for a memory bank is generated by its refresh control circuitry, it is immediately performed if that memory bank is not otherwise occupied with an internal "load" cycle (i.e., a load read or write cycle to an external address, or an automatic load read or write cycle to an internally generated address to continue a burst read or write). If the memory bank happens to be busy with such a load cycle and is unable to perform the refresh when requested, the request is queued and performed the first cycle that the memory bank is available (i.e., not executing an internal load cycle).

Unlike earlier devices, such a "hidden" refresh cycle can fully complete in just one cycle, and another internal load cycle can begin in the same memory bank on the very next external cycle, if required, in accordance with the next command and address received. Thus, even if the memory bank is free for only one cycle, a hidden refresh operation can be fully performed and the memory bank ready on the very next cycle to accept an external load cycle with full confidence. This makes such hidden refresh cycles possible totally under internal control, with no user interaction, because there is no risk that an external cycle will be received that cannot be carried out because the memory bank is still busy performing an internal refresh cycle. For the same reason, there is no need for a "busy" signal to alert the user when an internal refresh cycle is in progress.

The respective counters within each refresh control circuit are offset so that every 64 external cycles one of the four memory banks adds "1" to its number of queued or pending refresh requests. Whenever the number in the queue exceeds zero, that memory bank attempts a refresh on every cycle. Therefore, on the first available cycle after the queue is incremented, the request is retired (i.e., the refresh cycle is performed) and the count in the queue is decremented. No further refresh requests are pending in the queue when it decrements to its normal state of zero. For every 256 external clock cycles, as long as a memory bank is free for just one cycle, a hidden refresh can be performed without having the queued number of refresh requests increase. In the memory device embodiment described, two particular address bits (e.g., the A2 and A1 bit) choose which memory bank is addressed (recall that the LSB, address bit A0, chooses the between the upper or lower 36-bit word accessed from a single memory bank). If the user arranges the significance of the external address bits to use the same significance as the memory device, then for any reasonable addressing sequence which accesses small or large blocks of memory, or even those which randomly address various addresses, the lower significance address bits are almost assuredly changing frequently. Consequently, as the memory device responds to the particular sequence of addresses, all four memory banks are likely addressed with some reasonable frequency (thus ensuring that each memory bank is free reasonably often, such as, on average, 192 out of 256 cycles if all cycles are load read or load write cycles, and even more if some cycles are idle or burst cycles). The likelihood of a single memory bank being busy for 256 straight cycles is very low. Moreover, the likelihood of a single memory bank being busy for additional multiples of 256 straight cycles is extremely low.

A refresh request does not need to be retired before the next refresh request arrives. Up to 64 refresh requests may be placed into the refresh queue. A refresh flag is provided in the extremely unlikely event that the internal refresh for a particular memory bank gets very far behind its desired rate (i.e., if too many refresh requests are queued). If the refresh queue is nearly full, the refresh flag is asserted. For example, if a particular memory bank has not performed a refresh cycle in 61×256 external clock cycles, the refresh flag is asserted. However, even if a memory bank gets seriously "behind" and has queued up many refresh requests, if the memory bank thereafter is free for at least two cycles out of every 256 external clock cycles, refresh requests will be retired from the queue faster than new ones will be added, and the device will eventually "catch up." It is for this reason, along with the depth of the refresh queue, that the refresh flag is seldom, if ever, expected to be asserted (provided the user assigns the significance of the address bits as described).

The refresh counters and control circuits are also arranged to ensure that no more than three memory banks can perform an internal array operation at the same time (one performing an internal load cycle, and two each performing a hidden refresh cycle) to reduce the worst case current transients (i.e., power supply noise) that would occur if all four memory banks were simultaneously active.

The choice of counting clock cycles to determine when to refresh, rather than elapsed time, has several advantages. First, it is easy to do. The clock exists and is always running (as required by the phase-locked delay line previously described). Second, the refresh interval required for proper operation is more or less proportional to the operating cycle time. As the operating frequency increases (i.e., cycle time decreases), more minority carriers are injected into the substrate, increasing the leakage of the memory cells, thus decreasing the data retention time of the memory cells. Consequently, faster cycling (i.e., shorter cycle times) requires more frequent refreshing. Furthermore, another significant source of cell leakage is the sub-threshold conduction of the access transistors on unselected rows of memory cells. This sub-threshold conduction only occurs when the bit line (or complement bit line), to which the unselected memory cell is attached, is biased at VSS, which only occurs for about 2 ns per cycle. This component of memory cell leakage is directly proportional to frequency. Again, higher frequency operation requires more frequent refreshing.

In the preferred embodiment, the memory device supports burst mode for both read and write cycles. For example, a burst mode read sequence to read four consecutively-addressed 36-bit single words is accomplished by presenting the address of the first of the four words, and initiating a first "load" cycle as indicated in Table 2 (which, as described previously, drives the corresponding output data for the first word during a subsequent external cycle). The next three cycles are then initiated as "continue" or "advance counter" cycles, and no addresses need be presented to the memory device. Rather, the memory device increments the address received from the load cycle (in either of two well-known counting orders) to provide the proper addresses for the next three cycles. Consequently, the external memory bus is available for other use, and is not required to service the memory device in performing the three successive burst mode cycles.

The above description of burst mode is cast from the perspective of the user of the memory device, and is not particularly instructive of the internal operation of the memory device. For example, such a burst mode capability may be (and usually is) supported by a memory device which maintains an internal address counter (which is initialized by the address of the load cycle, and incremented for each successive burst mode cycle), and which performs a full 36-bit access into the memory array for each of the four burst mode cycles (which, in effect, is an external load cycle for the first cycle, and is an "internal load cycle" for each of the following three burst mode cycles). However, in the preferred embodiment, the internal data path to and from the memory array is a 72-bit wide path corresponding to two 36-bit single words whose addresses differ only in the LSB. Taking advantage of this capability, upon receipt of the external load cycle (which starts the burst), the memory device may perform an "internal" load cycle which retrieves the full 72-bit double word which includes the 36-bit single word addressed by the external load cycle, as well as the "other" 36-bit word whose address differs only in that its least significant address bit is opposite that of the addressed word. The addressed 36-bit word is directed to the output buffers as normal, and the second 36-bit word is stored internally in registers located outside the array. Consequently, in the next cycle, the stored, second 36-bit word may be retrieved and provided to the output buffers (assuming the burst counting sequence corresponds to the address of the stored second word) and the memory array need not perform another load cycle to retrieve the data. Instead the memory array can remain inactive, thus saving considerable power, or may be called upon to perform an internal refresh cycle (i.e., a "hidden" refresh cycle) at the same time that the memory array "appears" to be occupied with supporting the burst mode cycle. When operating in burst mode, the already remote chance that a given memory bank is unable to keep up with the internally generated refresh requests all but disappears.

If all, or at least many, memory cycles are burst mode cycles, then internally accessing the fall 72-bit double word and providing 36 of the bits to the output buffers during a first cycle, and providing the remaining 36 bits to the output buffers during the next cycle (assuming it is a burst cycle), results in far less power consumption than if two separate memory array operations were performed, each accessing only a 36-bit single word and providing it to the output buffers. However, if the address of each successive external memory cycle is unpredictable, rather than sequential in nature, and seldom addresses through at least a group of two consecutive addresses, then the "other" 36-bit word which is accessed during the 72-bit internal load cycle and stored in anticipation of the next cycle being a burst cycle, is frequently (or always) unused because the next address does not correspond to this stored word. In such a case, the memory device would be more advantageously configured to only access 36-bit words during an internal load cycle, thus saving the power consumption otherwise required to read and save the second word (which is ignored when the next external read cycle addressing a different word is received).

To provide for both modes of operation, in the preferred embodiment the memory device powers up in the non-burst mode. A burst mode flip-flop is reset upon power-up, and all internal load cycles are consequently 36-bit cycles. The first time a user initiates an ADVANCE cycle after a LOAD READ cycle (in other words, the first time the user tries to utilize a burst mode read cycle), the memory device computes the incremented address accordingly, and internally performs a second 36-bit internal load cycle to access the other half of the double word from the memory array. The memory device then correctly provides the read data to the output pins at the correct time. However, this first burst mode cycle also sets the burst mode flip-flop so that all future internal load read cycles are 72-bit load cycles, and consequently future burst mode read cycles may use the stored "second" 36-bit word retrieved during the 72-bit load read cycle. Such an internal 72-bit load read cycle uses approximately 20% more power than an internal 36-bit load read cycle. However, if all cycles are burst of four read cycles, only half as many internal load cycles need be performed. With half the cycles using 120% the power of a single 36-bit load read cycle, and the other half using zero memory array power, the average power consumed is only 60% of that used by consecutive 36-bit internal load read cycles (i.e., without the burst mode flip-flop being set).

In a burst mode sequence, the first 36-bit word in the consecutive sequence is retrieved from the memory bank corresponding to the read address using a 72-bit internal load cycle. If the burst mode continues to read a second word of the burst, the corresponding data may have already been retrieved by the first 72-bit internal load cycle (depending on the counting sequence, and the particular starting address), and can be provided to the data output buffers without performing another internal load cycle. Assume for a moment such a case. Then, if the burst mode continues to read a third word of the burst, a second internal load cycle is necessary and is automatically initiated to retrieve the next 72 bits of data, all transparent to the user. The address decoding may be arranged so that these next two 36-bit words of data in the consecutive sequence may correspond to another column or another word line in the same memory bank as the first two 36-bit words, or may be arranged to correspond to the same row and column address within another memory bank (e.g., an adjacent memory bank).

Conversely, the corresponding data may not have already been retrieved by the first 72-bit internal load cycle (depending on the counting sequence, and the particular starting address) when the burst mode continues to read the second word of the burst. In such a case, a second internal load cycle is necessary to retrieve even the second 36-bit word, and is automatically initiated (an "auto-load during a burst cycle") to retrieve the next 72 bits of data, all transparently to the user. Then, if the burst mode read continues to read a third word of the burst, the corresponding data has already been retrieved by the second 72-bit internal load cycle, and can be provided to the data output buffers without performing another internal load cycle. With this sequence, the fourth and final word of the burst was obtained as the unused half of the original 72-bit load read cycle, and no additional memory array cycle is required to output that data. Thus, an internal load cycle is automatically performed, without user interaction, whenever the burst mode counting sequence increments to an address for which the corresponding data has not already been retrieved by a 72-bit internal load cycle.

Since any internal load cycle, including an automatically initiated internal load cycle, as well as any burst mode ADVANCE cycle can fully complete in just one external clock cycle, the burst mode sequence is fully interruptible after any arbitrary cycle of the burst, and a new internal load read or load write cycle, having a totally arbitrary address, can be executed during the very next external clock cycle.

The burst mode thus far has been described largely in the context of read cycles. The write cycle merging capability already described provides the internal capabilities in the data path which are necessary to support burst mode write cycles. In particular, recall that two consecutive write cycles, writing data to two 36-bit words whose addresses differ only in the LSB, are merged (whether or not they were received in a burst mode) so that only one internal 72-bit write operation is performed. The address incrementing capability, already described above for read burst cycles, is also required to support burst mode write cycles because, like burst mode read cycles, the user need not present the write address on subsequent burst mode write cycles after the first "LOAD WRITE" cycle.

In the preferred embodiment a burn-in mode is provided which dispenses with most of the internal timing, and drives every other word line in every array block (in all four memory banks) to a DC high voltage (which is adjustable, and usually set to a higher voltage than the normal VPP voltage), enables the column decoders in each hole (including both the left and right decoded write signals), latches the bit line sense amplifiers in every hole, and holds all these signals for an entire second. As a result, every word line in the entire memory device is at a voltage opposite that of both of its neighboring word lines, every bit line is driven to a voltage opposite that of both respective neighboring bit lines for at least half the time with the proper choice of data pattern, and one-fourth of the memory cells have a voltage stress placed across its dielectric, for substantially the entire duration of each one-second long cycle. This affords a significant decrease in the burn-in times required to adequately stress the device for at least two reasons. First, the cycle time achievable during burn-in is frequently much longer than during normal operation. When testing a self resetting device at such slow cycle times, the device only infrequently performs an active cycle, and otherwise remains in a reset or precharge state most of the time. By holding the signals stated above for the entire very long active cycle, the desired voltage stress is applied for substantially the entire active cycle. This increases the duty cycle of active cycles from about 2 ns per 1000 ns for a typical 1 MHz clock during burn-in, to almost 100% duty cycle, which is a factor of 500 improvement! Second, this technique described above allows so much more of the circuit elements to be stressed at the same time than normally achievable if the decode functions were to be operating normally. This increases the number of word lines being stressed simultaneously from 1 (i.e., one word line in one memory bank) to 8192 word lines (i.e., half of the 4096 word lines in each of the four memory banks), a factor of 8000 improvement. The stress time is thus increased by a factor of (500)(8192)=16,385,000. Every 2 seconds of burn-in using this mode accomplishes about the same stress to the memory array as 1 year of burn-in under normal operation at the very low operating frequency of 1 MHz.

Using the teachings described above, the exemplary dynamic memory array architecture described above affords random access cycles (each requiring a new row access) at a sustained rate in excess of 200 MHz operation for memory devices tolerating aggressive $t_1$, $t_2$, and $t_3$ timing, even when each new row access is within the same array-block of the same memory bank!

The many aspects, features, and advantages of the present invention are conveyed herein by describing several exemplary embodiments of a high-performance DRAM memory device. In some instances, simplified block diagrams and schematics are shown, particularly when the key concepts, features, or implementation details may be more easily communicated. In other cases, more complete schematics are shown if helpful to impart a more complete understanding of the invention or to better appreciate its nuances. One skilled in the art will recognize the many teachings of this disclosure and be able to apply these teachings to additional embodiments and, indeed, to other kinds of devices, as well, without departing from the teachings of this disclosure. For example, the teachings of this disclosure may also be advantageously applied to memory arrays incorporated within an integrated circuit that includes a processor, such as an integrated processor (e.g., microprocessor) circuit including an embedded dynamic memory array. Consequently, the scope of the invention should not be inferred as being limited by the exemplary embodiments described herein, but rather should be viewed as teaching in the art far greater than just these exemplary embodiments. Accordingly, other embodiments, variations, and improvements not described herein are not necessarily excluded from the scope of the invention.

General Nomenclature and Terminology Usage

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high" and "circuit 10 drives OUT high." Such shorthand phrases for describing circuit operation are more efficient to communicate details of circuit operation, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure. It is to be appreciated by those skilled in the art that each of these and other similar phrases may be interchangeably used to describe common circuit operation, and no subtle inferences should be read into varied usage within this description.

As an additional example, a logic signal has an active level and an inactive level (at least for traditional binary logic signals) and the active and inactive levels are sometimes also respectively called active and inactive "states." The active level for some logic signals is a high level (i.e., an "active-high" signal) and for others is a low level (i.e., an "active-low" signal). A logic signal is "asserted" or "activated" when driven to the active level. Conversely, a logic signal is "de-asserted" or "de-activated" when driven to the inactive level. A high logic level is frequently referred to as a logic "1" and a low logic level is frequently referred to as a logic "0" (at least for positive logic).

Frequently logic signals are named in a fashion to convey which level is the active level. For example, CLKEN is commonly used to name an active-high clock enable signal, because the true polarity is implied in the name. Conversely, CLKENB, /CLKEN, CLKEN#, CLKEN*, CLKEN_L, CLKEN_C, or #CLKEN are commonly used to name an active-low clock enable signal, because one of the many common expressions indicating the complement polarity is used in the name. Complementary pairs of signals or node names, such as true and complement clock lines, and true and complement bit lines within a column of a memory array, are frequently named to clarify the polarity of both nodes or signals (e.g., BL3T and BL3C; BL6__T and BL6__C) and in other instances, only the complement polarity may be indicated in the names (e.g., CLK and CLK#, or BL and BLB). In still other cases, two "complementary" signals are both inactive at one state (e.g., inactive low), and only one is driven to an active level to convey the polarity of the signal. For example, two complementary address lines (e.g., A2T and A2C) are both inactive low during a quiescent portion of a cycle. Later, A2T is driven high to indicate that the received address A2 is high (A2=H). Alternatively, A2C is driven high to indicate that the address received is low (A2=L). It is to be appreciated by those skilled in the art that these and other similar phrases may be used to name the signals and nodes. The schematic diagrams and accompanying description of the signals and nodes should in context be clear.

A transistor may be conceptualized as having a control terminal which controls the flow of current between a first current handling terminal (or current carrying terminal) and a second current handling terminal. An appropriate condition on the control terminal causes a current to flow from/to the first current handling terminal and to/from the second current handling terminal (for typical operating voltages of the first and second current handling terminals). In a bipolar NPN transistor, the first current handling terminal may be deemed the emitter, the control terminal deemed the base, and the second current handling terminal deemed the collector. A sufficient base current into the base causes a collector-to-emitter current to flow (for typical collector-toemitter operating voltages). In a bipolar PNP transistor, the first current handling terminal may be deemed the emitter, the control terminal deemed the base, and the second current handling terminal deemed the collector. A sufficient base current exiting the base causes an emitter-to-collector current to flow (for typical collector-to-emitter operating voltages).

An MOS transistor may likewise be conceptualized as having a control terminal which controls the flow of current between a first current handling terminal and a second current handling terminal. Although MOS transistors are frequently discussed as having a drain, a gate, and a source, in most such devices the drain is interchangeable with the source. This is because the layout and semiconductor processing of the transistor is symmetrical (which is typically not the case for bipolar transistors). For an N-channel MOS transistor, the current handling terminal normally residing at the higher voltage is customarily called the drain. The current handling terminal normally residing at the lower voltage is customarily called the source. A sufficiently high voltage on the gate (relative to the source voltage) causes a current to therefore flow from the drain to the source (provided the respective voltage of the drain and source are different). For an enhancement mode N-channel device, a positive gate-to-source voltage greater than the threshold voltage (including body effect) is sufficient. The source voltage referred to in N-channel MOS device equations merely refers to whichever current handling terminal has the lower voltage at any given point in time. For example, the "source" of the N-channel device of a bi-directional CMOS transfer gate depends on which side of the transfer gate is at the lower voltage. To reflect this symmetry of most N-channel MOS transistors, the control terminal may be deemed the gate, the first current handling terminal may be termed the "drain/source", and the second current handling terminal may be termed the "source/drain". Such a description is equally valid for a P-channel MOS transistor, since the polarity between drain and source voltages, and the direction of current flow between drain and source, is not implied by such terminology. Alternatively, one current handling terminal may arbitrarily deemed the "drain" and the other deemed the "source", with an implicit understanding that the two are not distinct, but interchangeable.

Regarding power supplies, a single positive power supply voltage (e.g., a 2.5 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node", which is typically then operably connected to actually receive the VDD power supply voltage during use of the integrated circuit.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor (unless otherwise defined) means the same as being "pulled low" or "pulled to ground" by the transistor.

Generalizing somewhat, the first power supply terminal is frequently named "VDD", and the second power supply terminal is frequently named "VSS." Both terms may appear either using subscripts (e.g., $V_{DD}$) or not. Historically the nomenclature "$V_{DD}$" implied a DC voltage connected to the drain terminal of an MOS transistor and $V_{SS}$ implied a DC voltage connected to the source terminal of an MOS transistor. For example, old PMOS circuits used a negative VDD power supply, while old NMOS circuits used a positive VDD power supply. Common usage, however, frequently ignores this legacy and uses VDD for the more positive supply voltage and VSS for the more negative (or ground) supply voltage unless, of course, defined otherwise. Describing a circuit as functioning with a "VDD supply" and "ground" does not necessarily mean the circuit cannot function using other power supply potentials. Other common power supply terminal names are "VCC" (a historical term from bipolar circuits and frequently synonymous with a +5 volt power supply voltage, even when used with MOS transistors which lack collector terminals) and "GND" or just "ground."

What is claimed is:

1. An integrated circuit comprising:
   a memory array including a plurality of memory cells, each memory cell coupled to an associated one of a plurality of word lines within the memory array;
   a power supply terminal for receiving, relative to a ground potential, a power supply voltage operably coupled to the integrated circuit, by which voltage most circuits associated with the memory array are generally powered;
   a voltage generator circuit for generating, on an output node thereof, a substantially fixed boosted voltage having a regulated magnitude, relative to the ground potential, that is substantially independent of the power supply voltage, over at least an expected range of possible operating values for the power supply voltage; and
   a row decoder circuit coupled to receive the boosted voltage, for decoding a selected word line and driving the selected word line to the boosted voltage during a memory operation.

2. An integrated circuit as in claim 1 wherein the integrated circuit further comprises:
   an array select control circuit coupled to receive the boosted voltage, for decoding at least one selected array select signal and driving the at least one selected array select signal to the boosted voltage during a memory operation.

3. An integrated circuit as in claim 2 wherein:
   the array select control circuit is arranged to drive, during a memory operation, the at least one selected array select signal to the boosted voltage from an initial voltage equal to the power supply voltage.

4. An integrated circuit comprising:
   a memory array including a plurality of memory cells, each memory cell coupled to an associated one of a plurality of word lines within the memory array;
   a power supply terminal for receiving, relative to a ground potential, a power supply voltage operably coupled to the integrated circuit, by which voltage most circuits associated with the memory array are generally powered;
   a voltage generator circuit for generating, on an output node thereof, a boosted voltage having a regulated magnitude, relative to the ground potential, that is substantially independent of the power supply voltage, over at least an expected range of possible operating values for the power supply voltage; and a row decoder circuit coupled to receive the boosted voltage, for decoding a selected word line and driving the selected word line to the boosted voltage during a memory operation;

wherein the voltage generator circuit comprises:

a reference voltage circuit for internally generating a reference voltage;

a controller circuit coupled to receive the boosted voltage and the internally generated reference voltage, for at least determining whether the magnitude of the boosted voltage, relative to the ground potential, is less than its desired regulated value; and at least one pump circuit responsive to the controller circuit for periodically coupling charge onto the output node of the voltage generator circuit when the magnitude of the boosted voltage, relative to the ground potential, is less than its desired regulated value, thereby tending to increase the magnitude of the boosted voltage relative to the ground potential.

5. An integrated circuit as in claim 4 wherein:

the reference voltage circuit comprises a bandgap reference voltage circuit; and the internally generated reference voltage is substantially independent of the power supply voltage, substantially independent of variations in semiconductor process parameters, and substantially independent of variations in temperature.

6. An integrated circuit as in claim 4 wherein:

the controller circuit is also coupled to receive the power supply voltage, for controlling the amount of charge coupled periodically onto the output node of the voltage generator circuit as a function of both the boosted voltage and the power supply voltage.

7. An integrated circuit as in claim 4 wherein the voltage generator circuit further comprises:

a plurality of pump circuits, each independently enabled by the controller circuit for periodically coupling a corresponding amount of electronic charge per pump cycle onto the output node of the voltage generator circuit.

8. An integrated circuit as in claim 7 wherein the controller circuit comprises:

a first regulator circuit coupled to receive the boosted voltage and the internally generated reference voltage, for outputting at least one control signal when the magnitude of the boosted voltage is less than its desired regulated value; and a pump control circuit, responsive to the at least one control signal from the first regulator circuit, for determining if one or more of the plurality of pump circuits should be enabled as a function of the boosted voltage relative to its desired regulated value, and for controlling each of the plurality of pump circuits in accordance therewith.

9. An integrated circuit as in claim 8 wherein the first regulator circuit comprises:

a plurality of sensing circuits, each for comparing the internally generated reference voltage to a respective one of a plurality of voltages proportional to the boosted voltage.

10. An integrated circuit as in claim 8 wherein the first regulator circuit comprises:

a plurality of sensing circuits, each for comparing a voltage proportional to the boosted voltage to a respective one of a plurality of voltages proportional to the internally generated reference voltage.

11. An integrated circuit as in claim 8 wherein the controller circuit further comprises:

a second regulator circuit coupled to receive the power supply voltage and the internally generated reference voltage, for outputting at least one control signal indicative of the magnitude of the power supply voltage; and wherein the pump control circuit is also responsive to the at least one control signal from the second regulator circuit, for determining if one or more of the plurality of pump circuits should be enabled as a function of both the power supply voltage and the boosted voltage relative to its desired regulated value, and for controlling each of the plurality of pump circuits in accordance therewith.

12. An integrated circuit comprising:

a memory array including a plurality of memory cells, each memory cell coupled to an associated one of a plurality of word lines within the memory array;

a power supply terminal for receiving, relative to a ground potential, a power supply voltage operably coupled to the integrated circuit, by which voltage most circuits associated with the memory array are generally powered;

a voltage generator circuit for generating, on an output node thereof, a boosted voltage having a regulated magnitude, relative to the ground potential, that is substantially independent of the power supply voltage, over at least an expected range of possible operating values for the power supply voltage; and a row decoder circuit coupled to receive the boosted voltage, for decoding a selected word line and driving the selected word line to the boosted voltage during a memory operation;

wherein the voltage generator circuit further comprises:

a test input coupled to receive a test mode signal, to alter by a particular amount the voltage to which the boosted voltage is regulated when the test mode signal is active.

13. An integrated circuit as in claim 11 wherein the controller circuit is arranged such that:

whenever the boosted voltage is less in magnitude than a lower limit, all the pump circuits are enabled;

whenever the boosted voltage is greater in magnitude than an upper limit, none of the pump circuits are enabled; and whenever the magnitude of the boosted voltage falls between the lower limit and the upper limit, a variable number of the pump circuits are enabled as a function of both the power supply voltage and the boosted voltage.

14. An integrated circuit as in claim 13 wherein the controller circuit further comprises:

a test input coupled to receive a test mode signal, to lower in magnitude by a particular amount the lower limit voltage and the upper limit voltage when the test mode signal is active.

15. An integrated circuit as in claim 11 wherein:

each of the plurality of pump circuits are individually sized so that, as the power supply voltage varies over its anticipated operating range, and as the number and pumping capacity of pump circuits that are enabled varies accordingly, the peak magnitude of electronic charge pumped per cycle, just before each change in the selection of pump circuits so enabled, is substantially uniform over the anticipated operating range of the power supply voltage.

16. An integrated circuit as in claim 1 wherein:

the row decoder circuit is arranged so that deselected row decoders provide significant capacitive load on the boosted output node of the voltage generator circuit when compared to the capacitance of a selected word line within the memory array that must be charged to the boosted voltage during each memory cycle, such capacitive load providing a significant reservoir of electronic charge on the boosted output node without requiring separate devices or structures.

17. An integrated circuit as in claim 1 wherein the memory array comprises a dynamic memory array.

18. An integrated circuit as in claim 1 wherein the memory array comprises a read-only memory array.

19. An integrated circuit as in claim 1 wherein:

the power supply voltage is a positive voltage relative to the ground potential; and the boosted voltage is more positive than the power supply voltage.

20. An integrated circuit comprising:

a memory array including a plurality of memory cells, each memory cell coupled to an associated one of a plurality of word lines within the memory array;

a power supply terminal for receiving, relative to a ground potential, a power supply voltage operably coupled to the integrated circuit, by which voltage most circuits associated with the memory array are generally powered;

a voltage generator circuit for generating, on an output node thereof, a boosted voltage having a regulated magnitude, relative to the ground potential, that is substantially independent of the power supply voltage, over at least an expected range of possible operating values for the power supply voltage; and a row decoder circuit coupled to receive the boosted voltage, for decoding a selected word line and driving the selected word line to the boosted voltage during a memory operation;

wherein the voltage generator circuit comprises:

a controller circuit coupled to receive the boosted voltage and the power supply voltage;

a plurality of pump circuits responsive to the controller circuit, each having a respective size pump capacitance, for periodically coupling electronic charge onto the output node of the voltage generator circuit, thereby tending to increase the magnitude of the boosted voltage;

wherein each of the plurality of pump circuits may be independently enabled by the controller circuit to couple a corresponding amount of electronic charge per pump cycle onto the output node of the voltage generator circuit;

wherein, for a given value of the power supply voltage, the controller circuit is arranged to enable one or more pump circuits having, in aggregate, incrementally more total pump capacitance as the magnitude of the boosted voltage tends further below its desired regulated value, and to disable all pump circuits if the magnitude of the boosted voltage exceeds its desired regulated value; and wherein, for a given value of the boosted voltage, the controller circuit is arranged to enable one or more pump circuits having, in aggregate, incrementally more total pump capacitance as the magnitude of the power supply voltage tends correspondingly further below its nominal value, and to enable one or more pump circuits having, in aggregate, incrementally less total pump capacitance as the magnitude of the power supply voltage tends correspondingly further above its nominal value, thereby tending to maintain a more uniform value of total pumped charge per cycle over an operating range of the power supply voltage.

21. An integrated circuit as in claim 20 wherein:

the memory array comprises a dynamic memory array;

the power supply voltage is a positive voltage relative to the ground potential; and the boosted voltage is more positive than the power supply voltage.

22. An integrated circuit as in claim 21 wherein the integrated circuit further comprises:

an array select control circuit coupled to receive the boosted voltage, for decoding at least one selected array select signal and driving the at least one selected array select signal from an initial voltage equal to the power supply voltage up to the boosted voltage during a memory operation.

23. An integrated circuit as in claim 20 wherein:

each of the plurality of pump circuits are individually sized so that, as the power supply voltage varies over its anticipated operating range, and as the number and pumping capacity of pump circuits that are enabled varies accordingly, the peak magnitude of electronic charge pumped per cycle, just before each change in the selection of pump circuits so enabled, is substantially uniform over the anticipated operating range of the power supply voltage.

24. An integrated circuit as in claim 20 wherein the controller circuit comprises:

a reference voltage circuit for internally generating a reference voltage;

a first regulator circuit coupled to receive the boosted voltage and the internally generated reference voltage, for generating a first voltage related to the boosted voltage and a second voltage related to the internally generated reference voltage, for comparing the first voltage to the second voltage to infer a determination of the boosted voltage, and for outputting at least one control signal in accordance therewith;

a second regulator circuit coupled to receive the power supply voltage and the internally generated reference voltage, for generating a third voltage related to the power supply voltage, for comparing the third voltage to a voltage related to the internally generated reference voltage to infer a determination of the power supply voltage, and for outputting at least one control signal in accordance therewith; and a pump control circuit, responsive to the at least one control signal from the first regulator circuit and responsive to the at least one control signal from the second regulator circuit, for determining if one or more of the plurality of pump circuits should be enabled, and for controlling each of the plurality of pump circuits in accordance therewith.

25. An integrated circuit as in claim 24 wherein:

the first voltage comprises a linear fraction of the boosted voltage; and the second voltage is substantially equal to the internally generated reference voltage.

26. An integrated circuit as in claim 24 wherein:

the third voltage comprises a linear fraction of the power supply voltage; and the voltage to which the third voltage is compared is substantially equal to the internally generated reference voltage.

27. An integrated circuit as in claim 24 wherein:

the first voltage comprises a linear fraction of the boosted voltage;

the second voltage is substantially equal to the internally generated reference voltage;

the third voltage comprises a linear fraction of the power supply voltage; and the voltage to which the third voltage is compared is substantially equal to the internally generated reference voltage.

28. An integrated circuit as in claim 26 wherein:

the reference voltage circuit comprises a bandgap reference voltage circuit; and the internally generated reference voltage is substantially independent of the power supply voltage, substantially independent of variations in semiconductor process parameters, and substantially independent of variations in temperature.

29. An integrated circuit as in claim 24 wherein the controller circuit further comprises:

a test input coupled to receive a test mode signal, to lower by a particular amount the voltage to which the boosted voltage is regulated when the test mode signal is active.

30. An integrated circuit as in claim 29 wherein:

the particular amount by which the boosted voltage is altered, when the test mode signal is active, is approximately 200 mV.

31. In an integrated circuit having a memory array, a method of operating the integrated circuit comprising:

receiving, relative to a ground potential, a power supply voltage operably coupled to the integrated circuit, by which voltage most circuits associated with the memory array are generally powered;

generating a boosted voltage having a regulated magnitude, relative to the ground potential, that is substantially independent of the power supply voltage, over at least an expected range of possible operating values for the power supply voltage; and then driving a selected word line to the boosted voltage during a memory operation.

32. A method as in claim 31 further comprising:

decoding at least one selected array select signal; and driving the at least one selected array select signal to the boosted voltage during a memory operation.

33. A method as in claim 32 wherein:

the at least one selected array select signal is driven from an initial voltage equal to the power supply voltage to the boosted voltage during a memory operation.

34. A method as in claim 31 wherein the generating step comprises:

determining whether the magnitude of the boosted voltage, relative to the ground potential, is less than its desired regulated value; and periodically coupling charge onto the boosted output node when the magnitude of the boosted voltage, relative to the ground potential, is less than its desired regulated value, thereby tending to increase the magnitude of the boosted voltage relative to the ground potential.

35. A method as in claim 34 further comprising:

controlling the amount of charge coupled periodically onto the output node of the voltage generator circuit as a function of both the boosted voltage and the power supply voltage.

36. In an integrated circuit having a memory array, a method of operating the integrated circuit comprising:

receiving, relative to a ground potential, a power supply voltage operably coupled to the integrated circuit, by which voltage most circuits associated with the memory array are generally powered;

generating a boosted voltage having a regulated magnitude, relative to the ground potential, that is substantially independent of the power supply voltage, over at least an expected range of possible operating values for the power supply voltage; and driving a selected word line to the boosted voltage during a memory operation;

wherein the generating step comprises:

determining whether the magnitude of the boosted voltage, relative to the ground potential, is less than its desired regulated value; and periodically coupling charge onto the boosted output node when the magnitude of the boosted voltage, relative to the ground potential, is less than its desired regulated value, thereby tending to increase the magnitude of the boosted voltage relative to the ground potential; and wherein the amount of charge coupled onto the boosted output node is controlled by varying which one or ones of a plurality of pump circuits are enabled.

37. A method as in claim 36 further comprising:

generating a first voltage related to the boosted voltage and a second voltage related to the internally generated reference voltage;

comparing the first voltage to the second voltage;

outputting at least one control signal when the magnitude of the boosted voltage is less than desired;

determining if one or more of the plurality of pump circuits should be enabled as a function of the boosted voltage relative to its desired regulated value; and controlling each of the plurality of pump circuits in accordance therewith.

38. A method as in claim 37 further comprising:

generating a third voltage related to the power supply voltage;

comparing the third voltage to a voltage related to the internally generated reference voltage;

outputting at least one control signal indicative of the magnitude of the power supply voltage;

determining if one or more of the plurality of pump circuits should be enabled as a function of both the power supply voltage and the boosted voltage relative to its desired regulated value; and controlling each of the plurality of pump circuits in accordance therewith.

39. In an integrated circuit having a memory array, a method of operating the integrated circuit comprising:

receiving, relative to a ground potential, a power supply voltage operably coupled to the integrated circuit, by which voltage most circuits associated with the memory array are generally powered;

generating a boosted voltage having a regulated magnitude, relative to the ground potential, that is substantially independent of the power supply voltage, over at least an expected range of possible operating values for the power supply voltage;

driving a selected word line to the boosted voltage during a memory operation;

receiving a test mode signal; and altering by a particular amount the voltage to which the boosted voltage is regulated when the test mode signal is active.

40. A method as in claim 38 further comprising:

whenever the boosted voltage is less in magnitude than a lower limit, enabling all the pump circuits;

whenever the boosted voltage is greater in magnitude than an upper limit, enabling none of the pump circuits; and whenever the magnitude of the boosted voltage falls between the lower limit and the upper limit, enabling a variable number of the pump circuits as a function of both the power supply voltage and the boosted voltage.

41. A method as in claim 38 wherein:

each of the plurality of pump circuits are individually sized so that, as the power supply voltage varies over its anticipated operating range, and as the number and pumping capacity of pump circuits that are enabled varies accordingly, the peak magnitude of electronic charge pumped per cycle, just before each change in the selection of pump circuits so enabled, is substantially uniform over the anticipated operating range of the power supply voltage.

42. A method as in claim 31 wherein:

row decoder circuitry is arranged so that deselected row decoders provide significant capacitive load on the boosted voltage node when compared to the capacitance of a selected word line within the memory array that must be charged to the boosted voltage during each memory cycle, such capacitive load providing a significant reservoir of electronic charge on the boosted voltage node without requiring separate devices or structures.

43. A method as in claim 31 wherein the memory array comprises a dynamic memory array.

44. A method as in claim 31 wherein the memory array comprises a read-only memory array.

45. A method as in claim 31 wherein:

the power supply voltage is a positive voltage relative to the ground potential; and the boosted voltage is more positive than the power supply voltage.

46. An integrated circuit comprising:

a memory array including a plurality of memory cells, each memory cell coupled to an associated one of a plurality of word lines within the memory array;

a power supply terminal for receiving, relative to a ground potential, a power supply voltage operably coupled to the integrated circuit, by which voltage most circuits associated with the memory array are generally powered;

means for generating a substantially fixed boosted voltage having a regulated magnitude, relative to the ground potential, that is substantially independent of the power supply voltage, over at least an expected range of possible operating values for the power supply voltage; and means for driving a selected word line to the boosted voltage during a memory operation.

47. An integrated circuit as in claim 46 further comprising:

means for decoding at least one selected array select signal; and means for driving the at least one selected array select signal to the boosted voltage during a memory operation.

48. An integrated circuit as in claim 46 wherein the boosted voltage generation means comprises:

means for determining whether the magnitude of the boosted voltage, relative to the ground potential, is less than its desired regulated value; and means for periodically coupling charge onto the output node of the voltage generator circuit when the magnitude of the boosted voltage, relative to the ground potential, is less than its desired regulated value, thereby tending to increase the magnitude of the boosted voltage relative to the ground potential.

49. An integrated circuit in claim 47 wherein the boosted voltage generation means further comprises:

means for controlling the amount of charge coupled periodically onto the output node of the voltage generator circuit as a function of both the boosted voltage and the power supply voltage.

50. An integrated circuit as in claim 48 wherein the means for controlling the amount of charge coupled periodically onto the output node of the voltage generator circuit comprises:

means for enabling one or more of a plurality of pump circuits.

51. An integrated circuit comprising:

a memory array including a plurality of memory cells, each memory cell coupled to an associated one of a plurality of word lines within the memory array;

a power supply terminal for receiving, relative to a ground potential, a VDD power supply voltage operably coupled to the integrated circuit;

a voltage generator circuit for generating, on an output node thereof, a boosted VPP voltage that is nominally greater in magnitude than the VDD power supply voltage, over at least an expected range of possible operating values for the VDD power supply voltage; and a row decoder circuit coupled to receive the VPP voltage, for decoding a selected word line and driving the selected word line to the VPP voltage;

wherein the voltage generator circuit includes a controller circuit;

a plurality of pump circuits responsive to the controller circuit for periodically coupling electronic charge onto the VPP output node of the voltage generator circuit, thereby tending to increase the magnitude of the VPP voltage;

wherein each of the plurality of pump circuits may be independently enabled by the controller circuit to couple a corresponding amount of electronic charge per pump cycle onto the VPP output node of the voltage generator circuit;

wherein, for a given value of the VPP voltage, the controller circuit is arranged to enable one or more pump circuits having, in aggregate, incrementally more total pump capacitance as the magnitude of the VDD voltage tends correspondingly further below its nominal value, and to enable one or more pump circuits having, in aggregate, incrementally less total pump capacitance as the magnitude of the VDD voltage tends correspondingly further above its nominal value, thereby tending to maintain a more uniform value of total pumped charge per cycle over an operating range of the VDD voltage; and wherein each of the plurality of pump circuits are individually sized so that, as the VDD voltage varies over its anticipated operating range, and as the number and pumping capacity of pump circuits that are enabled varies accordingly, the peak magnitude of electronic charge pumped per cycle, just before each change in the selection of pump circuits so enabled, is substantially uniform over the anticipated operating range of the VDD voltage.

52. An integrated circuit as in claim 51 wherein:

the controller circuit is further arranged to disable all pump circuits if the magnitude of the VPP voltage exceeds a particular voltage.

53. An integrated circuit as in claim 51 wherein the controller circuit comprises:

a first regulator circuit coupled to receive the VDD voltage and an internally generated reference voltage, for generating a first voltage related to the VDD voltage and a second voltage related to the internally generated reference voltage, for comparing the first voltage to the second voltage and for outputting at least one control signal indicative of the magnitude of the VDD voltage; and a pump control circuit, responsive to the at least one control signal from the first regulator circuit, for determining if one or more of the plurality of pump circuits should be enabled as a function of the VDD voltage, and for controlling each of the plurality of pump circuits in accordance therewith.

54. An integrated circuit as in claim 53 wherein the first regulator circuit comprises:

a plurality of sensing circuits, each for comparing a voltage proportional to the internally generated reference voltage to a respective one of a plurality of voltages proportional to the VDD voltage.

55. An integrated circuit as in claim 53 wherein the first regulator circuit comprises:

a plurality of sensing circuits, each for comparing a voltage proportional to the VDD voltage to a respective one of a plurality of voltages proportional to the internally generated reference voltage.

56. In an integrated circuit, a voltage generator circuit for generating, on an output node thereof, a boosted VPP voltage that is nominally greater in magnitude than a VDD power supply voltage operably coupled to the integrated circuit, over at least an expected range of possible operating values for the VDD power supply voltage, said voltage generator circuit comprising:

a controller circuit;

a plurality of pump circuits responsive to the controller circuit for periodically coupling electronic charge onto the VPP output node of the voltage generator circuit, thereby tending to increase the magnitude of the VPP voltage;

wherein each of the plurality of pump circuits may be independently enabled by the controller circuit to couple a corresponding-amount of electronic charge per pump cycle onto the VPP output node of the voltage generator circuit;

wherein, for a given value of the VPP voltage, the controller circuit is arranged to enable one or more pump circuits having, in aggregate, incrementally more total pump capacitance as the magnitude of the VDD voltage tends correspondingly further below its nominal value, and to enable one or more pump circuits having, in aggregate, incrementally less total pump capacitance as the magnitude of the VDD voltage tends correspondingly further above its nominal value, thereby tending to maintain a more uniform value of total pumped charge per cycle over an operating range of the VDD voltage; and wherein each of the plurality of pump circuits are individually sized so that, as the VDD voltage varies over its anticipated operating range, and as the number and pumping capacity of pump circuits that are enabled varies accordingly, the peak magnitude of electronic charge pumped per cycle, just before each change in the selection of pump circuits so enabled, is substantially uniform over the anticipated operating range of the VDD voltage.

57. A circuit as in claim 56 wherein the controller circuit comprises:

a first regulator circuit coupled to receive the VDD voltage and an internally generated reference voltage, for generating a first voltage related to the VDD voltage and a second voltage related to the internally generated reference voltage, for comparing the first voltage to the second voltage and for outputting at least one control signal indicative of the magnitude of the VDD voltage; and a pump control circuit, responsive to the at least one control signal from the first regulator circuit, for determining if one or more of the plurality of pump circuits should be enabled as a function of the VDD voltage, and for controlling each of the plurality of pump circuits in accordance therewith.

58. A circuit as in claim 57 wherein the first regulator circuit comprises:

a plurality of sensing circuits, each for comparing a voltage proportional to the internally generated reference voltage to a respective one of a plurality of voltages proportional to the VDD voltage.

59. A circuit as in claim 57 wherein the first regulator circuit comprises:

a plurality of sensing circuits, each for comparing a voltage proportional to the VDD voltage to a respective one of a plurality of voltages proportional to the internally generated reference voltage.

60. An integrated circuit as in claim 1 wherein:

the power supply voltage is a positive voltage relative to the ground potential; and the boosted voltage is lower in magnitude, for certain combinations of semiconductor process parameters, power supply voltage, and temperature, than the power supply voltage.

61. A method as in claim 31 wherein:

the power supply voltage is a positive voltage relative to the ground potential; and the boosted voltage is lower in magnitude, for certain combinations of semiconductor process parameters, power supply voltage, and temperature, than the power supply voltage.

* * * * *